US011482279B2

(12) United States Patent
Zhu

(10) Patent No.: US 11,482,279 B2
(45) Date of Patent: Oct. 25, 2022

(54) SRAM CELL, MEMORY COMPRISING THE SAME, AND ELECTRONIC DEVICE

(71) Applicant: INSTITUTE OF MICROELECTRONICS CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/768,479

(22) PCT Filed: Oct. 31, 2019

(86) PCT No.: PCT/CN2019/114824
§ 371 (c)(1),
(2) Date: May 29, 2020

(87) PCT Pub. No.: WO2021/056682
PCT Pub. Date: Apr. 1, 2021

(65) Prior Publication Data
US 2022/0208258 A1 Jun. 30, 2022

(30) Foreign Application Priority Data
Sep. 23, 2019 (CN) .......................... 201910902431.X

(51) Int. Cl.
G11C 11/00 (2006.01)
G11C 11/412 (2006.01)
(Continued)

(52) U.S. Cl.
CPC .......... *G11C 11/412* (2013.01); *G11C 11/417* (2013.01); *H01L 27/1052* (2013.01); *H01L 27/1104* (2013.01); *H01L 29/7827* (2013.01)

(58) Field of Classification Search
CPC . G11C 11/412; G11C 11/417; H01L 27/1052; H01L 27/1104; H01L 29/7827
(Continued)

(56) References Cited

U.S. PATENT DOCUMENTS 8,004,042 B2 * 8/2011 Yang .................... H01L 27/088
257/E27.098
8,942,030 B2 * 1/2015 Liaw ................... H01L 27/1104
365/230.05

(Continued)

FOREIGN PATENT DOCUMENTS

CN 103022038 4/2013
CN 103811051 5/2014
(Continued)

OTHER PUBLICATIONS

International Search Report issued in corresponding PCT Patent Application No. PCT/CN2019/114824, dated Jun. 24, 2020.

*Primary Examiner* — Viet Q Nguyen
(74) *Attorney, Agent, or Firm* — Pillsbury Winthrop Shaw Pittman LLP

(57) ABSTRACT

A Static Random Access Memory (SRAM) cell that may include a first pull-up transistor, a second pull-up transistor, a first pull-down transistor, a second pull-down transistor, a first pass-gate transistor and a second pass-gate transistor provided at two levels on a substrate. The respective transistors may be vertical transistors. The first pull-up transistor and the second pull-up transistor may be provided at a first level, and the first pull-down transistor, the second pull-down transistor, the first pass-gate transistor and the second pass-gate transistor may be provided at a second level
(Continued)

different from the first level. A region where the first pull-up transistor and the second pull-up transistor are located and a region where the first pull-down transistor, the second pull-down transistor, the first pass-gate transistor and the second pass-gate transistor are located may at least partially overlap in a vertical direction with respect to an upper surface of the substrate.

30 Claims, 98 Drawing Sheets

(51) Int. Cl.
*G11C 11/417* (2006.01)
*H01L 27/105* (2006.01)
*H01L 27/11* (2006.01)
*H01L 29/78* (2006.01)

(58) Field of Classification Search
USPC .......................................................... 365/154
See application file for complete search history.

(56) References Cited

U.S. PATENT DOCUMENTS

| | | | |
|---|---|---|---|
| 9,397,104 B2 | 7/2016 | Zhu et al. | |
| 9,515,077 B1 * | 12/2016 | Liaw .................... | H01L 29/0847 |
| 10,032,782 B2 * | 7/2018 | Hsu ...................... | H01L 27/1052 |
| 10,147,802 B2 * | 12/2018 | Zang ..................... | H01L 27/1211 |
| 10,157,928 B2 * | 12/2018 | Colinge .................. | H01L 29/45 |
| 10,163,915 B1 * | 12/2018 | Zang ..................... | H01L 29/0847 |
| 10,211,206 B1 * | 2/2019 | Zang ..................... | G11C 5/025 |
| 10,312,229 B2 * | 6/2019 | Moroz ................. | H01L 27/1108 |
| 10,515,970 B2 * | 12/2019 | Hsu ...................... | H01L 27/1104 |
| 10,580,779 B2 * | 3/2020 | Lim ........................ | H01L 23/50 |
| 10,685,966 B2 * | 6/2020 | Liaw .................... | H01L 27/0207 |
| 2008/0224258 A1 | 9/2008 | Schepis et al. | |
| 2016/0336329 A1 | 11/2016 | Colinge et al. | |
| 2017/0317087 A1 | 11/2017 | Chen et al. | |
| 2019/0027483 A1 * | 1/2019 | Zang ..................... | H01L 27/1104 |

FOREIGN PATENT DOCUMENTS

| | | | | |
|---|---|---|---|---|
| CN | 106158867 | | 11/2016 | |
| CN | 107425000 | | 12/2017 | |
| EP | 3581543 A1 * | | 12/2019 | ............ B82Y 10/00 |

* cited by examiner

SRAM CELL, MEMORY COMPRISING THE SAME, AND ELECTRONIC DEVICE

CROSS-REFERENCE TO RELATED APPLICATION(S)

This application is the U.S. national phase entry of PCT Application No. PCT/CN2019/114824, filed on Oct. 31, 2019, which claims the benefit of priority to Chinese Patent Application No. 201910902431.X, filed on Sep. 23, 2019, entitled "SRAM CELL, MEMORY COMPRISING THE SAME, AND ELECTRONIC DEVICE", which is incorporated herein by reference in its entirety.

TECHNICAL FIELD

The present disclosure relates to the field of semiconductors, and more particularly, to a Static Random Access Memory (SRAM) cell, a method of manufacturing the same, a memory comprising the same and an electronic device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

In addition, it is desired to increase a degree of integration to increase a storage density, and therefore the vertical device is promising in application to memory devices such as SRAMs. However, there is currently no effective means to further enhance the degree of integration or the storage density of SRAMs based on vertical devices, especially vertical nanosheet or nanowire MOSFETs.

SUMMARY

In view of the above, the present disclosure aims to provide, among others, an SRAM cell with improved performance, a method of manufacturing the same, a memory comprising the same, and an electronic device.

According to an aspect of the present disclosure, there is provided an SRAM cell, including a first pull-up transistor, a second pull-up transistor, a first pull-down transistor, a second pull-down transistor, a first pass-gate transistor and a second pass-gate transistor provided at two levels on a substrate. The respective transistors may be vertical transistors. The first pull-up transistor and the second pull-up transistor may be provided at a first level, and the first pull-down transistor, the second pull-down transistor, the first pass-gate transistor and the second pass-gate transistor may be provided at a second level different from the first level. A region where the first pull-up transistor and the second pull-up transistor are located and a region where the first pull-down transistor, the second pull-down transistor, the first pass-gate transistor and the second pass-gate transistor are located may at least partially overlap in a vertical direction with respect to an upper surface of the substrate.

According to another aspect of the present disclosure, there is provided a method of manufacturing an SRAM cell, comprising: providing a stack of a first group of a first source/drain layer, a channel layer and a second source/drain layer and a second group of a first source/drain layer, a channel layer and a second source/drain layer sequentially on a substrate; forming a hard mask layer on the stack, wherein the hard mask layer comprises body portions and connection portions between the respective body portions, wherein the body portions are configured to define transistors included in the SRAM cell, and the connection portions are configured to define interconnection structures included in the SRAM cell and have a line width less than that of the body portions; defining, in the channel layer and the second source/drain layer of the second group, active regions of pull-down transistors and pass-gate transistors among the transistors included in the SRAM cell by using the hard mask layer; defining, in the first source/drain layer of the second group and the second source/drain layer of the first group, a first interconnection structure and a second interconnection structure among the interconnection structures included in the SRAM cell by using the hard mask layer; and defining, in the channel layer and the first source/drain layer of the first group, active regions of pull-up transistors among the transistors included in the SRAM cell by using the hard mask layer.

According to another aspect of the present disclosure, there is provided an electronic device, comprising a memory having the SRAM cell described above.

According to embodiments of the present disclosure, the constituent transistors of the SRAM cell may be vertically stacked, resulting in a reduced footprint. The transistors at the upper level and the lower level may be stacked in a self-aligned manner, resulting in a further reduced footprint. The active regions of the transistors, especially the channels, may comprise a single-crystalline semiconductor material, and thus it is possible to provide high mobility and thus enhance the performance of the SRAM cell.

BRIEF DESCRIPTION OF THE DRAWINGS

The above and other objects, features, and advantages of the present disclosure will become more apparent from following descriptions of embodiments thereof with reference to attached drawings, in which.

Throughout the drawings, like or similar reference numbers denote like or similar elements.

DETAILED DESCRIPTION

Figure 1:
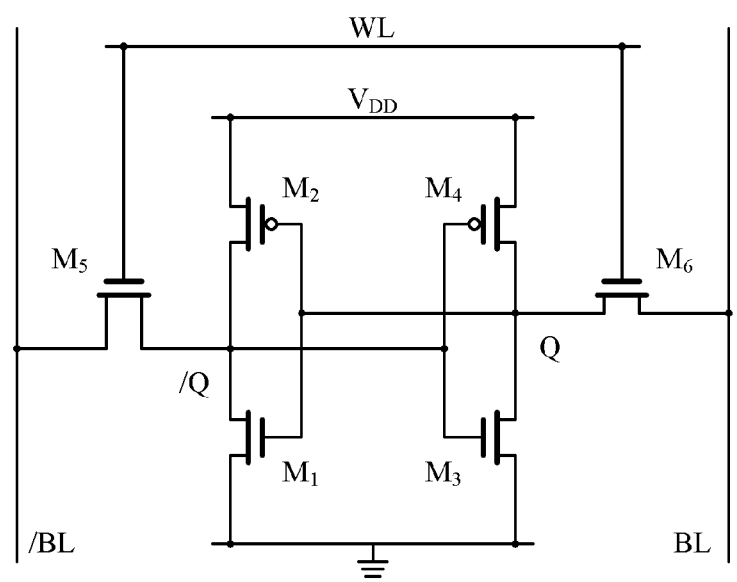
FIG. 1 is an equivalent circuit diagram schematically showing a Static Random Access Memory (SRAM) cell.

Hereinafter, descriptions are given with reference to embodiments shown in the attached drawings. However, it is to be understood that these descriptions are illustrative and not intended to limit the present disclosure. Further, in the following, descriptions on known structures and technologies are omitted so as not to obscure the concept of the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art may also devise regions/layers of other different shapes, sizes, and relative positions as desired.

In the context of the present disclosure, when a layer/element is recited as being "on" a further layer/element, the layer/element may be provided directly on the further layer/element, or otherwise there may be an intervening layer/element interposed therebetween. Further, if a layer/element is "on" a further layer/element in an orientation, then the layer/element may be "under" the further layer/element when the orientation is turned.

According to embodiments of the present disclosure, there is provided a Static Random Access Memory (SRAM) cell based on vertical devices such as vertical nanosheet or nanowire Metal Oxide Semiconductor Field Effect Transistors (MOSFETs). In the SRAM cell, the vertical devices which are constituent elements of the SRAM cell may be stacked in a vertical direction to further enhance a degree of integration.

FIG. 1 is an equivalent circuit diagram schematically showing an SRAM cell.

As shown in FIG. 1, the SRAM cell may have a 6T structure, that is, the SRAM cell comprises six constituent transistors $M_1$ to $M_6$, for example, Field Effect Transistors (FETs). Among these six transistors, four transistors $M_1$, $M_2$, $M_3$, and $M_4$ may form two cross-coupled inverters as a storage position to store one bit in the SRAM cell. The other two transistors $M_5$ and $M_6$ may control data transmission between the storage position and a bit line BL and a complementary bit line /BL, respectively, under control of a word line WL, to achieve reading and writing.

Among the four transistors $M_1$, $M_2$, $M_3$, and $M_4$ which constitute the cross-coupled inverters, the two p-type transistors $M_2$ and $M_4$ may be connected to a power supply voltage $V_{DD}$, and thus may be referred to as "pull-up transistors" (PU); and the two n-type transistors $M_1$ and $M_3$ may be connected to a ground voltage, and thus may be referred to as "pull-down transistors" (PD). The transistors $M_5$ and $M_6$ (which may also be n-type transistors) may control reading and writing, in other words, data transmission, and thus may be referred to as "access control transistors" or "pass-gate transistors" (PG).

Reading and writing operations of the 6T SRAM cell will be briefly described below.

Firstly, the reading operation will be described. It is assumed that bit of "1" is stored at the storage position, that is, a node Q is at a high level and a node /Q is at a low level. At the beginning of a reading cycle, the bit line BL and the complementary bit line /BL may be pre-charged to a logic of 1, and then the word line WL may be charged to a high level to cause the access control transistors $M_5$ and $M_6$ to be turned on. Due to the high level at Q, the pull-up transistor $M_2$ is turned off and the pull-down transistor $M_1$ is turned on, and then the pull-down transistor $M_1$ and the access control transistor $M_5$ cause the complementary bit line /BL to be connected to the ground. Therefore, the pre-charged value of the complementary bit line /BL is discharged, and thereby the complementary bit line /BL has a value of 0. On the other hand, due to the low level at /Q, the pull-up transistor $M_4$ is turned on and the pull-down transistor $M_3$ is turned off, and then the pull-up transistor $M_4$ and the access control transistor $M_6$ cause the bit line BL to be connected to the power supply voltage $V_{DD}$. Therefore, the pre-charged value is maintained, that is, the bit line BL has a value of 1. If the stored bit is "0", a reversed circuit state may cause the complementary bit line /BL to have a value of 1 and cause the bit line BL to have a value of 0. The stored bit "0" or "1" may be read out by distinguishing which one of the bit line BL and the complementary bit line /BL has a high potential.

During the writing operation, at the beginning of a writing cycle, a state to be written is loaded to the bit line BL. For example, if "0" is to be written, the bit line BL is set to "0" (and the complementary bit line /BL is set to "1"). Then, the word line WL may be charged with a high level to cause the access control transistors $M_5$ and $M_6$ to be turned on and thus the state of the bit line BL is loaded to the storage position of the SRAM cell. This is achieved by designing (transistors for) input driving of the bit line to be more robust than (the transistors at) the storage position, so that the state of the bit line may overwrite the previous state of the cross-coupled inverters at the storage position.

For the 6T SRAM cell, the following parameters may be defined:

$\beta = PD(w/l)/PG(w/l)$; and   Reading Noise Margin (RNM):

$\alpha = PU(w/l)/PG(w/l)$,   Writing Noise Margin (WNM):

where PD(w/l) represents a width to length ratio of the pull-down transistor, PU(w/l) represents a width to length ratio of the pull-up transistor, and PG(w/l) represents a width to length ratio of the pass-gate transistor.

Different values of α and β may be selected according to design. According to an embodiment of the present disclosure, the PD, the PU, and the PG may each comprise one or more unit transistors having substantially the same width to length ratio w/l, for convenience of manufacturing. In order to achieve different values of α and β, the PD, the PU, and the PG may comprise different numbers of unit transistors. The following table lists several exemplary values of α and β and corresponding numbers of unit transistors.

TABLE 1

| Exemplary values of α and β | Number of unit transistors in PD | Number of unit transistors in PU | Number of unit transistors in PG |
|---|---|---|---|
| β = 1, α = 1 | 1 | 1 | 1 |
| β = 1, α = 2 | 1 | 2 | 1 |
| β = 2, α = 1 | 2 | 1 | 1 |
| β = 2, α = 2 | 2 | 2 | 1 |
| β = 2, α = 3 | 2 | 3 | 1 |

Figure 2:
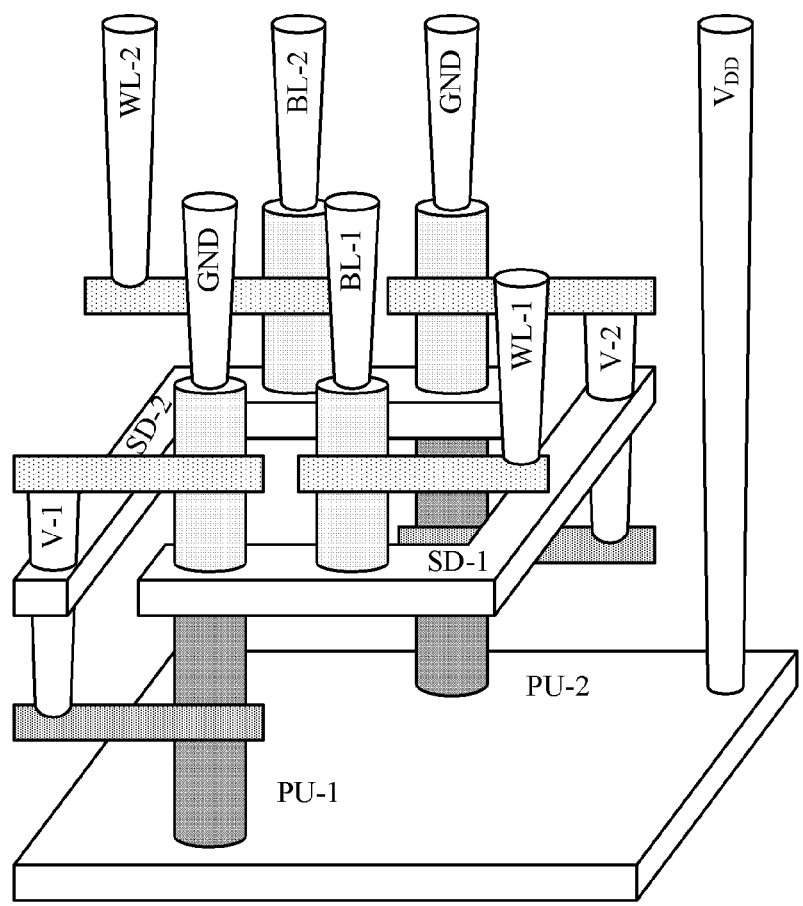
FIG. 2 is a perspective view schematically showing an SRAM cell according to an embodiment of the present disclosure.
Figure 3A:
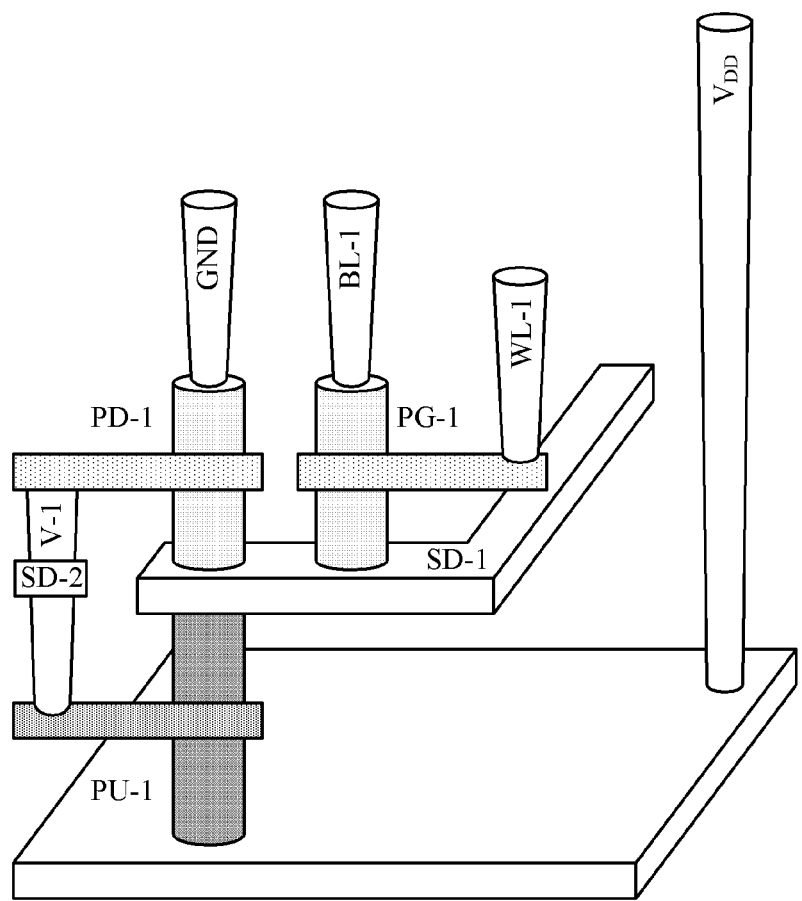
FIGS. 3(a) and 3(b) are exploded perspective views showing the SRAM cell shown in FIG. 2.
Figure 3B:
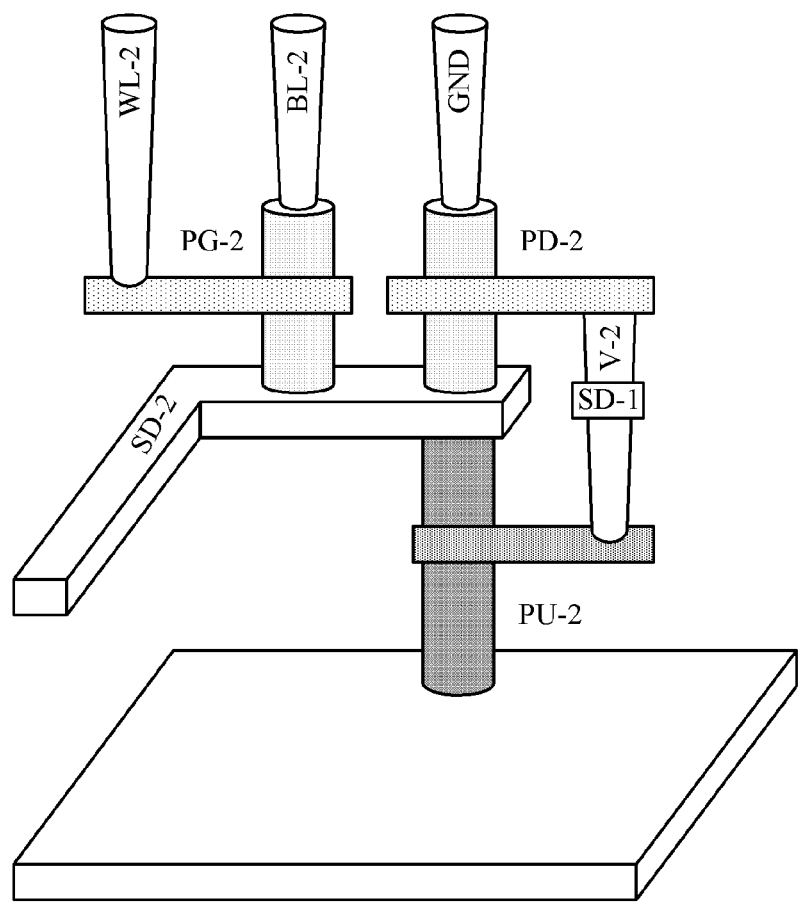

FIG. 2 is a perspective view schematically showing an SRAM cell according to an embodiment of the present disclosure, and FIGS. 3(a) and 3(b) are exploded perspective views showing the SRAM cell shown in FIG. 2.

In this example, β=1 and α=1, that is, the PD, the PU, and the PG may each comprise a single unit transistor. Therefore, in a 6T SRAM cell, six unit transistors may be included, that is, two pull-up transistors PU-1 and PU-2, two pull-down transistors PD-1 and PD-2 and two pass-gate transistors PG-1 and PG-2 as shown in FIGS. 2, 3(a) and 3(b). These transistors may all be vertical transistors.

Each of the vertical transistors may comprise an active region extending in a vertical direction with respect to an upper surface of a substrate (for example, a direction substantially perpendicular to the upper surface of the substrate). The active region may comprise a channel region and source/drain regions on opposite sides of the channel region in the vertical direction. As described below, the active region of the transistor may comprise a first source/drain layer, a channel layer, and a second source/drain layer which are sequentially stacked in the vertical direction. The respective layers may be contiguous to each other. Certainly, there may be other semiconductor layer(s) therebetween, for example, a leakage suppression layer and an On state current enhancement layer (i.e., a semiconductor layer having a band gap greater than or less than that of an adjacent layer). The source and drain regions may be formed substantially in the first source/drain layer and the second source/drain layer respectively, and the channel region may be formed substantially in the channel layer. For example, the source/drain regions may be realized by doped regions in the source/drain layers. A gate stack may be formed around at least a part or even the whole of a periphery of the channel region.

In the drawings, the active regions of these transistors are shown as nanowires extending in the vertical direction, but the present disclosure is not limited thereto. For example, the active regions may also be nanosheets or in other forms. In addition, for the sake of illustration and convenience only, in the perspective view, a gate electrode included in the gate stack is illustrated, only by its cross-section, to schematically show a position of the gate stack.

According to an embodiment of the present disclosure, such a transistor may be a conventional FET. In a case of the conventional FET, the source/drain regions on opposite sides of the channel region may have the same conductivity type of doping (for example, n-type doping or p-type doping). A conduction channel may be formed by the channel region between the source and drain regions at opposite ends of the channel region. Alternatively, the transistor may be a tunneling FET. In a case of the tunneling FET, the source and drain regions on the opposite sides of the channel region may have different conductivity types of doping (for example, n-type doping and p-type doping respectively). In this case, charged particles such as electrons may tunnel from the source region into the drain region through the channel region, thereby forming a conduction path between the source and drain regions. Although the conventional FET and the tunneling FET have different conductive mechanisms, they both exhibit an electrical property that the gate controls whether there is a conduction or not between the source and drain regions. Therefore, for both the conventional FET and the tunneling FET, descriptions are given by collectively using the terms "source/drain layer (source/drain region)" and "channel layer (channel region)", although there is no common "channel" in the tunneling FET.

Unlike the conventional technology where the constituent transistors of the SRAM cell are arranged in a planar layout, according to the embodiments of the present disclosure, the constituent transistors of the SRAM cell may be stacked in the vertical direction to further save a footprint of the SRAM cell.

In order to facilitate manufacturing, for example, to facilitate the doping of the active regions and the arrangement of interconnection structures, transistors of the same conductivity type may be provided in one layer (for example, at substantially the same level from the upper surface of the substrate), and transistors of different conductivity types may be located respectively in two layers (for example, at different levels from the upper surface of the substrate) and the two layers may overlap at least partially in the vertical direction.

In the example shown in FIGS. 2, 3(a) and 3(b), the pull-up transistors PU-1 and PU-2, as p-type transistors, are provided in one layer, and the pull-down transistors PD-1 and PD-2 and the pass-gate transistors PG-1 and PG-2, as n-type transistors, are provided in one layer. In this example, the p-type transistors are in a lower layer and the n-type transistors are in an upper layer, but the present disclosure is not limited thereto. For example, by flipping the structure shown in FIGS. 2, 3(a) and 3(b) upside down (but with the substrate still kept at the bottom) and adjusting the interconnection structures accordingly, the p-type transistors may be in the upper layer and the n-type transistors may be in the lower layer.

Since electrical connections to the pull-down transistors PD-1 and PD-2 and the pass-gate transistors PG-1 and PG-2, which are n-type transistors, are relatively complicated, it is advantageous to provide the n-type transistors in the upper layer, for example, to facilitate manufacturing of the electrical connections. In the drawings and the following description, the case where the n-type transistors are provided in the upper layer is described by way of example.

These transistors may be electrically connected to each other according to the above 6T layout.

As shown in FIGS. 2, 3(a) and 3(b), an upper source/drain region (for example, a drain region) of the first pull-up transistor PU-1 may be connected to a lower source/drain region (for example, a drain region) of the first pull-down transistor PD-1, and a first node therebetween corresponds to, for example, the node Q in FIG. 1. A lower source/drain region of the first pass-gate transistor PG-1 may be connected to the first node, and an upper source/drain region of the first pass-gate transistor PG-1 may be connected to a first bit line (for example, the bit line BL in FIG. 1) through a corresponding contact plug BL-1. Here, connections between the respective source/drain regions of the first pull-up transistor PU-1, the first pull-down transistor PD-1, and the first pass-gate transistor PG-1 are shown as a first interconnection structure SD-1. Similarly, an upper source/drain region (for example, a drain region) of the second pull-up transistor PU-2 may be connected to a lower source/drain region (for example, a drain region) of the second pull-down transistor PD-2, and a second node therebetween corresponds to, for example, the node /Q in FIG. 1. A lower source/drain region of the second pass-gate transistor PG-2 may be connected to the second node, and an upper source/drain region of the second pass-gate transistor PG-2 may be connected to a second bit line (for example, the bit line /BL in FIG. 1) through a corresponding contact plug BL-2. Here, connections between the respective source/drain regions of the second pull-up transistor PU-2, the second pull-down transistor PD-2, and the second pass-gate transistor PG-2 are shown as a second interconnection structure SD-2. As described below, the first interconnection structure SD-1 and the second interconnection structure SD-2 are not necessarily additional conductive layers which are provided separately, and may also implemented using material layers (for example, the source/drain layers described above) where the source/drain regions of the transistors are located.

Respective gate electrodes of the first pull-up transistor PU-1 and the first pull-down transistor PD-1 may be electrically connected to each other through a third interconnection structure V-1, and the third interconnection structure V-1 may be electrically connected to the second interconnection structure SD-2 (through, for example, direct contact with each other) (so as to be commonly connected to the node /Q). Similarly, respective gate electrodes of the second pull-up transistor PU-2 and the second pull-down transistor PD-2 may be electrically connected to each other through a fourth interconnection structure V-2, and the fourth interconnection structure V-2 may be connected to the first interconnection structure SD-1 (through, for example, direct contact with each other) (so as to be commonly connected to the node Q). As described below, the third interconnection structure V-1 and the fourth interconnection structure V-2 may be implemented using material layers (for example, the channel layers described above) used for the active regions of the transistors.

Respective lower source/drain regions (for example, source regions) of the first pull-up transistor PU-1 and the second pull-up transistor PU-2 may be provided on the substrate, and receive a power supply voltage $V_{DD}$ through a contact plug to the substrate. Respective upper source/drain regions (for example, source regions) of the first pull-down transistor PD-1 and the second pull-down transistor PD-2 may receive a ground voltage GND through respective contact plugs. Respective gate electrodes of the first pass-gate transistor PG-1 and the second pass-gate transistor PG-2 may be electrically connected to a word line (for example, the word line WL shown in FIG. 1) through respective contact plugs WL-1 and WL-2.

As shown in FIGS. 3(a) and 3(b), based on the first node and the second node, the six constituent transistors may be divided into two groups, that is, a first group of the first pull-up transistor PU-1, the first pull-down transistor PD-1 and the first pass-gate transistor PG-1 which are commonly connected to the first node (as shown in FIG. 3(a)), and a second group of the second pull-up transistor PU-2, the second pull-down transistor PD-2 and the second pass-gate transistor PG-2 which are commonly connected to the second node (as shown in FIG. 3(b)). The two groups may have the same layout or symmetrical layouts (rotating the layout shown in FIG. 3(a) by 180° will result in the layout shown in FIG. 3(b)). However, the present disclosure is not limited thereto. The two groups may have different or asymmetric layouts.

The two layers may be manufactured separately, for example, the p-type transistors may be manufactured firstly in the lower layer, and then the n-type transistors may be manufactured in the upper layer. Specifically, active material layers (for example, the source/drain layers and the channel layer described above) for the p-type transistors may be provided on the substrate, and active regions of the p-type transistors may be defined therein. In addition, patterns of the interconnection structures may be further defined by using the active material layers. Next, the p-type transistors may be manufactured according to a flow of manufacturing vertical transistors. Then, gaps in the lower layer may be filled with an insulating material. Active material layers (for example, the source/drain layers and the channel layer described above) for the n-type transistors may be provided at least partially over a region where the p-type transistors are located, and active regions of the n-type transistors may be defined therein. Similarly, patterns of the interconnection structures may also be defined by using the active material layers. There may be necessary connections or contacts between the interconnection patterns which are defined in the two processes to achieve the electrical connections described above. Then, the n-type transistors may be manufactured according to the flow of manufacturing vertical transistors. Since the n-type transistors are manufactured over the region where the p-type transistors are located, the upper layer and the lower layer overlap at least partially, and thereby the area may be saved. For example, active regions of at least a part of the transistors (especially the first pull-up transistor and the first pull-down transistor and/or the second pull-up transistor and the second pull-down transistor of which source/drain regions need to be connected to each other) may overlap or even be aligned in the vertical direction. However, it might be difficult for this method to form single-crystalline active regions, especially single-crystalline channel regions, for the upper layer, which is disadvantageous for further improving the performance of the SRAM cell.

According to other embodiments of the present disclosure, the active material layers for the p-type transistors and the active material layers for the n-type transistors may be sequentially provided on the substrate. For example, the active material layers may be provided by epitaxial growth, for example, the first source/drain layer, the channel layer and the second source/drain layer for the p-type transistors and the first source/drain layer, the channel layer, and the second source/drain layer for the n-type transistors may be sequentially grown. Thus, the active material layers may be formed as single-crystalline semiconductor materials. The single-crystalline semiconductor materials facilitate high mobility.

According to an embodiment of the present disclosure, a gate length may be determined by a thickness of the channel layer itself due to, for example, a self-alignment process described below. The channel layer may be formed by epitaxial growth, and thus the thickness thereof can be well controlled. Therefore, the gate length can be well controlled. For example, the gate length may be controlled to be small (for example, less than about 10 nm).

The active regions of the n-type transistors and the patterns of the interconnections in the upper layer, and also the active regions of the p-type transistors and the patterns of the interconnections in the lower layer may be defined respectively in the active material layers for the n-type transistors and in the active material layers for the p-type transistors sequentially from the top down. In order to achieve vertical overlap between the respective transistors to save the area, active patterns in the upper layer and the lower layer may be defined using the same mask pattern or mask layer. According to an embodiment of the present disclosure, the first interconnection structure and the second interconnection structure may be defined by using source/drain layers between the upper layer and the lower layer (for example, the second source/drain layer for the p-type transistors and the first source/drain layer for the n-type transistors), and the third interconnection structure and the fourth interconnection structure may be defined by using the channel layers in the upper layer and the lower layer. Then, the p-type transistors may be manufactured in the lower layer. In manufacturing the p-type transistors, the active regions of the n-type transistors in the upper layer may be covered by a placeholder layer. When the p-type transistors are completed, the lower layer may be covered by an isolation layer, and then the n-type transistors may be manufactured in the upper layer.

In order to facilitate the replacement gate process, a placeholder layer (also referred to as a "sacrificial gate") for the gate stacks may comprise a different material from those of placeholder layers at other positions. In this way, the sacrificial gate may then be removed, and the gate stacks may be formed in a space left due to the removal of the sacrificial gate.

In order to facilitate the formation of such a sacrificial gate or placeholder layer, the process of defining the active regions may be carried out separately for the channel layer and the source/drain layers. For example, the active regions may be firstly defined in the channel layer (for example, the channel layer is divided into channel regions for the respective transistors and portions for defining the third interconnection structure and the fourth interconnection structure, which may be in a form of, for example, nanowires). Then, a placeholder layer (a sacrificial gate) may be formed. Since the respective source/drain layers on opposite sides of the channel layer still continuously extend at this time, the placeholder layer (the sacrificial gate) thus formed may be self-aligned to the channel layer, so that self-aligned gate stacks may be formed by the replacement gate process. The placeholder layer (the sacrificial gate) may have its pattern further adjusted to achieve electrical connections and/or electrical isolations required for the gate stacks which are then formed by replacing the placeholder layer (the sacrificial gate). Then, the active regions may be defined in the source/drain layers, and placeholder layers may also be formed similarly.

According to an embodiment, the first interconnection structure and the second interconnection structure may be implemented using the source/drain layers between the two layers. Therefore, in patterning the active regions, the second source/drain layer for the p-type transistors and the first source/drain layer for the n-type transistors may be patterned according to a layout of the first interconnection structure and the second interconnection structure. In view of this, a mask pattern which is used to define the active regions may comprise portions (for example, circular portions) for defining the active regions of the transistors, portions (for example, circular portions) for defining the third interconnection structure and the fourth interconnection structure, and portions (connecting lines between the respective circular portions described above) for defining the first interconnection structure and the second interconnection structure. As described below, the mask pattern may have a grid shape.

FIGS. 4(a) to 7(b) are exploded perspective views schematically showing SRAM cells according to other embodiments of the present disclosure. These SRAM cells differ from the SRAM cell described above with reference to FIGS. 2, 3(a) and 3(b) mainly in that there are different numbers of unit transistors which constitute the pull-up transistor or the pull-down transistor to achieve different values of $\alpha$ and $\beta$. The unit transistors which constitute the same pull-up transistor or pull-down transistor may be connected in the same manner, and gate electrodes of the unit transistors may be connected together. Hereinafter, the descriptions focus on the differences from the embodiment described above.

Figure 4A:
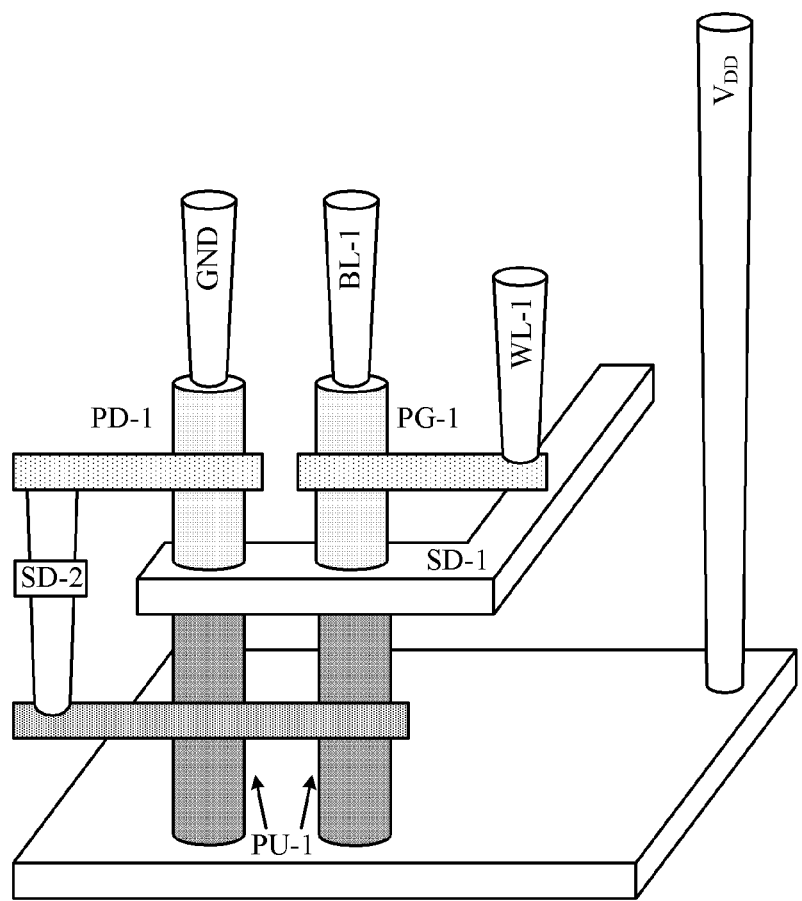
FIGS. 4(a) and 4(b) are exploded perspective views schematically showing an SRAM cell according to another embodiment of the present disclosure.
Figure 4B:
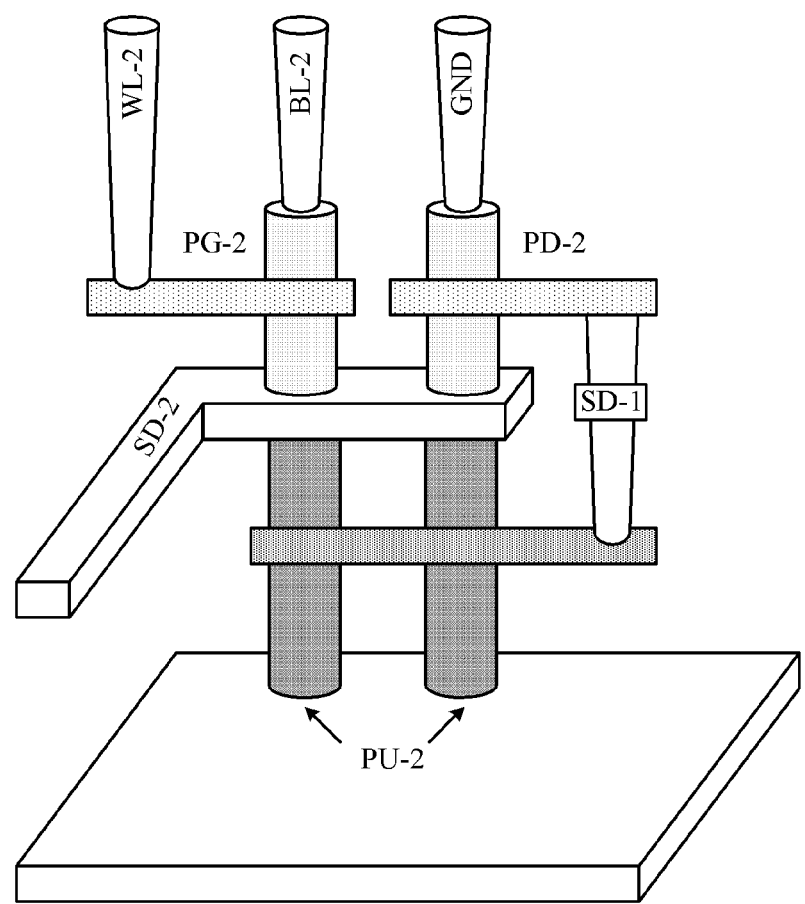

As shown in FIGS. 4(a) and 4(b), in this embodiment, each of the first pull-up transistor PU-1 and the second pull-up transistor PU-2 may comprise two unit transistors ($\beta$=1 and $\alpha$=2). In order to save the area, four (unit) transistors in the upper layer and four (unit) transistors in the lower layer may be aligned in the vertical direction.

Figure 5A:
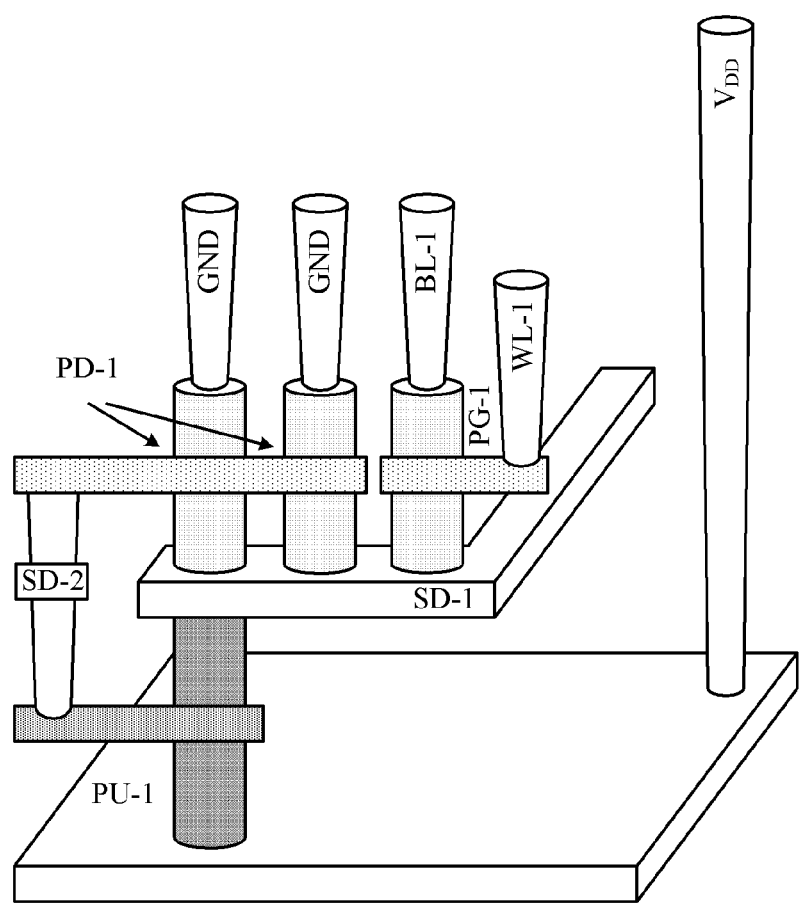
FIGS. 5(a) and 5(b) are exploded perspective views schematically showing an SRAM cell according to another embodiment of the present disclosure.
Figure 5B:
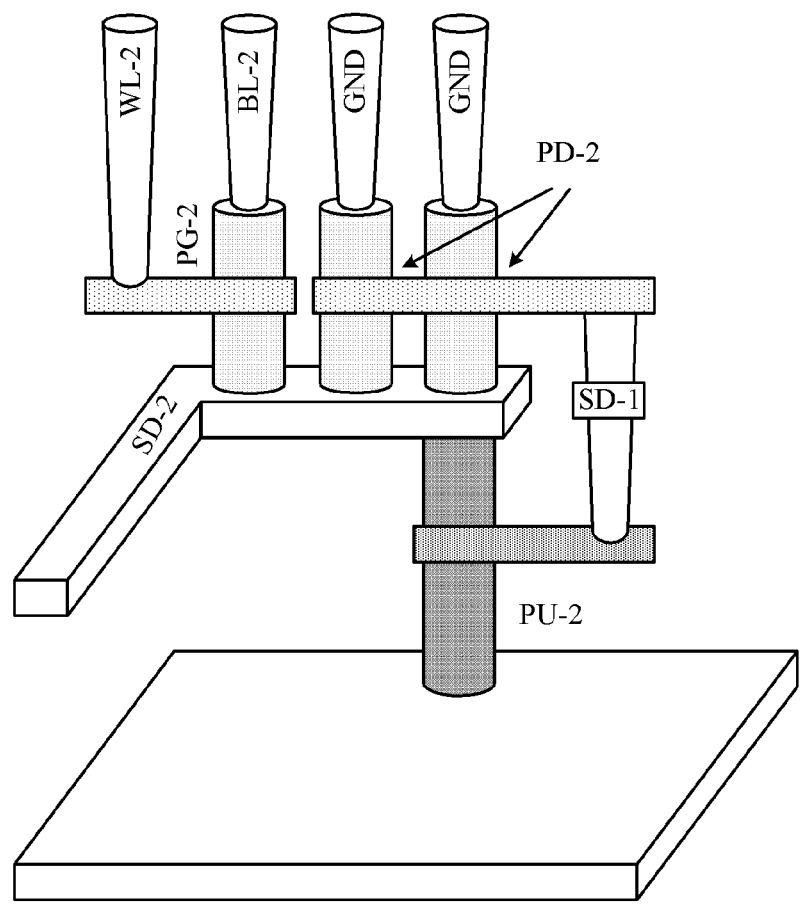

As shown in FIGS. 5(a) and 5(b), in this embodiment, each of the first pull-down transistor PD-1 and the second pull-down transistor PD-2 may comprise two unit transistors ($\beta$=2 and $\alpha$=1). In order to save the area, the first pull-up transistor PU-1 and one unit transistor of the first pull-down transistor PD-1 may be aligned in the vertical direction, and the second pull-up transistor PU-2 and one unit transistor of the second pull-down transistor PD-2 may be aligned in the vertical direction.

Figure 6A:
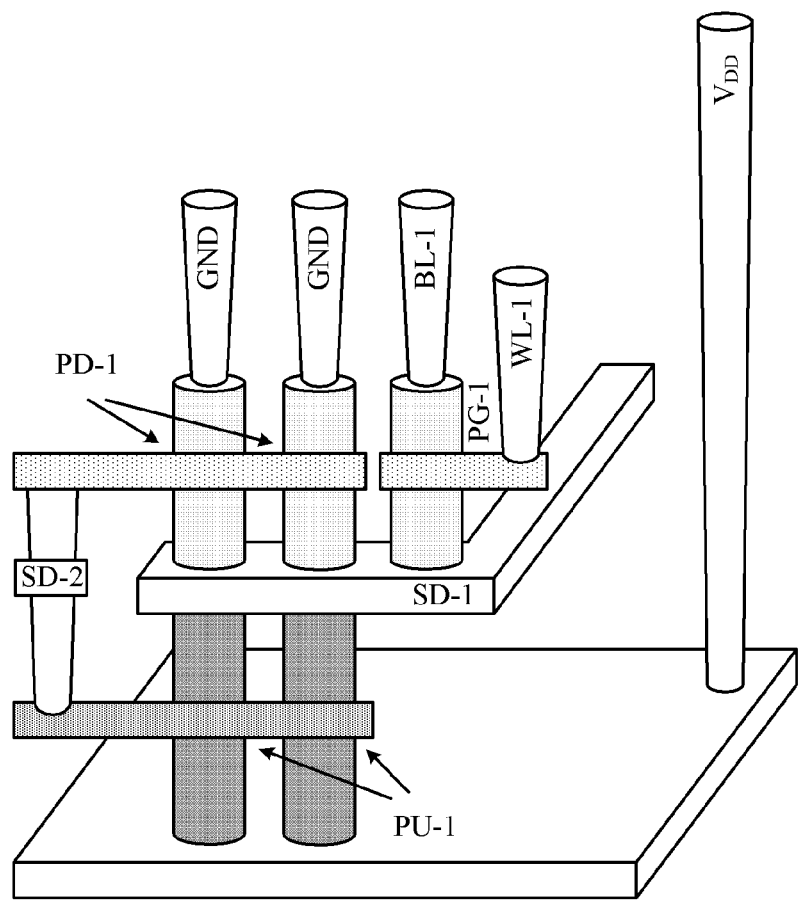
FIGS. 6(a) and 6(b) are exploded perspective views schematically showing an SRAM cell according to another embodiment of the present disclosure.
Figure 6B:
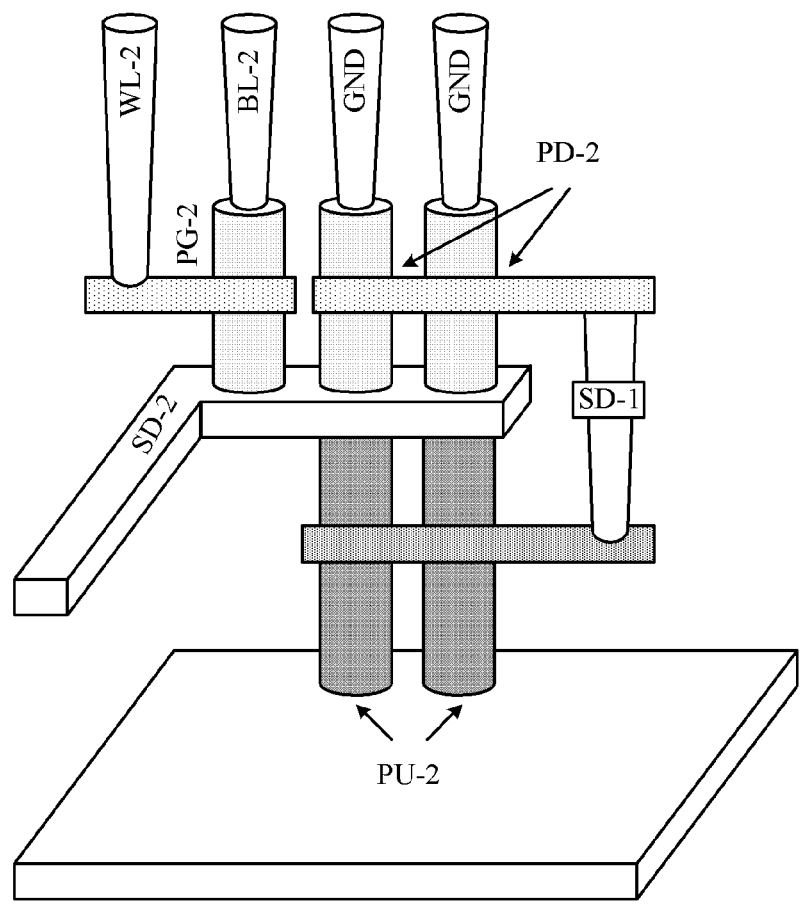

As shown in FIGS. 6(a) and 6(b), in this embodiment, each of the first pull-up transistor PU-1 and the second pull-up transistor PU-2 may comprise two unit transistors, and each of the first pull-down transistor PD-1 and the second pull-down transistor PD-2 may comprise two unit transistors ($\beta$=2 and $\alpha$=2). The two unit transistors of the first pull-up transistor PU-1 and the two respective unit transistors of the first pull-down transistor PD-1 may be aligned in the vertical direction, and the two unit transistors of the second pull-up transistor PU-2 and the two respective unit transistors of the second pull-down transistor PD-2 may be aligned in the vertical direction.

Figure 7A:
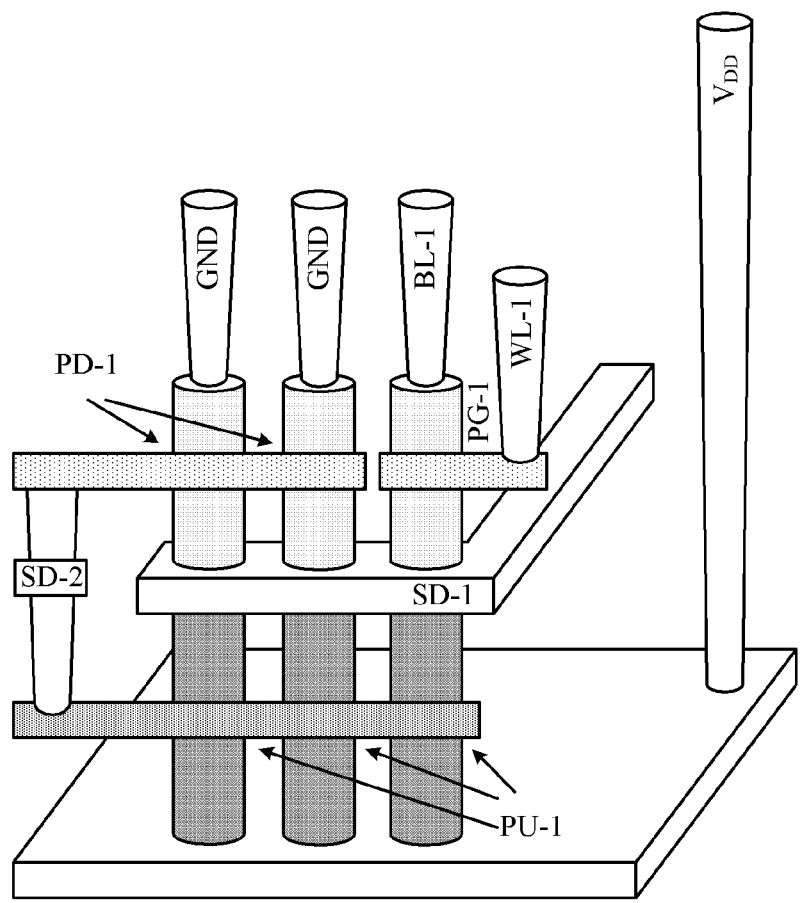
FIGS. 7(a) and 7(b) are exploded perspective views schematically showing an SRAM cell according to another embodiment of the present disclosure.
Figure 7B:
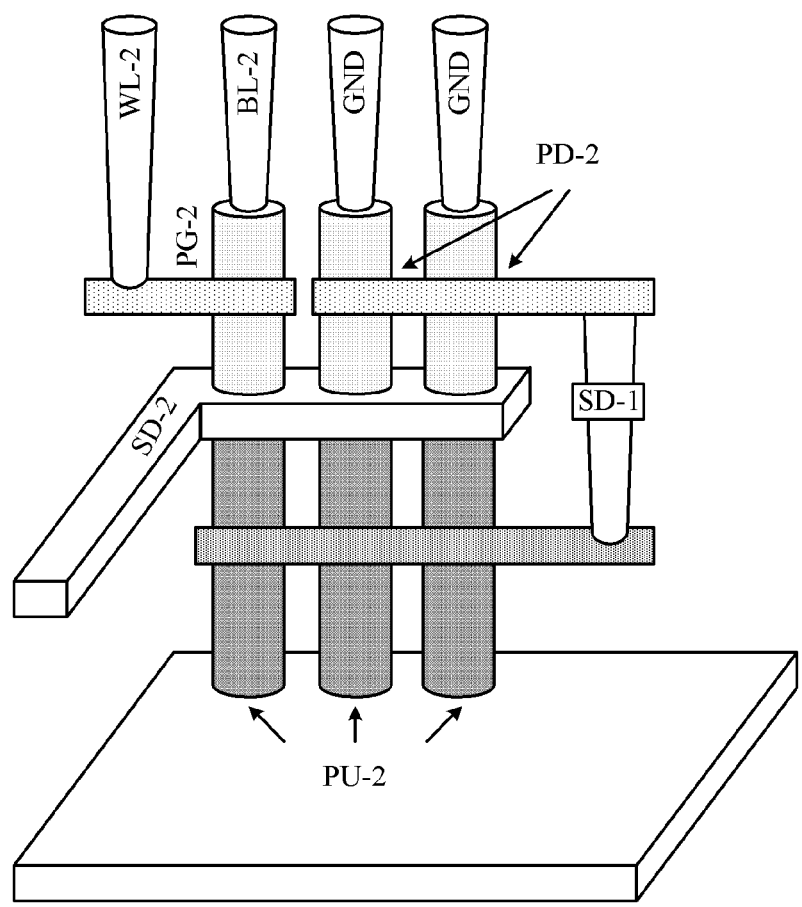

As shown in FIGS. 7(a) and 7(b), in this embodiment, each of the first pull-up transistor PU-1 and the second pull-up transistor PU-2 may comprise three unit transistors, and each of the first pull-down transistor PD-1 and the second pull-down transistor PD-2 may comprise two unit transistors ($\beta$=2 and $\alpha$=3). In order to save the area, the six (unit) transistors in the upper layer and the six (unit) transistors in the lower layer may be aligned in the vertical direction, respectively.

In the above examples, all the unit transistors in one (in the above examples, the lower layer) of the upper layer and the lower layer and the corresponding unit transistors in the other layer are aligned in the vertical direction. However, the present disclosure is not limited thereto. For example, only some of the unit transistors, instead of all the unit transistors, in this layer may be aligned in the vertical direction with the corresponding transistors in the other layer.

FIGS. 8 to 52(c) are schematic views showing some stages of a flow of manufacturing an SRAM cell according to an embodiment of the present disclosure.

In the following description, materials of the respective layers are enumerated. However, these materials are just examples. A material for each of the layers is mainly determined by a function of the layer (for example, a semiconductor material is used to provide active regions, and a dielectric material is used to provide gap filling and electrical isolation, or the like) and etching selectivity required. In the description, sometimes it may not be clearly indicated that a material of a certain layer has etching selectivity with respect to materials of other specific layers, or only the "etching selectivity desired" is simply mentioned. This "etching selectivity desired" may be known at least partially from a relevant etching process.

Figure 8:
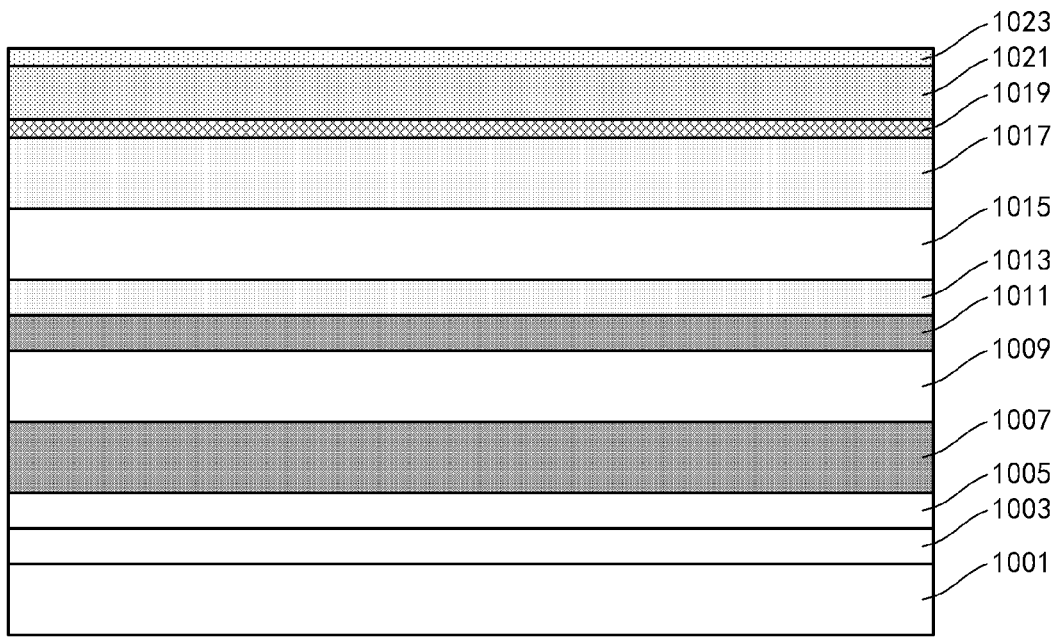
FIGS. 8 to 52(c) are schematic views showing some stages of a flow of manufacturing an SRAM cell according to an embodiment of the present disclosure.

As shown in FIG. 8, a substrate 1001 is provided. The substrate 1001 may be various forms of substrates. The substrate 1001 may comprise a semiconductor material for example, but not limited to, a bulk semiconductor material such as bulk silicon (Si), a Semiconductor On Insulator (SOI), a compound semiconductor material such as SiGe, or the like. In the following description, for convenience of explanation, a bulk Si substrate is described by way of example. A well region (not shown) may be formed in the substrate 1001 as needed by, for example, implanting impurities. In an example where p-type transistors are provided in a lower layer, the implanted impurities may be n-type impurities.

A contact layer 1003 may be formed on the substrate 1001 to facilitate connecting source/drain regions on sides of lower-layer transistors of the SRAM cell (for example, p-type pull-up transistors) close to the substrate. The contact layer 1003 may be formed by implanting impurities into an upper portion of the substrate 1001. In the example where the p-type transistors are provided in the lower layer, the implanted impurities may be p-type impurities such as B or In, with a concentration of, for example, about 1E18-1E21 cm$^{-3}$. Certainly, the contact layer 1003 may be formed additionally on the substrate 1001 by epitaxial growth.

An isolation auxiliary layer 1005 may be formed on the contact layer 1003 by, for example, epitaxial growth. The isolation auxiliary layer 1005 may facilitate electrical isolation between third and fourth interconnection structures and the contact layer at desired positions, which will be described in further detail below. In addition, in order to ensure electrical connections between the contact layer 1003 and the source/drain regions of the p-type transistors formed thereon, the isolation auxiliary layer 1005 may have p-type conductivity by doping in-situ during growth or implanting impurities after the growth.

Active material layers may be provided on the isolation auxiliary layer 1005. For example, a first source/drain layer 1007, a channel layer 1009, and a second source/drain layer 1011 for the p-type transistors and a first source/drain layer 1013, a channel layer 1015 and a second source/drain layer 1017 for n-type transistors may be sequentially formed by epitaxial growth. These layers may have desired conductivity by doping in-situ during growth or implanting impurities after the growth.

Adjacent ones of the semiconductor material layers formed on the substrate 1001 may have etching selectivity with respect to each other, except for the second source/drain layer 1011 for the p-type transistors and the first source/drain layer 1013 for the n-type transistors, which may have no etching selectivity or have relatively low etching selectivity with respect to each other, because they are processed almost as one same layer in subsequent processes except for being doped to have different conductivity types to act as source/drain regions of the p-type transistors and the n-type transistors respectively. In addition, for the p-type transistors, the first source/drain layer 1007 and the second source/drain layer 1011 may comprise the same material. Similarly, for the n-type transistors, the first source/drain layer 1013 and the second source/drain layer 1017 may comprise the same material.

In one example, these semiconductor material layers may comprise a stack of alternating Si and SiGe. For example, in a case where the substrate 1001 (comprising the contact layer 1003 formed therein) comprises Si, the isolation auxiliary layer 1005 may comprise SiGe with a thickness of about 5-20 nm. For the p-type transistors, the first source/drain layer 1007 may comprise Si with a thickness of about 20-50 nm; the channel layer 1009 may comprise SiGe (with an atomic percentage of Ge being, for example, about 10-40%) with a thickness of about 10-100 nm; and the second source/drain layer 1011 may comprise Si with a thickness of about 10-30 nm. P-type doping may be performed on the first source/drain layer 1007 and the second source/drain layer 1011 with a doping concentration of, for example, about 1E19-1E21 cm$^{-3}$. Similarly, for the n-type transistors, the first source/drain layer 1013 may comprise Si with a thickness of about 10-30 nm; the channel layer 1015 may comprise SiGe (with an atomic percentage of Ge being, for example, about 10-70%) with a thickness of about 10-100 nm; and the second source/drain layer 1017 may comprise Si with a thickness of about 20-50 nm. N-type doping may be performed on the first source/drain layer 1013 and the second source/drain layer 1017 with a doping concentration of, for example, about 1E19-1E21 cm$^{-3}$.

In addition, the channel layers may be doped as well to adjust threshold voltages ($V_t$) of the transistors. For the p-type transistors, n-type doping may be performed on the channel layer 1009 with a doping concentration of about 1E17-2E18 cm$^{-3}$; and for the n-type transistors, p-type doping may be performed on the channel layer 1015 with a doping concentration of about 1E17-2E18 cm$^{-3}$. For a tunneling FET, the channel layer may be doped to have the same conductivity type as that of the corresponding first source/drain layer or second source/drain layer. Certainly, the channel layer may not be intentionally doped.

A hard mask may be provided on the active material layers, in order to subsequently define active regions and patterns of interconnections. For example, an aluminum oxide ($Al_2O_3$) layer 1019 (or a silicon carbide layer) with a thickness of about 2-10 nm, a nitride (for example, silicon nitride) layer 1021 with a thickness of about 10-100 nm and an oxide (for example, silicon oxide) layer 1023 with a thickness of about 10-100 nm may be sequentially formed by deposition. The hard mask is provided for the purpose of pattern defining, etching stopper or the like as appropriate in subsequent processes. A number of layers included in the hard mask and materials of the respective layers may vary according to the processes. In this example, the hard mask may have such a layer configuration that (at least one layer of) the hard mask may be maintained at least until the transistors are completed.

Figure 9A:
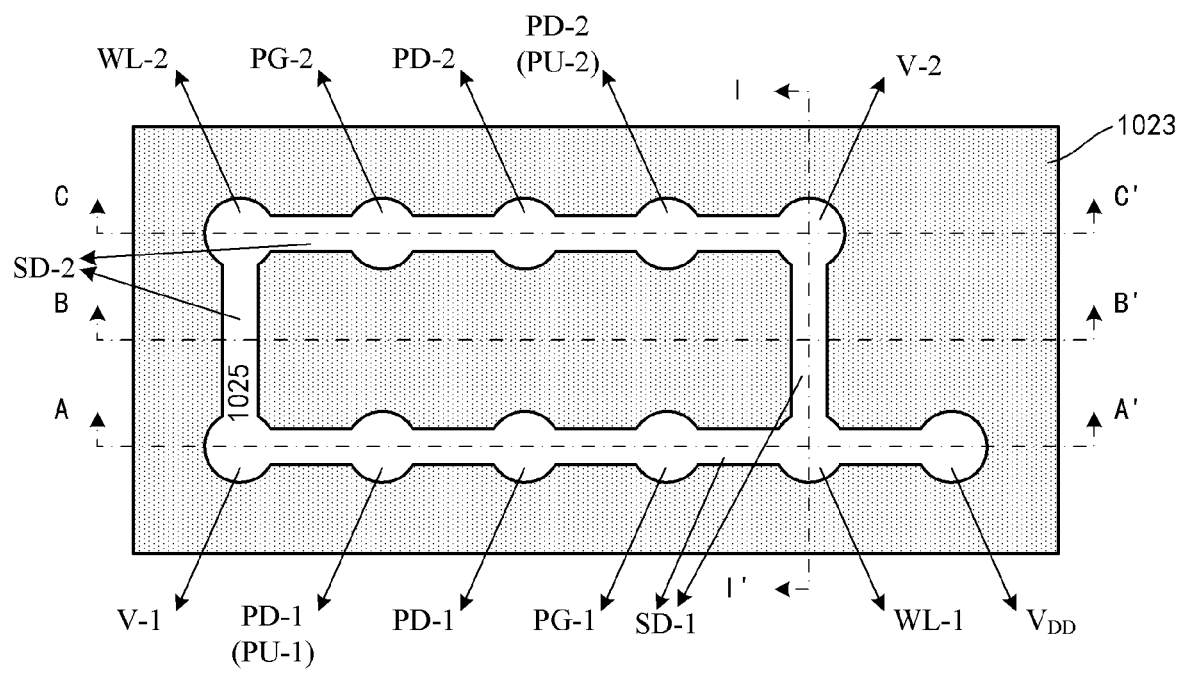

As shown in FIG. 9(a), photoresist 1025 may be formed on the hard mask. The photoresist 1025 may be formed to have a certain pattern through exposure and development. Here, the pattern may comprise portions (circular portions in a case of nanowires, or square or rectangular portions in a case of nanosheets) for defining the active regions of the transistors, portions (for example, circular or square portions) for defining the third interconnection structure and the fourth interconnection structure, and portions (for example, connecting lines between the respective portions described above) for defining a first interconnection structure and a second interconnection structure. Hereinafter, the circular portions are described by way of example.

The pattern may be divided into two columns corresponding to the two groups described above. In the example of FIG. 9(a), the lower column corresponds to the first pull-up transistor PU-1, the first pull-down transistor PD-1, and the first pass-gate transistor PG-1 which are commonly connected to the first node, and the upper column corresponds to the second pull-up transistor PU-2, the second pull-down transistor PD-2, and the second pass-gate transistor PG-2 which are commonly connected to the second node.

In a case of $\beta=2$ ($\alpha=1$, 2 or 3), one column may have five circular portions, and the other column may have six circular portions. More specifically, the lower column may comprise, in an order from left to right, one circular portion for defining the third interconnection structure V-1, two circular portions for defining two unit transistors of the first pull-down transistor PD-1 ($\beta=2$), one circular portion for defining the first pass-gate transistor PG-1, one circular portion for defining the contact plug WL-1, and one circular portion for defining a contact plug to apply a power supply voltage VDD. All the circular portions for defining the pull-down transistor and the pass-gate transistor may be also used to define the pull-up transistor. In this example, it is illustrated that one circular portion (one circular portion on the left in the figure, wherein $\alpha=1$) for defining the first pull-down transistor PD-1 is also used to define the first pull-up transistor PU-1. Similarly, the upper column may comprise, in an order from right to left, one circular portion for defining the fourth interconnection structure V-2, two circular portions for defining two unit transistors of the second pull-down transistor PD-2 (β=2), one circular portion for defining the second pass-gate transistor PG-2, and one circular portion for defining the contact plug WL-2. All the circular portions for defining the pull-down transistor and the pass-gate transistor may be used to define the pull-up transistor. In this example, it is illustrated that one circular portion (one circular portion on the right in the figure, wherein α=1) for defining the second pull-down transistor PD-2 is also used to define the second pull-up transistor PU-2.

These circular portions are connected by linear portions. These linear portions may define the first interconnection structure and the second interconnection structure. More specifically, a closed quadrilateral in the figure may have is lower and right sides to define the first interconnection structure SD-1, and its upper and left sides to define the second interconnection structure SD-2.

A line width (for example, a diameter) of the circular portions may be greater than that of the linear portions. The circular portions may have substantially the same spacing therebetween, but the present disclosure is not limited thereto.

The two columns may extend in parallel in a first direction (a horizontal direction in the figure), and corresponding ones of the circular portions in the two columns may be aligned in a second direction (a vertical direction in the figure) crossing, for example, perpendicular to, the first direction. However, the present disclosure is not limited thereto. For example, the two columns may not extend in parallel. In addition, the circular portions in the two columns are not necessarily aligned in the second direction, but may have an offset therebetween.

Here, the portion for defining the contact plug to apply the power supply voltage $V_{DD}$ is also incorporated in the mask pattern. However, the present disclosure is not limited thereto. The contact plug may be formed separately. In this case, the mask pattern may have a substantially quadrangular shape (in this example, a rectangular shape).

In addition, the portions for defining the contact plugs WL-1 and WL-2 are also incorporated in the mask pattern. This facilitates forming the contact plugs self-aligned to gate stacks of the pass-gate transistors. However, the present disclosure is not limited thereto. For example, the contact plugs to the gate stacks of the pass-gate transistors may be formed separately. In this case, one circular portion may be omitted in each of the two columns.

Figure 9B:
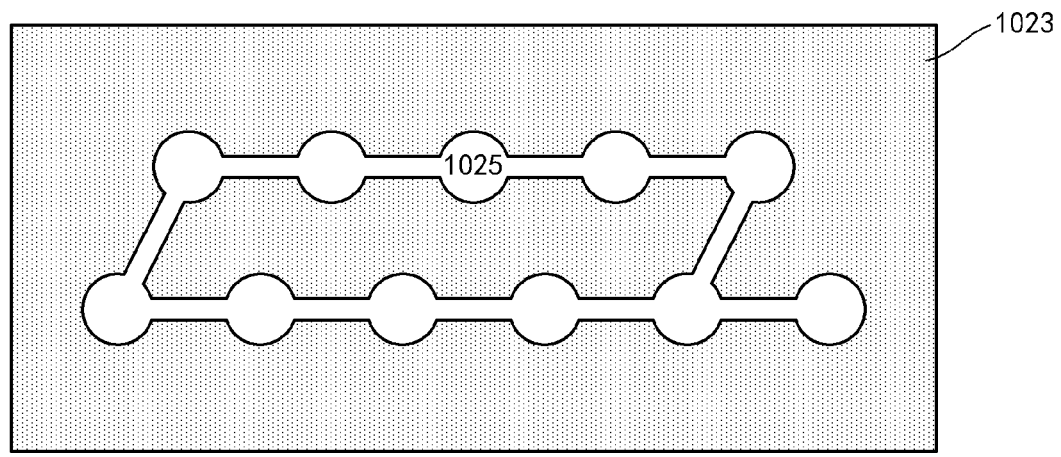

In the example of FIG. 9(a), substantially right angles may be formed between the respective linear portions which intersect each other, so that the linear portions form a substantially rectangular shape. However, the present disclosure is not limited thereto. For example, as shown in FIG. 9(b), other angles such as an angle of about 60° or 120° may be formed between the respective linear portions which intersect each other. This may further save the area when distances between the respective circular portions remain unchanged.

Figure 9C:
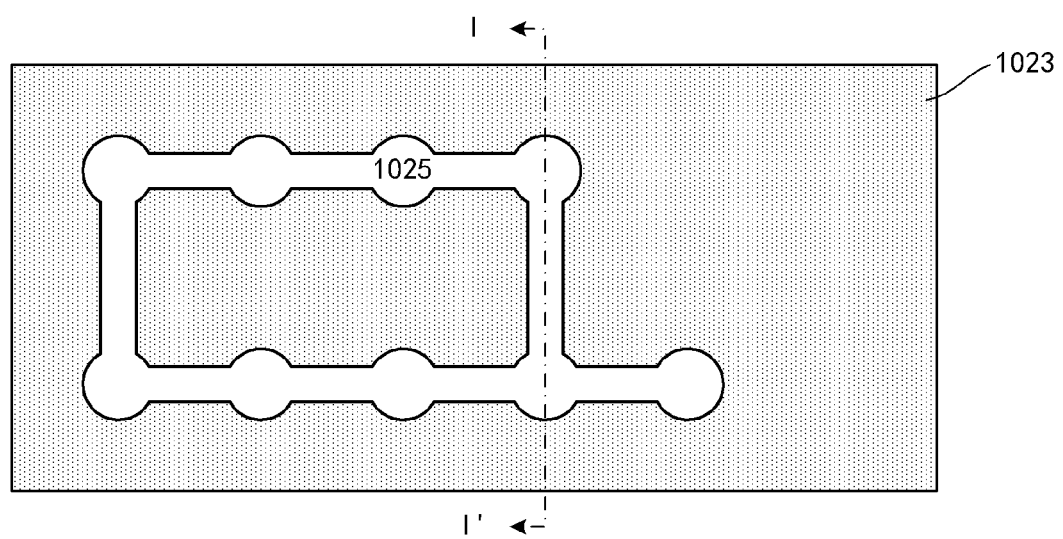
Figure 9D:
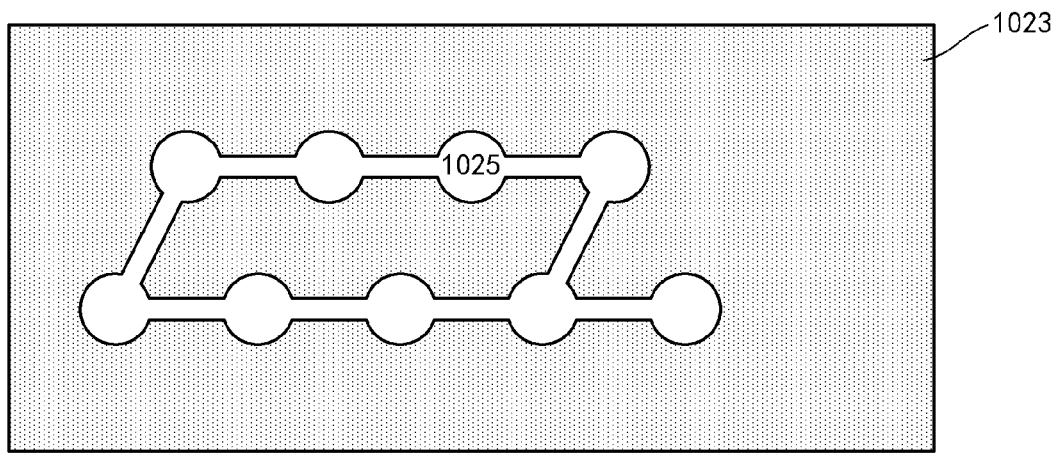

In addition, in a case of β=1 (α=1 or 2), one column may have four circular portions, and the other column may have five circular portions (each of the columns has circular portion reduced by one as compared with the above example, because only one single unit transistor is required in each of the pull-down transistors, while in the above example, two unit transistors are required in each of the pull-down transistors), as shown in FIG. 9(c). Similarly, although substantially right angles may be formed between the respective linear portions which intersect each other in the example of FIG. 9(c), other angles such as an angle of about 60° or 120° may also be formed therebetween, as shown in FIG. 9(d).

In the following description, the pattern shown in FIG. 9(a) is described by way of example. The pattern shown in FIG. 9(c) may be mentioned when necessary.

In addition, positions where the following cross-sections are taken, that is, line AA', line BB', line CC' and line II', are illustrated in FIGS. 9(a) and 9(c).

The pattern of the photoresist 1025 may be transferred into the hard mask, and then into the underlying active material layers.

Figure 10A:
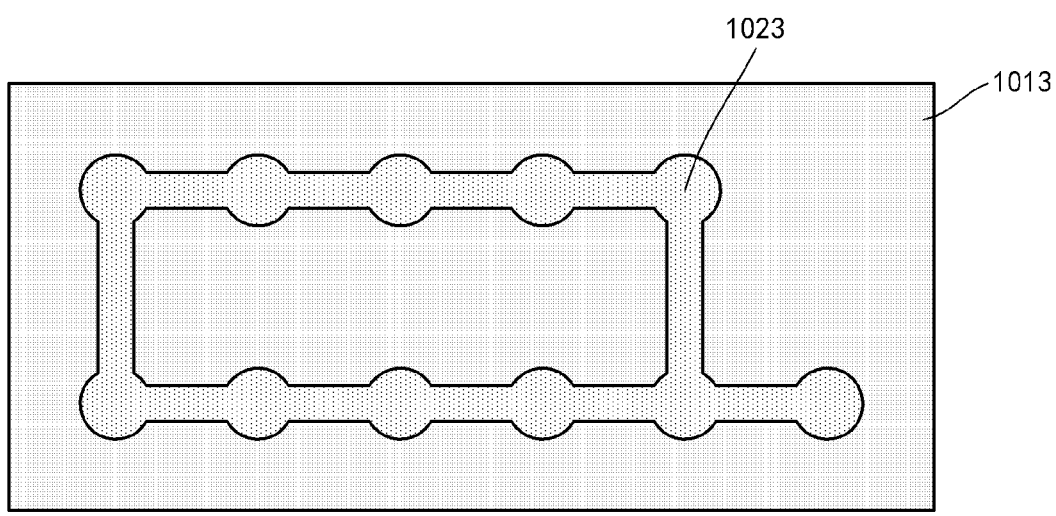
Figure 10B:
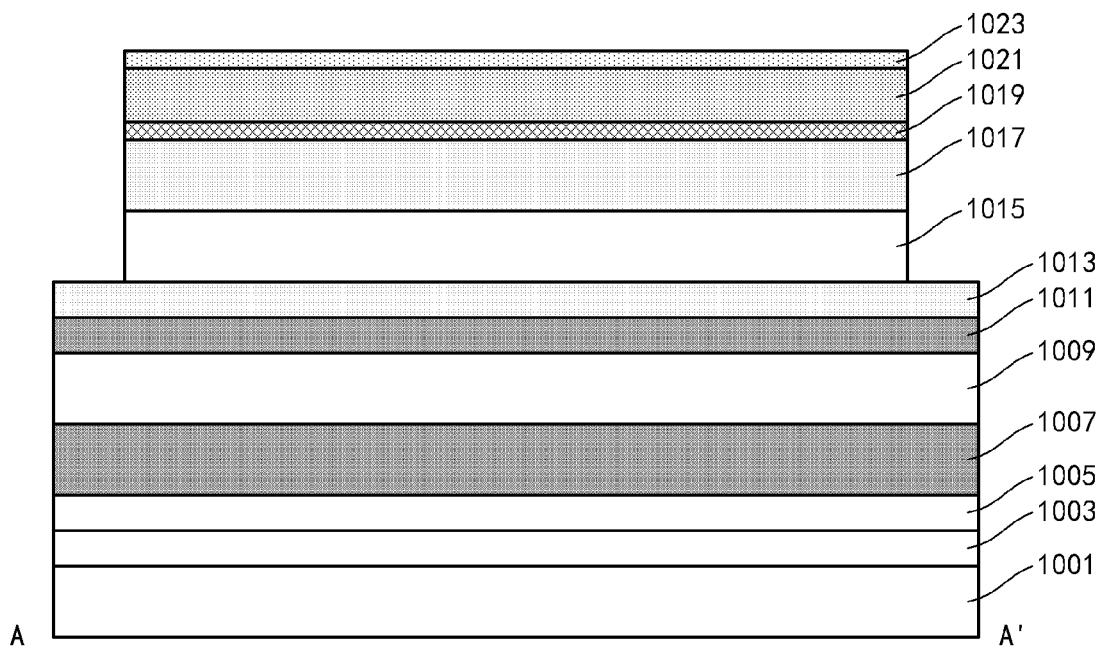
Figure 10C:
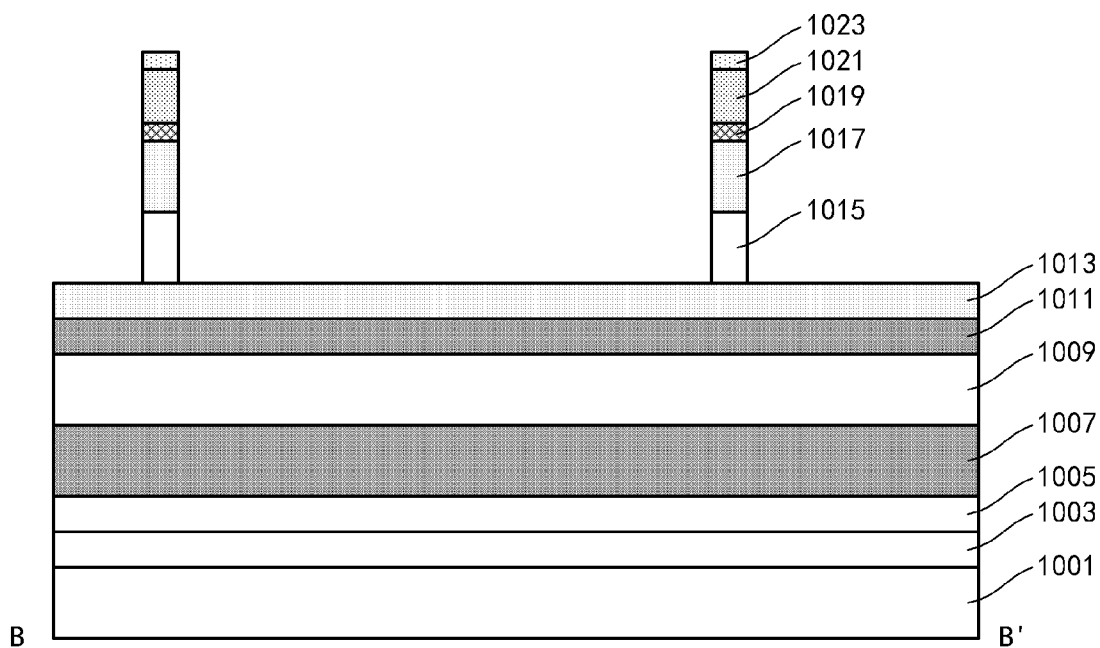

As shown in FIGS. 10(a), 10(b), and 10(c) (FIGS. 10(a), 10(b), and 10(c) are a top view, a sectional view taken along line AA', and a sectional view taken along line BB' respectively), the hard mask (comprising the oxide layer 1023, the nitride layer 1021, and the aluminum oxide layer 1019), and the second source/drain layer 1017 and the channel layer 1015 for the n-type transistors may be sequentially etched with the photoresist 1025 as an etching mask by, for example, Reactive Ion Etching (RIE). The RIE may be performed in a direction substantially perpendicular to the substrate surface, and may be stopped at the first source/drain layer 1013 for the n-type transistors. In this example, the patterning of the active material layers for the n-type transistors is not performed on the first source/drain layer 1013 mainly for the following reasons. On one hand, in this example the first source/drain layer 1013 for the n-type transistors may have a pattern substantially the same as that of the second source/drain layer 1011 for the p-type transistors, and thus may be patterned then together with the second source/drain layer 1011 for the p-type transistors. On the other hand, the second source/drain layer 1017 may be separated then, and if the first source/drain layer 1013 is also etched here, the first source/drain layer 1013 may also be divided into separated portions, which is disadvantageous for forming the first interconnection structure and the second interconnection structure. Then, the photoresist 1025 may be removed.

In this way, positions (circular portions in the top view of FIG. 10(a)) of the active regions of the n-type transistors and the third interconnection structure and the fourth interconnection structure are substantially defined in the upper layer, but these circular portions are currently connected by the respective linear portions, as shown in the sectional view of FIG. 10(b). These circular portions may be separated to define the active regions of the respective n-type transistors and the third interconnection structure and the fourth interconnection structure, respectively.

Figure 11A:
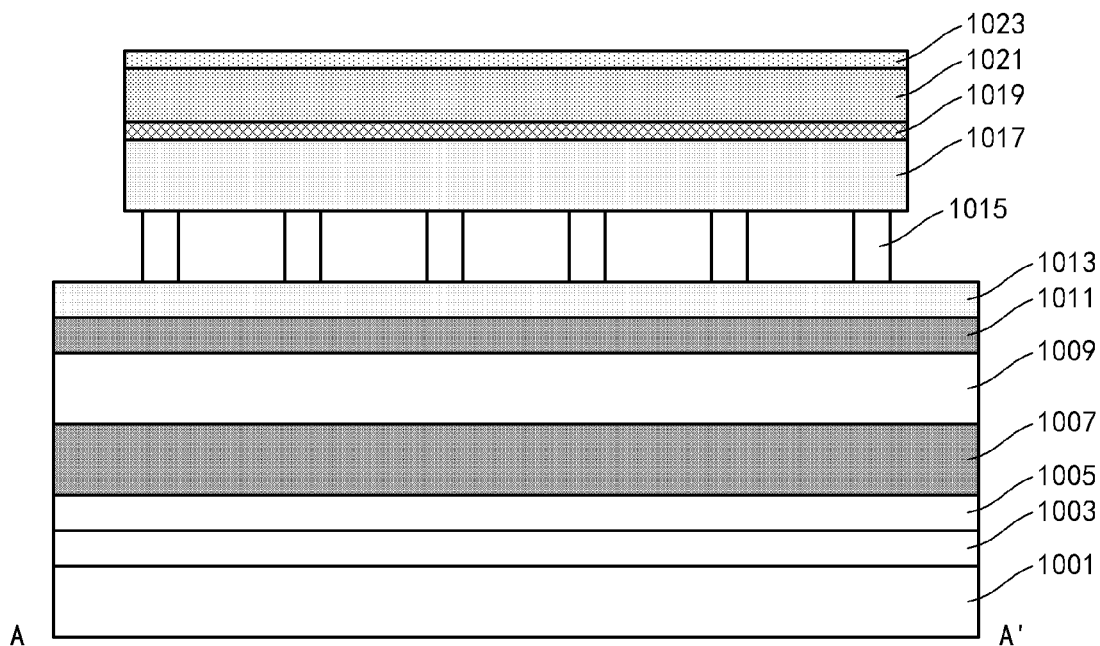
Figure 11B:
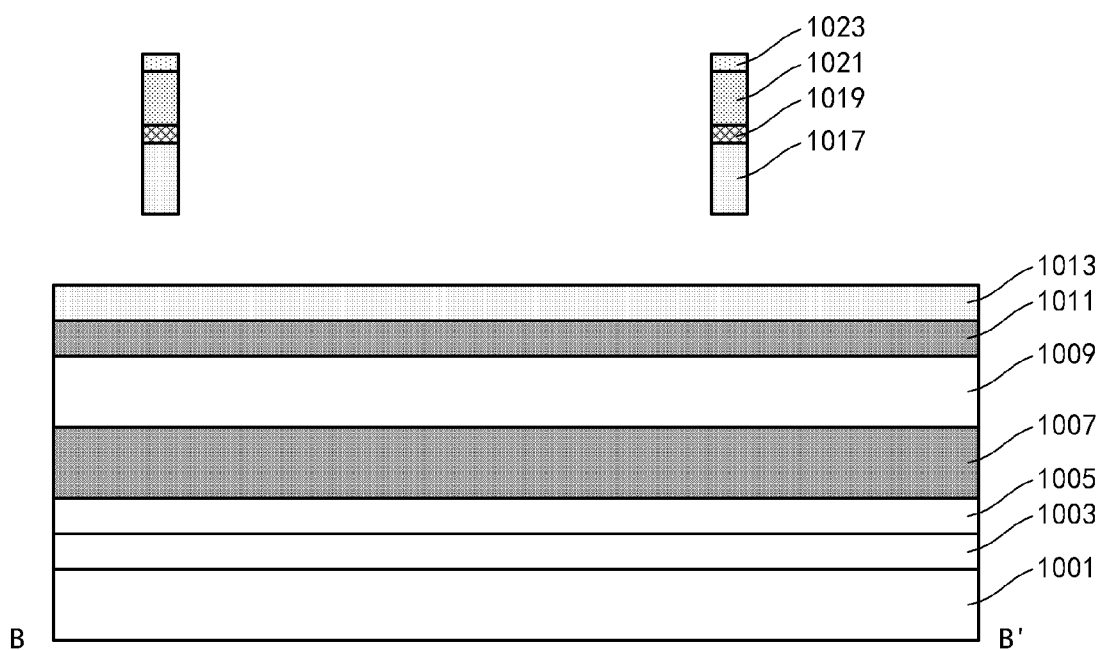
Figure 11C:
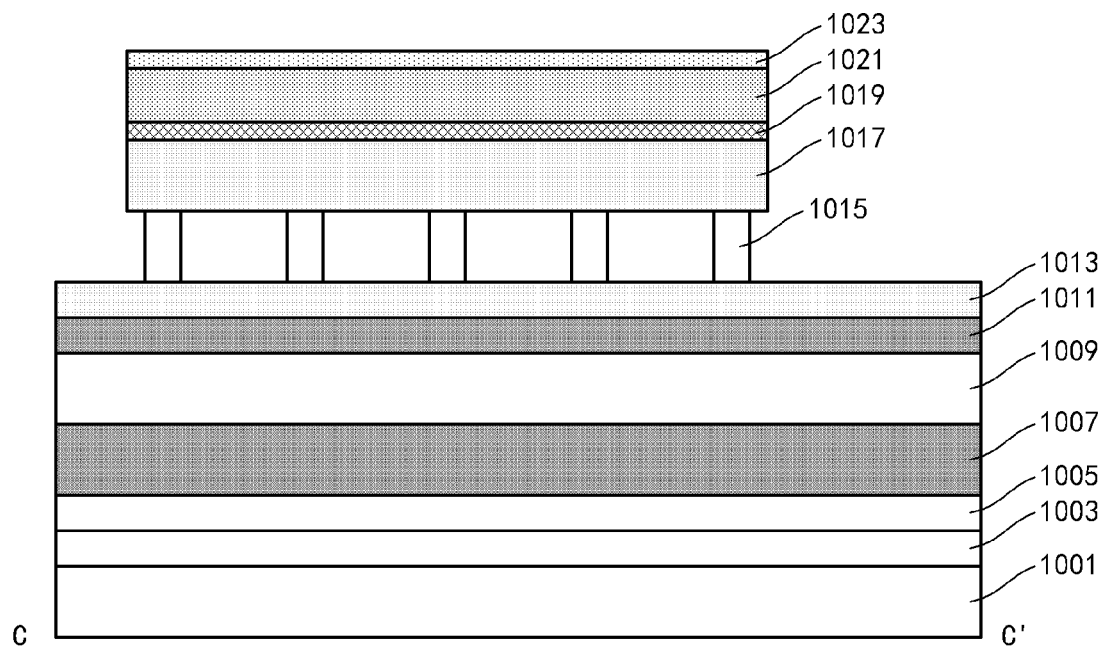

For example, as shown in FIGS. 11(a), 11(b), and 11(c) (FIGS. 11(a), 11(b), and 11(c) are sectional views taken along line AA', line BB', and line CC' respectively), the channel layer 1015 may be further selectively etched because the channel layer 1015 has etching selectivity with respect to the source/drain layers 1013 and 1017. In order to accurately control the etching, an Atomic Layer Etching (ALE) method may be used for the selective etching. The etching may be controlled so that the linear portions can be removed while parts (for example, central parts) of the circular portions can be left. Thus, the channel layer 1015 may be divided into several separated pillar-shaped portions, i.e., nanowires, corresponding to the circular portions in the mask pattern.

In this example, by ignoring anisotropy, it is assumed that the selective etching of the channel layer 1015 is substantially isotropic. Thus, in the top view, portions of the channel layer 1015 after being etched still present a substantially circular shape, and are substantially (centrally) aligned in the vertical direction with the respective circular portions of the mask pattern.

Figure 12A:
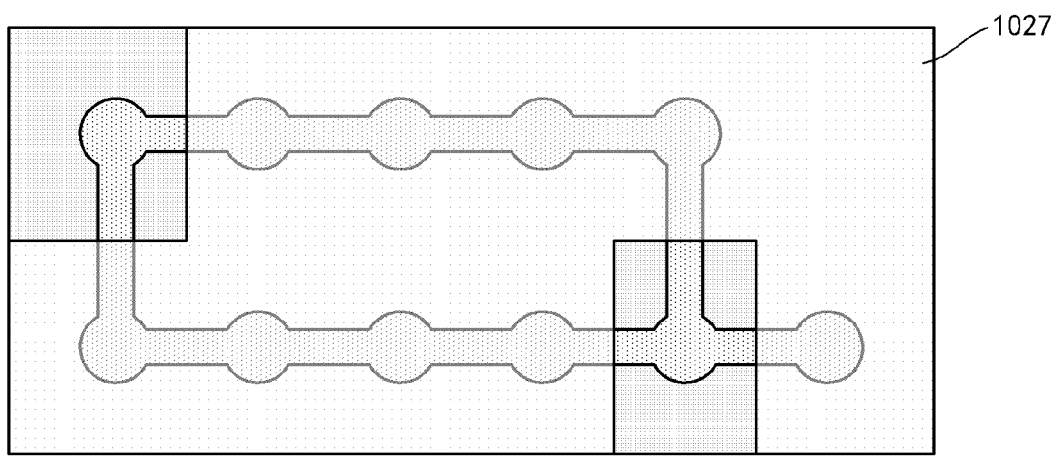
Figure 12B:
Figure 12C:
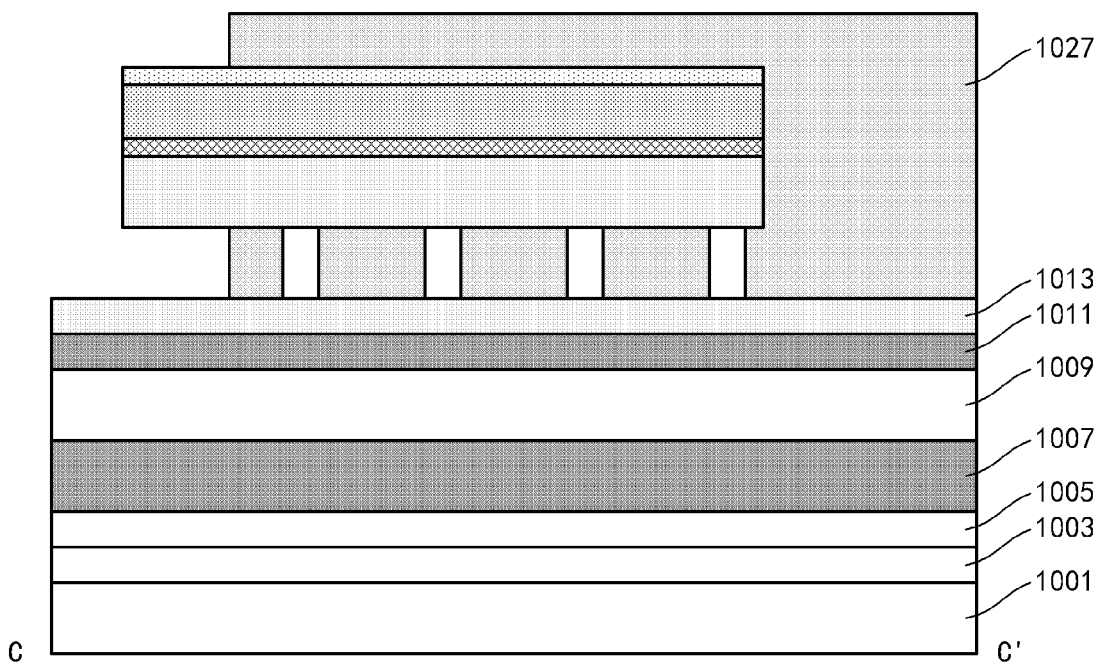

Nanowires in the channel layer 1015 at positions where the contact plugs WL-1 and WL-2 are located are not required, because the nanowires may connect the contact plugs WL-1 and WL-2 to the underlying source/drain layers. Therefore, the nanowires in the channel layer at the positions where the contact plugs WL-1 and WL-2 are located may be removed. For example, as shown in FIGS. 12(a), 12(b), and 12(c) (FIGS. 12(a), 12(b), and 12(c) are a top view, a sectional view taken along line AA', and a sectional view taken along line CC' respectively), photoresist 1027 may be formed on the above structure, and the photoresist 1027 may be patterned to expose the nanowires in the channel layer which need to be removed (the leftmost nanowire in the upper column and the second nanowire from the right in the lower column in the top view of FIG. 12(a)) while covering the remaining nanowires in the channel layer. The exposed nanowires in the channel layer may be removed by selective etching with the photoresist 1027 as an etching mask. Then, the photoresist 1027 may be removed.

Figure 13A:
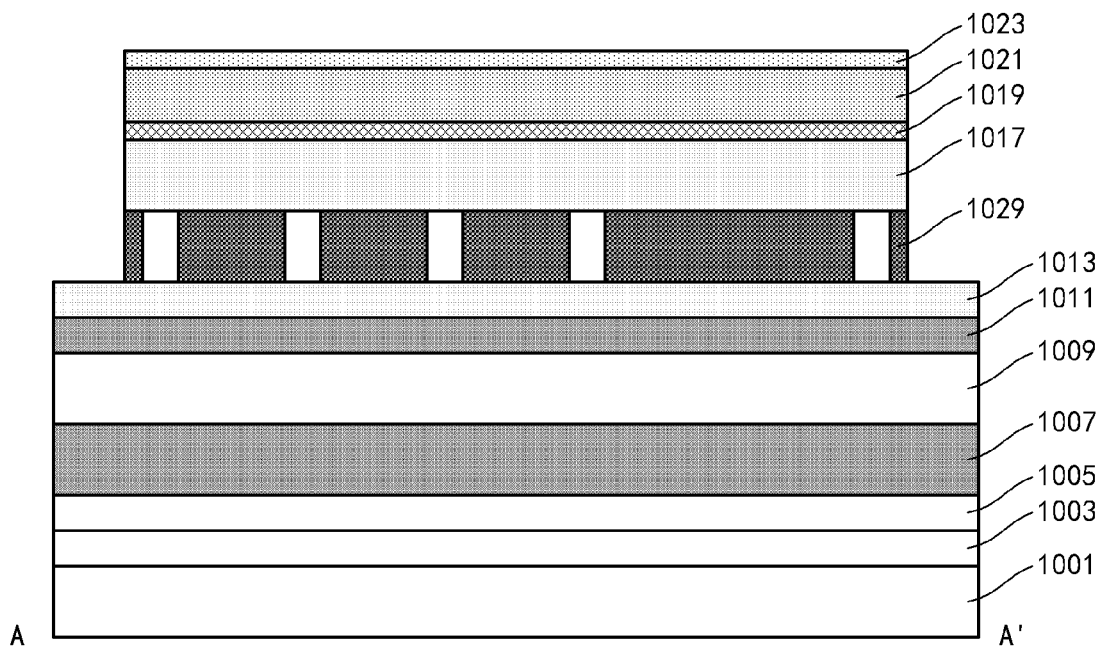
Figure 13B:
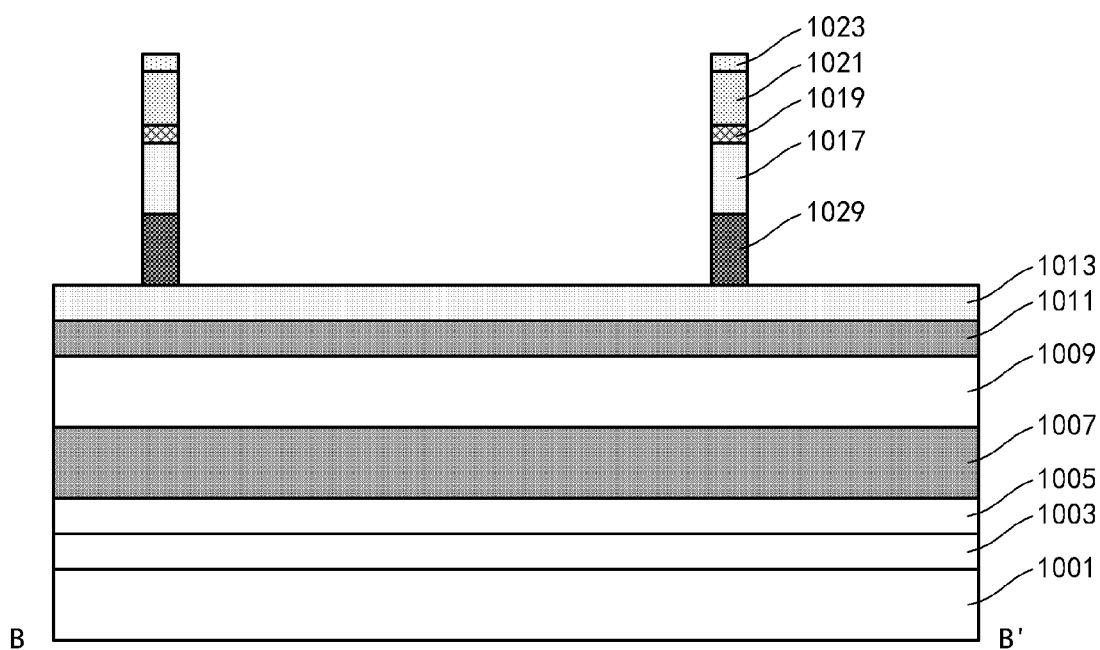
Figure 13C:
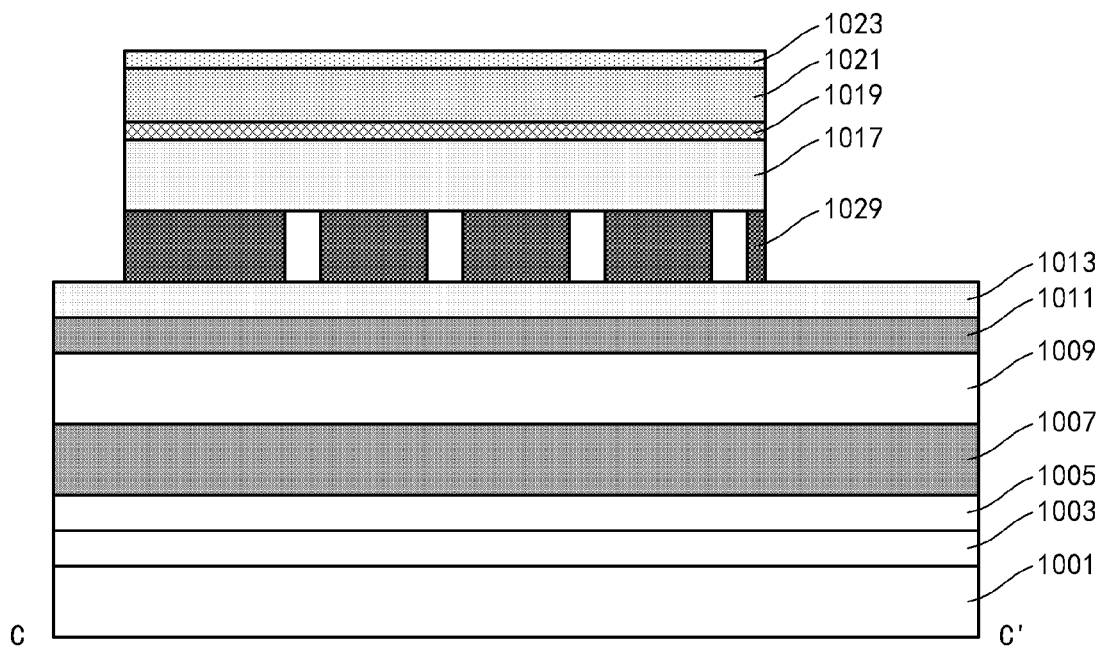

There is a recess formed by the respective nanowires in the channel layer 1015 with respect to a periphery of the hard mask, in which then gate stacks may be formed. In order to prevent subsequent processes from affecting the channel layer 1015 or leaving unnecessary materials in the recess which thus impact the subsequent formation of the gate stacks, a placeholder layer may be formed in the recess to occupy a space for the gate stacks (and thus, this material layer may be referred to as a "sacrificial gate"). For example, as shown in FIGS. 13(a), 13(b), and 13(c) (FIGS. 13(a), 13(b), and 13(c) are sectional views taken along line AA', line BB', and line CC' respectively), a sacrificial gate 1029 may be formed by depositing a material such as oxynitride (for example, silicon oxynitride) having etching selectivity desired (with respect to, for example, the hard mask, the placeholder layer described below or the like) on the above structure and then etching back the deposited material by, for example, RIE. The RIE may be performed in the direction substantially perpendicular to the substrate surface, so that the sacrificial gate 1029 may be left only in the recess which is formed by the nanowires in the channel layer with respect to the periphery of the hard mask. In this case, the above recess may substantially be filled up with the sacrificial gate 1029.

Figure 14A:
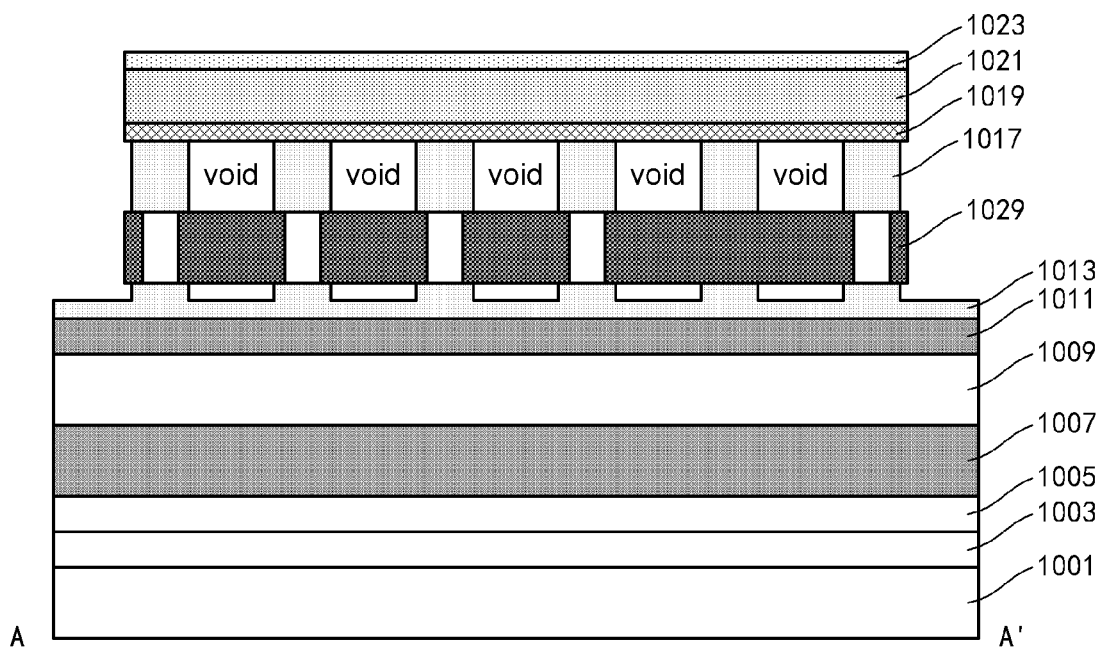
Figure 14B:
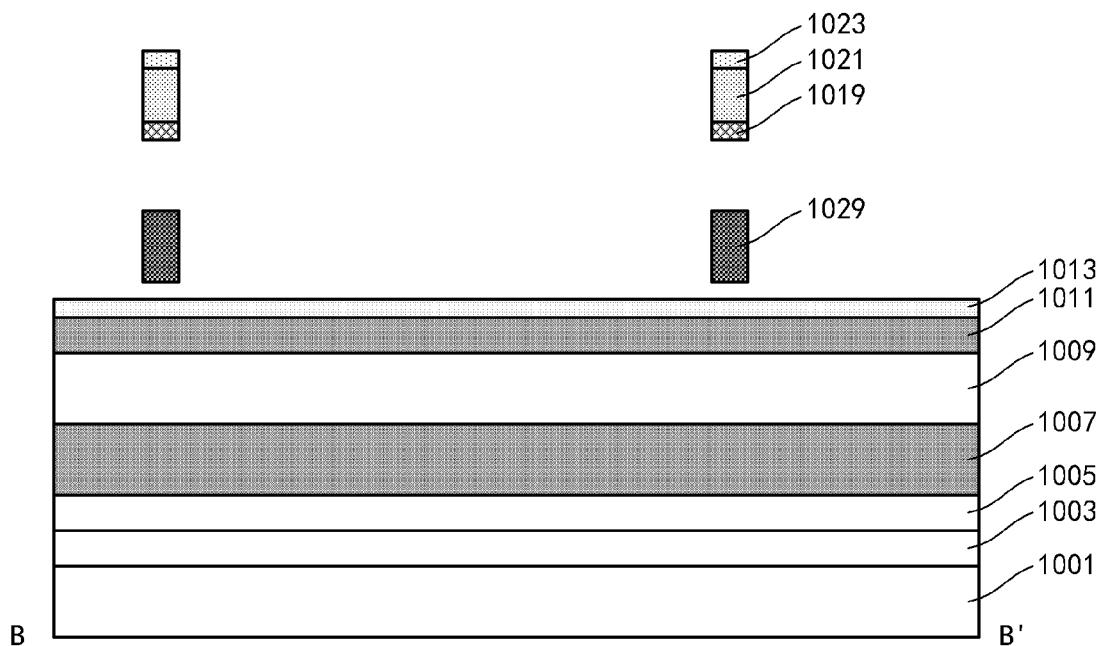
Figure 14C:
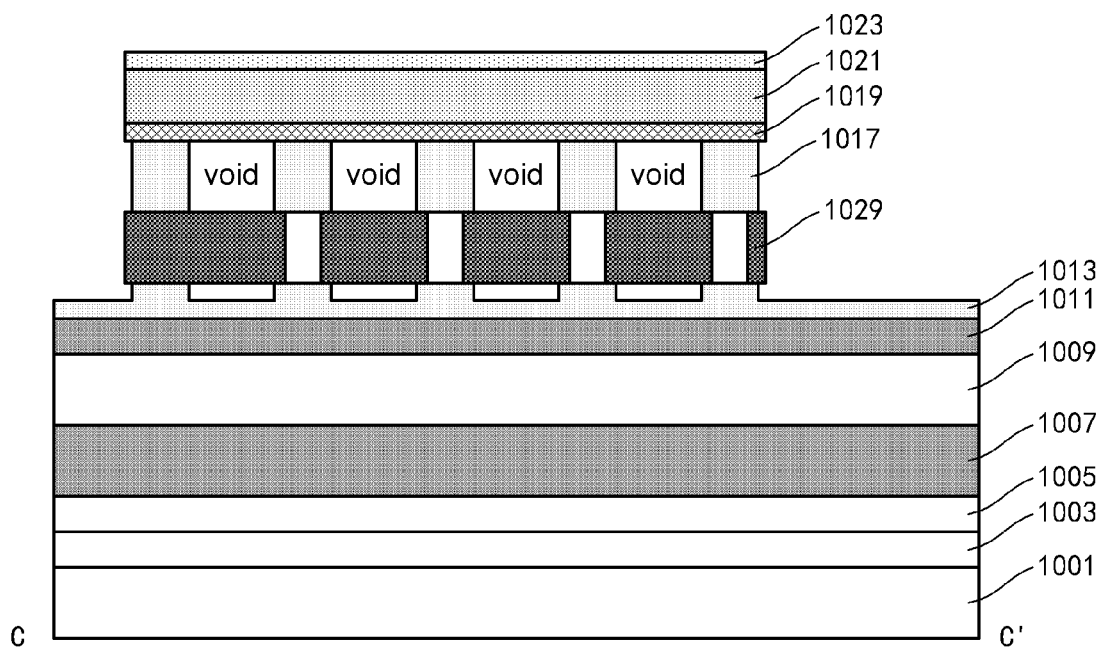

Similarly to the processing of the channel layer 1015, the second source/drain layer 1017 may be further selectively etched so that the second source/drain layer 1017 is divided into several separated pillar-shaped portions, i.e., nanowires, corresponding to the circular portions of the mask pattern, as shown in FIGS. 14(a), 14(b) and 14(c) (FIGS. 14(a), 14(b) and 14(c) are sectional views taken along line AA', line BB' and line CC' respectively). The selective etching of the second source/drain layer 1017 may be substantially the same as that of the channel layer 1015 except for a possibly different etching recipe, and thus detailed descriptions thereof may be omitted here. In addition, in this example, the first source/drain layer 1013 having the same material as that of the second source/drain layer 1017 may also be affected by the etching recipe, so that undercuts may be formed, particularly, gaps may be formed below the sacrificial gate 1029. This facilitates reducing capacitance between the gate and the source/drain.

Figure 15A:
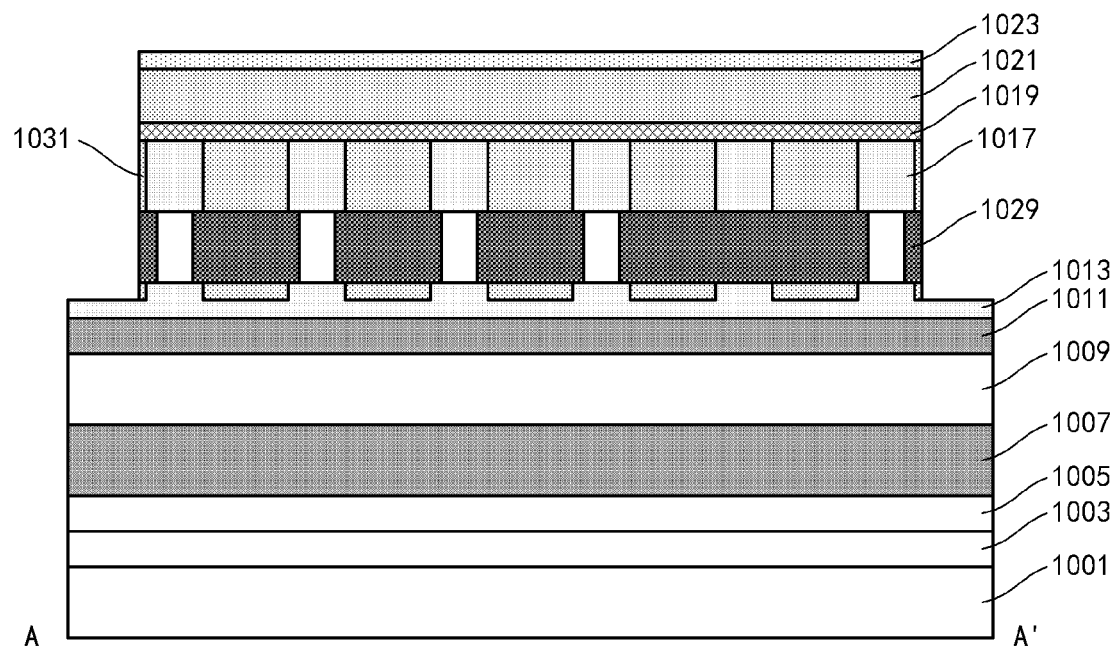
Figure 15B:
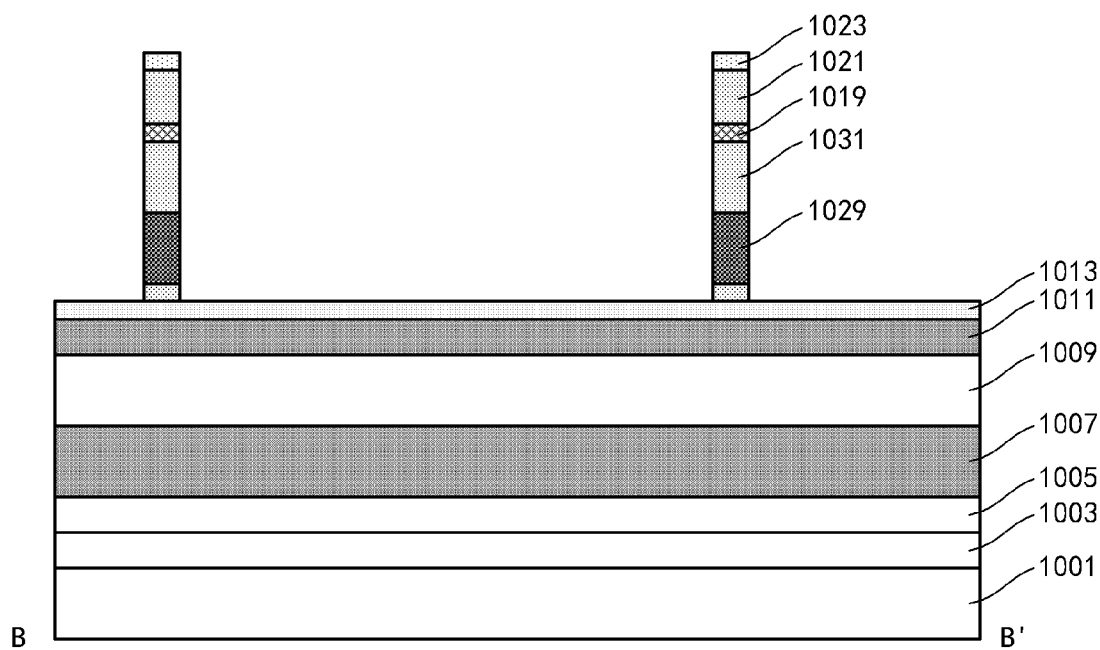
Figure 15C:
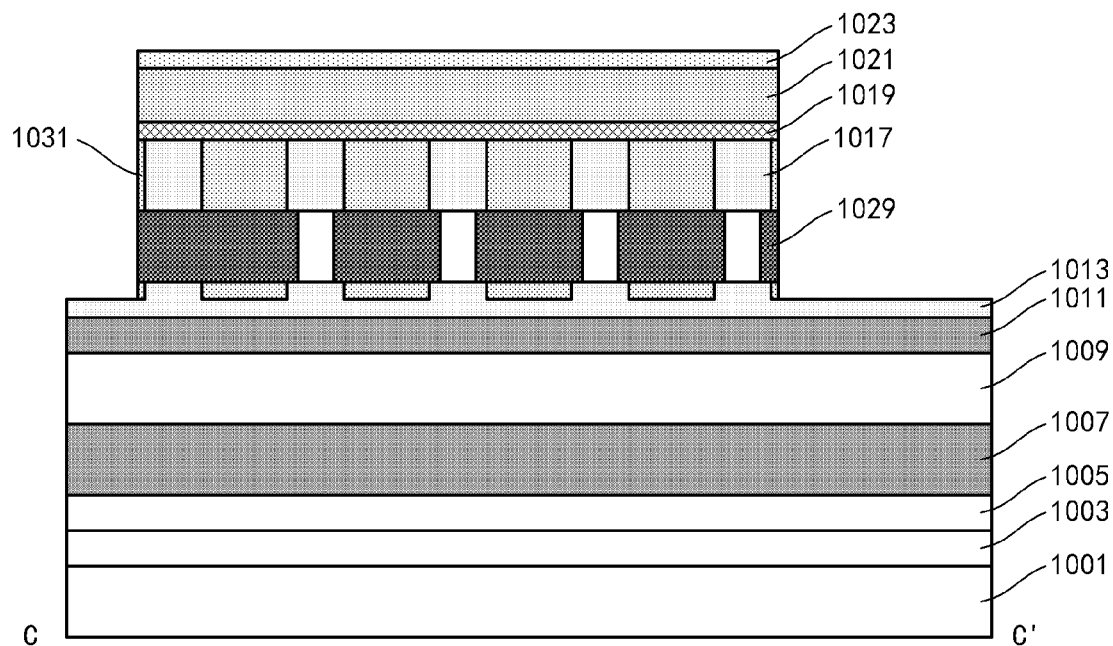

Similarly, a placeholder layer may be formed in gaps below the hard mask to prevent subsequent processes from affecting the source/drain layers (for example, to prevent the gate stacks from being formed in these gaps in a subsequent replacement gate process). For example, as shown in FIGS. 15(a), 15(b), and 15(c) (FIGS. 15(a), 15(b), and 15(c) are sectional views taken along line AA', line BB', and line CC' respectively), a material having etching selectivity desired (with respect to, for example, the hard mask, the sacrificial gate 1029, or the like), for example, nitride, may be deposited on the above structure by Chemical Vapor Deposition (CVD) or Atomic Layer Deposition (ALD) and then etched back by, for example, RIE, to form a placeholder layer 1031. Before the back-etching, the deposited dielectric may be planarized by, for example, Chemical Mechanical Polishing (CMP) (which may be stopped at the hard mask). The RIE may be performed in the direction substantially perpendicular to the substrate surface, so that the placeholder layer may be left only below the hard mask, and peripheral sidewalls of the placeholder may be kept substantially coplanar with those of the hard mask. As shown in FIGS. 15(a) and 15(c), the placeholder layer 1031 may be embedded in the undercuts below the sacrificial gate 1029. Due to the etching selectivity, in a subsequent process of removing the sacrificial gate 1029 and replacing the sacrificial gate 1029 with the gate stacks, the placeholder layer 1031 may be left, so as to reduce an overlap between the gate stacks and the source/drain layers and therefore reduce the capacitance therebetween.

Positions of the active regions of the p-type transistors and the third interconnection structure and the fourth interconnection structure may be defined similarly in the lower layer.

Figure 16A:
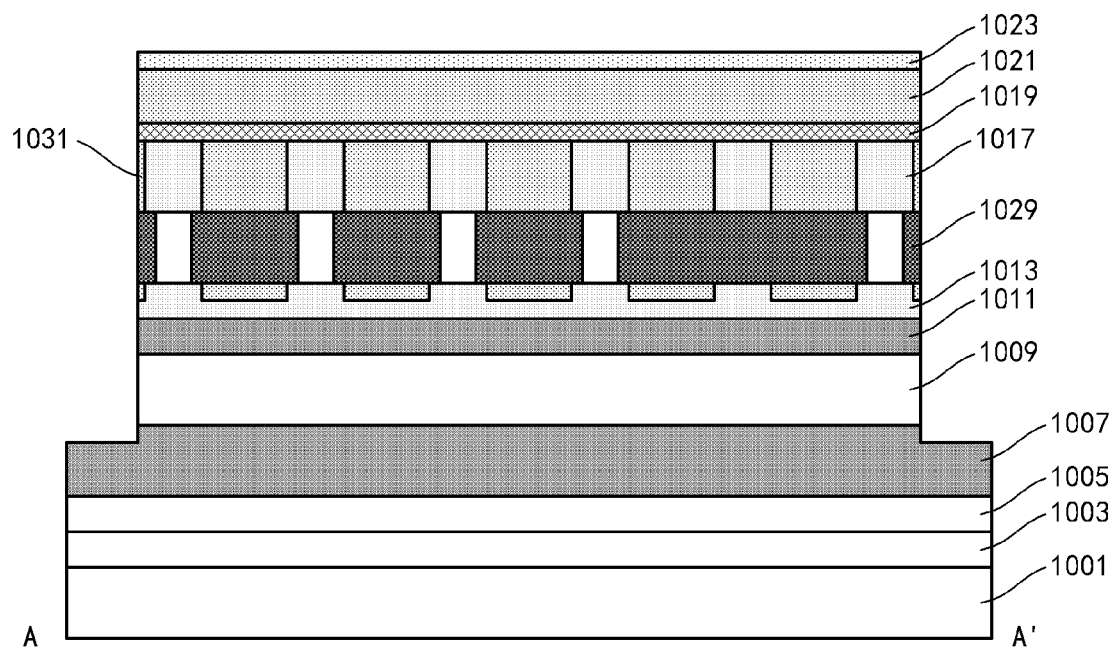
Figure 16B:
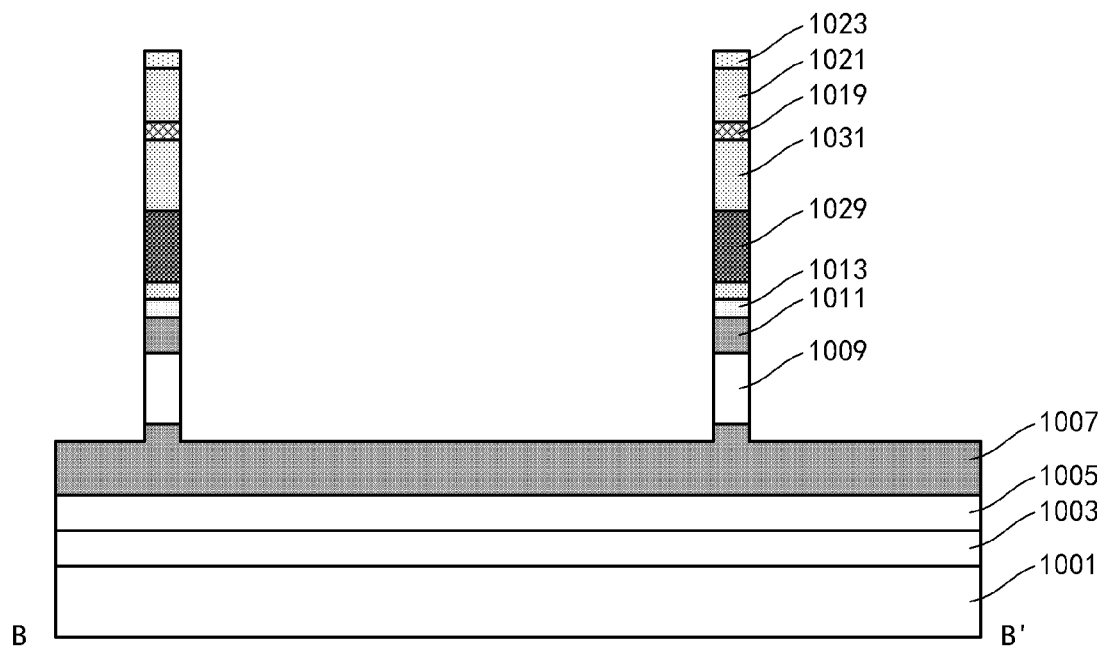
Figure 16C:
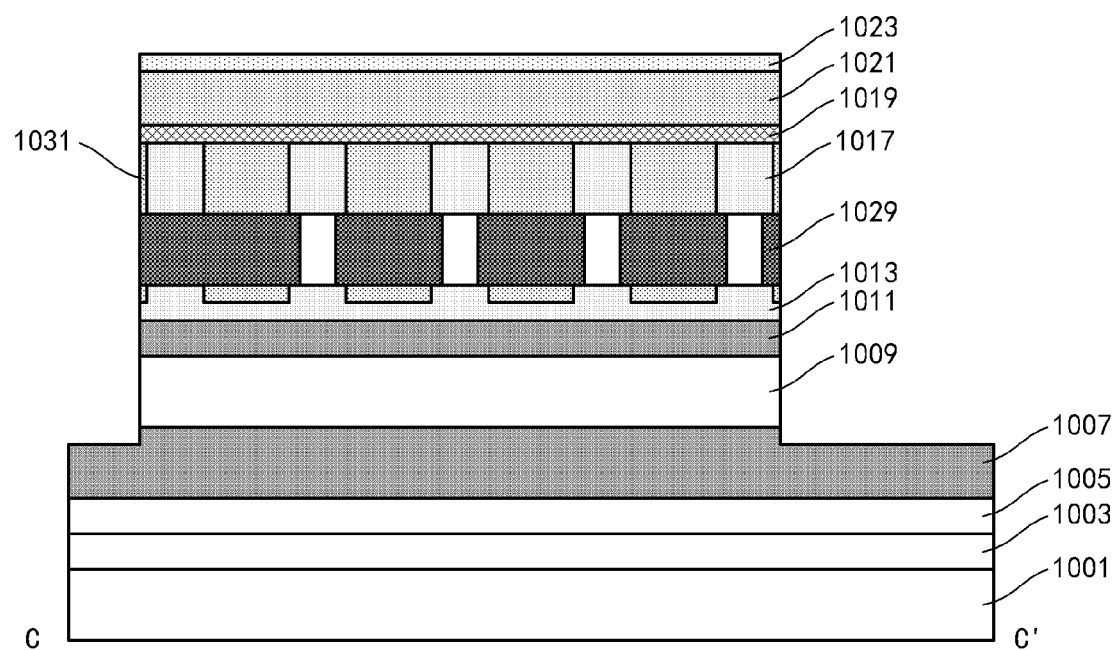

For example, as shown in FIGS. 16(a), 16(b), and 16(c) (FIGS. 16(a), 16(b), and 16(c) are sectional views taken along line AA', line BB', and line CC' respectively), the first source/drain layer 1013 for the n-type transistors and the second source/drain layer 1011, the channel layer 1009, and the first source/drain layer 1007 for the p-type transistors may be sequentially etched by, for example, RIE with the hard mask as an etching mask. The RIE may be performed in the direction substantially perpendicular to the substrate surface. Thus, the pattern of the hard mask may be transferred into these layers. In this example, the RIE is performed into the first source/drain layer 1007, but stopped before reaching a bottom surface of the first source/drain layer 1007. This is because in this example, the isolation auxiliary layer 1005 may comprise the same material as that of the channel layer 1009, for example, SiGe, and the first source/drain layer 1007 is temporarily reserved here to cover the isolation auxiliary layer 1005, which may facilitate preventing the isolation layer 1005 from being affected in processing the channel layer 1009.

Figure 17A:
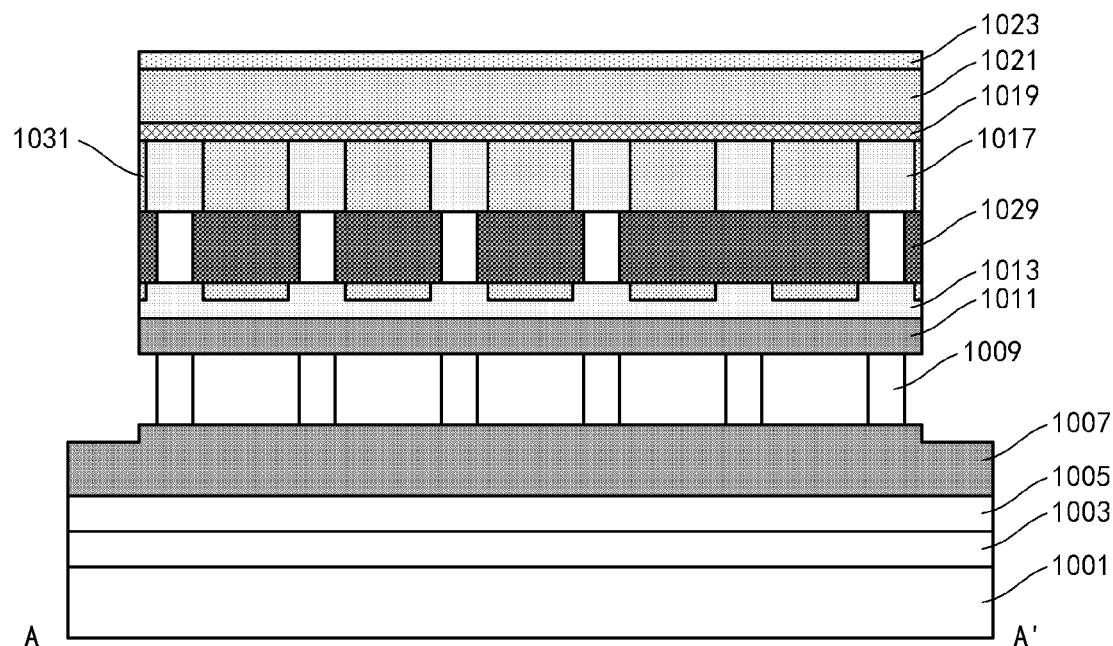
Figure 17B:
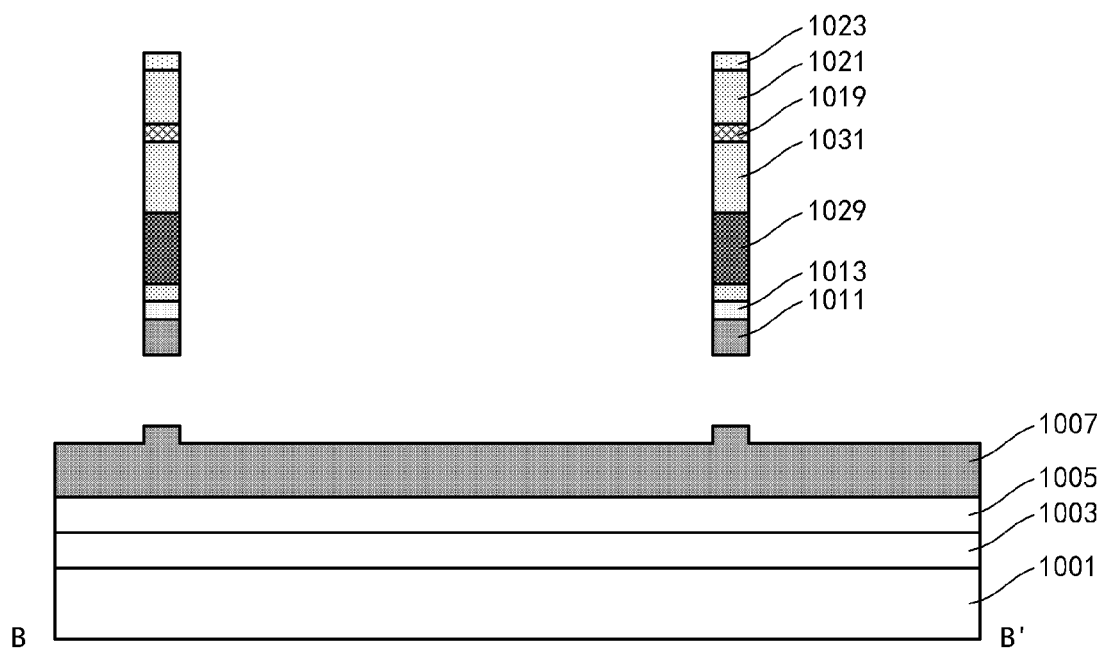
Figure 17C:
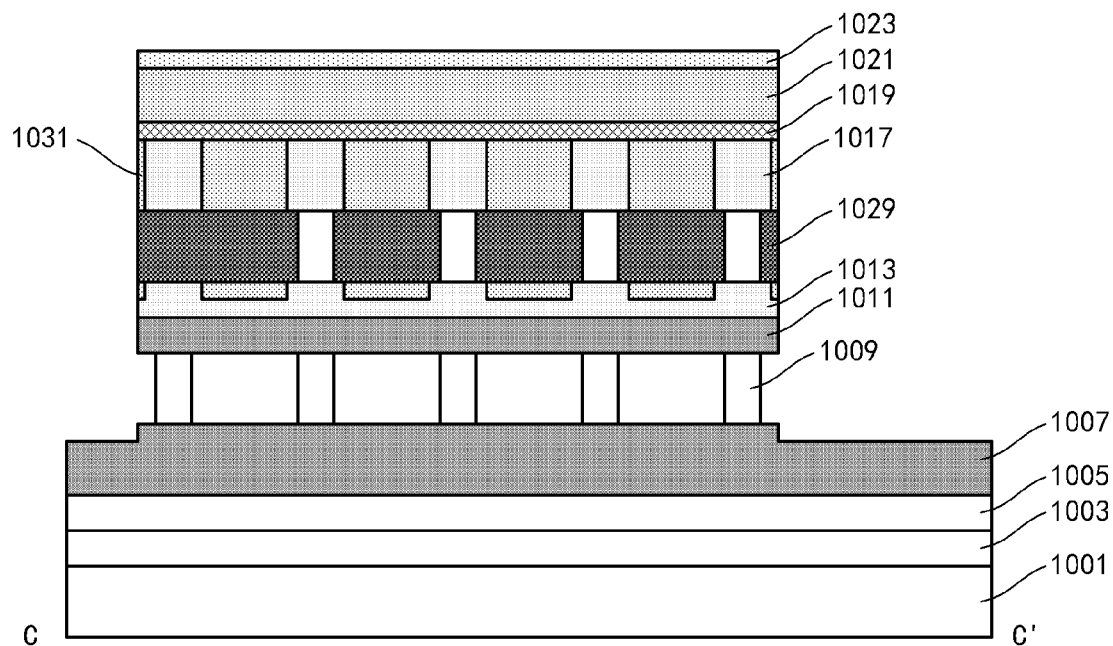

As shown in FIGS. 17(a), 17(b), and 17(c) (FIGS. 17(a), 17(b), and 17(c) are sectional views taken along line AA', line BB', and line CC' respectively), the channel layer 1009 may be further selectively etched by, for example, ALE, so that the channel layer 1009 is divided into several separated pillar-shaped portions, i.e., nanowires, corresponding to the central portions of the mask pattern. In this regard, reference may be made to the description above in conjunction with FIGS. 11(a), 11(b) and 11(c).

Figure 18A:
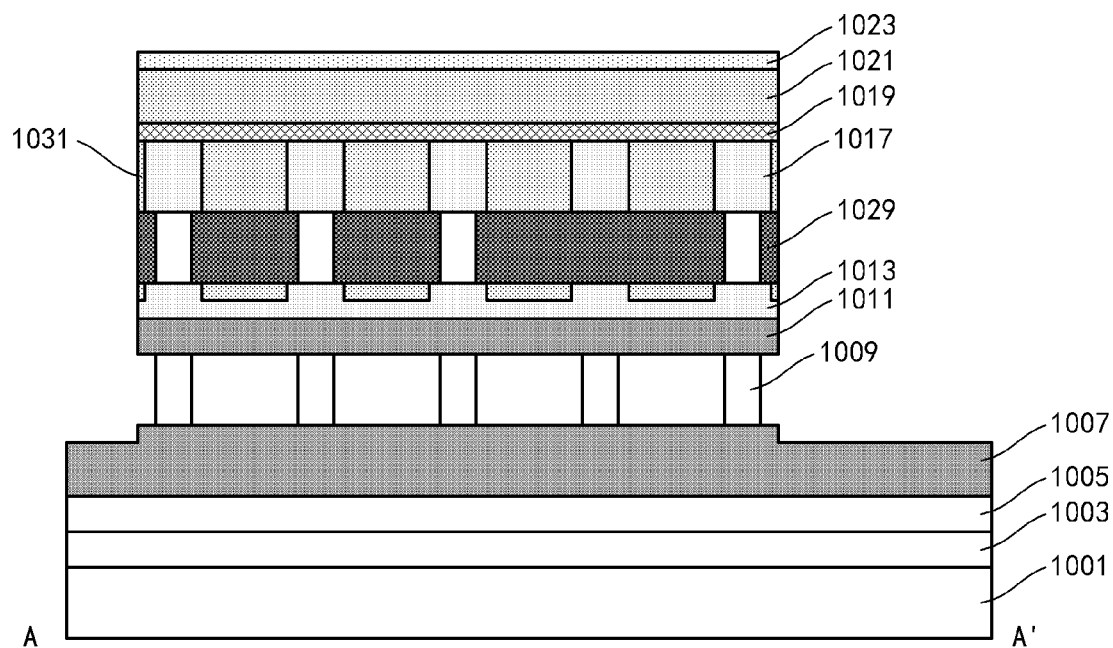
Figure 18B:
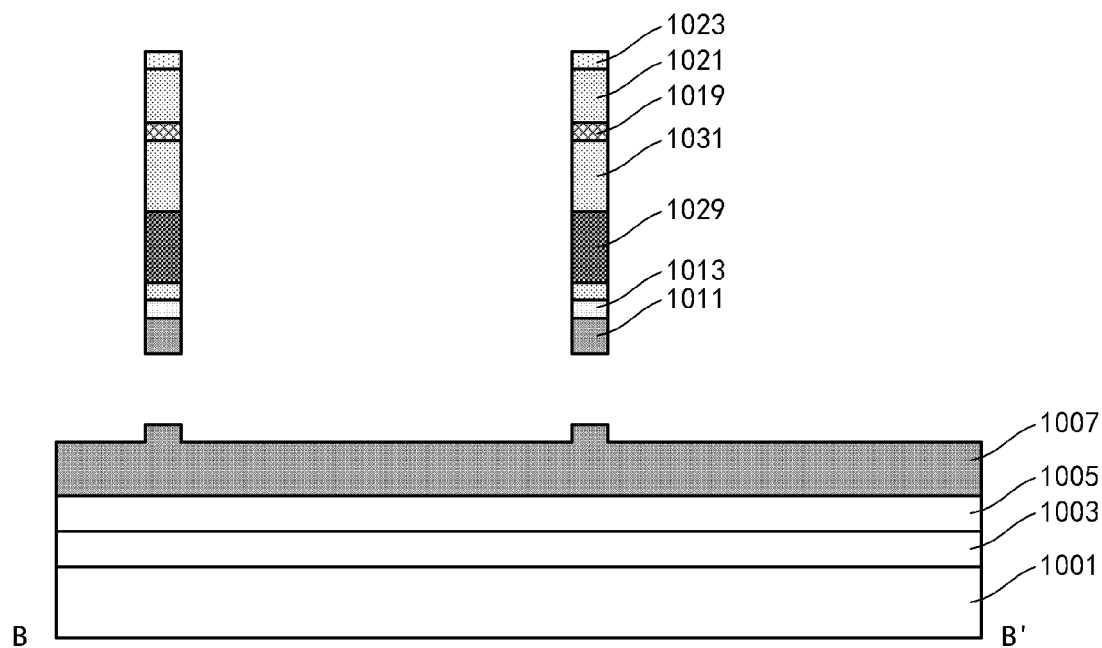
Figure 18C:
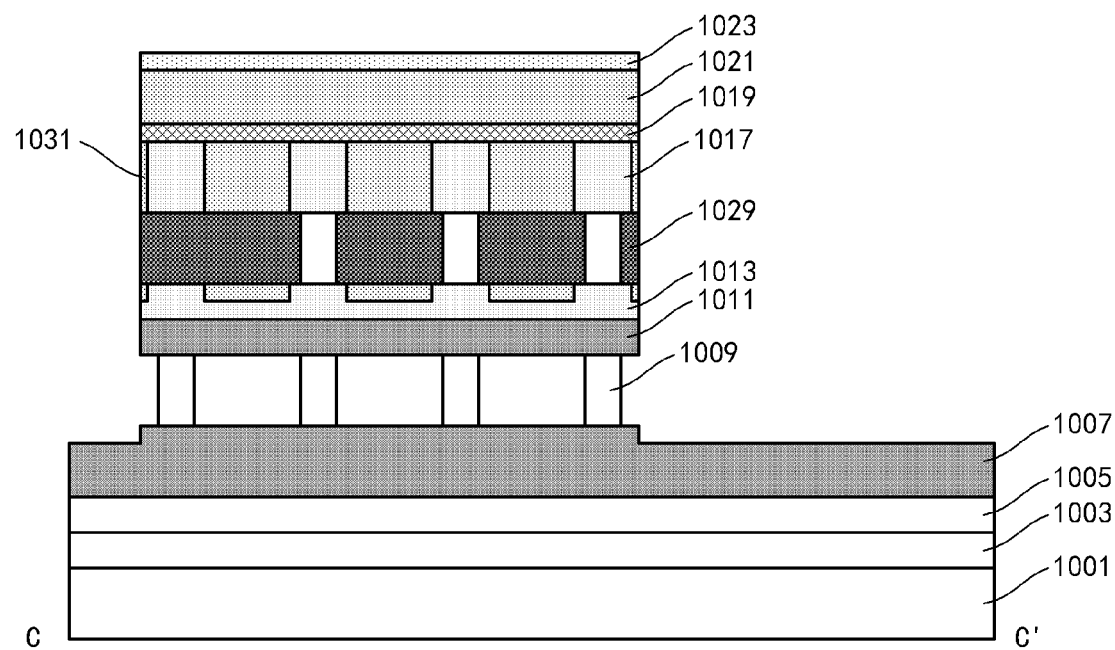
Figure 19A:
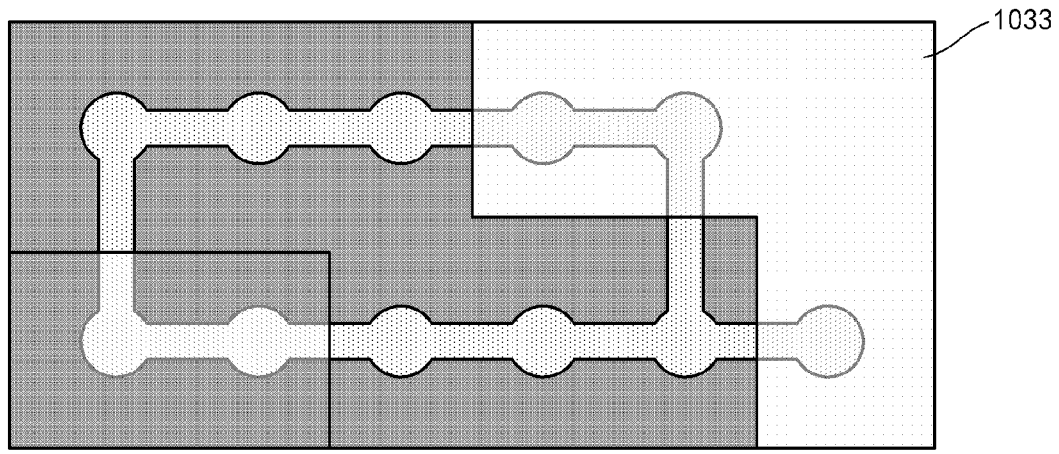
Figure 19B:
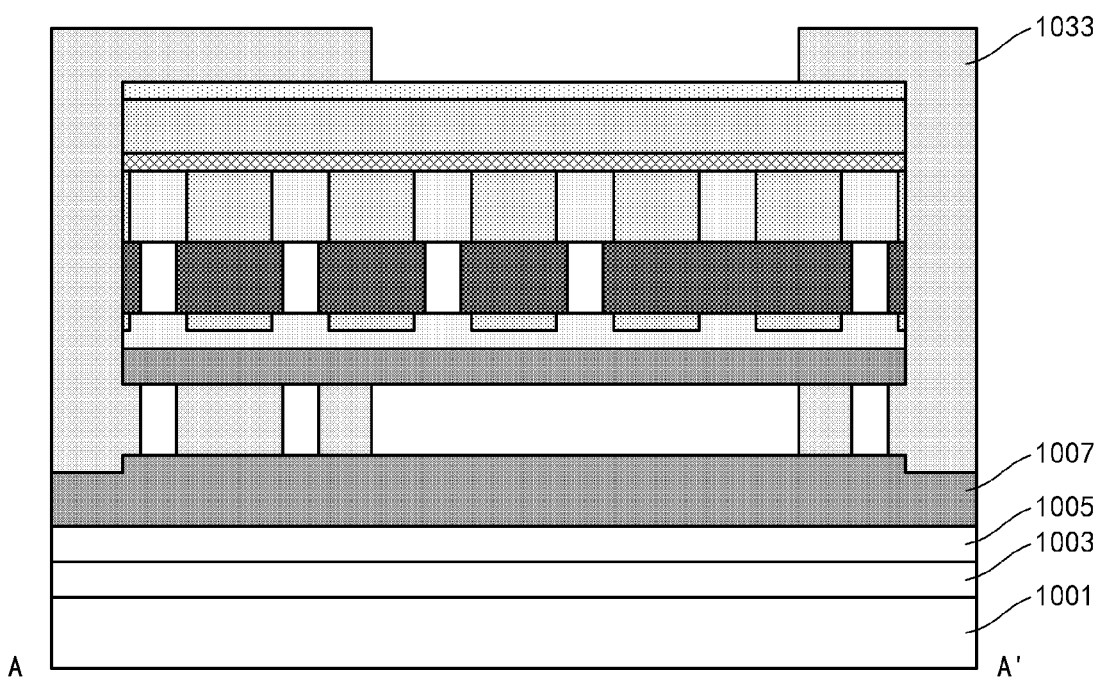
Figure 19C:
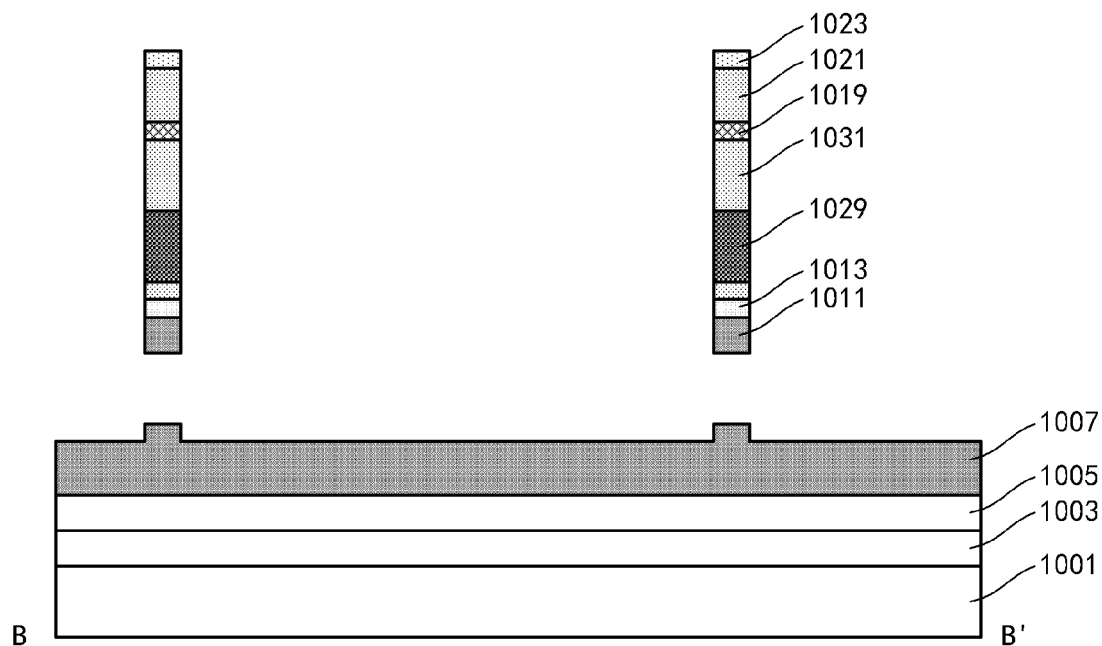
Figure 19D:
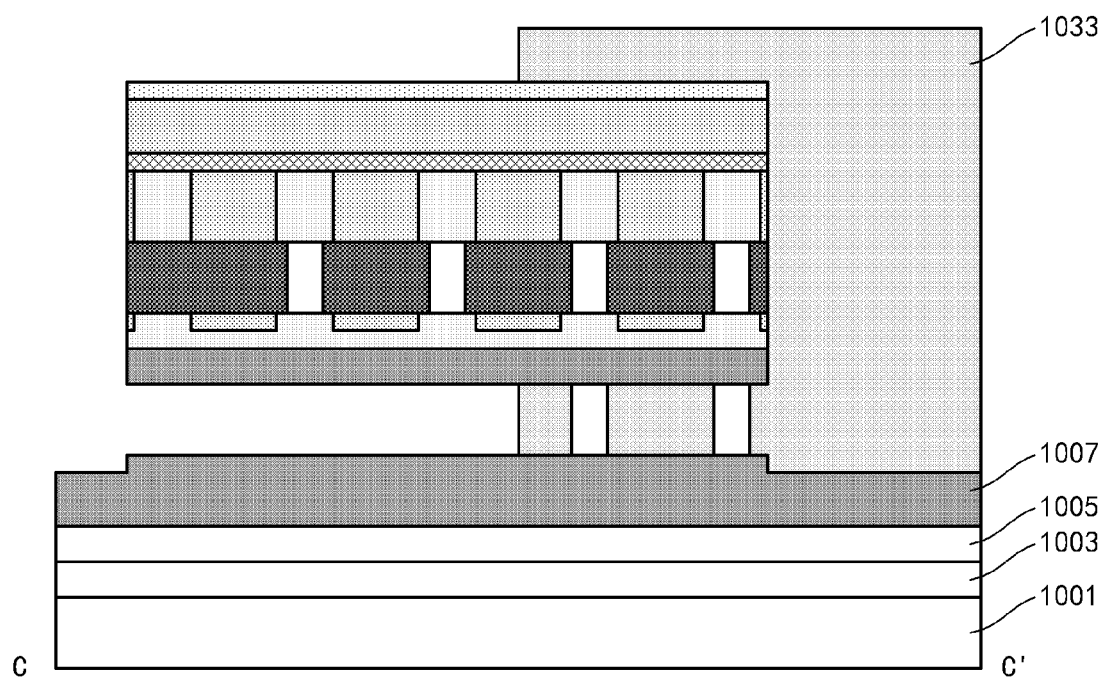
Figure 20A:
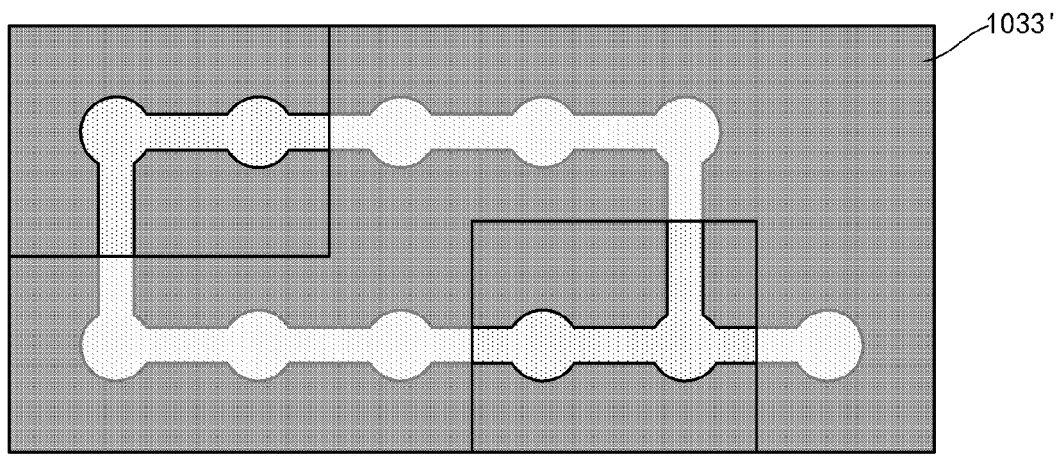
Figure 20B:
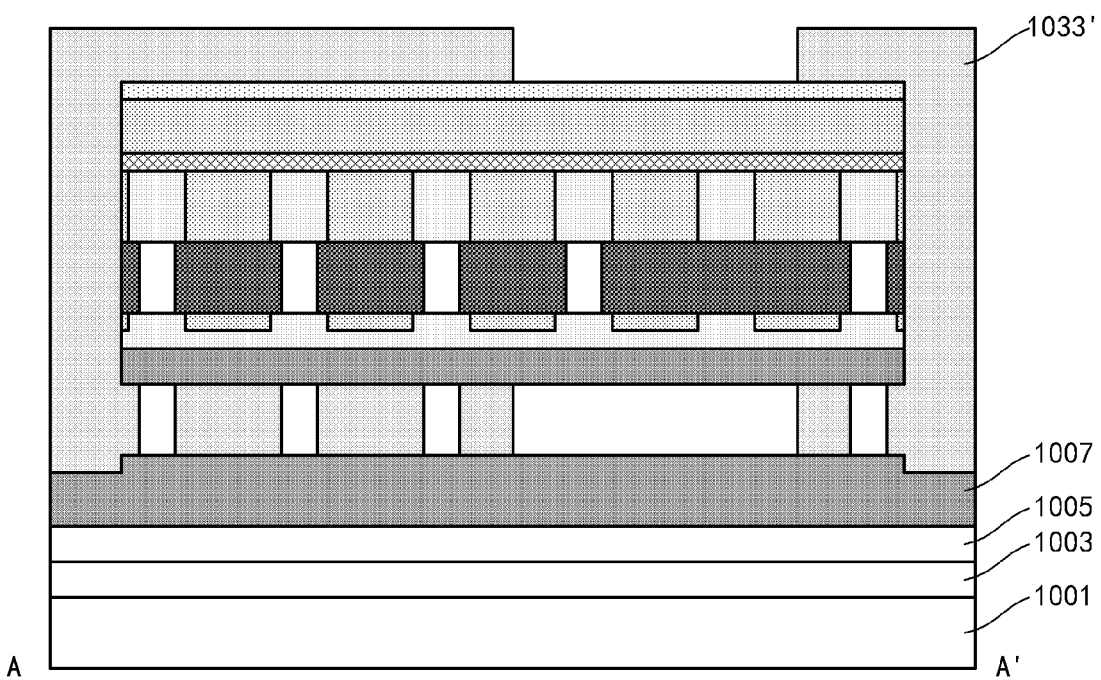
Figure 20C:
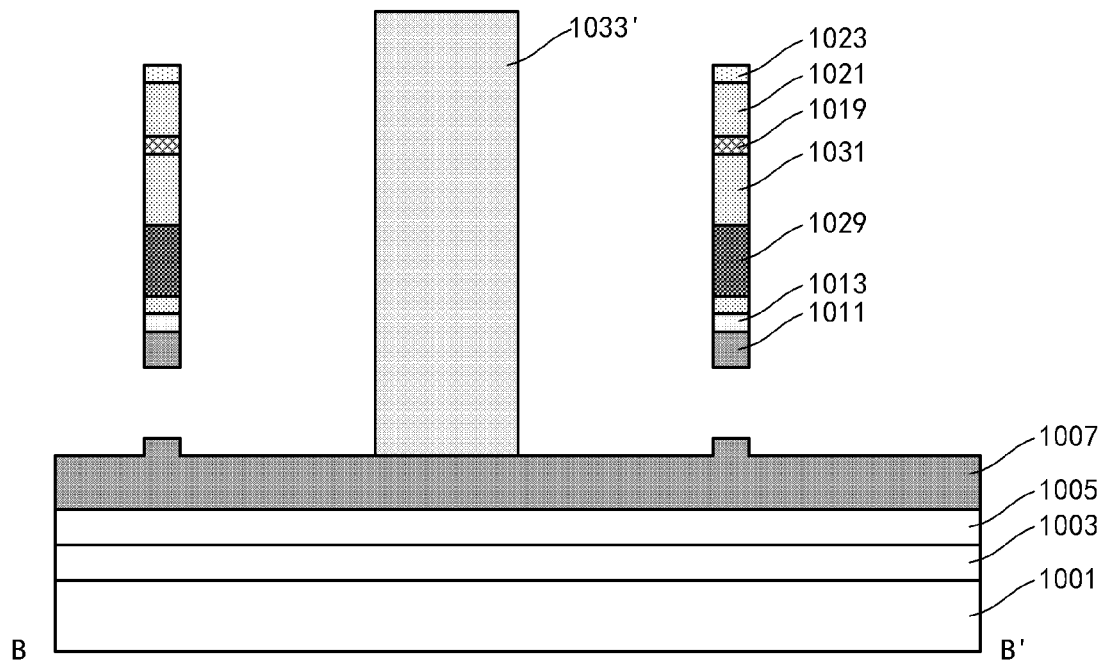
Figure 20D:
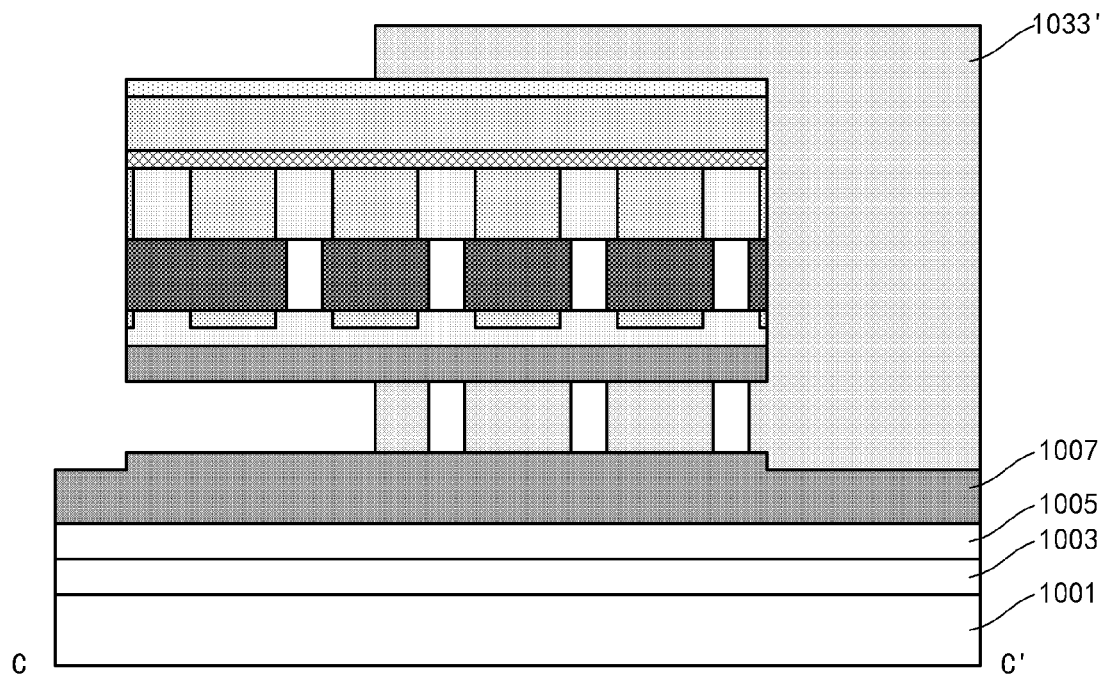
Figure 21A:
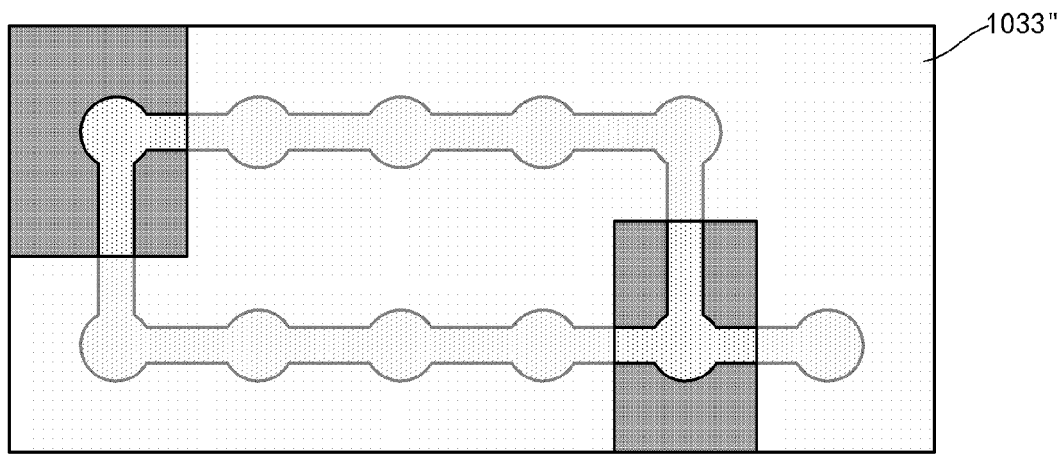
Figure 21B:
Figure 21C:
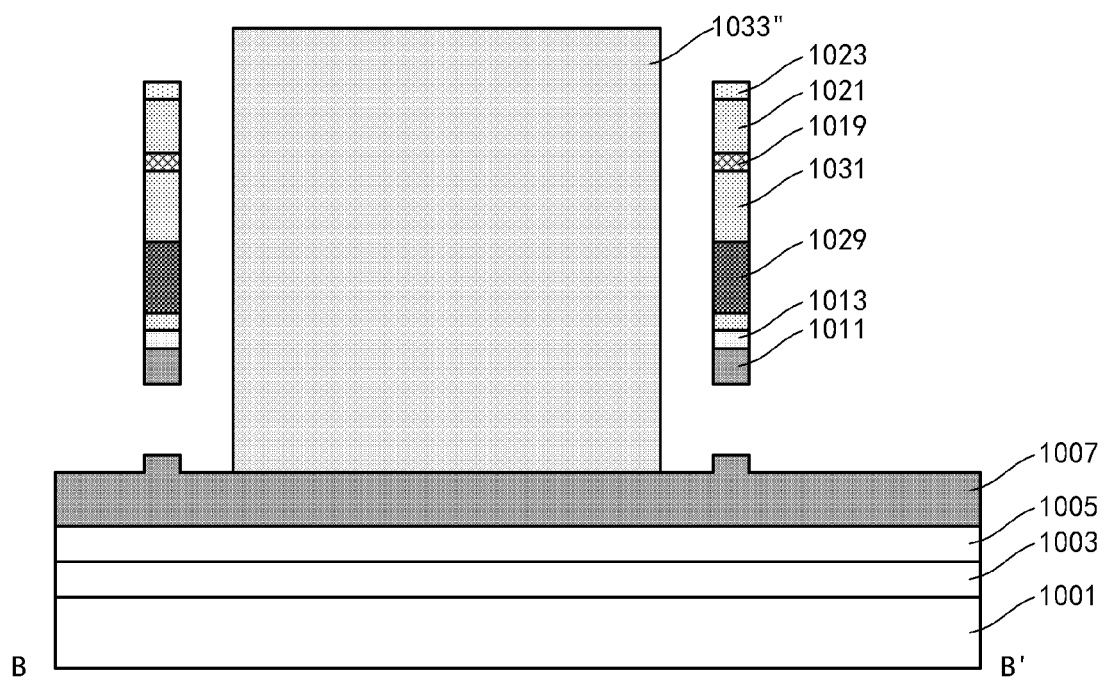
Figure 21D:
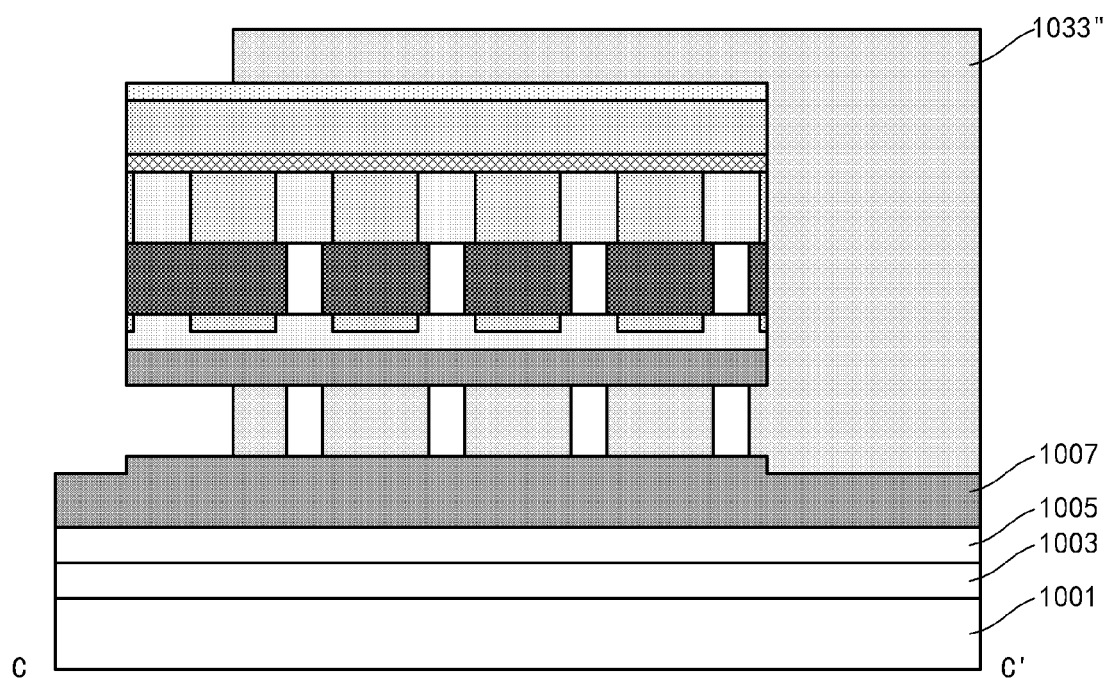
Figure 22A:
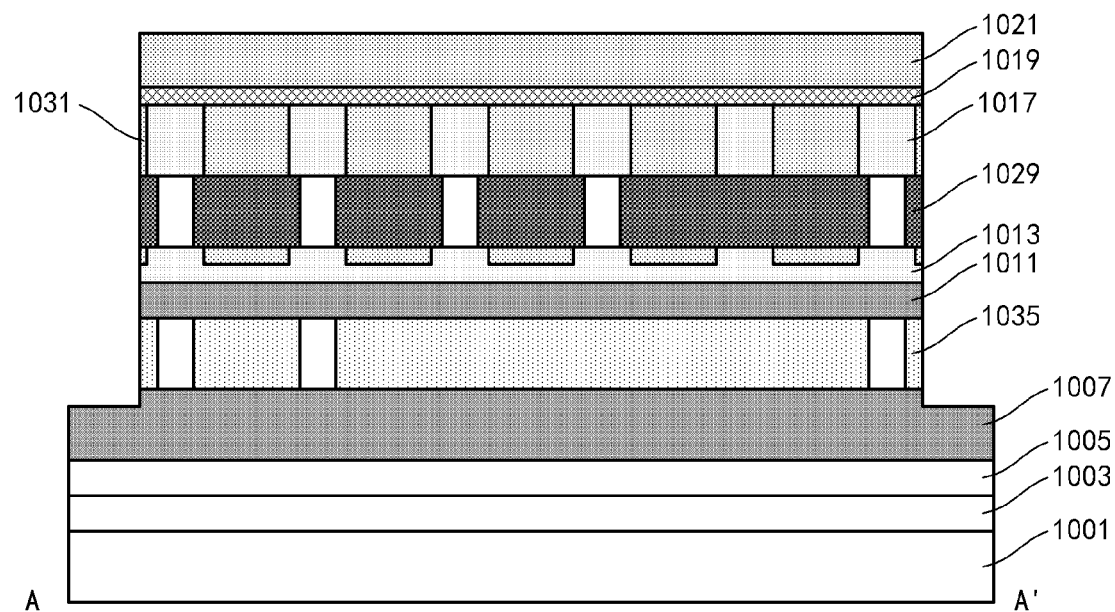
Figure 22B:
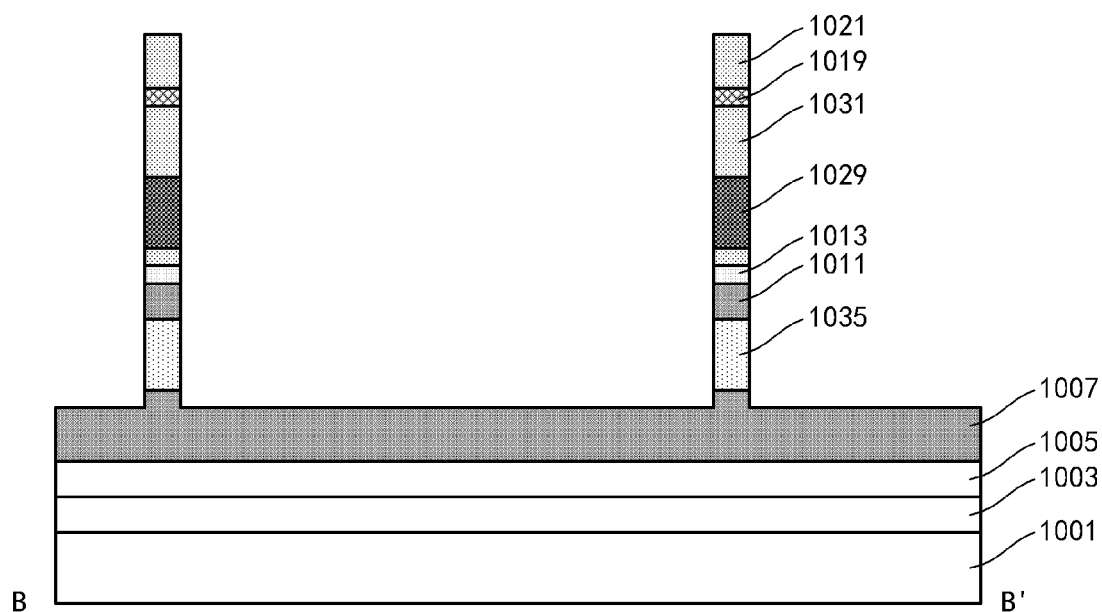
Figure 22C:
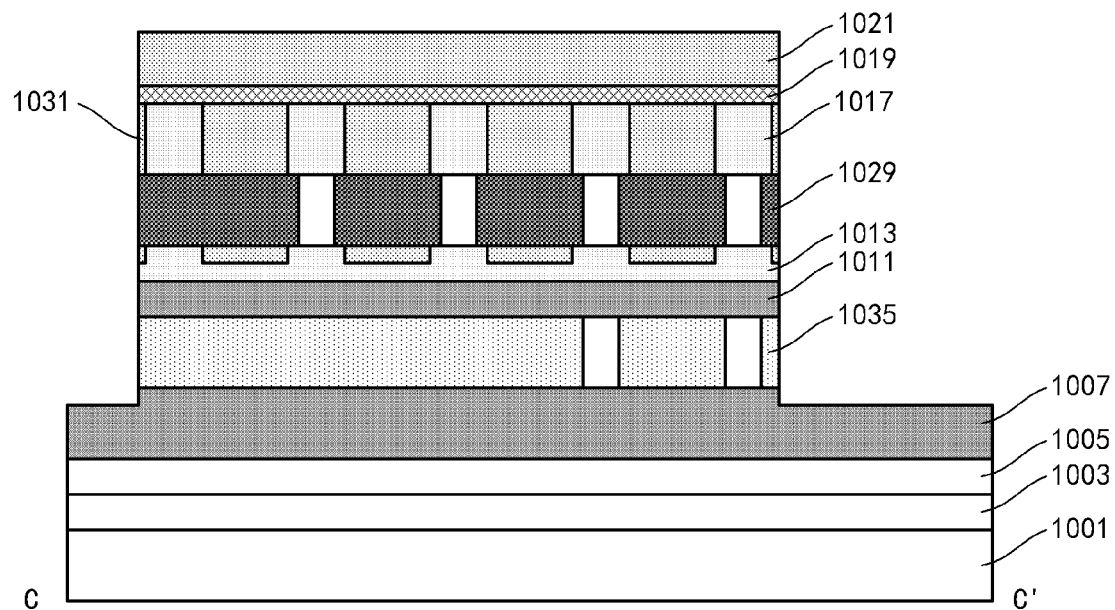
Figure 22D:
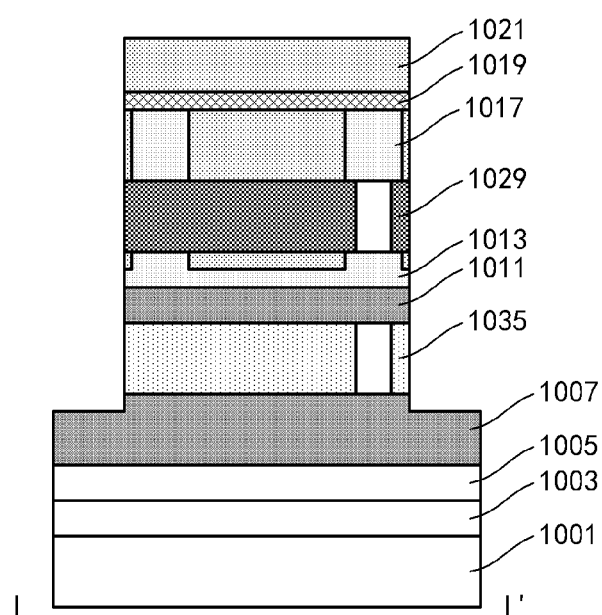
Figure 23A:
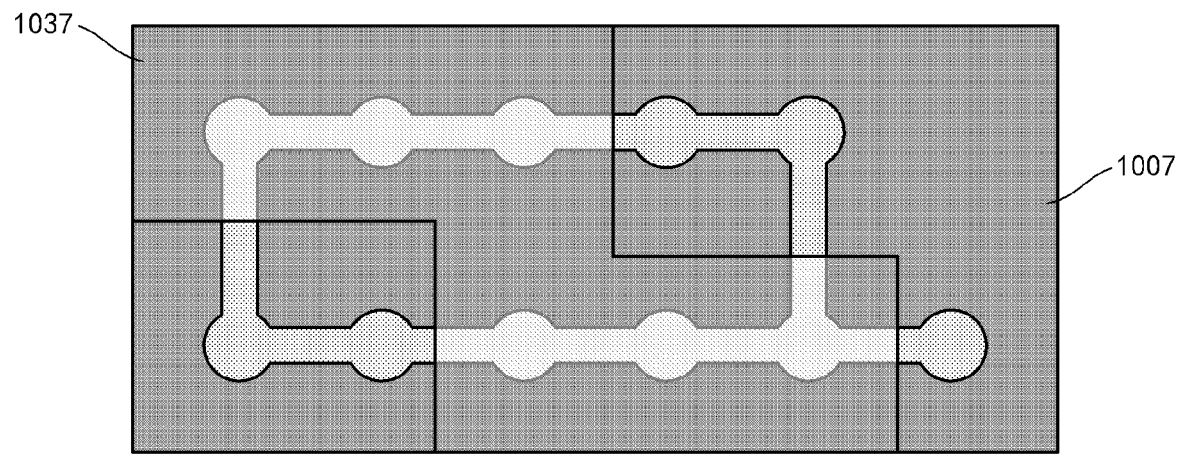
Figure 23B:
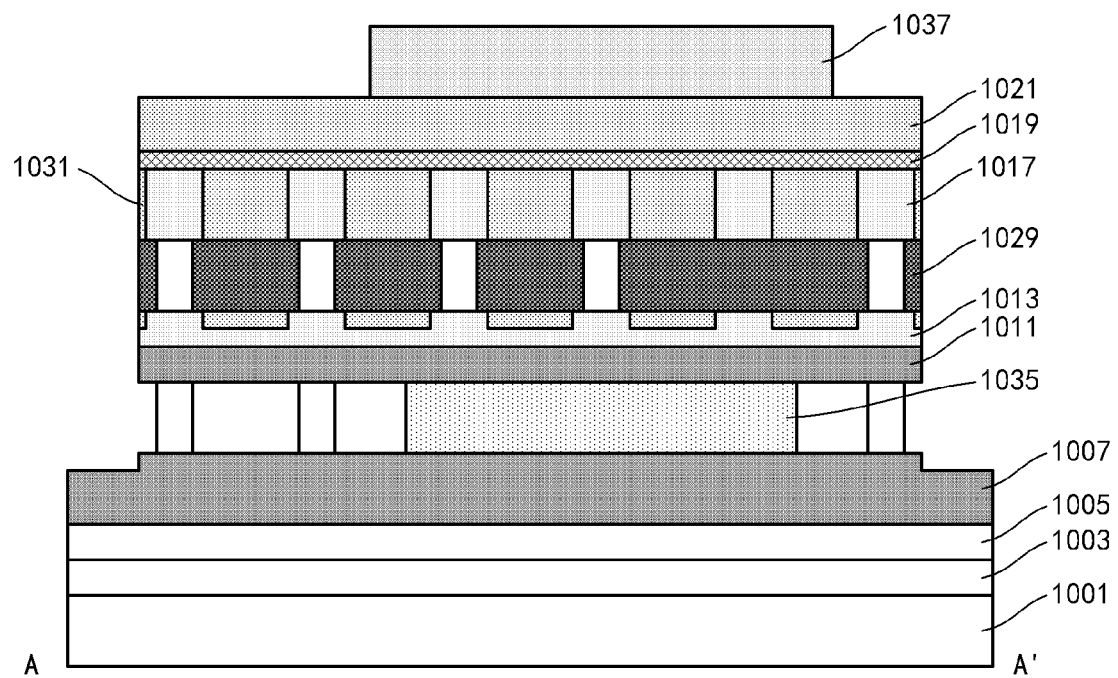
Figure 23C:
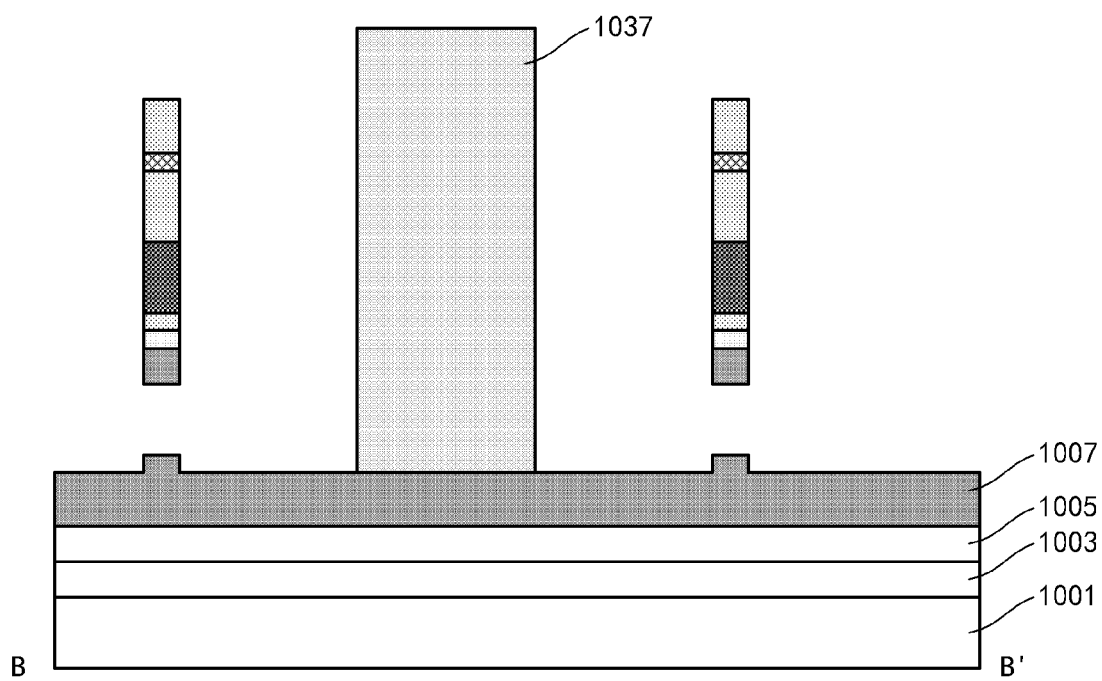
Figure 23D:
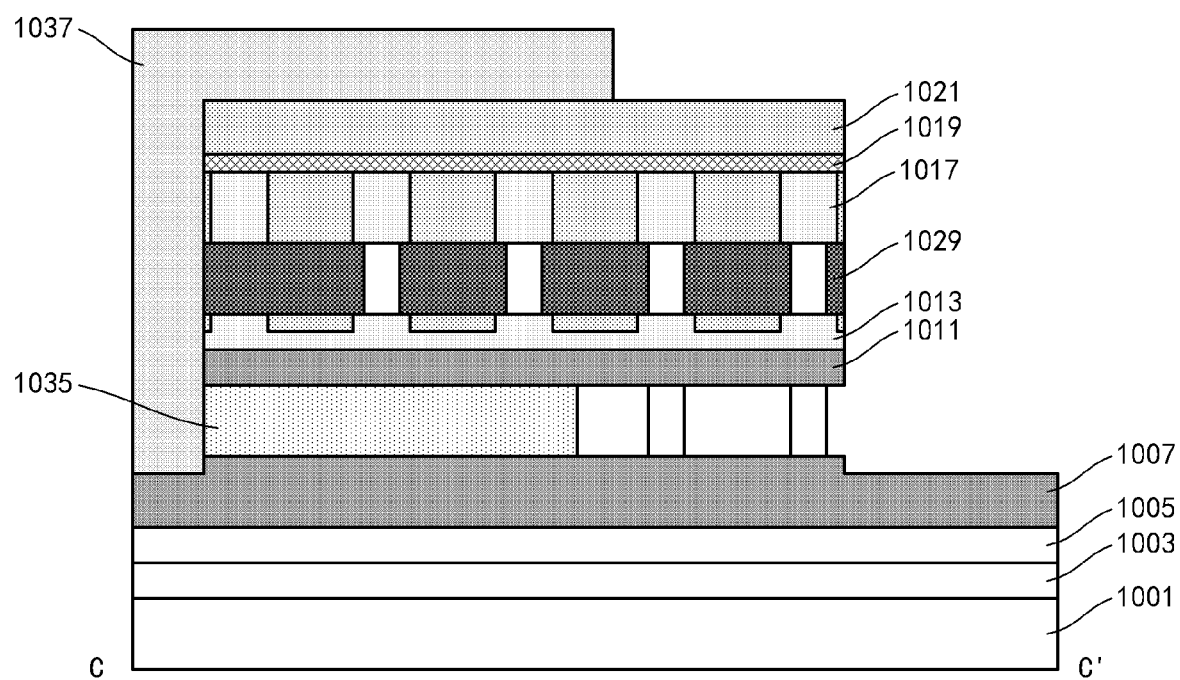
Figure 23E:
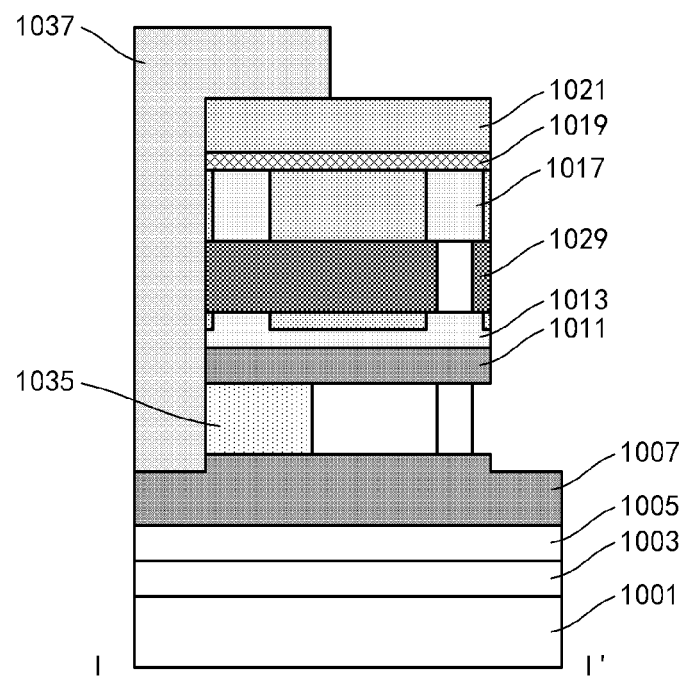
Figure 24A:
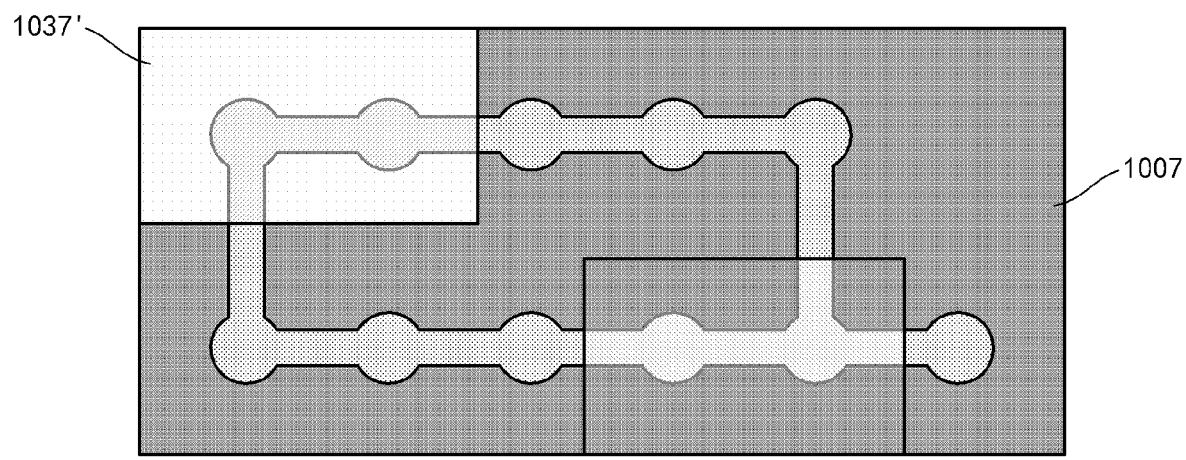
Figure 24B:
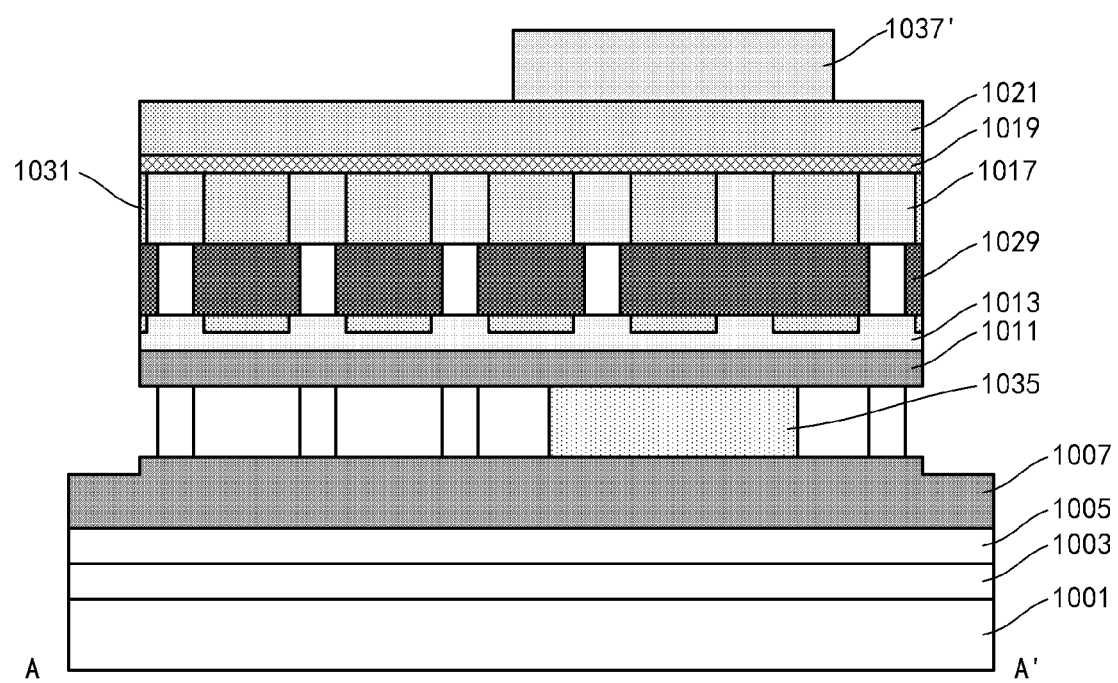
Figure 24C:
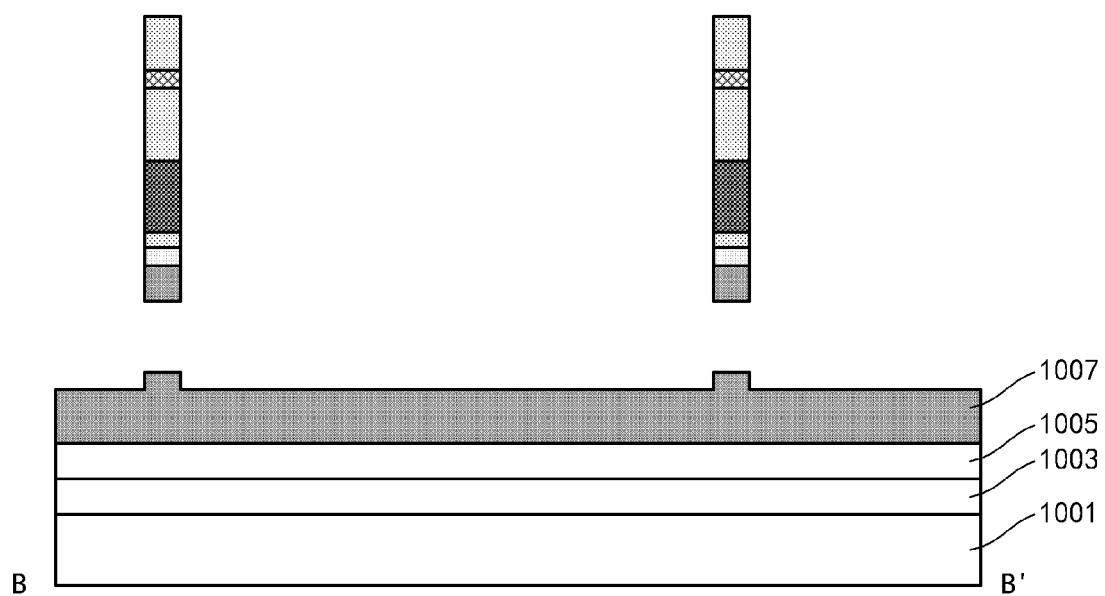
Figure 24D:
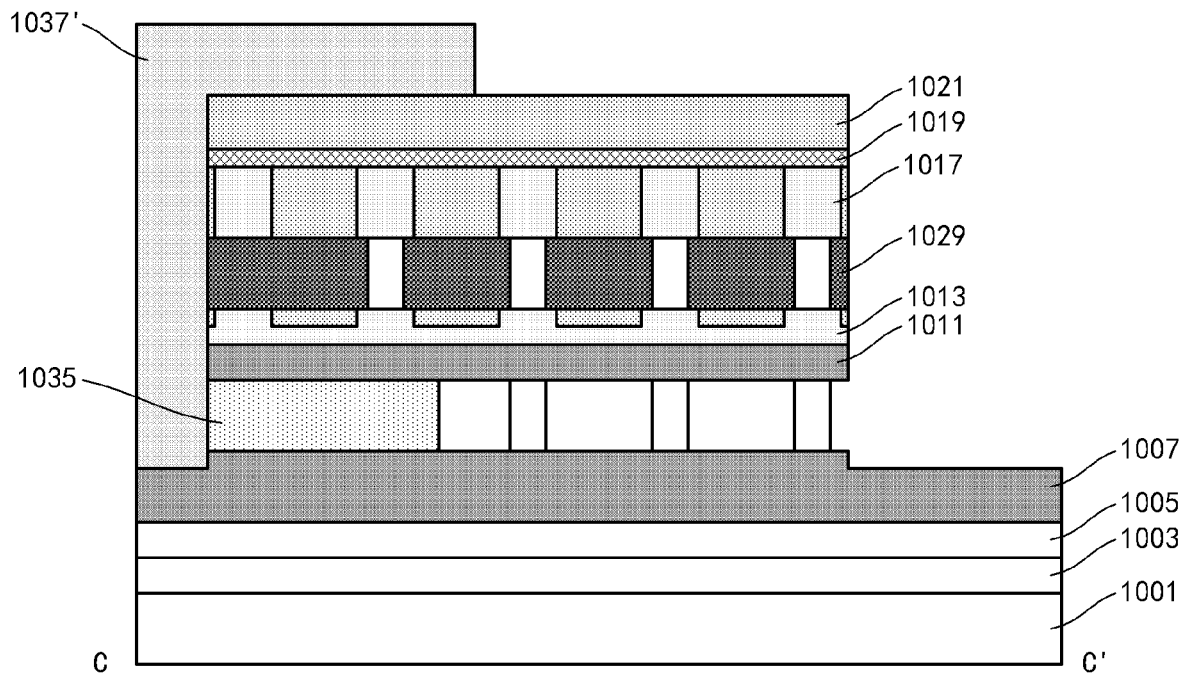
Figure 24E:
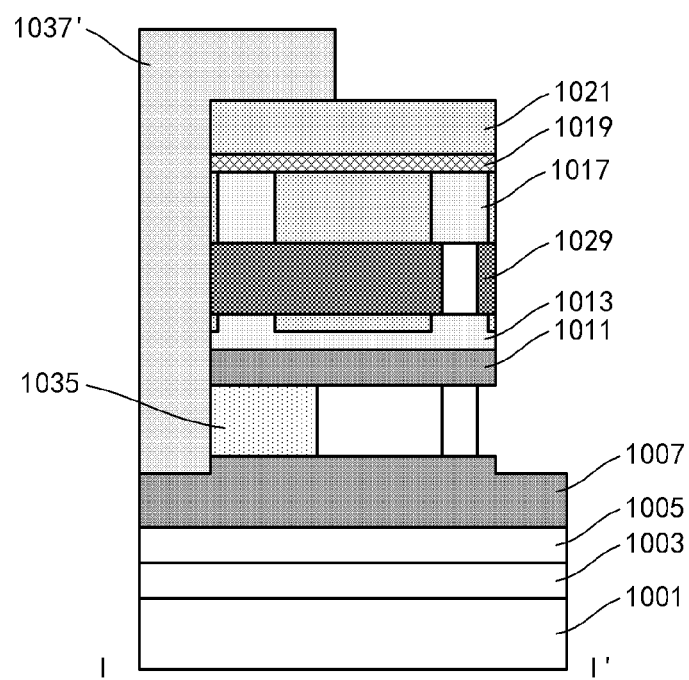
Figure 25A:
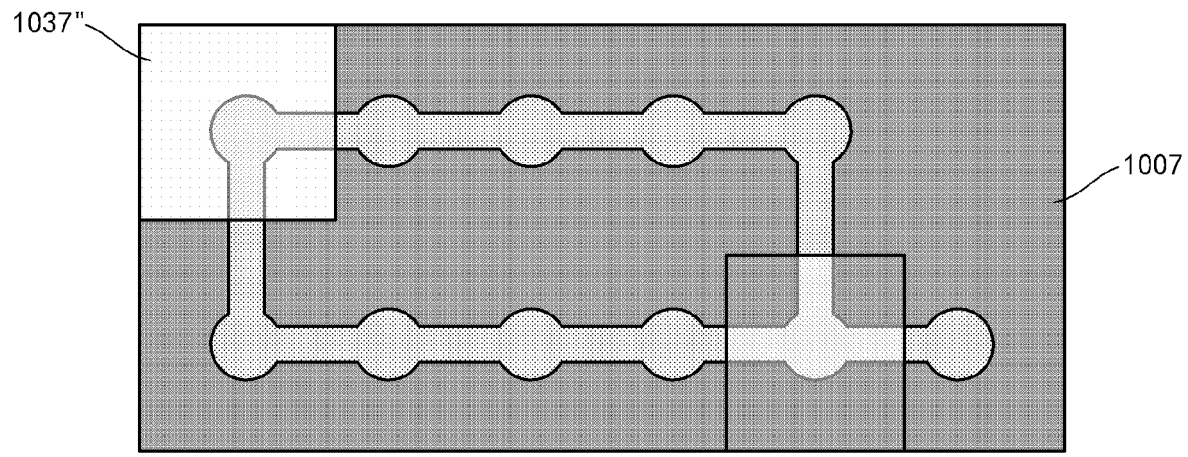
Figure 25B:
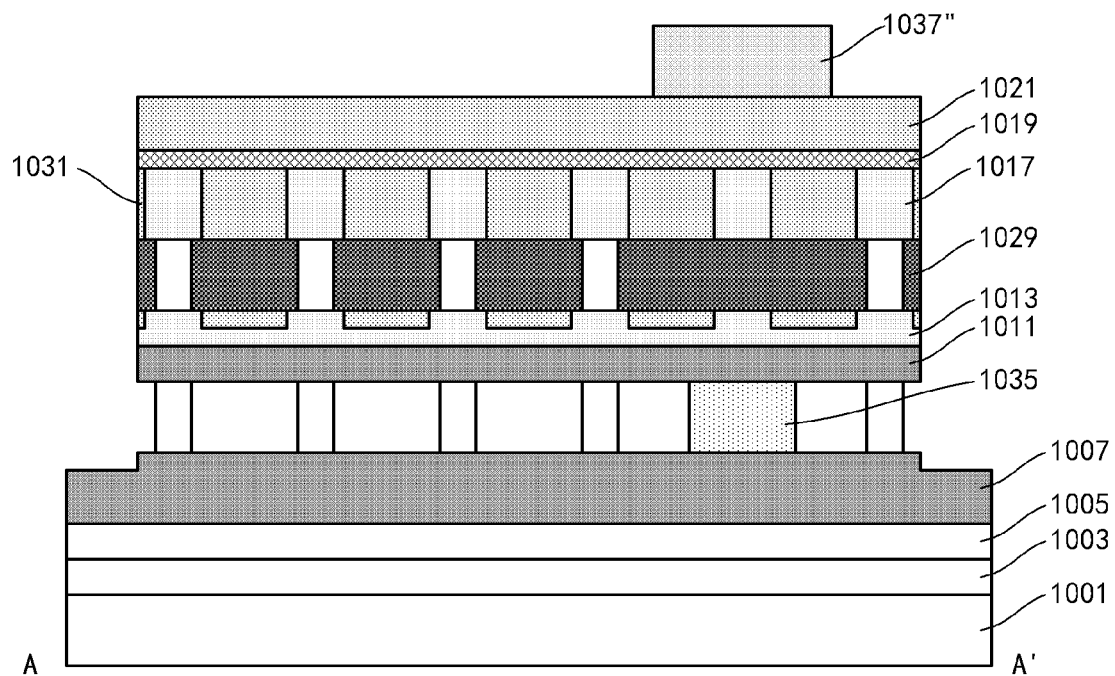
Figure 25C:
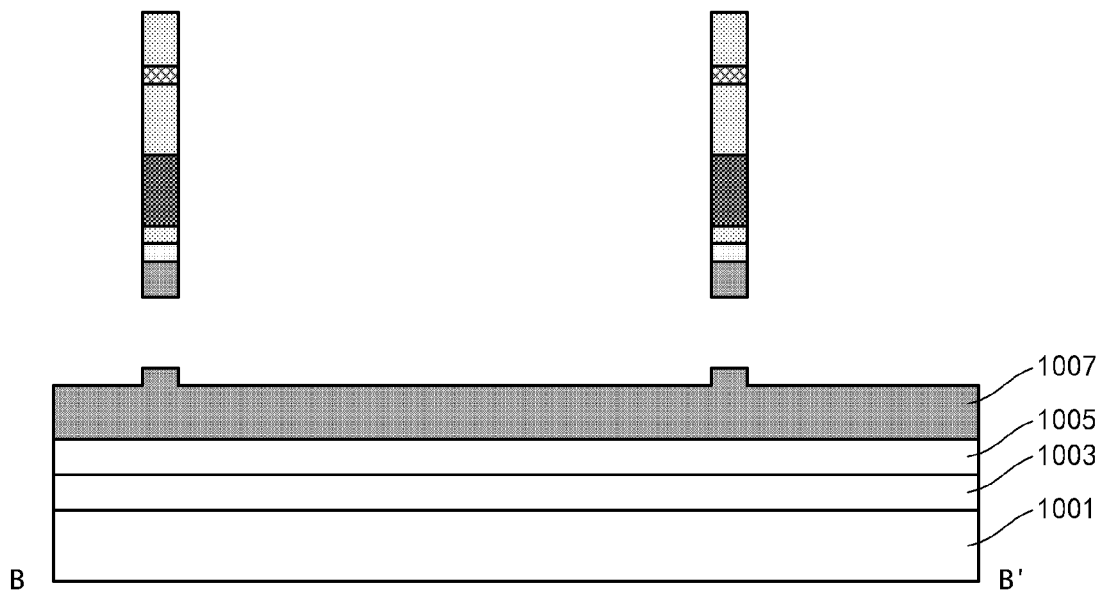
Figure 25D:
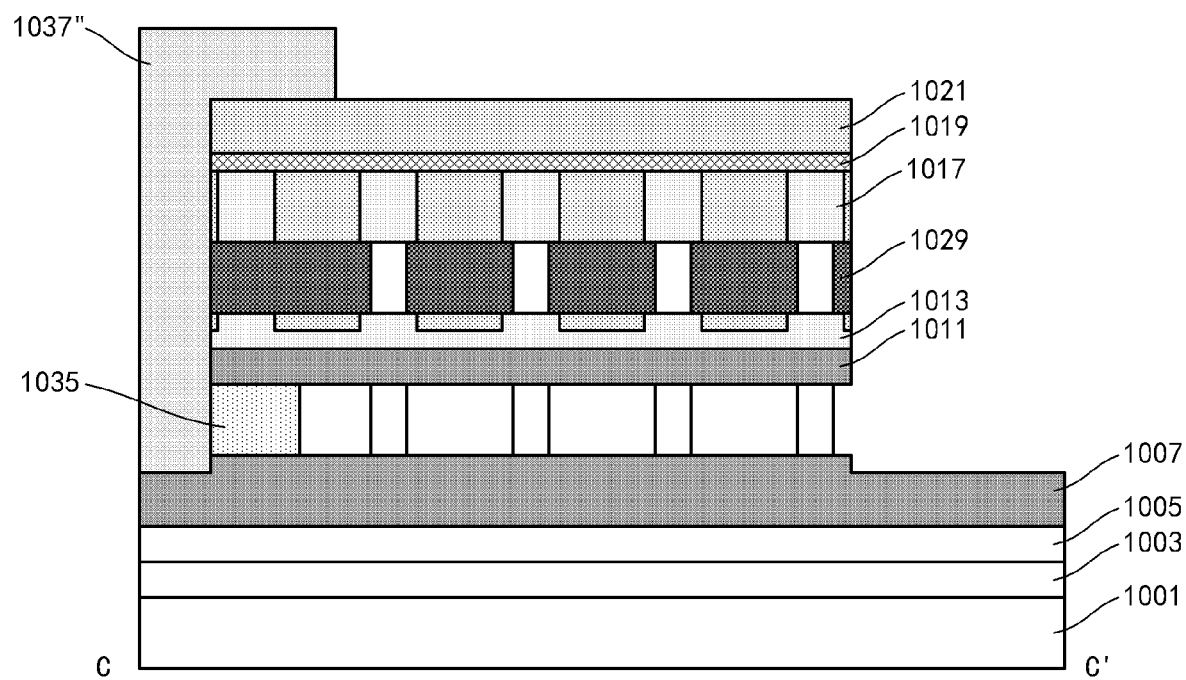
Figure 25E:
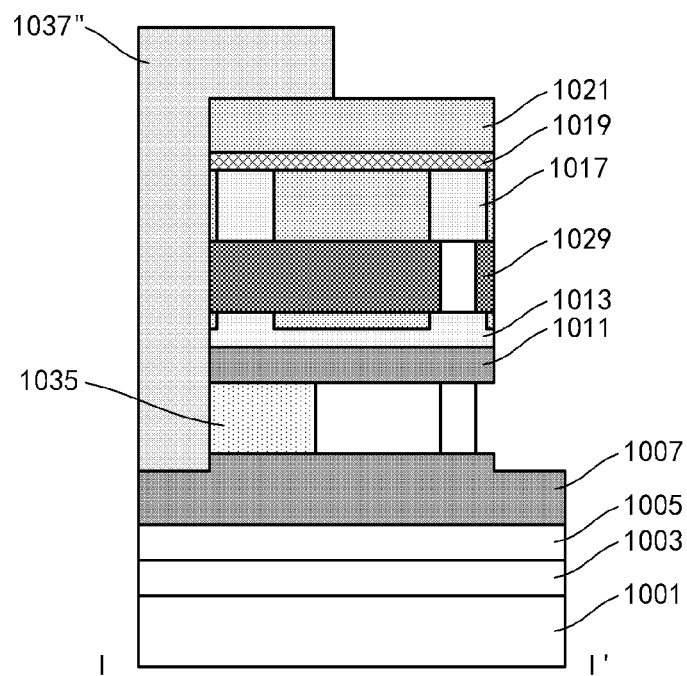
Figure 26A:
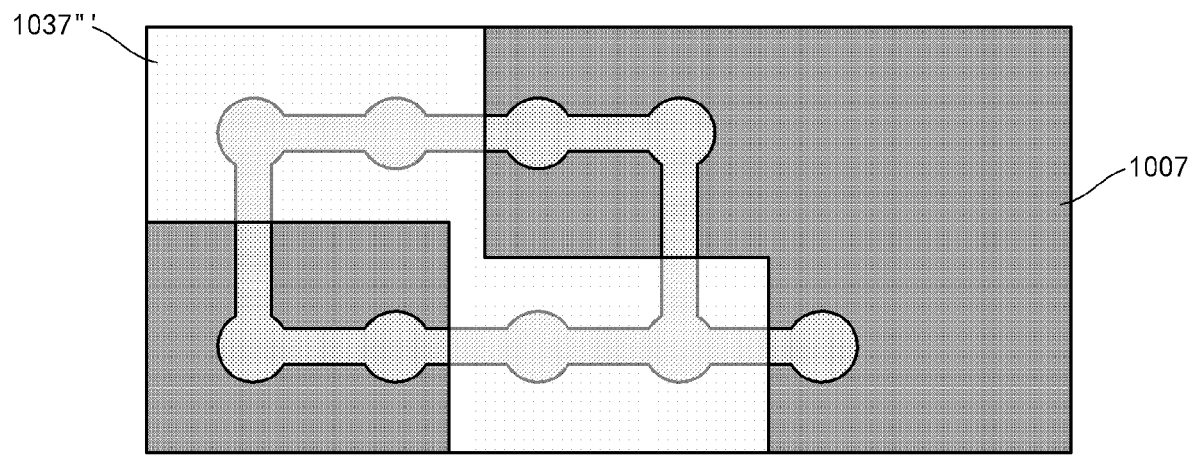
Figure 26B:
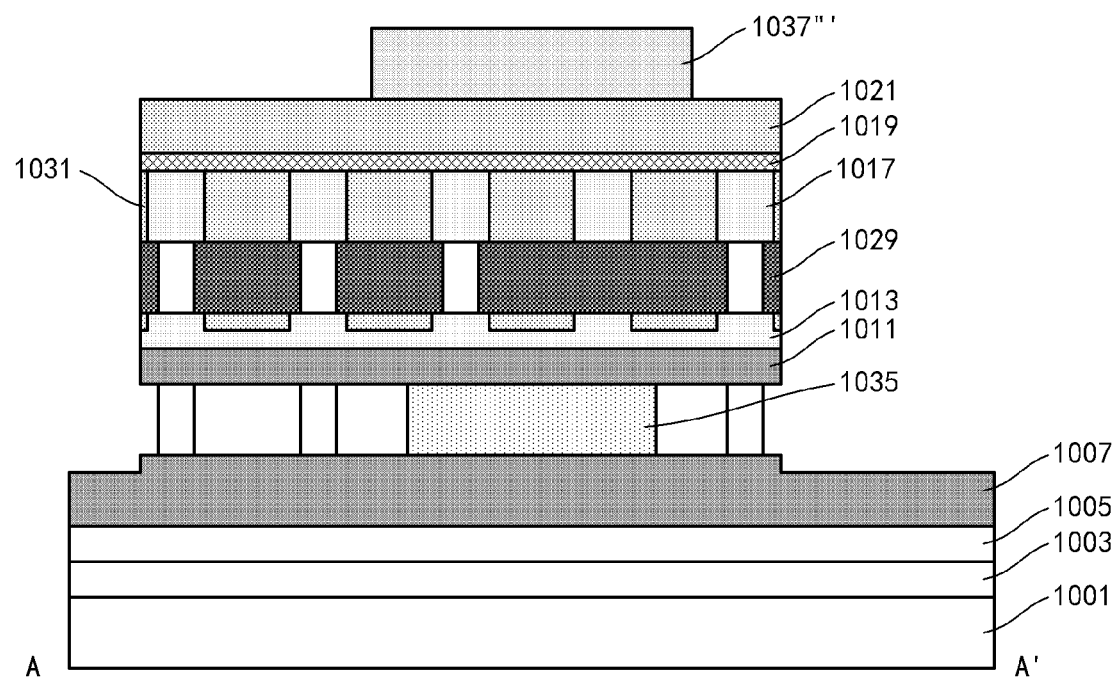
Figure 26C:
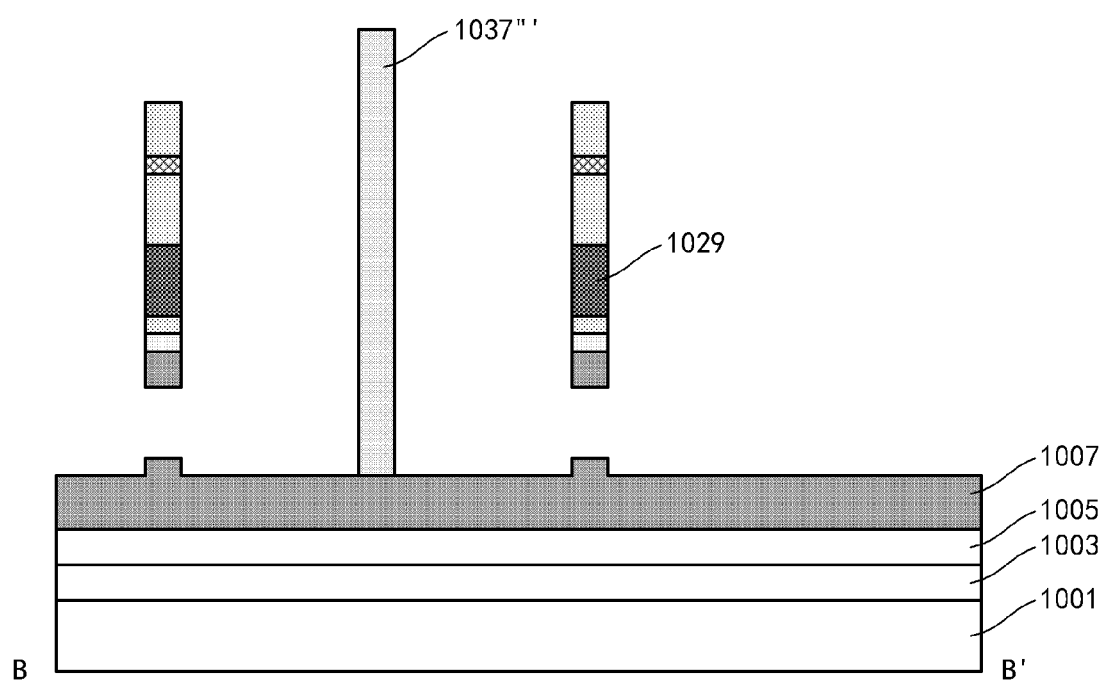
Figure 26D:
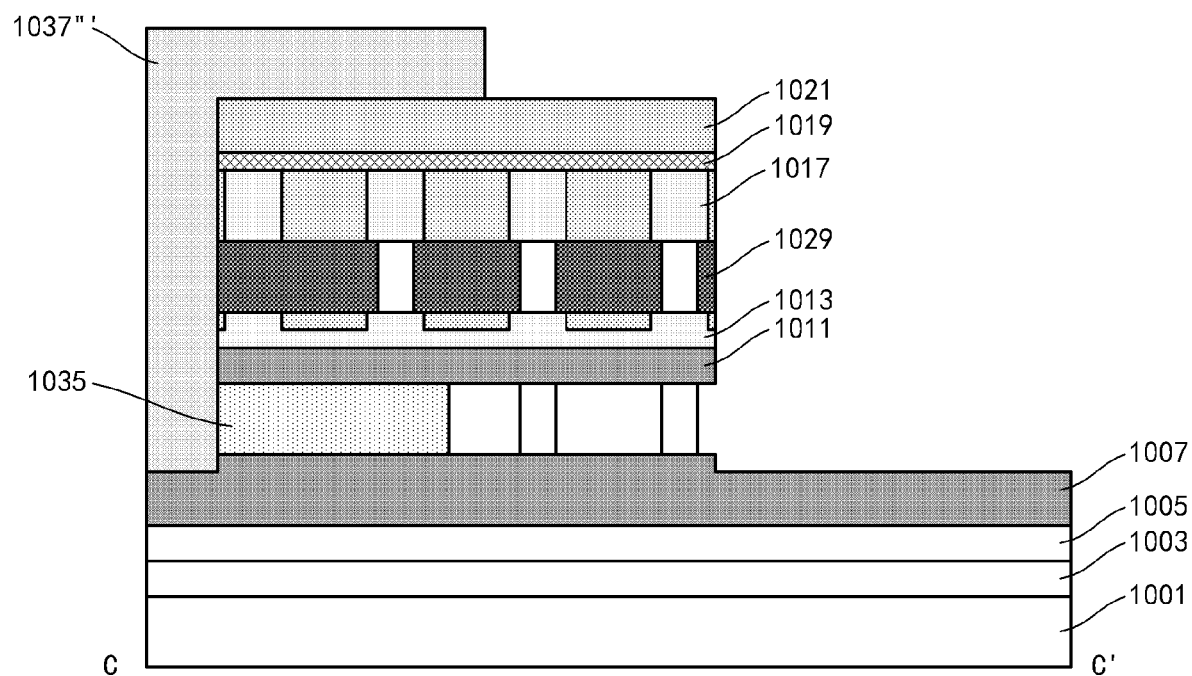
Figure 26E:
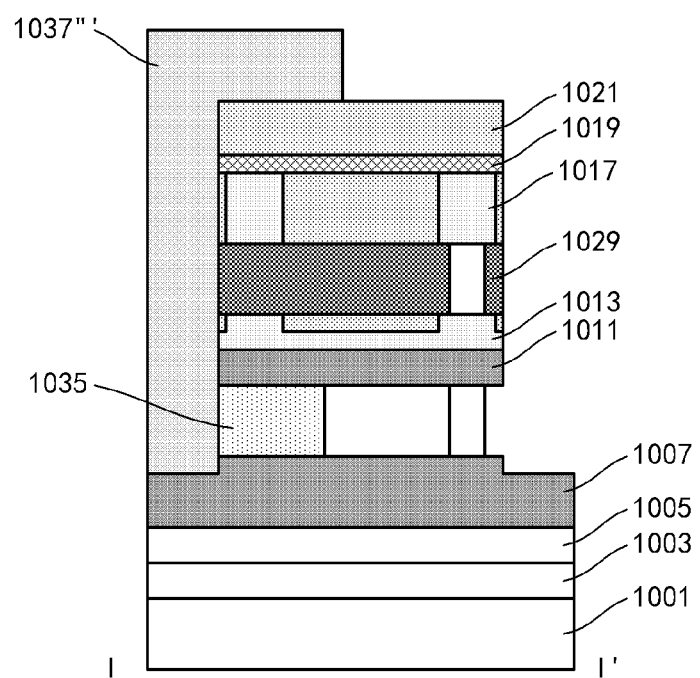
Figure 27A:
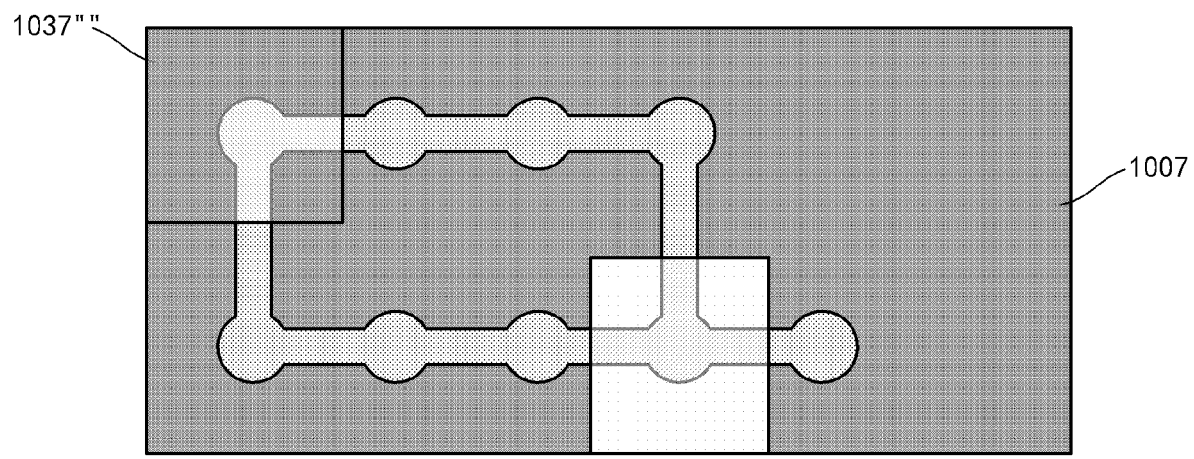
Figure 27B:
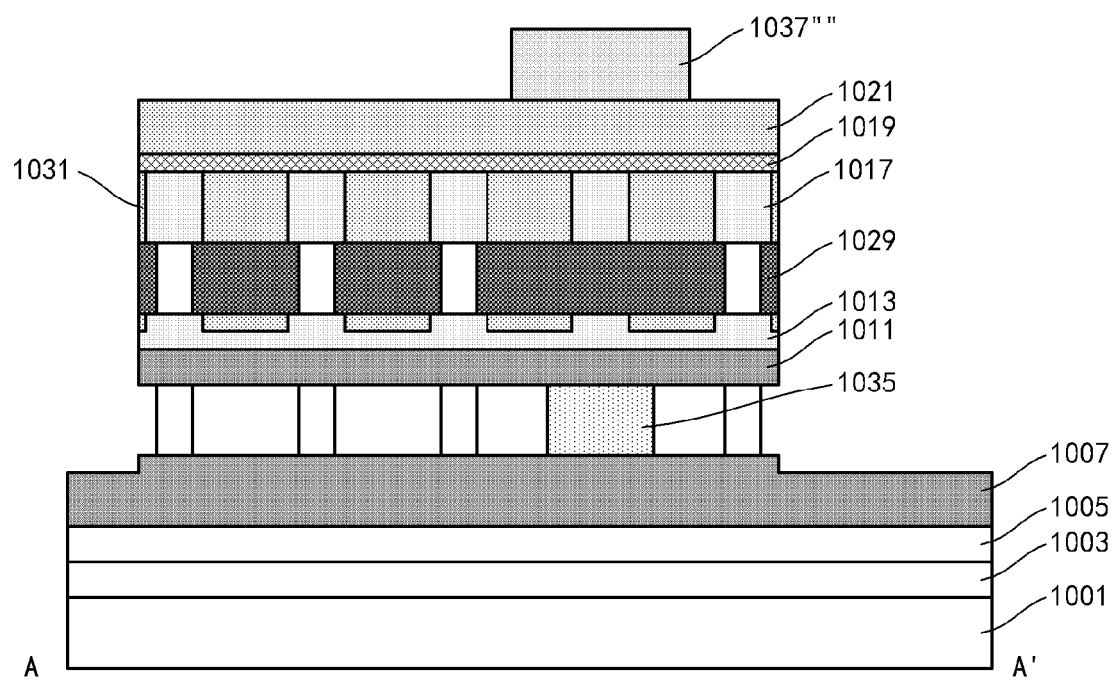
Figure 27C:
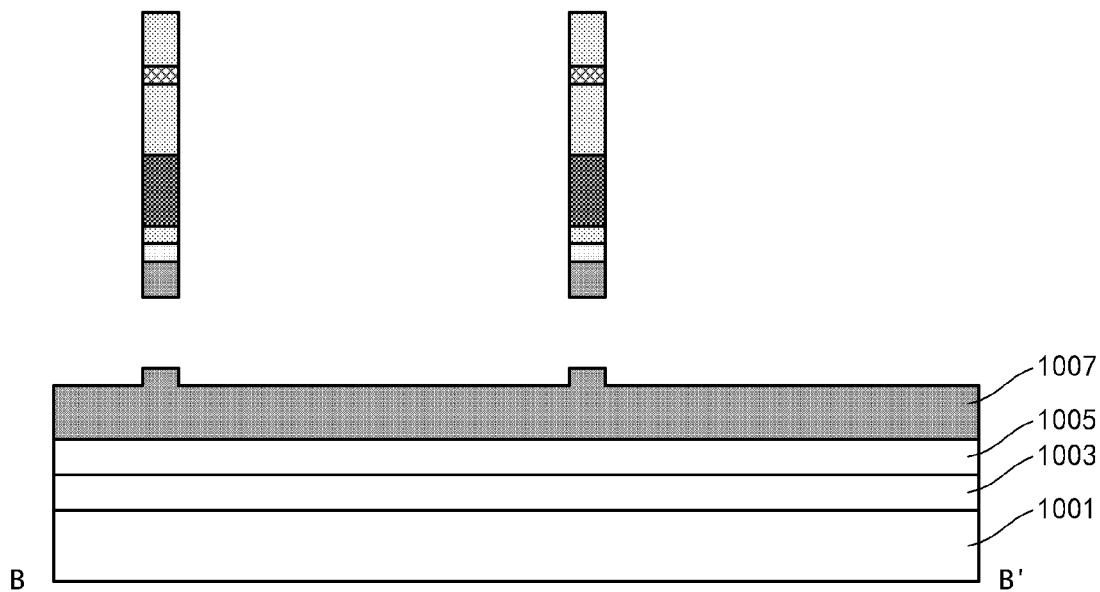
Figure 27D:
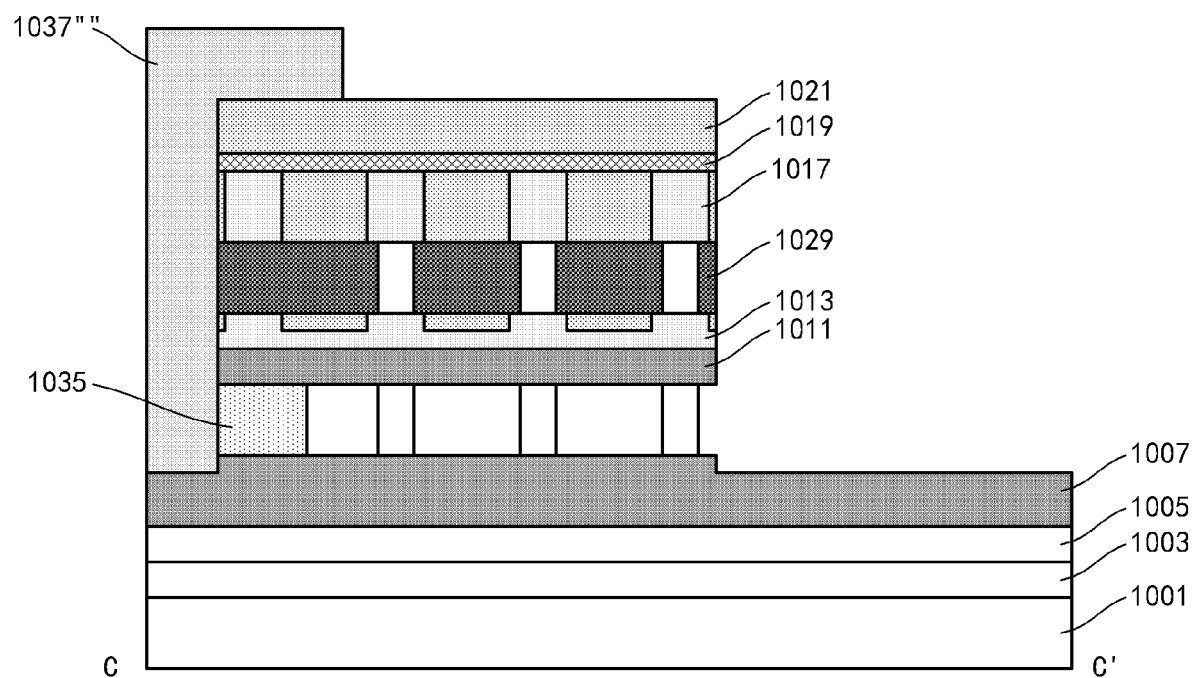
Figure 27E:
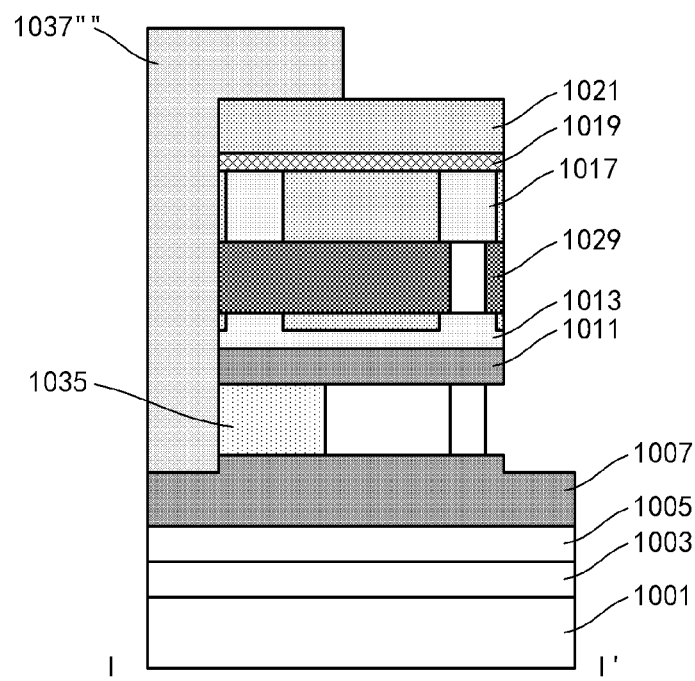
Figure 28A:
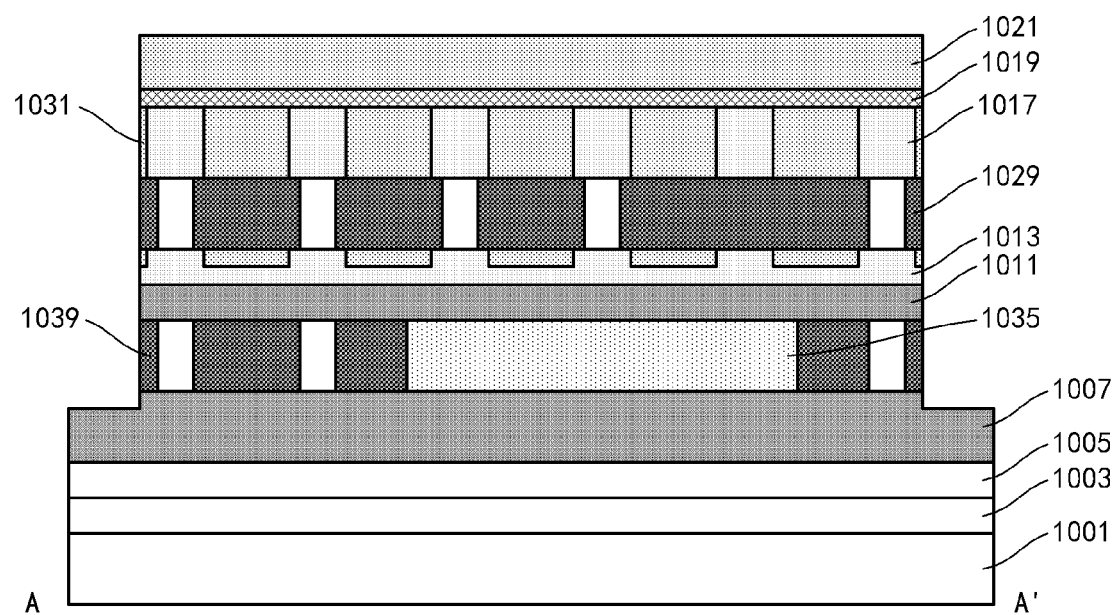
Figure 28B:
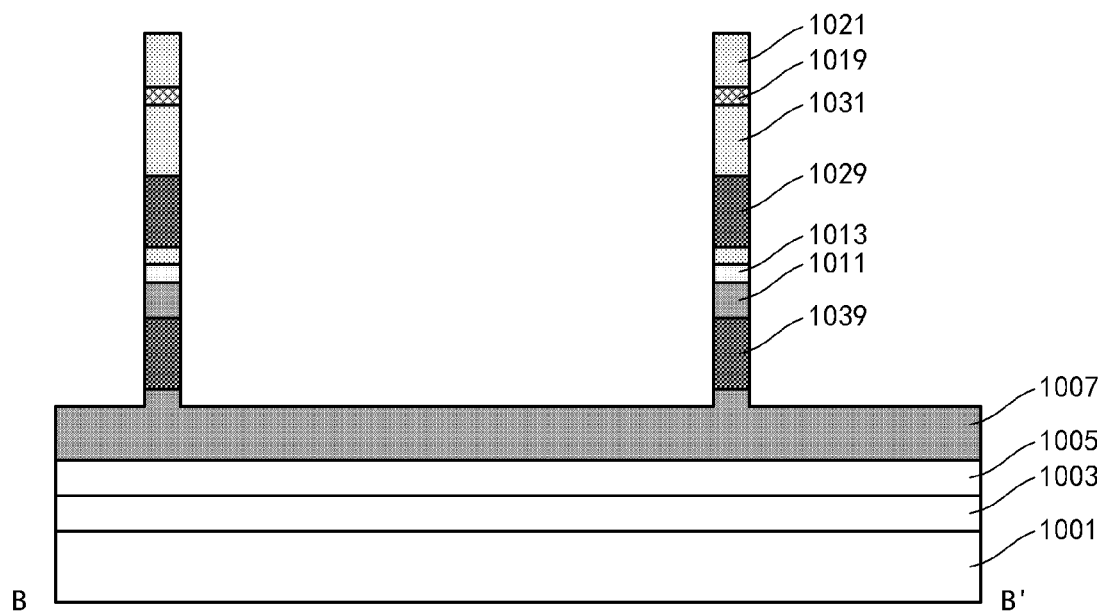
Figure 28C:
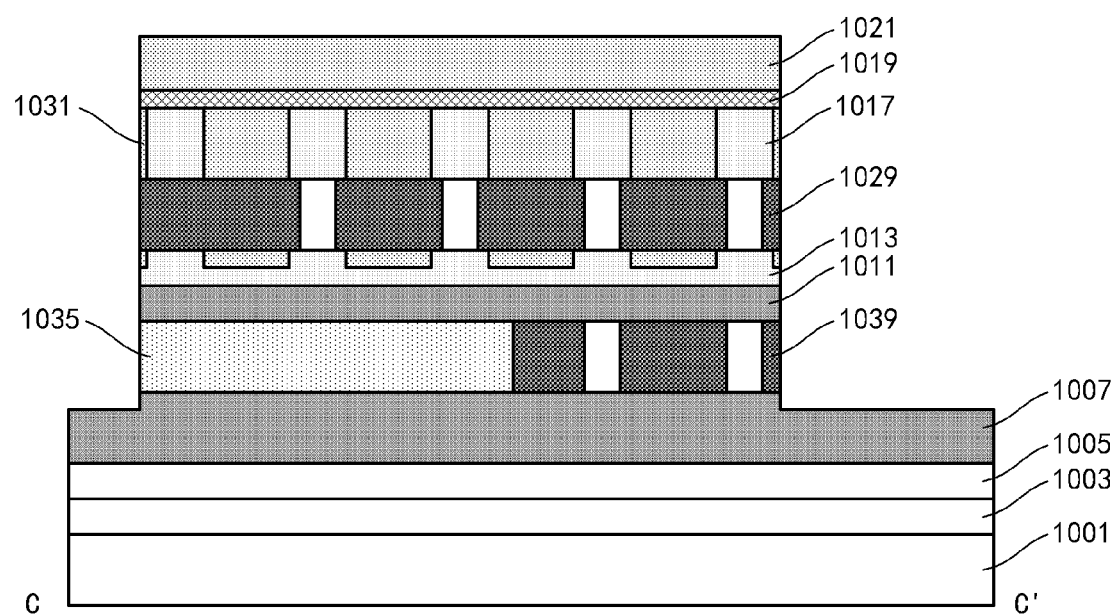
Figure 28D:
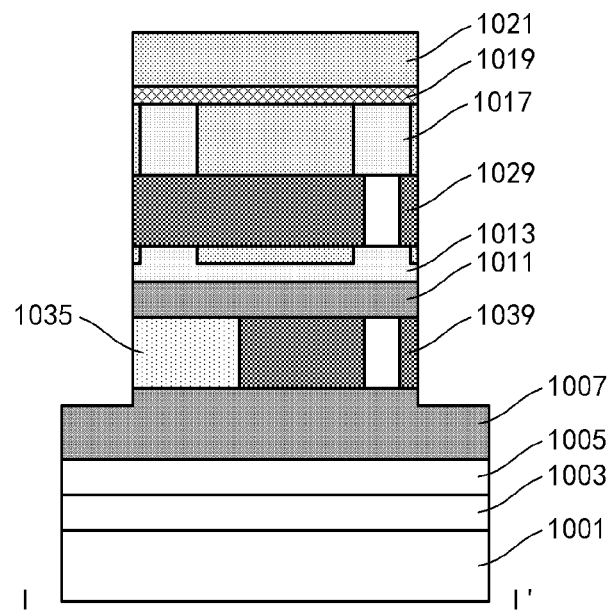
Figure 29A:
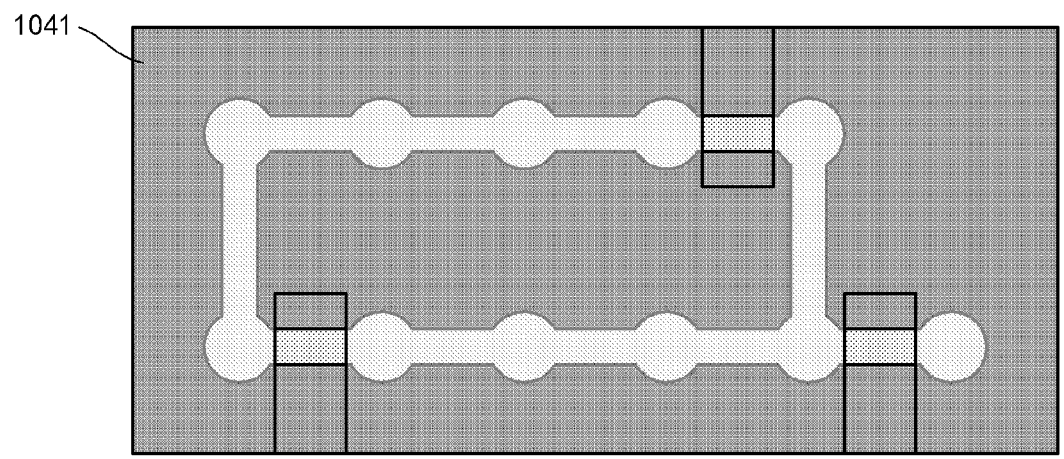
Figure 29B:
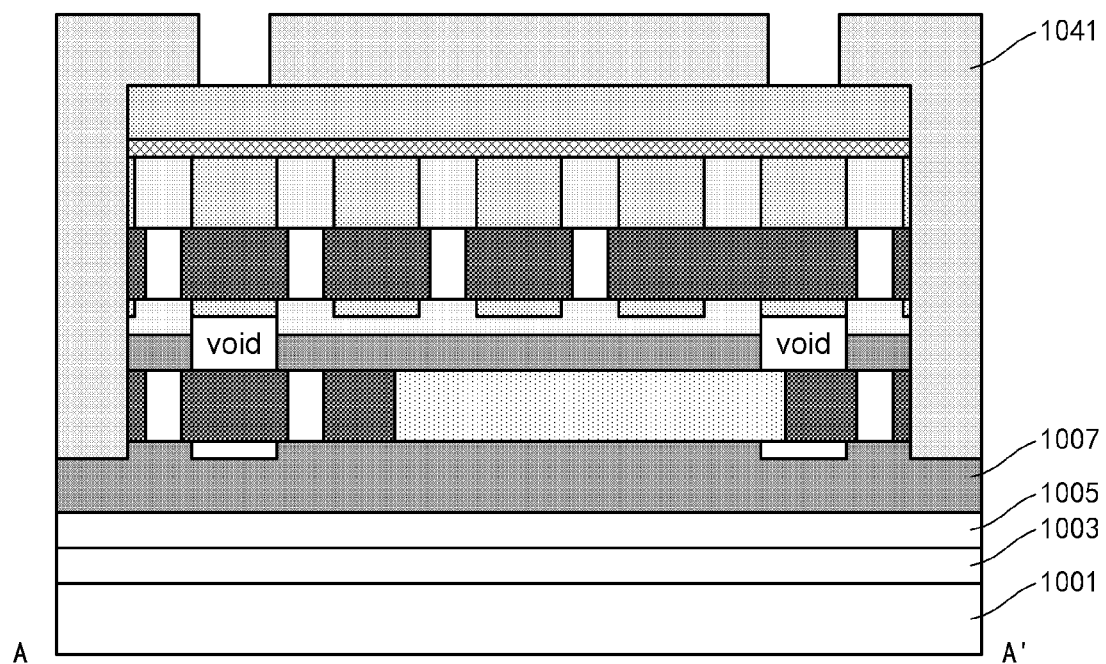
Figure 29C:
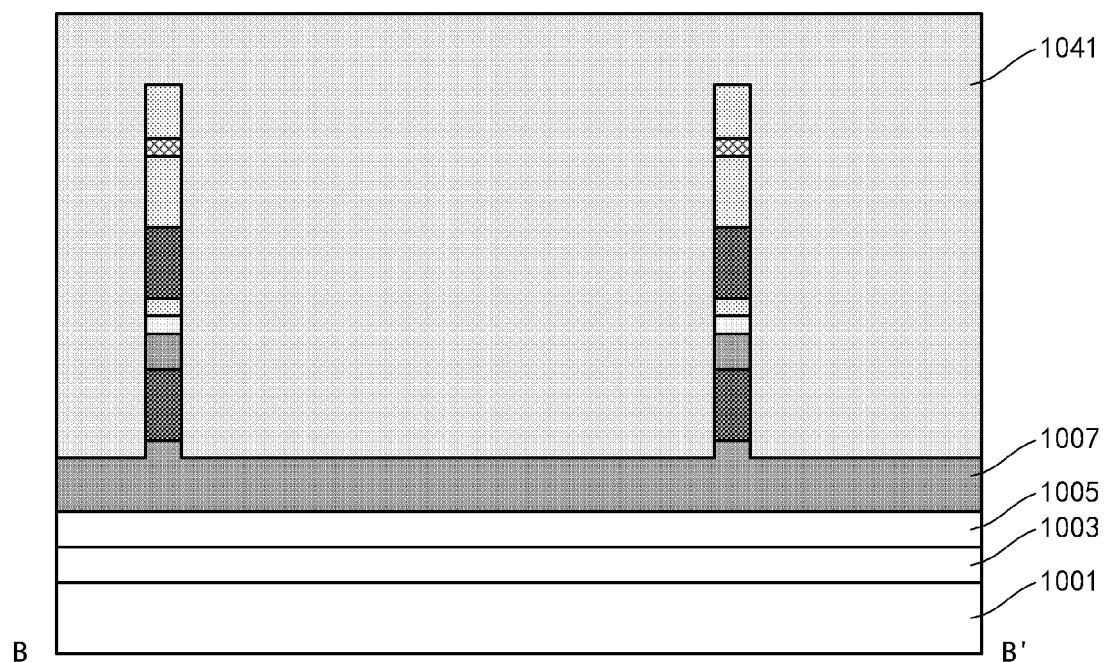
Figure 29D:
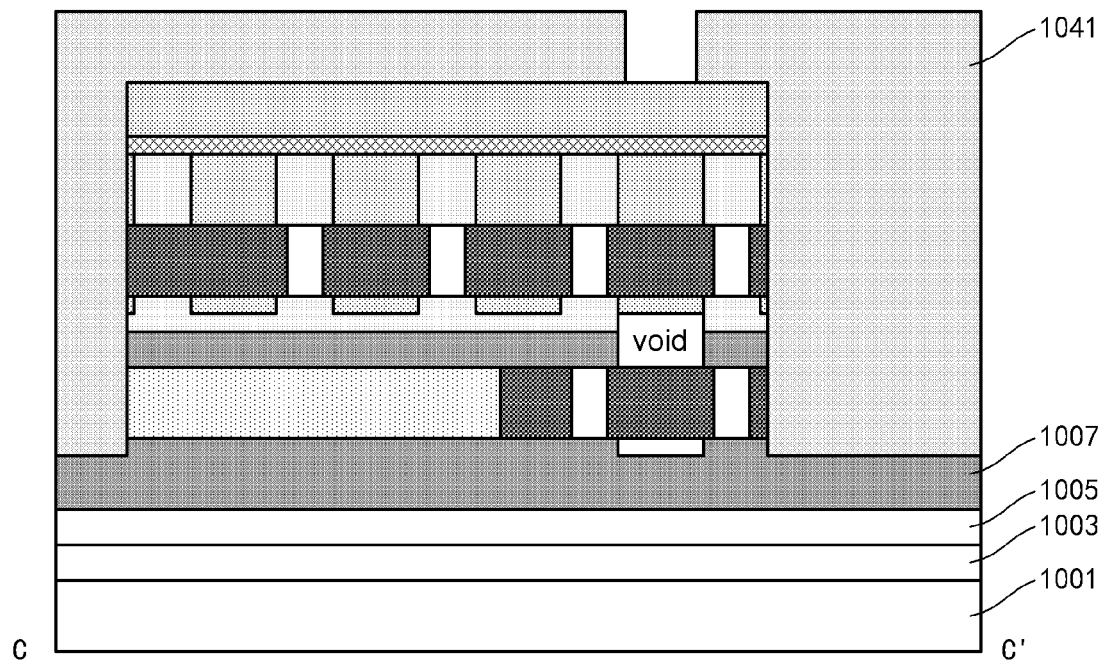
Figure 29E:
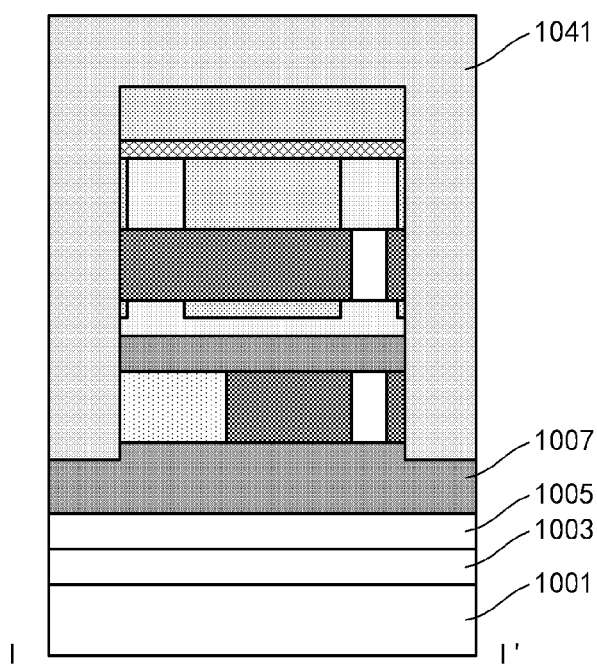

FIGS. 18(a), 18(b), and 18(c) (FIGS. 18(a), 18(b), and 18(c) are sectional views taken along line AA', line BB', and line CC' respectively) show a case of $\beta=1$ ($\alpha=1$ or 2). As described above in conjunction with FIG. 9(c), in this case, one column in the mask pattern may have four circular portions, and the other column in the mask pattern may have five circular portions. Accordingly, as shown in FIG. 18(a), in the cross section taken along line AA', there may be five nanowires in the channel layer 1009 in the lower layer and four nanowires in the channel layer 1015 in the upper layer (one nanowire corresponding to the contact plug WL-1, i.e., the second nanowire from the right, is removed). In addition, as shown in FIG. 18(*c*), in the cross section taken along line CC', there may be four nanowires in the channel layer 1009 in the lower layer and three nanowires in the channel layer 1015 in the upper layer (one nanowire corresponding to the contact plug WL-2, i.e., the leftmost nanowire, is removed).

As described above, for the case of β=2 shown in FIGS. 17(*a*), 17(*b*), and 17(*c*), there may be different configurations such as α=1, 2, or 3 or the like. The different configurations of α correspond to different numbers of nanowires in the channel layer in the lower layer. The number of the nanowires in the channel layer in the lower layer may be adjusted according to the different configurations of α.

For example, in a case of α=1, one p-type pull-up transistor may be formed using a single unit transistor. Therefore, in the lower layer, one column (the lower column in the top view) may have three nanowires (corresponding to the third interconnection structure V-1, the first pull-up transistor PU-1, and the contact plug to apply the power supply voltage $V_{DD}$ respectively) in the channel layer, and the other column (the upper column in the top view) may have two nanowires (corresponding to the fourth interconnection structure V-2 and the second pull-up transistor PU-2 respectively) in the channel layer. As shown in FIGS. 19(*a*), 19(*b*), 19(*c*), and 19(*d*) (FIGS. 19(*a*), 19(*b*), 19(*c*), and 19(*d*) are a top view, a sectional view taken along line AA', a sectional view taken along line BB', and a sectional view taken along line CC' respectively), photoresist 1033 may be formed on the above structure and may be patterned to expose nanowires in the channel layer which need to be removed (three nanowires on the left in the upper column and three nanometers in the middle in the lower column in the top view of FIG. 19(*a*)) while covering the remaining nanowires in the channel layer. The exposed nanowires in the channel layer may be removed by selective etching with the photoresist layer 1033 as an etching mask. Then, the photoresist 1033 may be removed.

Similarly, in a case of α=2, one p-type pull-up transistor may be formed using two unit transistors. Therefore, in the lower layer, one column (the lower column in the top view) may have four nanowires (corresponding to the third interconnection structure V-1, two unit transistors of the first pull-up transistor PU-1 and the contact plug to apply the power supply voltage $V_{DD}$ respectively) in the channel layer, and the other column (the upper column in the top view) may have three nanowires (corresponding to the fourth interconnection structure V-2 and two unit transistors of the second pull-up transistor PU-2 respectively) in the channel layer. As shown in FIGS. 20(*a*), 20(*b*), 20(*c*), and 20(*d*) (FIGS. 20(*a*), 20(*b*), 20(*c*), and 20(*d*) are a top view, a sectional view taken along line AA', a sectional view taken along line BB', and a sectional view taken along line CC' respectively), the nanowires in the channel layer may be selectively removed with photoresist 1033' which exposes two nanowires in the channel layer in each of the upper column and the lower column in the top view. Then, the photoresist 1033' may be removed.

Similarly, in a case of α=3, one p-type pull-up transistor may be formed using three unit transistors. Therefore, in the lower layer, one column (the lower column in the top view) may have five nanowires (corresponding to the third interconnection structure V-1, three unit transistors of the first pull-up transistor PU-1 and the contact plug to apply the power supply voltage $V_{DD}$ respectively) in the channel layer, and the other column (the upper column in the top view) may have four nanowires (corresponding to the fourth interconnection structure V-2 and three unit transistors of the second pull-up transistor PU-2 respectively) in the channel layer. As shown in FIGS. 21(*a*), 21(*b*), 21(*c*), and 21(*d*) (FIGS. 21(*a*), 21(*b*), 21(*c*), and 21(*d*) are a top view, a sectional view taken along line AA', a sectional view taken along line BB', and a sectional view taken along line CC' respectively), the nanowires in the channel layer may be selectively removed with photoresist 1033" which exposes one nanowire in the channel layer in each of the upper column and the lower column in the top view. Then, the photoresist 1033" may be removed.

In the above examples, the unit transistors which constitute the same pull-up or pull-down transistor may be defined using immediately adjacent circular portions in the mask pattern. However, the present disclosure is not limited thereto. Especially for the pull-up transistors in the lower layer, unit transistors thereof may be defined using circular portions in the mask pattern which are not immediately adjacent. This may be done by adjusting a pattern of the photoresist 1033' or 1033" described above.

Hereinafter, the case of β=2 and α=1 is described by way of example. It is apparent to those skilled in the art that techniques described below are also applicable to different configurations of α and β.

Similarly to the upper layer, a sacrificial gate may be also formed around the channel layer 1009 (which has been formed as the nanowires). In addition, in consideration of the electrical isolation between the gate stacks of the two p-type transistors in the lower layer and the electrical isolation between the gate stacks and the contact plug to apply the power supply voltage $V_{DD}$, a placeholder layer may be formed firstly. For example, as shown in FIGS. 22(*a*), 22(*b*), 22(*c*) and 22(*d*) (FIGS. 22(*a*), 22(*b*), 22(*c*) and 22(*d*) are sectional views taken along line AA', line BB', line CC' and line II' respectively), a placeholder layer 1035 may be formed in a recess which is formed by the respective nanowires in the channel layer 1009 with respect to the periphery of the hard mask. For example, the placeholder layer 1035 may comprise a material having etching selectivity desired (with respect to, for example, the sacrificial gate 1029, the placeholder layer 1031, or the like), for example, oxide or a low-k dielectric. The placeholder layer 1035 may be formed by deposition and then back-etching, similarly to the process of forming the sacrificial gate 1029 or the placeholder layer 1031. In a case where the placeholder layer 1035 comprises oxide, the oxide layer 1023 in the hard mask may be removed during the back-etching process.

Next, the placeholder layer 1035 may be patterned to leave a space for forming the gate stacks of the p-type transistors. For example, as shown in FIGS. 23(*a*), 23(*b*), 23(*c*), 23(*d*), and 23(*e*) (FIGS. 23(*a*), 23(*b*), 23(*c*), 23(*d*), and 23(*e*) are a top view, a sectional view taken along line AA', a sectional view taken along line BB', a sectional view taken along line CC', and a sectional view taken along line II' respectively), photoresist 1037 may be formed on the above structure and patterned to expose regions where the gate stacks of the p-type transistors need to be formed. Specifically, in this example, as shown in the top view of FIG. 23(*a*), in the lower column, gate stacks may be formed around peripheries of two nanowires (corresponding to the third interconnection structure V-1 and the first pull-up transistor PU-1 respectively) on the left in the channel layer; and in the upper column, gate stacks may be formed around peripheries of two nanowires (corresponding to the fourth interconnection structure V-2 and the second pull-up transistor PU-2 respectively) on the right in the channel layer. In addition, in this example, the photoresist 1037 also exposes a region where the rightmost nanowire in the channel layer in the lower column is located. This is for the purpose that the nanowires in the channel layer at positions where the third interconnection structure, the fourth interconnection structure and the contact plug to apply the power supply voltage $V_{DD}$ are located may be silicided simultaneously in subsequent processes. Certainly, the rightmost nanowire in the channel layer may not be exposed here, and instead may be processed separately. The placeholder layer 1035 may be selectively etched with the photoresist 1037 as an etching mask.

FIGS. 24(a), 24(b), 24(c), 24(d) and 24(e) (FIGS. 24(a), 24(b), 24(c), 24(d) and 24(e) are a top view, a sectional view taken along line AA', a sectional view taken along line BB', a sectional view taken along line CC', and a sectional view taken along line II' respectively) show an example of patterning the placeholder layer 1035 in a case of $\beta=2$ and $\alpha=2$. In this example, the process may be carried out likewise, except that photoresist 1037' has a pattern different from that of the photoresist 1037. Specifically, in this case, as shown in the top view of FIG. 24(a), in the lower column, gate stacks may be formed around peripheries of three nanowires (corresponding to the third interconnection structure V-1 and two unit transistors of the first pull-up transistor PU-1 respectively) on the left in the channel layer; and in the upper column, gate stacks may be formed around peripheries of three nanowires (corresponding to the fourth interconnection structure V-2 and two unit transistors of the second pull-up transistor PU-2 respectively) on the right in channel layer.

FIGS. 25(a), 25(b), 25(c), 25(d) and 25(e) (FIGS. 25(a), 25(b), 25(c), 25(d) and 25(e) are a top view, a sectional view taken along line AA', a sectional view taken along line BB', a sectional view taken along line CC', and a sectional view taken along line II' respectively) show an example of patterning the placeholder layer 1035 in a case of $\beta=2$ and $\alpha=3$. In this example, the process may be carried out likewise, except that photoresist 1037" has a pattern different from that of the photoresist 1037. Specifically, in this case, as shown in the top view of FIG. 25(a), in the lower column, gate stacks may be formed around peripheries of four nanowires (corresponding to the third interconnection structure V-1 and three unit transistors of the first pull-up transistor PU-1 respectively) on the left in the channel layer; and in the upper column, gate stacks may be formed around peripheries of four nanowires (corresponding to the fourth interconnection structure V-2 and three unit transistors of the second pull-up transistor PU-2 respectively) on the right in channel layer.

FIGS. 26(a), 26(b), 26(c), 26(d) and 26(e) (FIGS. 26(a), 26(b), 26(c), 26(d) and 26(e) are a top view, a sectional view taken along line AA', a sectional view taken along line BB', a sectional view taken along line CC', and a sectional view taken along line II' respectively) show an example of patterning the placeholder layer 1035 in a case of $\beta=1$ and $\alpha=1$. In this example, the process may be carried out likewise, except that photoresist 1037''' has a pattern different from that of the photoresist 1037. Specifically, in this case, as shown in the top view of FIG. 26(a), in the lower column, gate stacks may be formed around peripheries of two nanowires (corresponding to the third interconnection structure V-1 and the first pull-up transistor PU-1 respectively) on the left in the channel layer; and in the upper column, gate stacks may be formed around peripheries of two nanowires (corresponding to the fourth interconnection structure V-2 and the second pull-up transistor PU-2 respectively) on the right in channel layer.

FIGS. 27(a), 27(b), 27(c), 27(d) and 27(e) (FIGS. 27(a), 27(b), 27(c), 27(d) and 27(e) are a top view, a sectional view taken along line AA', a sectional view taken along line BB', a sectional view taken along line CC', and a sectional view taken along line II' respectively) show an example of patterning the placeholder layer 1035 in a case of $\beta=1$ and $\alpha=2$. In this example, the process may be carried out likewise, except that photoresist 1037"" has a pattern different from that of the photoresist 1037. Specifically, in this case, as shown in the top view of FIG. 27(a), in the lower column, gate stacks may be formed around peripheries of three nanowires (corresponding to the third interconnection structure V-1 and two unit transistors of the first pull-up transistor PU-1 respectively) on the left in the channel layer; and in the upper column, gate stacks may be formed around peripheries of three nanowires (corresponding to the fourth interconnection structure V-2 and two unit transistors of the second pull-up transistor PU-2 respectively) on the right in channel layer.

Hereinafter, the case of $\beta=2$ and $\alpha=1$ is described by way of example. It is apparent to those skilled in the art that techniques described below are also applicable to different configurations of $\alpha$ and $\beta$.

Then, a sacrificial gate may be formed around the channel layer 1009 (which has been formed as the nanowires). For example, as shown in FIGS. 28(a), 28(b), 28(c), and 28(d) (FIGS. 28(a), 28(b), 28(c), and 28(d) are sectional views taken along line AA', line BB', line CC', and line II' respectively), a sacrificial gate 1039 may be formed in the recess (in which the placeholder layer 1035 has been formed locally) which is formed by the respective nanowires in the channel layer 1009 with respect to the periphery of the hard mask. The sacrificial gate 1039 may be formed by deposition and then back-etching, which is similar to the process of forming the sacrificial gate 1029. The sacrificial gate 1039 may comprise a material having etching selectivity desired (with respect to, for example, the placeholder layers 1031 and 1035), for example, the same oxynitride as that of the sacrificial gate 1029.

In the above example, the placeholder layer 1035 is formed firstly, and then the sacrificial gate 1039 is formed. However, the present disclosure is not limited thereto. For example, it is also possible that the sacrificial gate 1039 is formed before the placeholder layer 1035.

In addition, in this example, the sacrificial gate 1039 in the lower layer is patterned before the sacrificial gate 1039 is subjected to the replacement gate process. This is because it is not easy to pattern the gate stacks in the lower layer after the replacement gate process. For the sacrificial gate 1029 in the upper layer, it may be patterned after the replacement gate process to achieve appropriate electrical isolation. Alternatively, similarly to the sacrificial gate 1039 in the lower layer, the sacrificial gate 1029 in the upper layer may also be patterned before the replacement gate process. In this case, similarly to the process of forming the sacrificial gate 1039 in the lower layer, a placeholder layer may be formed firstly and then patterned before the sacrificial gate 1029 is formed, and then the sacrificial gate 1029 may be formed.

Next, the source/drain layers in the lower layer may be similarly separated.

It is to be noted that in this example, it is not necessary to divide the first source/drain layer 1013 of the n-type transistors and the second source/drain layer 1011 of the p-type transistors into separated portions for the respective transistors because they may then be used to form the first interconnection structure and the second interconnection structure.

The first source/drain layer 1013 for the n-type transistors and the second source/drain layer 1011 for the p-type transistors may be patterned according to a layout of the first interconnection structure and the second interconnection structure. For example, as shown in FIGS. 29(*a*), 29(*b*), 29(*c*), 29(*d*) and 29(*e*) (FIGS. 29(*a*), 29(*b*), 29(*c*), 29(*d*) and 29(*e*) are a top view, a sectional view taken along line AA', a sectional view taken along line BB', a sectional view taken along line CC', and a sectional view taken along line II' respectively), photoresist 1041 may be formed on the above structure. The photoresist 1041 may be patterned to expose a region for isolation between the first interconnection structure and the second interconnection structure and a region for isolation between the first and second interconnection structures and the contact plug to apply the power supply voltage $V_{DD}$. Then, the first source/drain layer 1013 for the n-type transistors and the second source/drain layer 1011 for the p-type transistors may be selectively etched by, for example, ALE with the photoresist 1041 as an etching mask, to be cut off. Thus, in the top view, the first source/drain layer 1013 for the n-type transistors and the second source/drain layer 1011 for the p-type transistors may form two L-shapes which are opposed to each other and spaced apart from each other. The first source/drain layer 1007 for the p-type transistors may also be affected by the etching, so that undercuts may be formed.

Figure 30A:
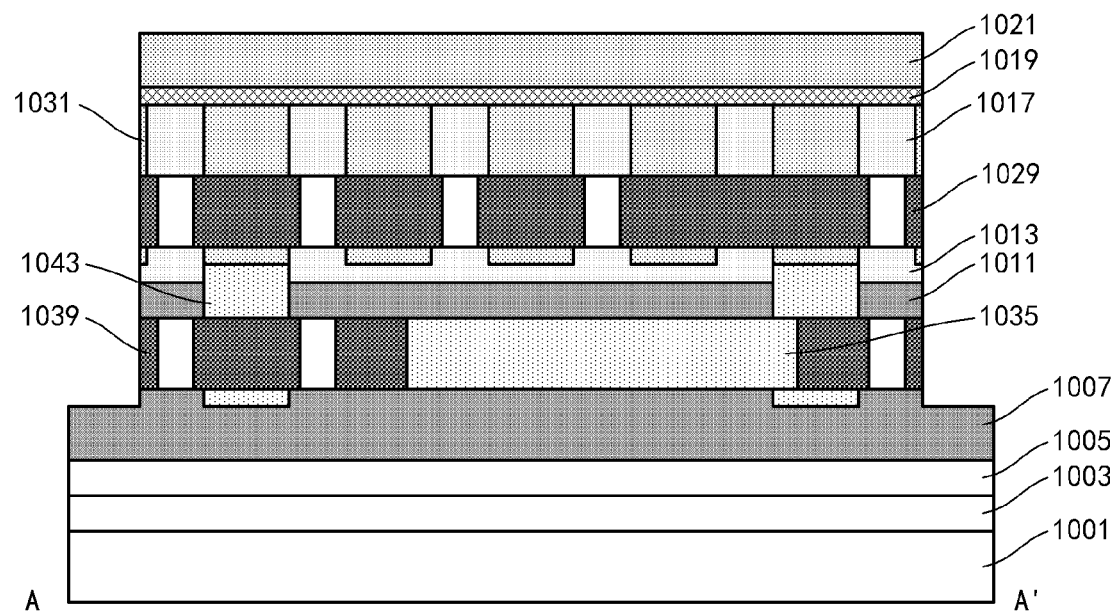
Figure 30B:
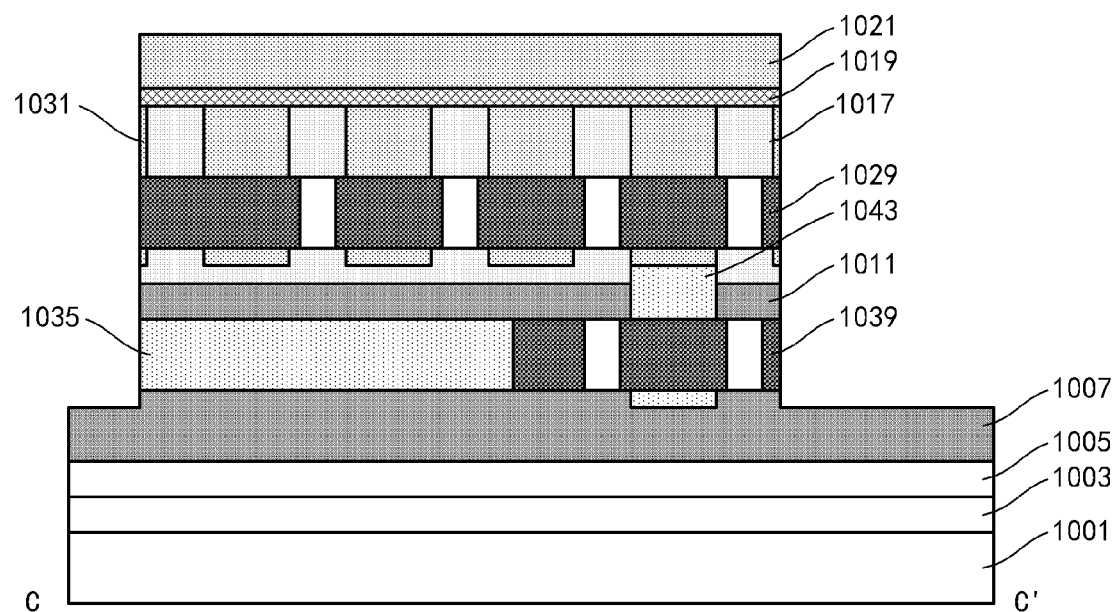
Figure 31A:
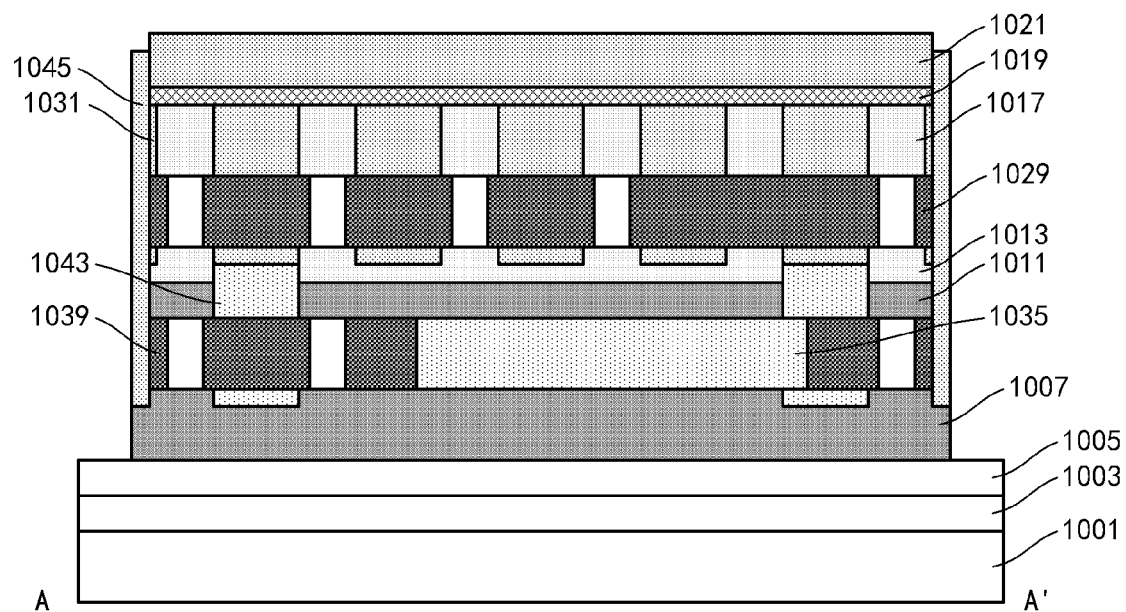
Figure 31B:
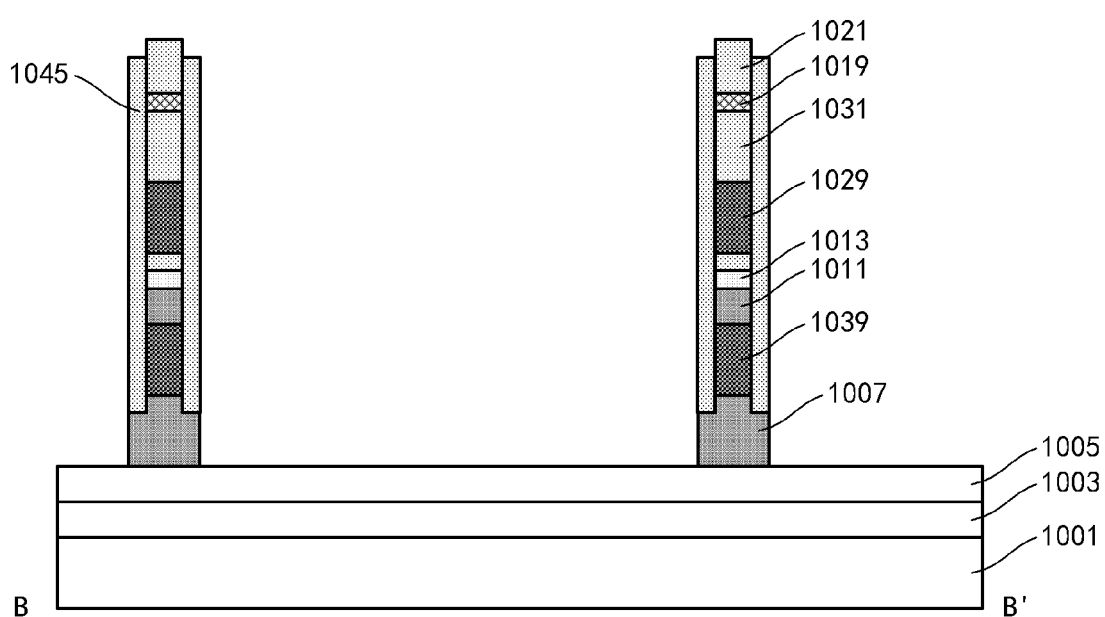
Figure 31C:
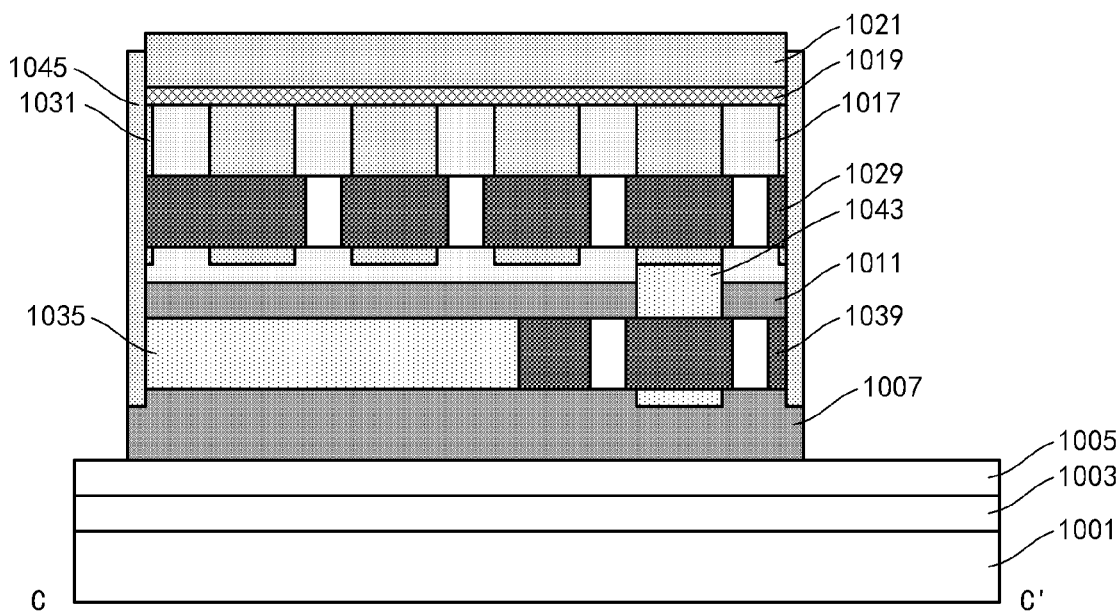
Figure 31D:
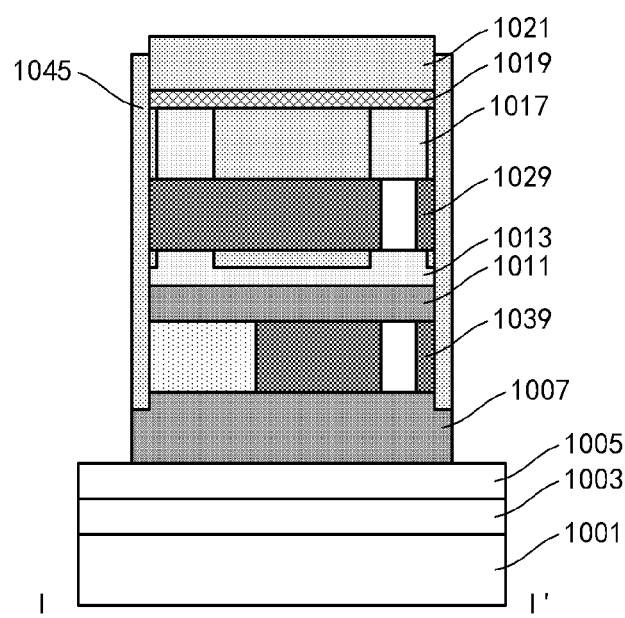
Figure 32A:
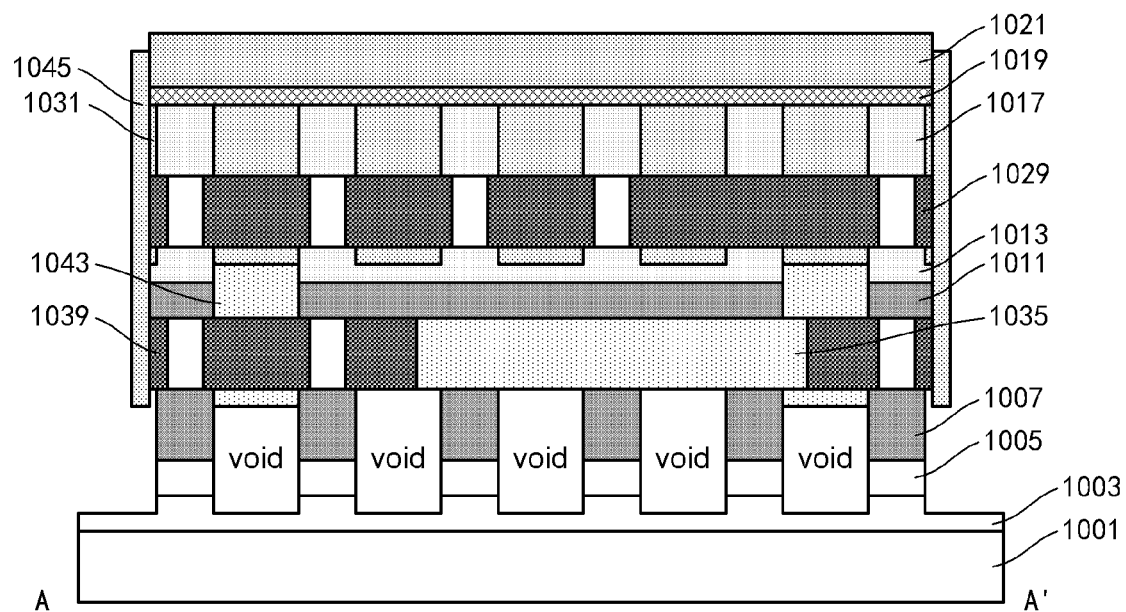
Figure 32B:
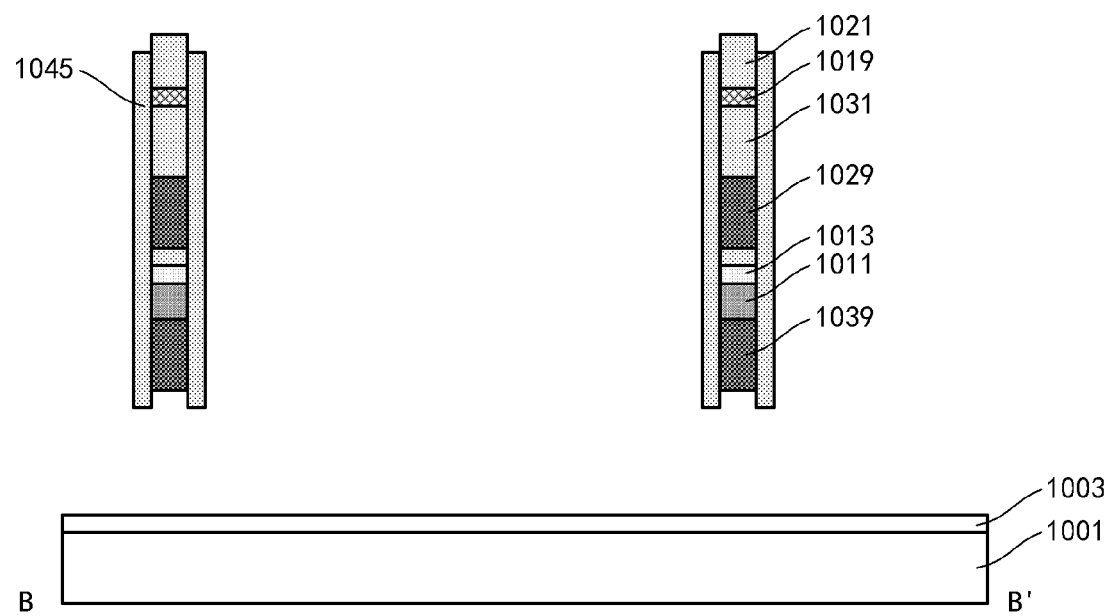
Figure 32C:
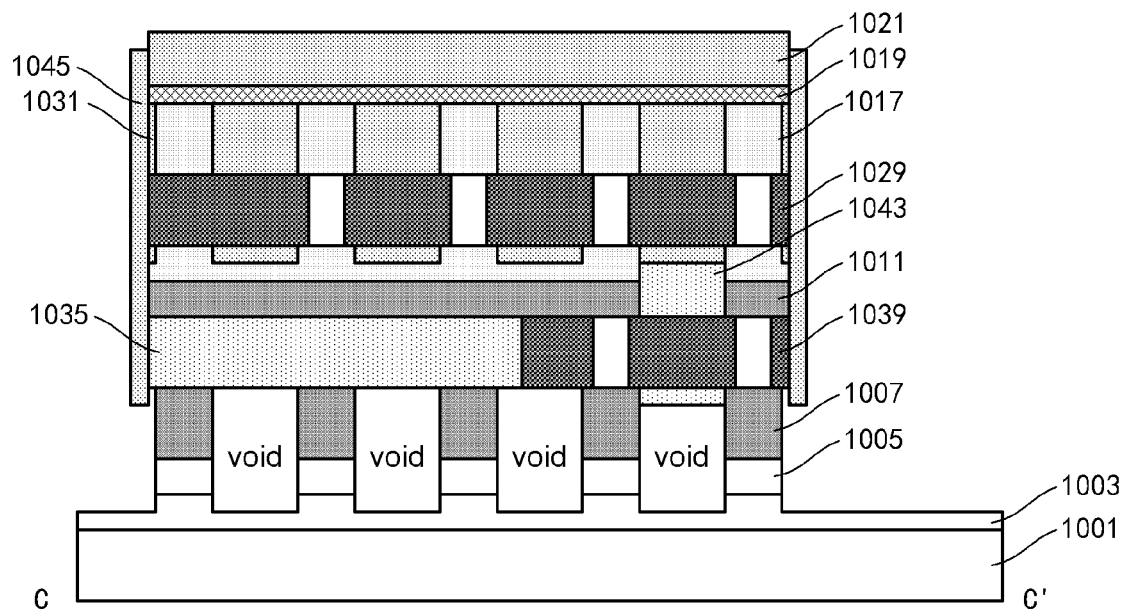
Figure 32D:
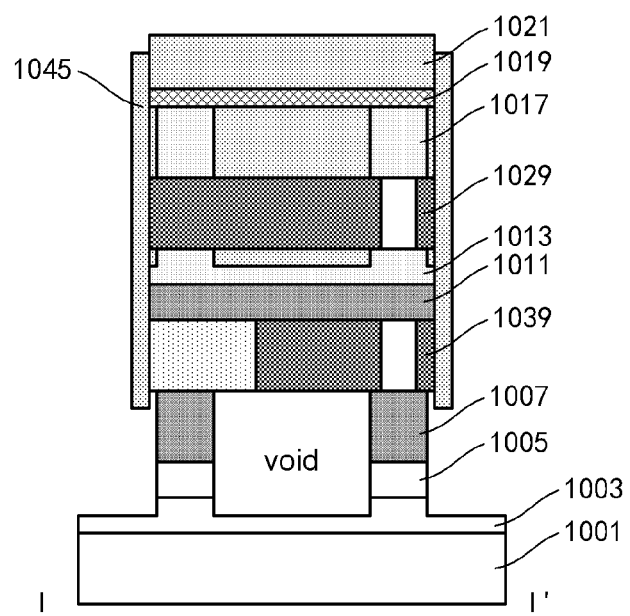
Figure 33A:
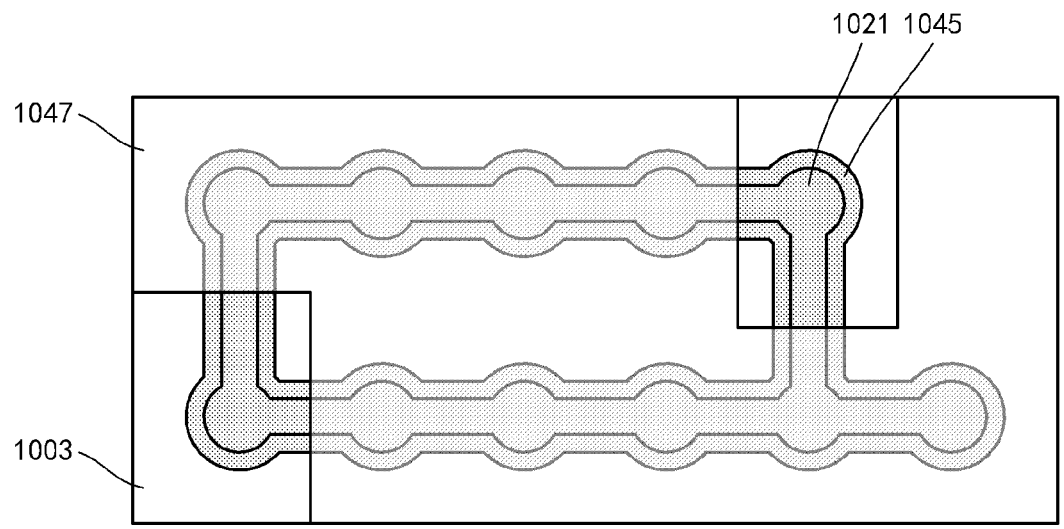
Figure 33B:
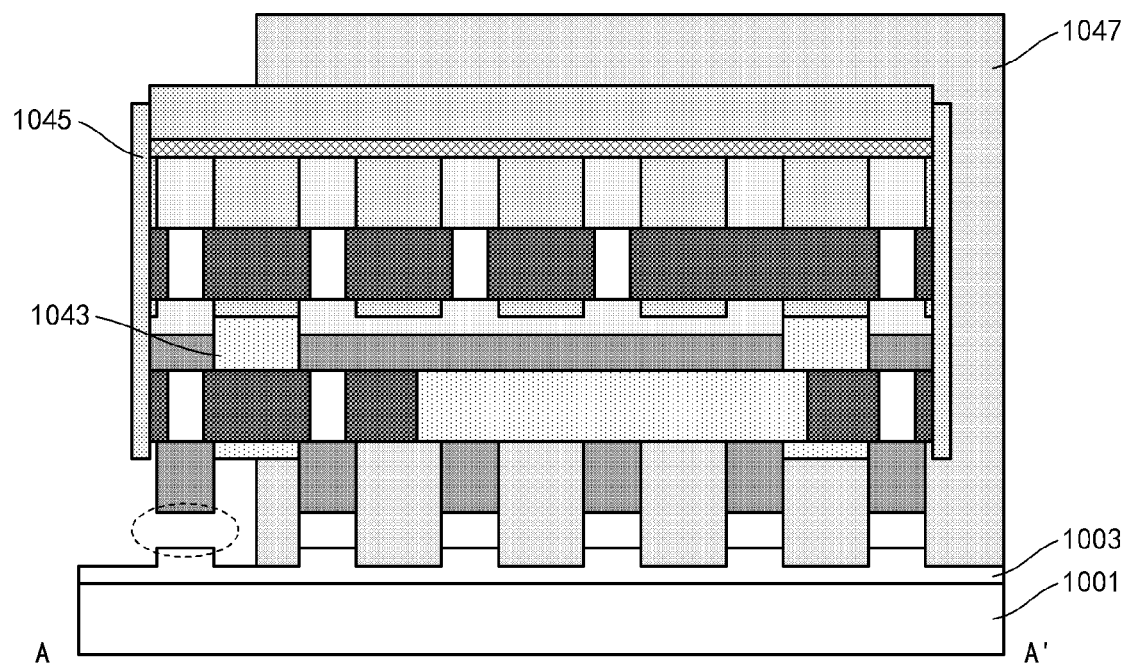
Figure 33C:
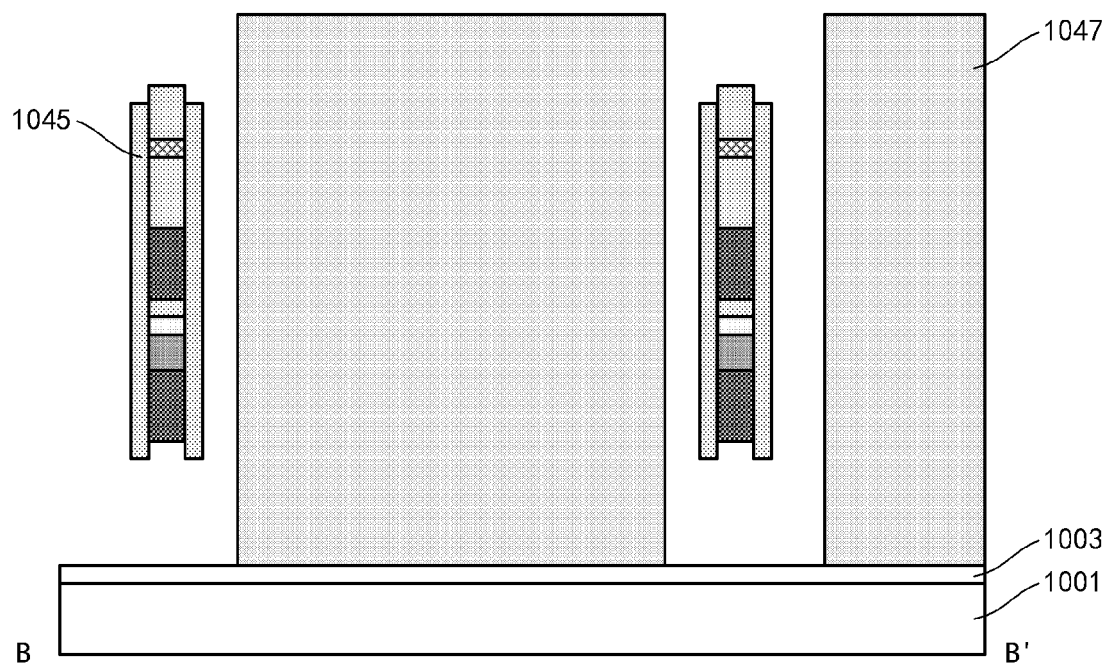
Figure 33D:
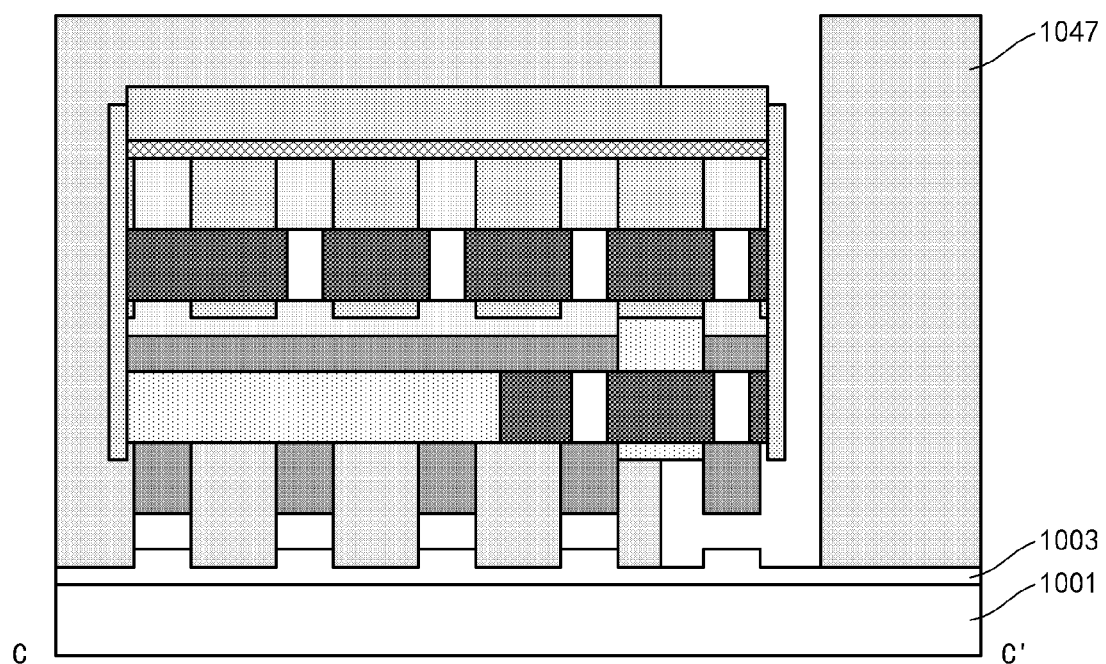
Figure 33E:
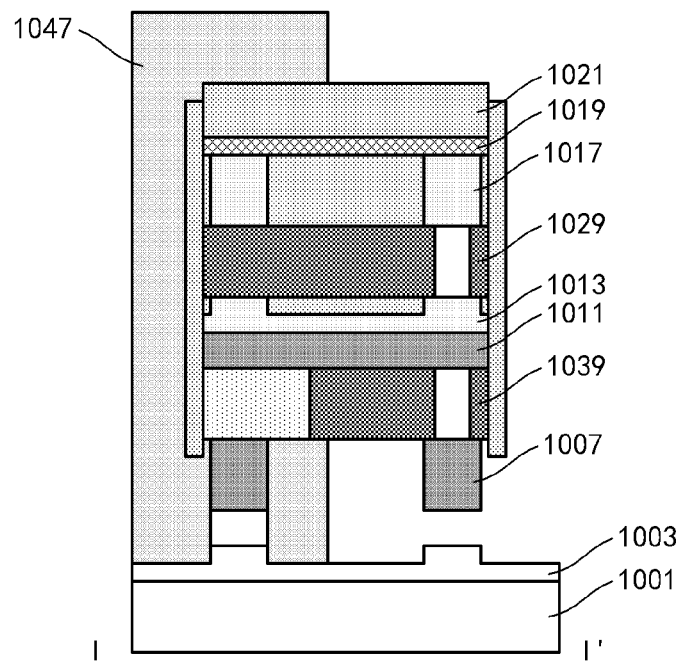
Figure 34A:
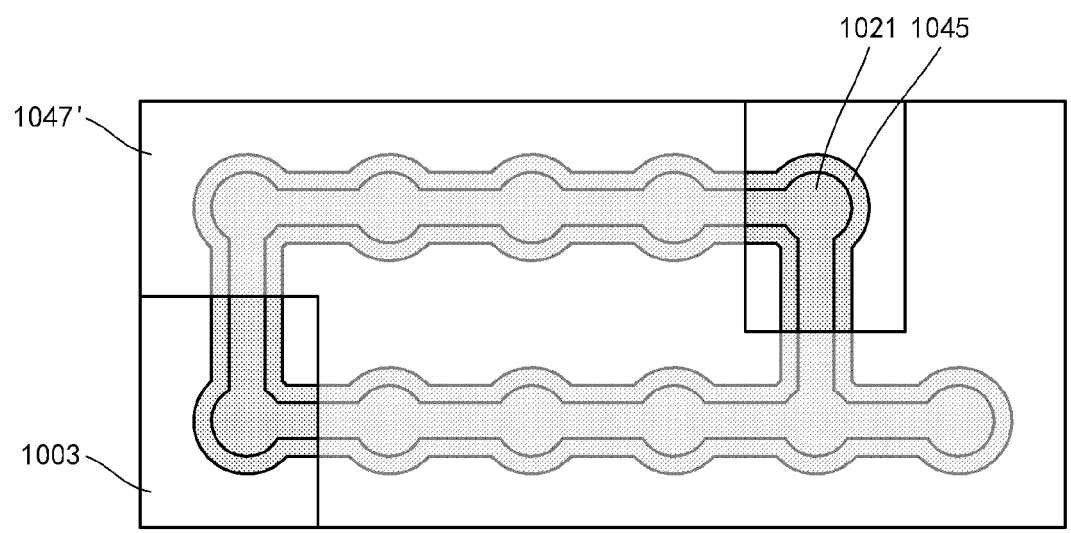
Figure 34B:
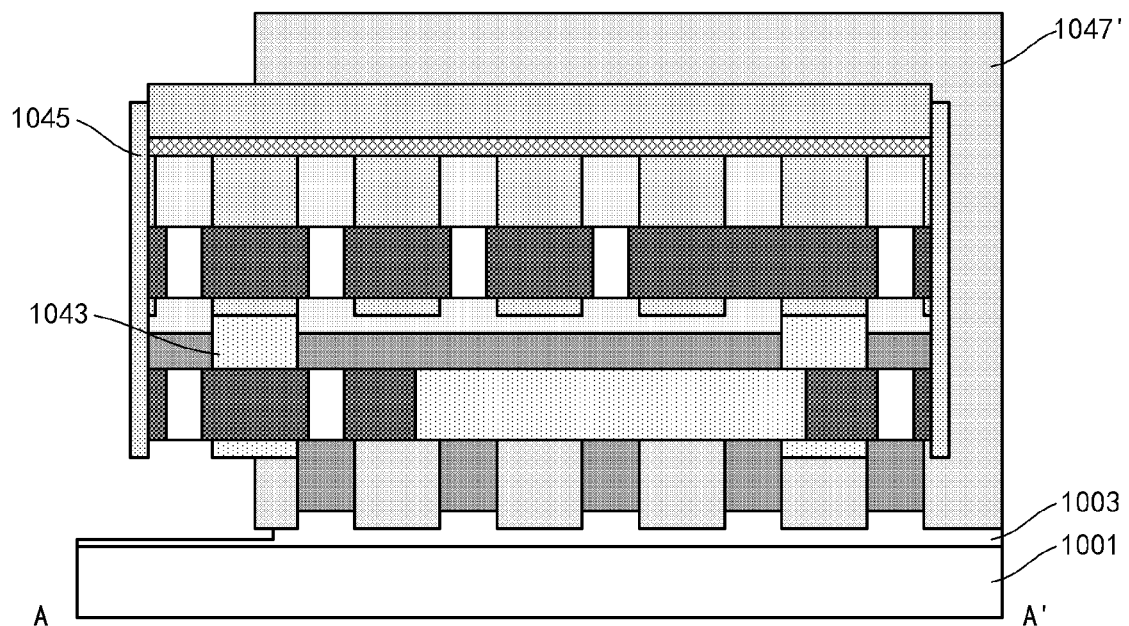
Figure 34C:
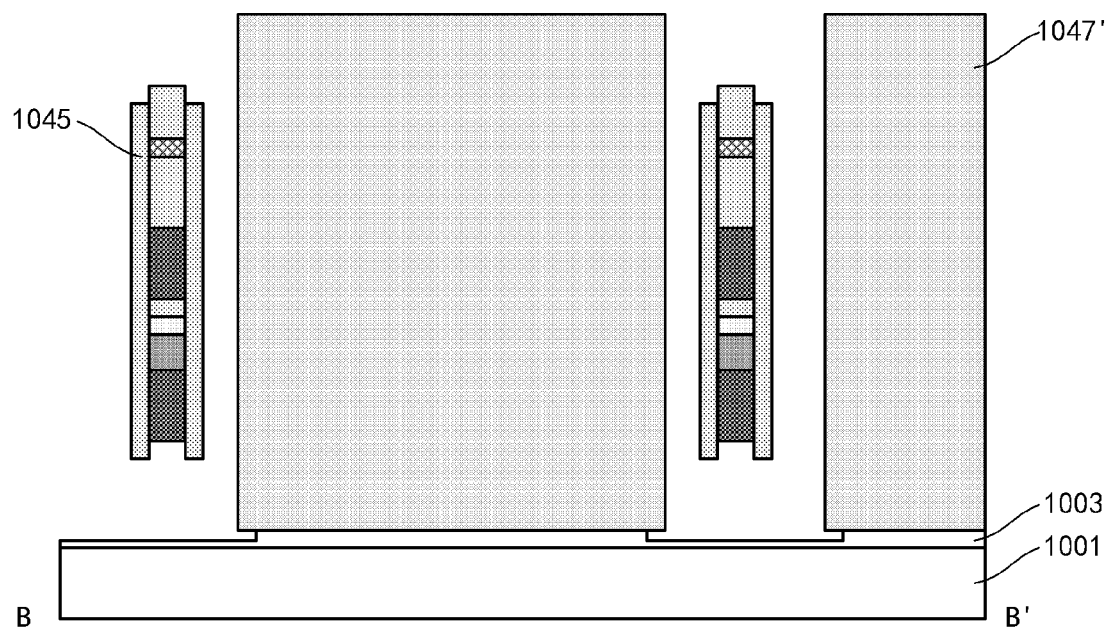
Figure 34D:
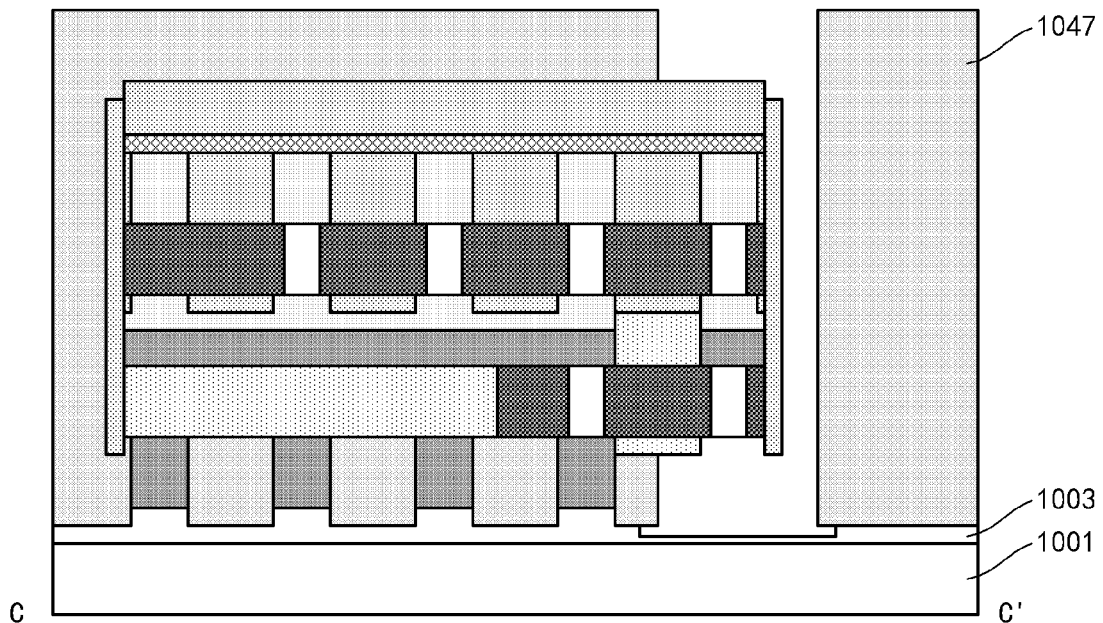
Figure 34E:
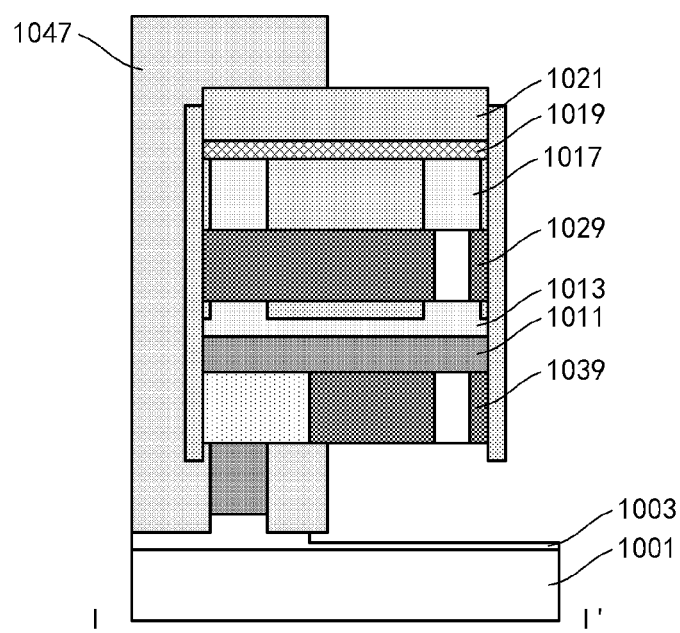
Figure 35A:
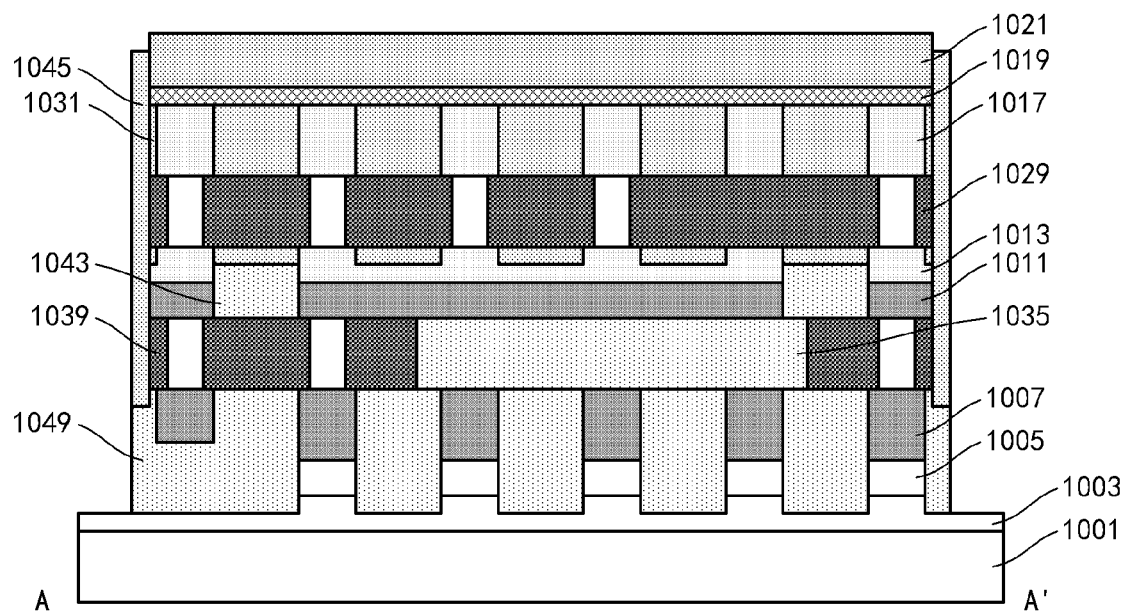
Figure 35B:
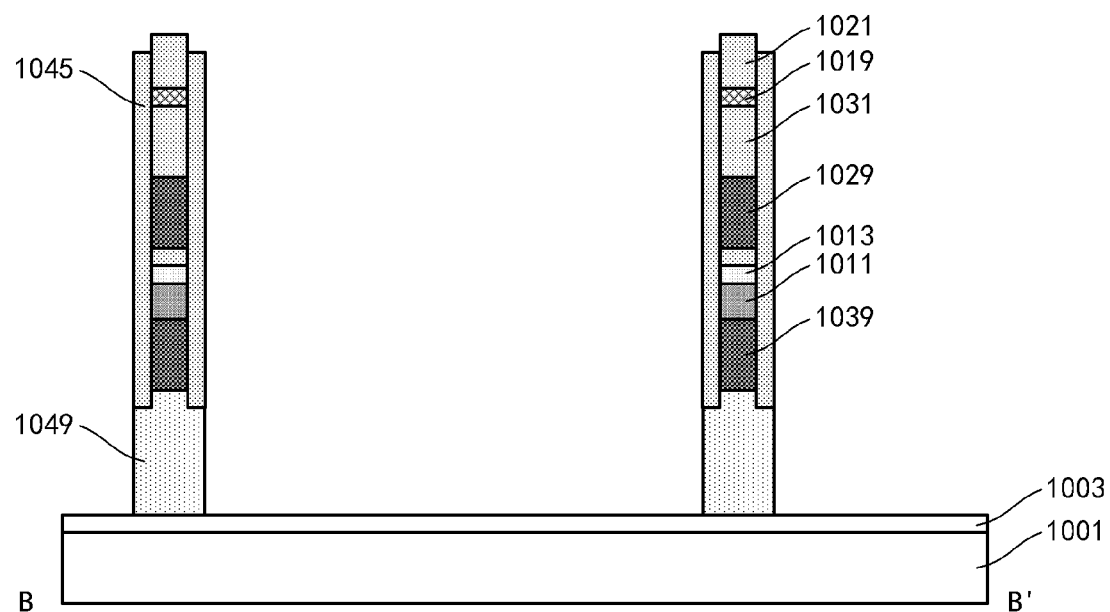
Figure 35C:
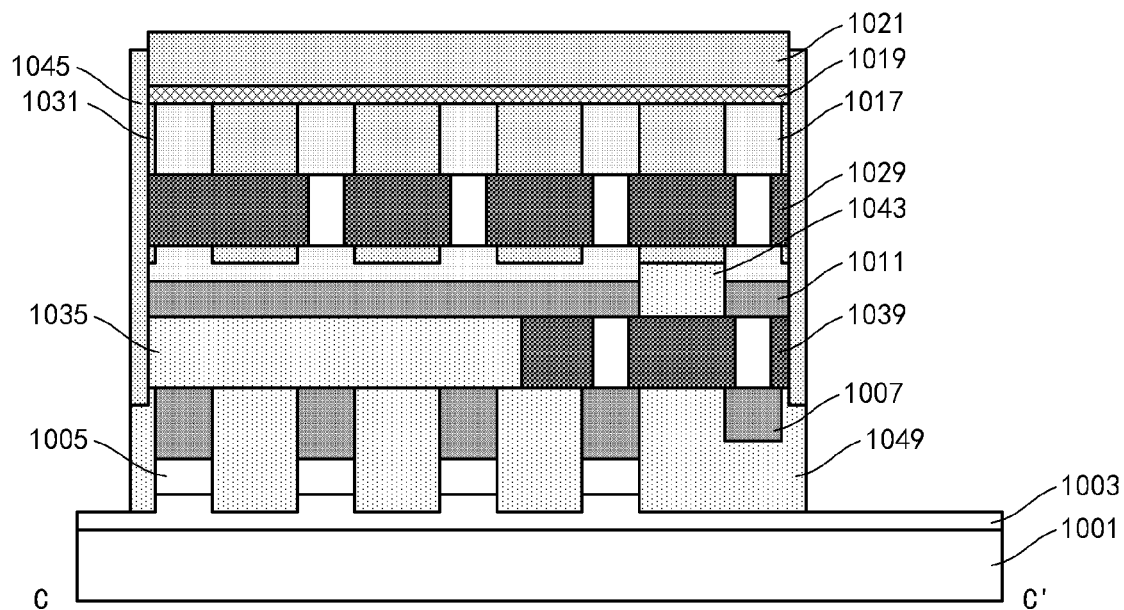
Figure 35D:
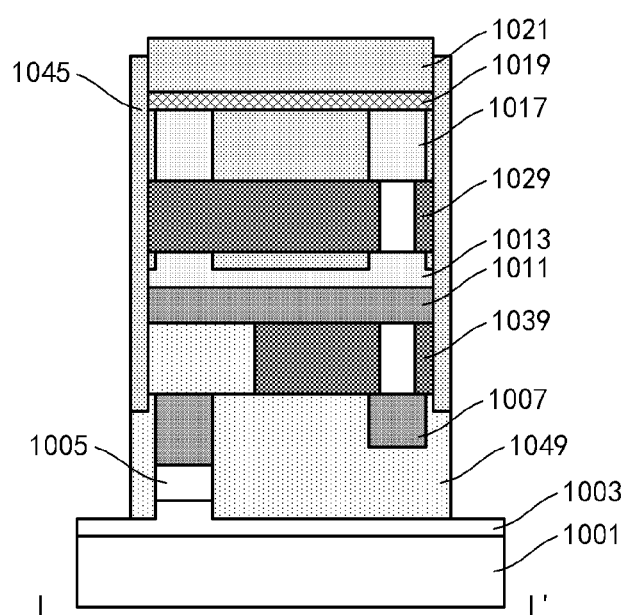
Figure 36A:
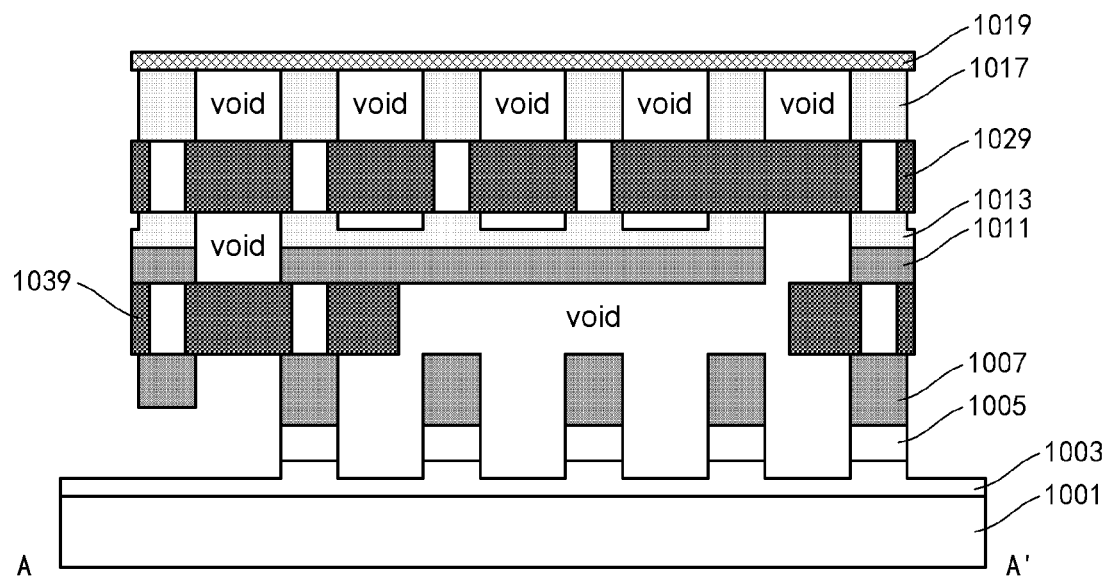
Figure 36B:
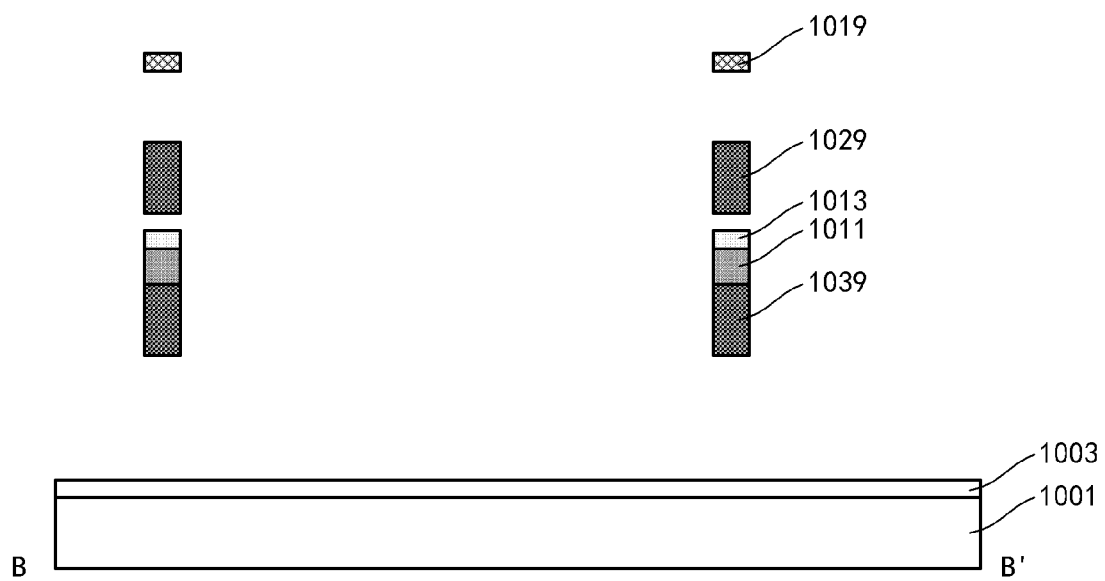
Figure 36C:
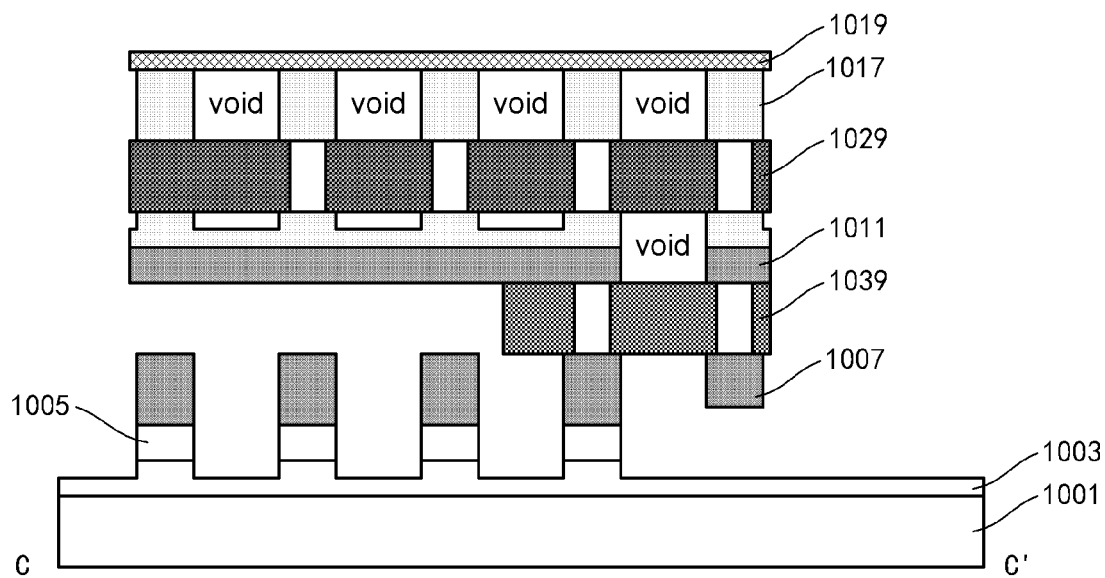
Figure 36D:
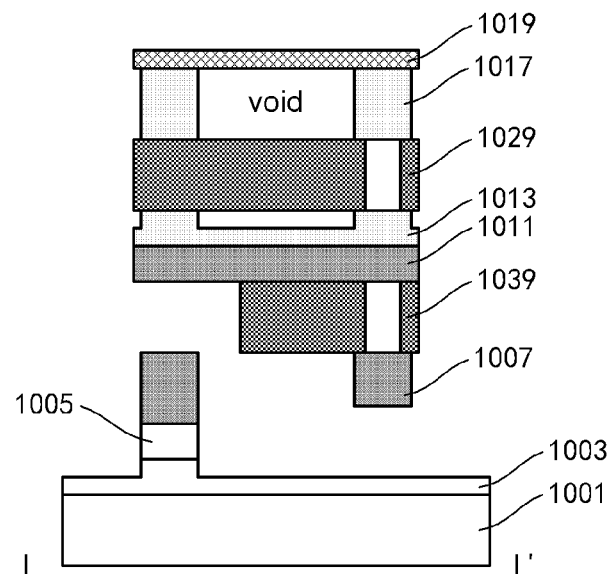
Figure 37A:
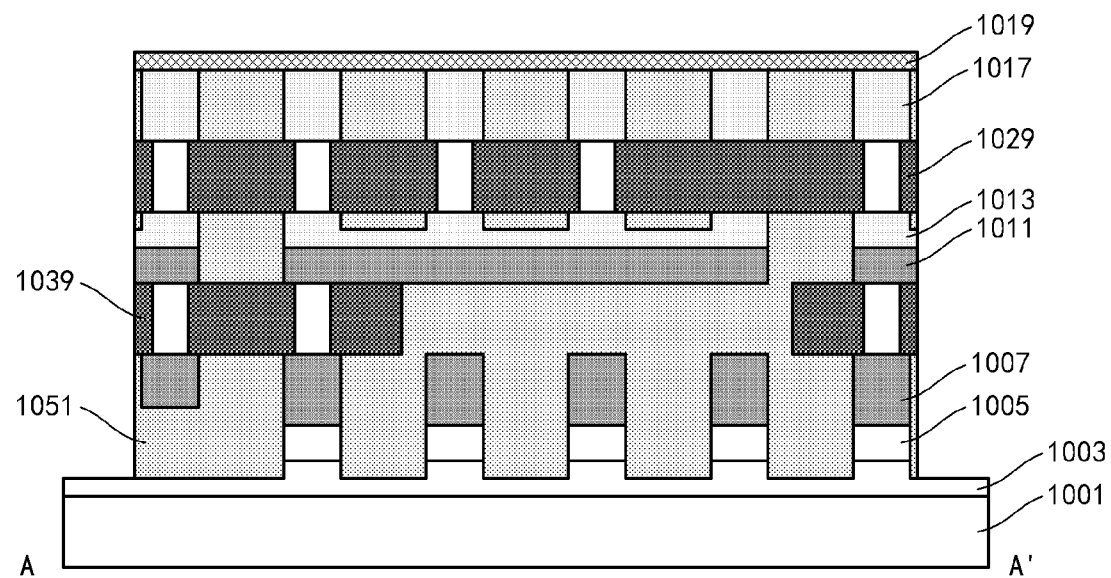
Figure 37B:
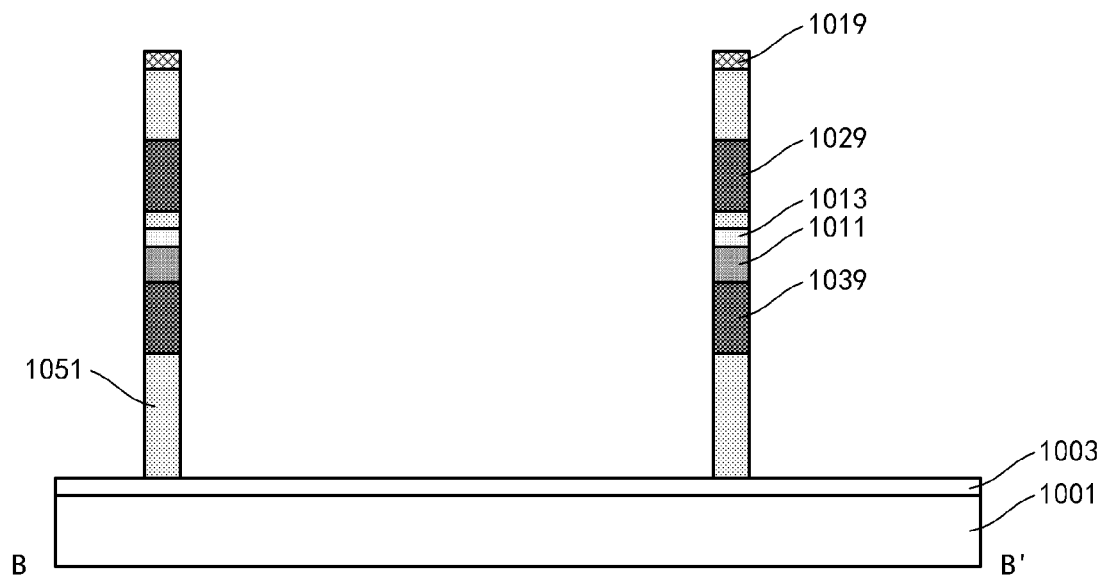
Figure 37C:
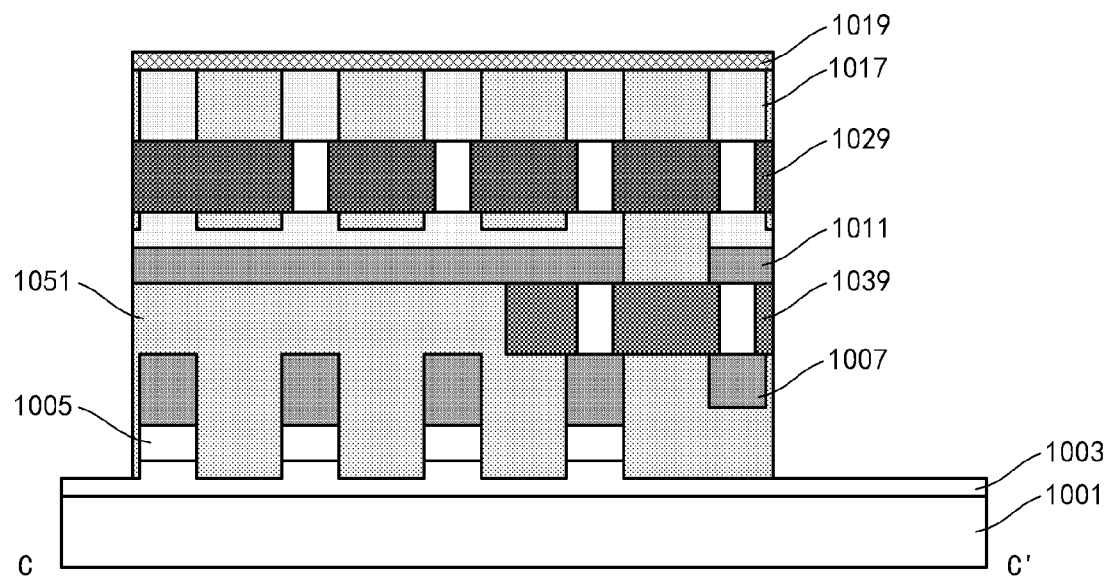
Figure 37D:
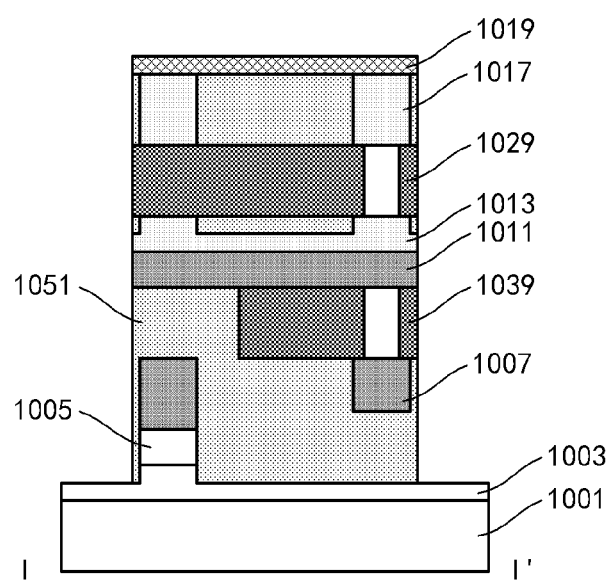
Figure 38A:
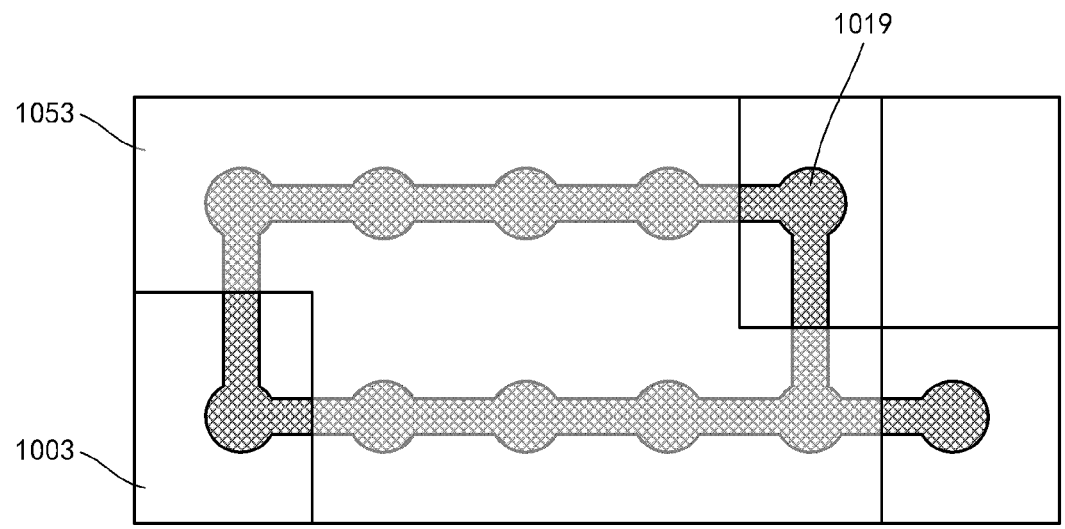
Figure 38B:
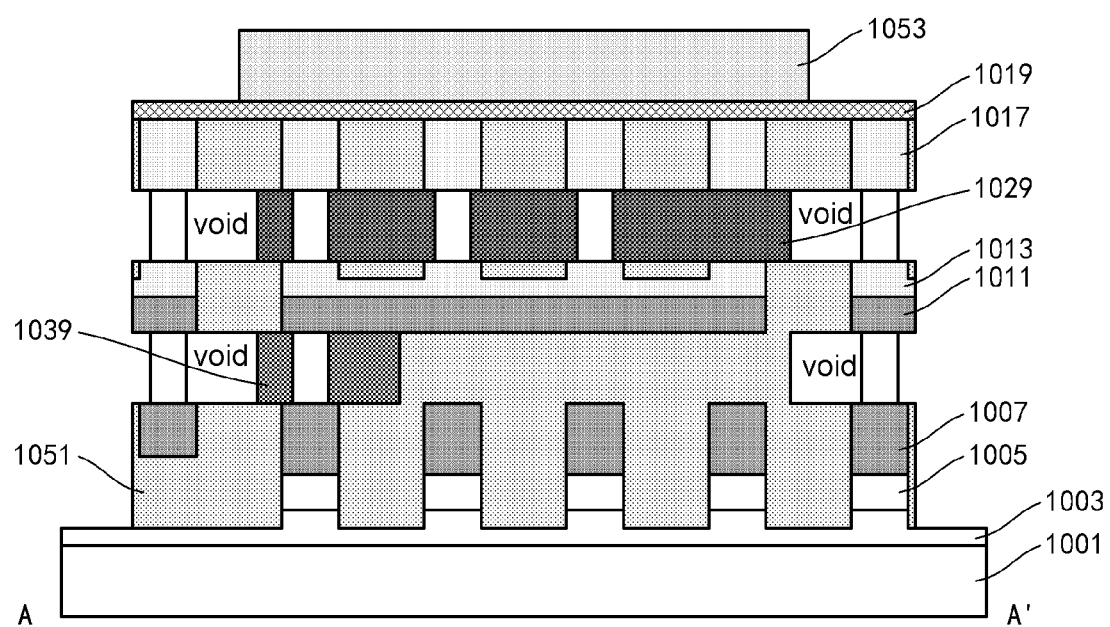
Figure 38C:
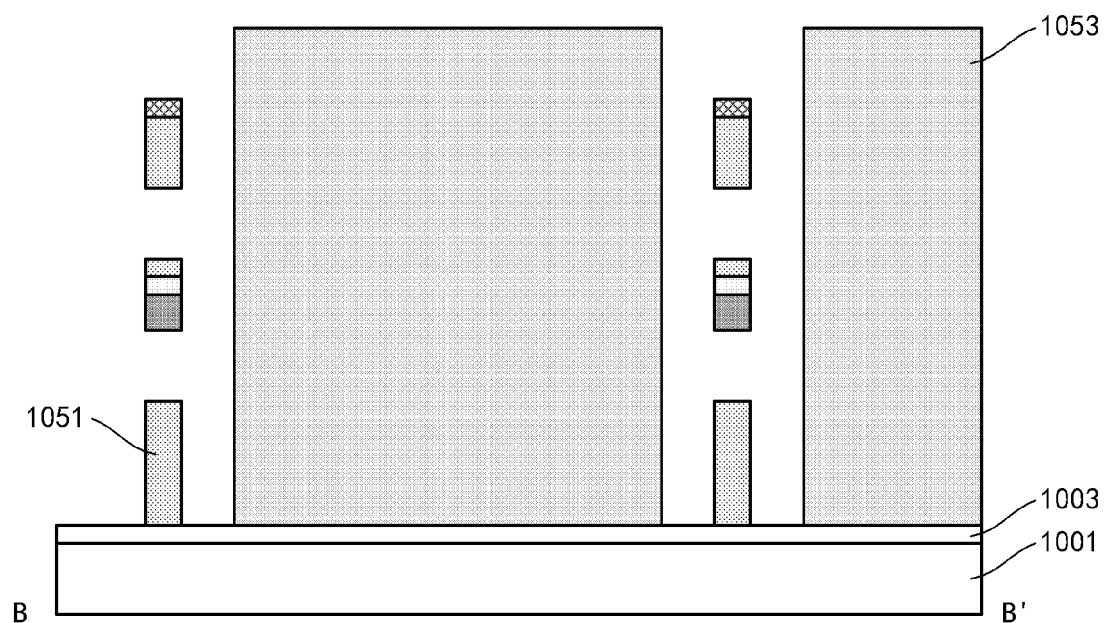
Figure 38D:
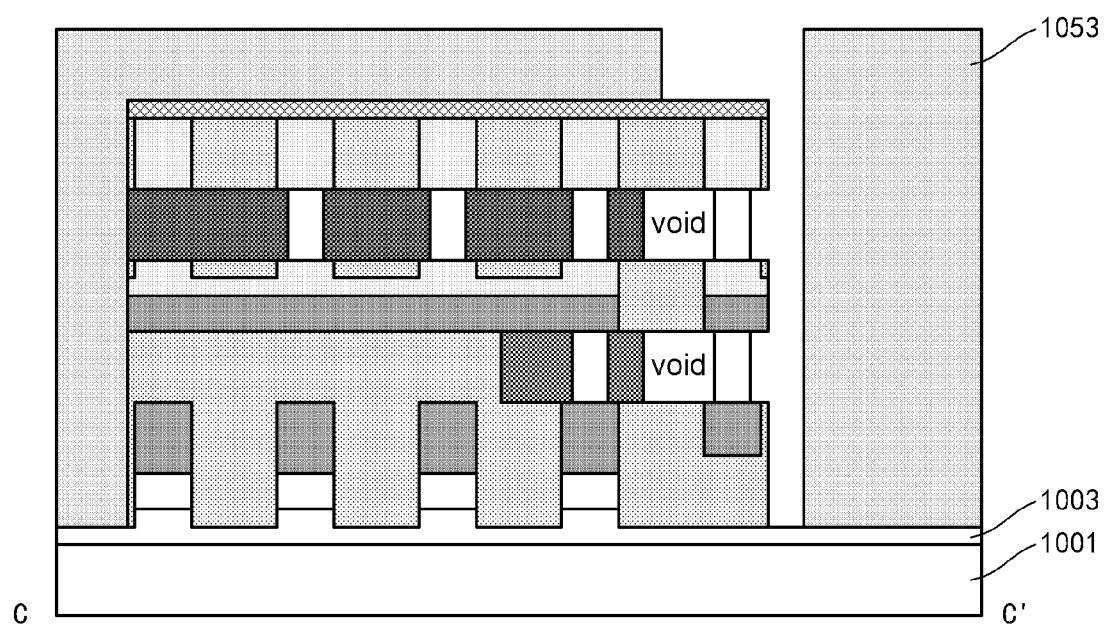
Figure 38E:
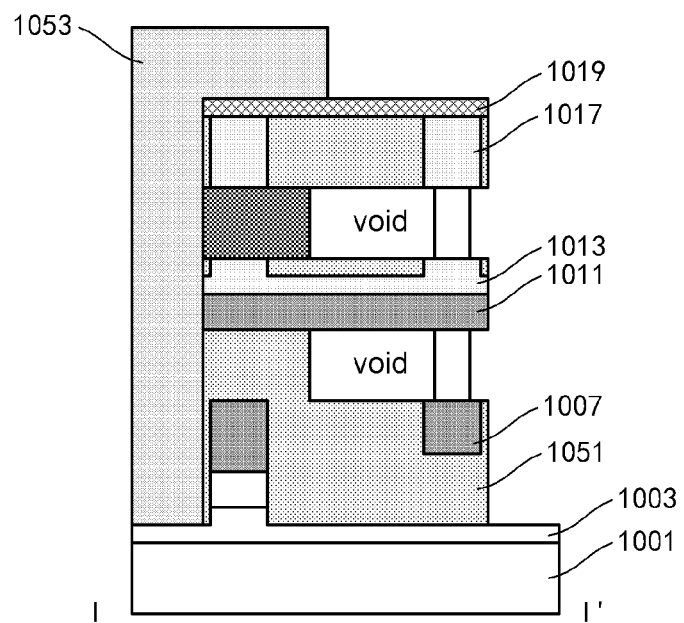
Figure 39A:
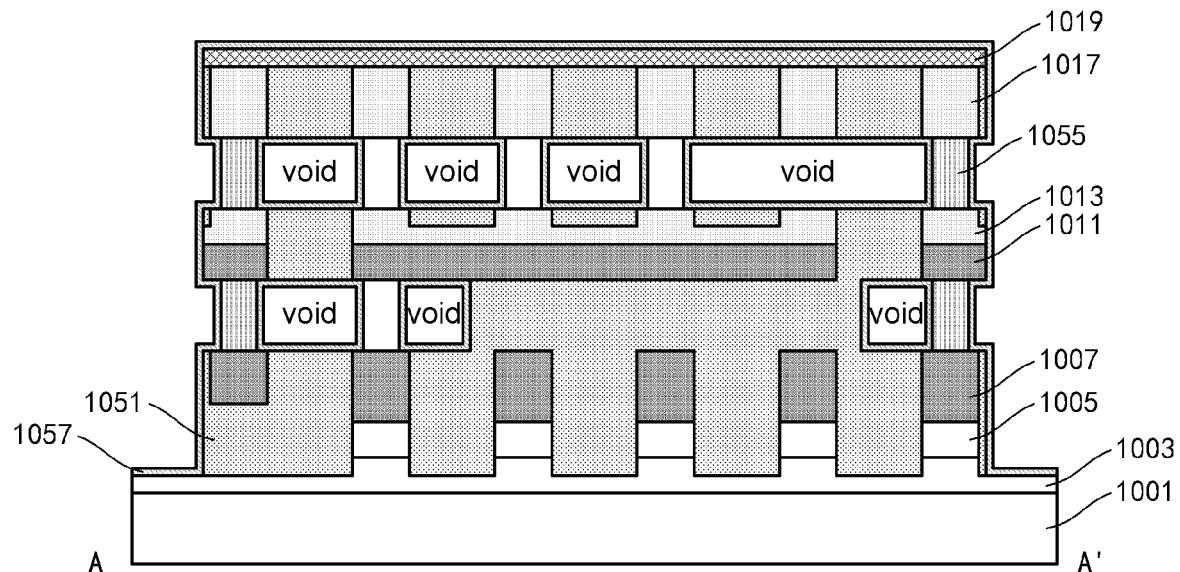
Figure 39B:
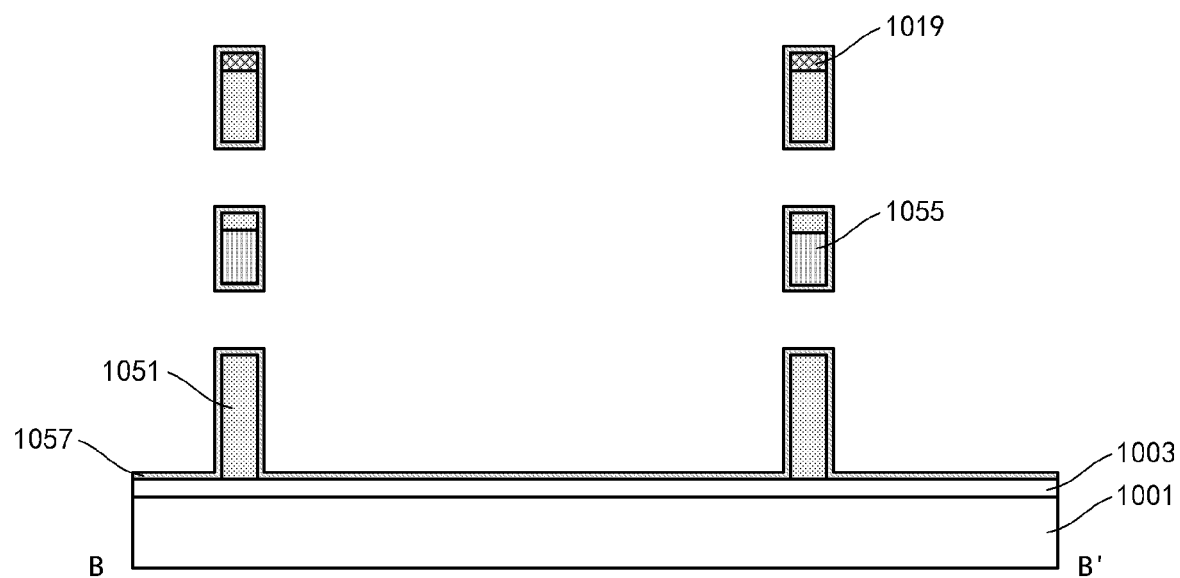
Figure 39C:
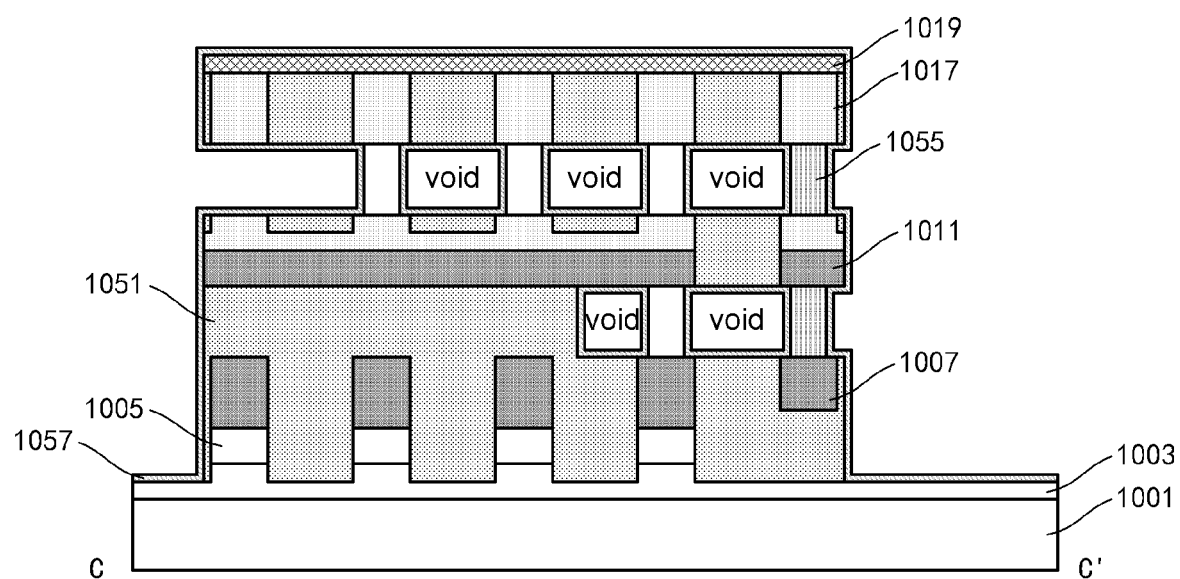
Figure 39D:
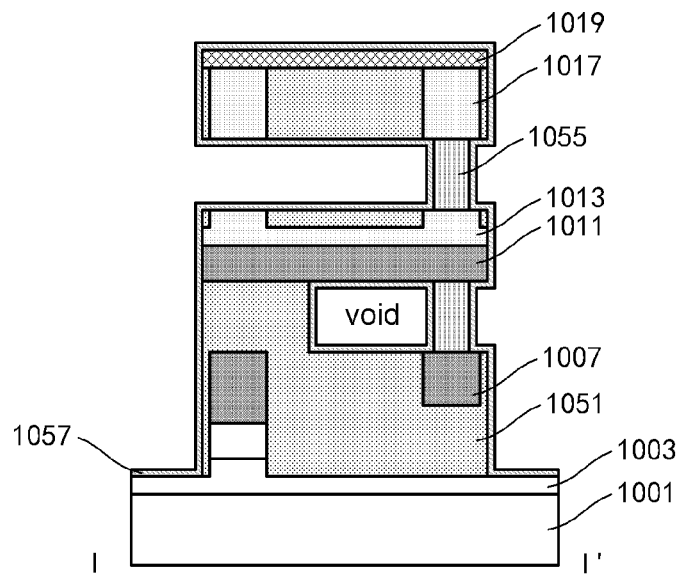
Figure 40A:
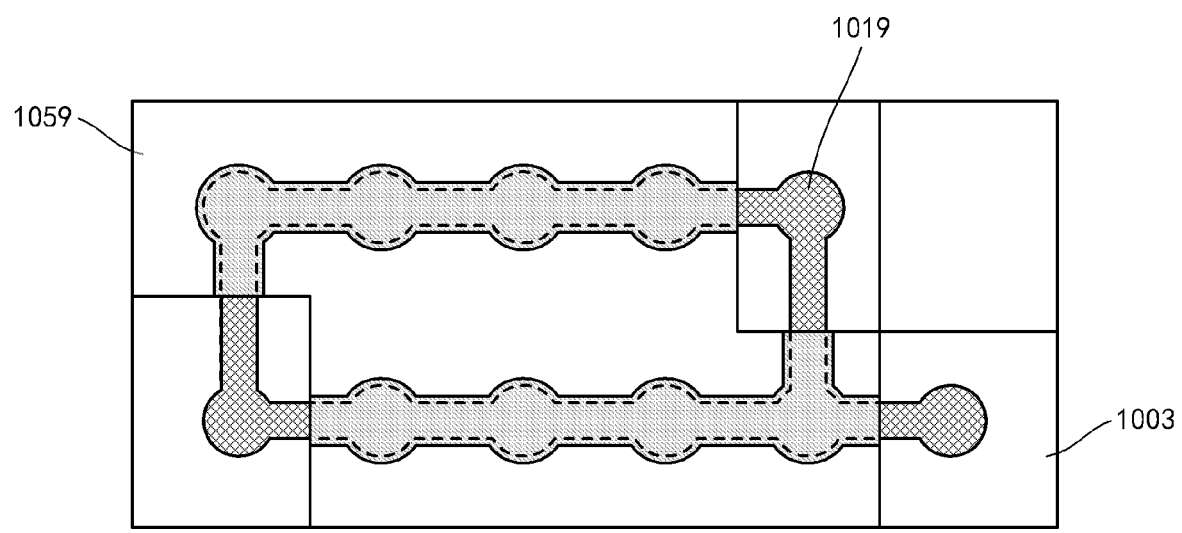
Figure 40B:
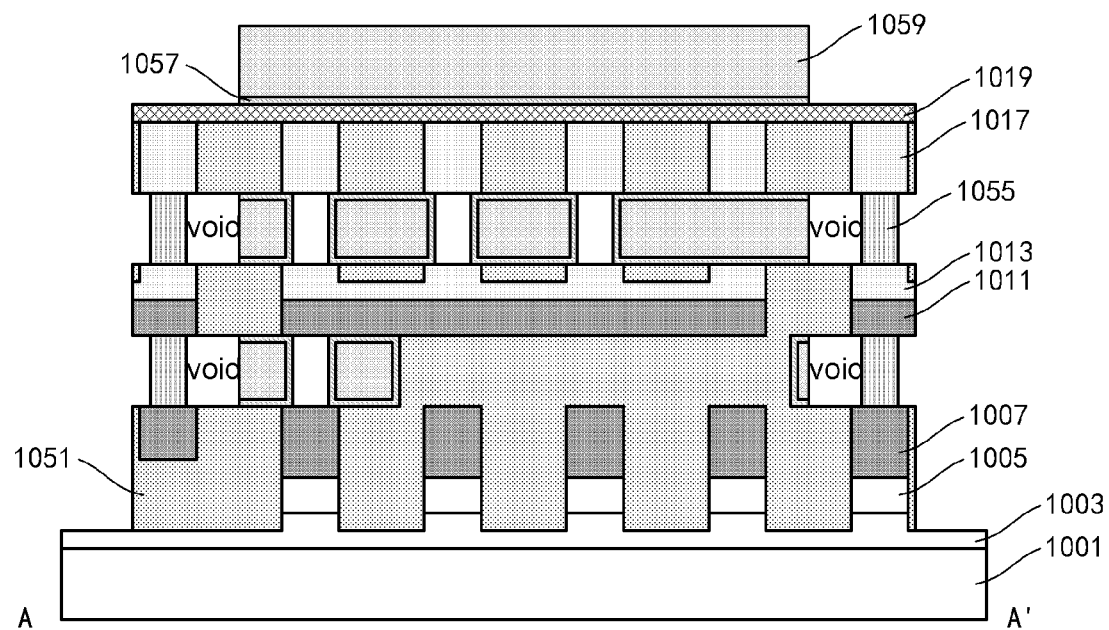
Figure 40C:
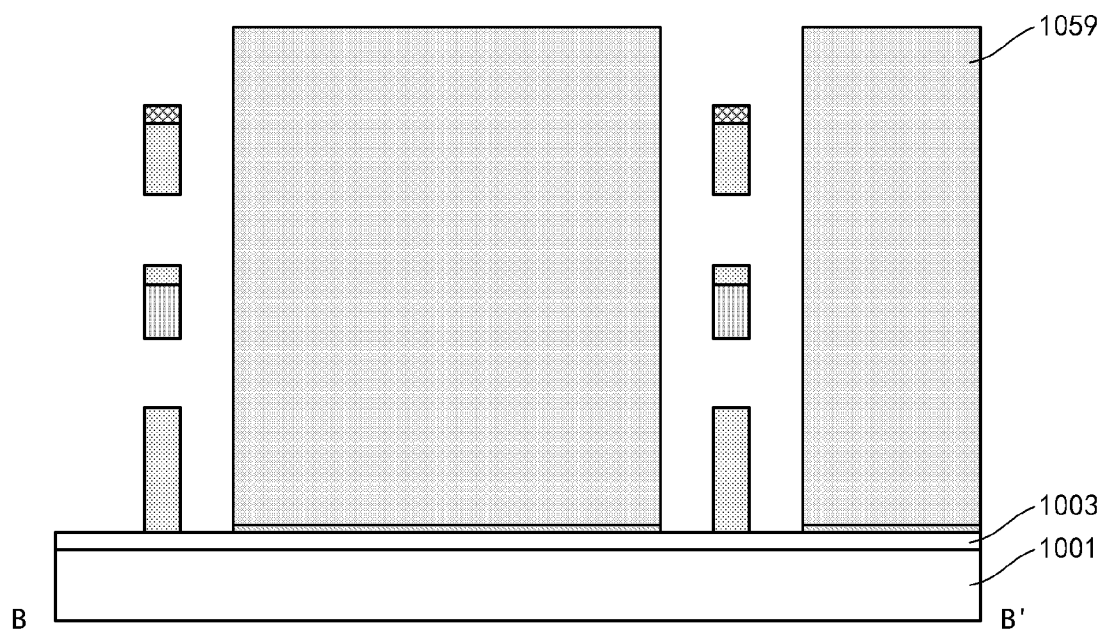
Figure 40D:
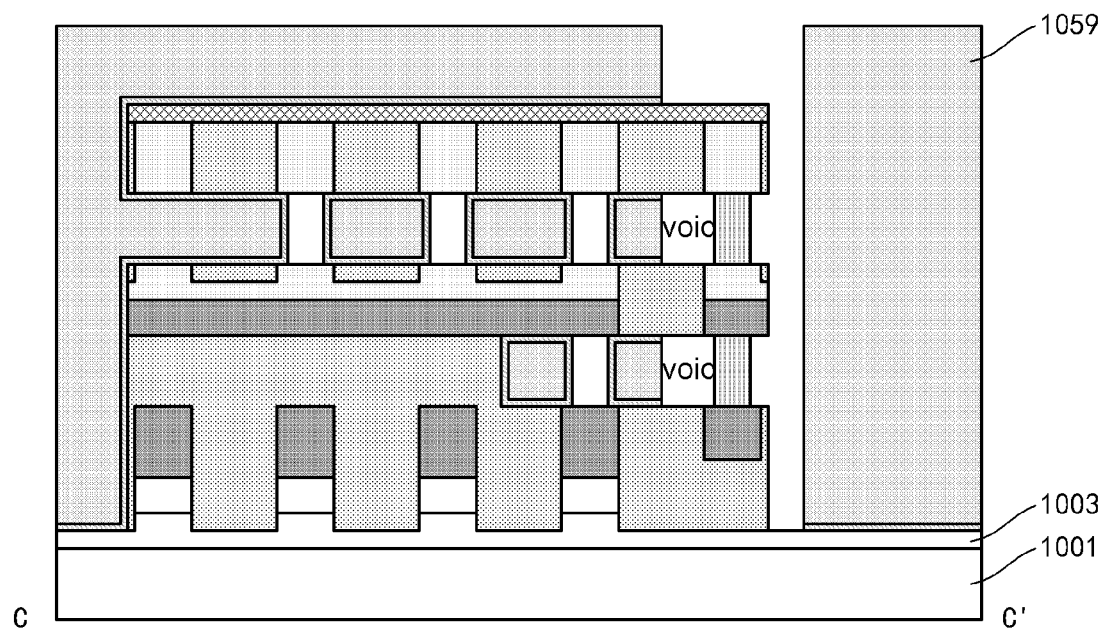
Figure 40E:
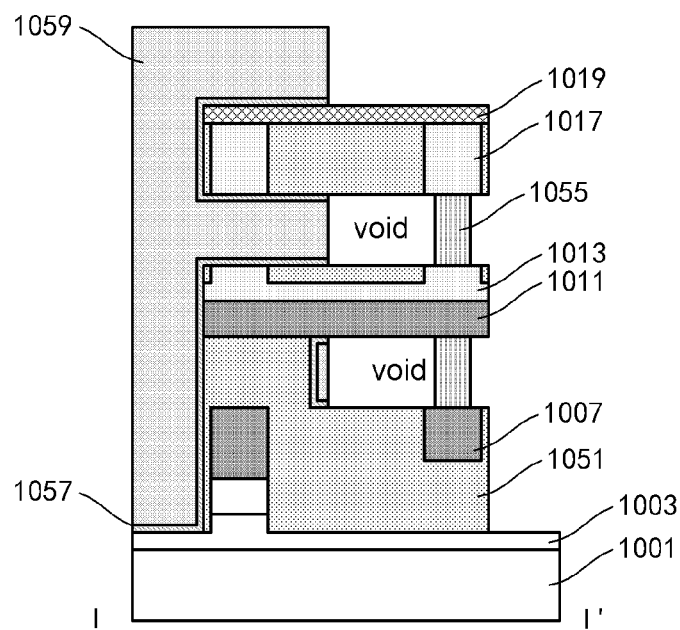

In gaps formed below the hard mask due to the above etching, a placeholder layer may be formed. For example, as shown in FIGS. 30(*a*) and 30(*b*) (FIGS. 30(*a*) and 30(*b*) are sectional views taken along line AA' and line CC' respectively), a placeholder layer 1043 may be formed by, for example, deposition and then back-etching. The placeholder layer 1043 may comprise a material having etching selectivity desired (with respect to, for example, the sacrificial gates 1029, 1039 or the like), for example, oxide or a low-k dielectric. The placeholder layer 1043 and the placeholder layer 1035 may comprise the same material.

In addition, in order to avoid affecting the first source/drain layer 1013 for the n-type transistors and the second source/drain layer 1011 for the p-type transistors in the following process of separating the first source/drain layer 1007 for the p-type transistors, a protective layer may be formed on sidewalls of the above structure. For example, as shown in FIGS. 31(*a*), 31(*b*), 31(*c*), and 31(*d*) (FIGS. 31(*a*), 31(*b*), 31(*c*), and 31(*d*) are sectional views taken along line AA', line BB', line CC', and line II' respectively), a protective layer 1045 may be formed on the sidewalls of the above structure by a spacer formation process. The protective layer 1045 may comprise a material having etching selectivity desired (with respect to, for example, the first source/drain layer 1007 or the like), for example, nitride. The spacer formation process may comprise forming a thin layer of nitride on the above structure in a substantially conformal manner, and then anisotropically etching the deposited thin layer of nitride by, for example, RIE in the vertical direction to remove laterally extending portions thereof while leaving vertically extending portions thereof.

Then, the first source/drain layer 1007 may be separated. This separation process may be the same as that described above. For example, the first source/drain layer 1007 may be selectively etched by, for example, RIE in the vertical direction with the hard mask as an etching mask. The RIE on the first source/drain layer 1007 may be stopped at the isolation auxiliary layer 1005. In this way, the pattern of the hard mask is transferred into the first source/drain layer 1007. Then, as shown in FIGS. 32(*a*), 32(*b*), 32(*c*), and 32(*d*) (FIGS. 32(*a*), 32(*b*), 32(*c*), and 32(*d*) are sectional views taken along line AA', line BB', line CC', and line II' respectively), the first source/drain layer 1007 may be further selectively etched by, for example, ALE, so that the first source/drain layer 1007 is divided into several separated pillar-shaped portions, i.e., nanowires, corresponding to the circular portions of the mask pattern. In order to ensure appropriate electrical isolation, it is desirable that the first source/drain layer 1007 is completely divided into several portions or nanowires which are separated from each other. The first source/drain layer 1013 for the n-type transistors and the second source/drain layer 1011 for the p-type transistors, which are also SiGe here, have their sidewalls surrounded by the protective layer 1045, and thus may receive substantially no affects from the etching, so that they keep the patterns of the first interconnection structure and the second interconnection structure.

So far, the active regions of the respective transistors have been substantially defined.

In addition, the isolation auxiliary layer 1005 may also be similarly divided into portions or nanowires which are separated from each other. The dividing of the isolation auxiliary layer 1005 into portions corresponding to the circular portions of the mask pattern facilitates separation of the first source/drain layer 1007 from the underlying contact layer 1003 at desired positions (specifically, positions where the third interconnection structure and the fourth interconnection structure are located), and also facilitates isolation between the third and fourth interconnection structures (connected to the gate stacks of the p-type transistors) and the contact layer 1003 (in electrical contact with lower source/drain regions of the p-type transistors). Undercuts may be formed in the contact layer 1003.

For example, as shown in FIGS. 33(*a*), 33(*b*), 33(*c*), 33(*d*), and 33(*e*) (FIGS. 33(*a*), 33(*b*), 33(*c*), 33(*d*), and 33(*e*) are a top view, a sectional view taken along line AA', a sectional view taken along line BB', a sectional view taken along line CC', and a sectional view taken along line II' respectively), photoresist 1047 may be formed on the above structure. The photoresist 1047 may be patterned to expose a region where the third interconnection structure and the fourth interconnection structure are located (in the top left view of FIG. 33(*a*), the leftmost circular portion in the lower column and the rightmost circular portion in the upper column). Then, the isolation auxiliary layer 1005 may be selectively etched with the photoresist 1047 as an etching mask to remove exposed portions thereof. As a result, the first source/drain layer 1007 may be separated from the contact layer 1003 at the positions where the third interconnection structure and the fourth interconnection structure are located. The first source/drain layer 1007 and the contact layer 1003 (both of which are Si in this example) may be further selectively etched to increase a spacing therebetween (as shown in FIGS. 35(*a*), 35(*b*), 35(*c*) and 35(*d*)) to ensure good electrical isolation and to reduce capacitance. Then, the photoresist 1047 may be removed.

In this example, the isolation auxiliary layer 1005 is used to facilitate the separation of the first source/drain layer 1007 from the contact layer 1003. However, the present disclosure is not limited thereto. According to other embodiments of the present disclosure, the isolation auxiliary layer 1005 may not be provided. In this case, for example, as shown in FIGS. 34(*a*), 34(*b*), 34(*c*), 34(*d*), and 34(*e*) (FIGS. 34(*a*), 34(*b*), 34(*c*), 34(*d*), and 34(*e*) are a top view, a sectional view taken along line AA', a sectional view taken along line BB', a sectional view taken along line CC', and a sectional view taken along line II' respectively), photoresist 1047' may be formed on the structure shown in FIGS. 32(*a*), 32(*b*), 32(*c*), and 32(*d*) (without the isolation auxiliary layer 1005). The photoresist 1047' may have the same pattern as that of the photoresist 1047. Then, the first source/drain layer 1007 may be selectively etched with the photoresist 1047' as an etching mask to remove exposed portions thereof. Thus, the first source/drain layer 1007 is removed at the positions where the third interconnection structure and the fourth interconnection structure are located. Then, the photoresist 1047' may be removed.

Hereinafter, the case where the isolation auxiliary layer 1005 exists is described by way of example.

So far, definition of the layout of the SRAM cell (comprising the transistors and the interconnection structures) has been substantially completed. Next, the transistors may be completed by the replacement gate process, and interconnections between the respective transistors may be formed, to complete the SRAM cell.

For convenience of the replacement gate process, a placeholder layer may be formed in the gaps below the hard mask. For example, as shown in FIGS. 35(*a*), 35(*b*), 35(*c*), and 35(*d*) (FIGS. 35(*a*), 35(*b*), 35(*c*), and 35(*d*) are sectional views taken along line AA', line BB', line CC', and line II' respectively), a placeholder layer 1049 may be formed by deposition and then back-etching. The placeholder layer 1049 may comprise a material having etching selectivity desired (with respect to, for example, the sacrificial gates 1029 and 1039, or the like), for example, oxide or a low-k dielectric. Before the placeholder layer 1049 is formed, a silicidation process may be performed. The placeholder layer 1049 may facilitate supporting the nanostructures (during, for example, an etching process described later with reference to FIGS. 36(*a*), 36(*b*), 36(*c*), and 36(*d*)) and preventing the nanostructures from collapsing and being adhered.

In order to enhance contact and/or to reduce resistance, the source/drain layers may be silicided.

For example, as shown in FIGS. 36(*a*), 36(*b*), 36(*c*), and 36(*d*) (FIGS. 36(*a*), 36(*b*), 36(*c*), and 36(*d*) are sectional views taken along line AA', line BB', line CC', and line II' respectively), the placeholder layer 1031 (of nitride) and the placeholder layers 1035, 1043 and 1049 (of oxide) may be removed by selective etching, for example, wet etching using hot phosphoric acid, with respect to the sacrificial gates 1029 and 1039 (and the aluminum oxide layer 1019 in the hard mask). During the selective etching process, the nitride layer 1021 in the hard mask and the protective layer 1045 of nitride may also be removed. Thus, the sidewalls of the respective source/drain layers may be at least partially exposed, but the sidewalls of the channel layers are surrounded by the sacrificial gates 1029 and 1039. A silicidation process may be performed to at least partially or completely silicide the exposed portions of the respective source/drain layers. The silicidation process may comprise, for example, depositing metal such as NiPt alloy, and performing heat treatment at a temperature of, for example, about 200-600° C., so that the deposited metal reacts with semiconductor elements such as Si and/or Ge in the source/drain layers to produce a compound of the metal and the semiconductor elements, for example, silicide, germanide, silicon germanide or the like (silicide for short hereinafter). Then, unreacted excess metal may be removed.

Then, as shown in FIGS. 37(*a*), 37(*b*), 37(*c*), and 37(*d*) (FIGS. 37(*a*), 37(*b*), 37(*c*), and 37(*d*) are sectional views taken along line AA', line BB', line CC', and line II' respectively), a placeholder layer 1051 may be formed in the gaps below the hard mask (which currently comprises only the aluminum oxide layer 1019) again. As described above, the placeholder layer 1051 may be formed by deposition and then back-etching. The placeholder layer 1051 may comprise a material having etching selectivity desired (with respect to, for example, the sacrificial gates 1029 and 1039 and the hard mask, or the like), for example, nitride.

As described above, there may be two nanowires (at diagonal corners of the rectangular pattern) in each of the channel layers to form the third interconnection structure and the fourth interconnection structure respectively, and there may be another nanowire to form the contact plug to apply the power supply voltage $V_{DD}$. In order to reduce the resistance, these nanowires may be silicided.

For example, as shown in FIGS. 38(*a*), 38(*b*), 38(*c*), 38(*d*), and 38(*e*) (FIGS. 38(*a*), 38(*b*), 38(*c*), 38(*d*), and 38(*e*) are a top view, a sectional view taken along line AA', a sectional view taken along line BB', a sectional view taken along line CC', and a sectional view taken along line II' respectively), photoresist 1053 may be formed on the above structure. The photoresist 1053 may be patterned to expose a region where the third interconnection structure and the fourth interconnection structure are located (in the top view of FIG. 38(*a*), the leftmost circular portion in the lower column and the rightmost circular portion in an upper column) and a region where the contact plug to apply the power supply voltage $V_{DD}$ is located (in the top view of FIG. 38(*a*), the rightmost circular portion in the lower column). The sacrificial gates 1029 and 1039 may be selectively etched (with respect to the placeholder layer 1051 and the respective channel layers and source/drain layers) with the photoresist 1053 as an etching mask to expose nanowires which need to be silicided.

Then, as shown in FIGS. 39(*a*), 39(*b*), 39(*c*), and 39(*d*) (FIGS. 39(*a*), 39(*b*), 39(*c*), and 39(*d*) are sectional views taken along line AA', line BB', line CC', and line II' respectively), the exposed nanowires in the channel layer may be silicided to form silicide 1055. The silicidation process may be done as described above. Thus, the third interconnection structure and the fourth interconnection structure and the contact plug to apply the power supply voltage $V_{DD}$ may be formed.

Specifically, as shown in FIG. 39(*a*), the leftmost nanowires in the channel layers in the upper layer and the lower layer are converted into the silicide 1055, resulting in the third interconnection structure which is connected to the second interconnection structure formed by the source/drain layers 1011 and 1013 (which have also been partially or completely converted into silicide). In addition, the rightmost nanowires in the channel layers in the upper layer and the lower layer are converted into the silicide 1055, resulting in, together with the source/drain layers 1007, 1011, 1013 and 1017 (which have also been partially or completely converted into silicide), a contact plug which is connected to the contact layer 1003 (through the isolation auxiliary layer 1005). In addition, as shown in FIG. 39(*c*), the rightmost nanowires in the channel layers in the upper layer and the lower layer are converted into the silicide 1055, resulting in the fourth interconnection structure which is connected to the first interconnection structure formed by the source/drain layers 1011 and 1013 (which have also been partially or completely converted into silicide).

Next, the replacement gate process may be performed.

For example, as shown in FIGS. 39(*a*), 39(*b*), 39(*c*), and 39(*d*), the sacrificial gates 1029 and 1039 may be removed by selective etching (with respect to the aluminum oxide layer 1019, the placeholder layer 1051, and the respective channel layers and source/drain layers or silicide formed therein). Thus, sidewalls of the respective nanowires in the channel layers may be at least partially exposed. A gate dielectric layer 1057 may be formed on the sidewalls of the respective nanowires in the channel layers by deposition such as Atomic Layer Deposition (ALD). The gate dielectric layer 1057 may be formed in a substantially conformal manner. The gate dielectric layer 1057 may comprise a suitable dielectric, for example, a high-k dielectric such as $HfO_2$, with a thickness of about 0.5-4 nm.

However, the gate dielectric layer is thus also formed on surfaces of the third interconnection structure and the fourth interconnection structure, which may hinder the electrical connection between the third and fourth interconnection structures and a gate electrode layer to be formed later. To this end, the gate dielectric layer on the surfaces of the third interconnection structure and the fourth interconnection structure (and optionally the contact plug to apply the power supply voltage $V_{DD}$) may be removed. As shown in FIGS. 40(a), 40(b), 40(c), 40(d) and 40(e) (FIGS. 40(a), 40(b), 40(c), 40(d) and 40(e) are a top view, a sectional view taken along line AA', a sectional view taken along line BB', a sectional view taken along line CC', and a sectional view taken along line II' respectively), photoresist 1059 may be formed on the above structure. The photoresist 1059 may be patterned to expose a region where the third interconnection structure and the fourth interconnection structure (and optionally the contact plug to apply the power supply voltage $V_{DD}$) are located. The gate dielectric layer 1057 may be selectively etched (with respect to the placeholder layer 1051 and the silicide) with the photoresist 1059 as an etching mask to remove exposed portions thereof. Then, the photoresist 1059 may be removed.

Figure 41A:
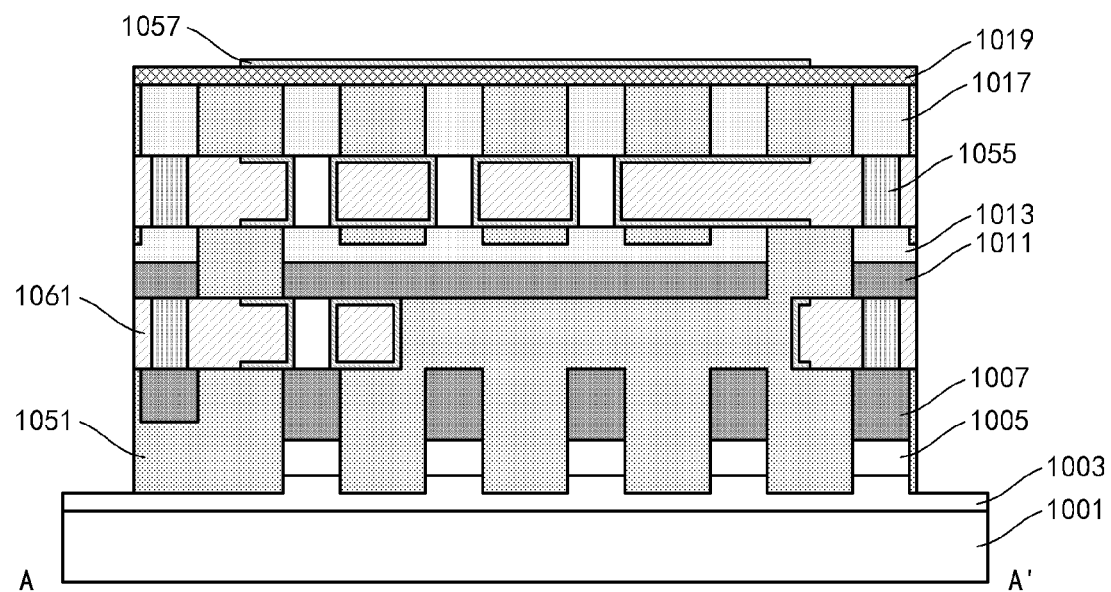
Figure 41B:
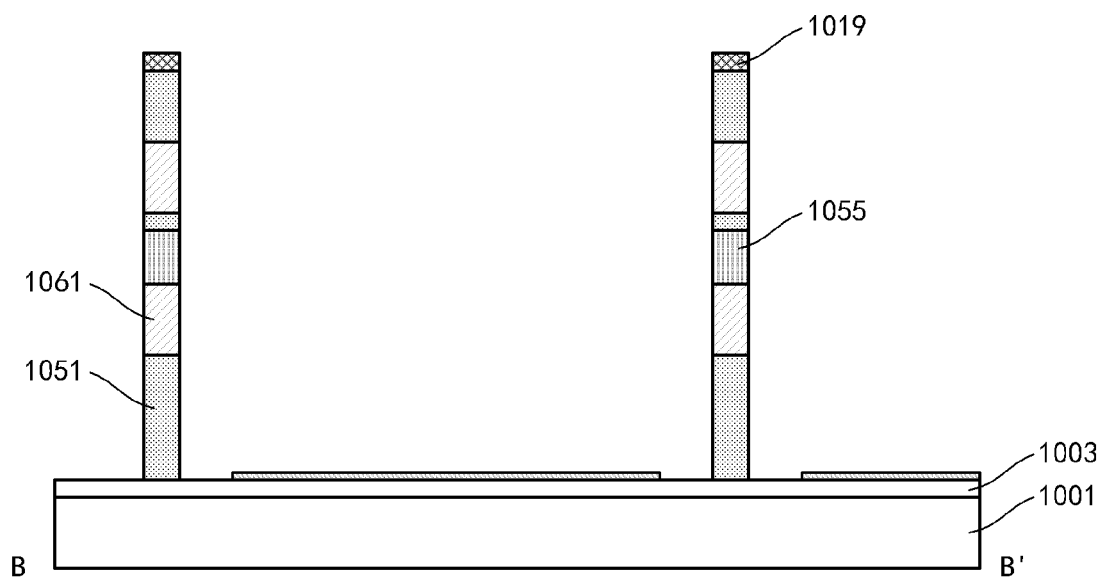
Figure 41C:
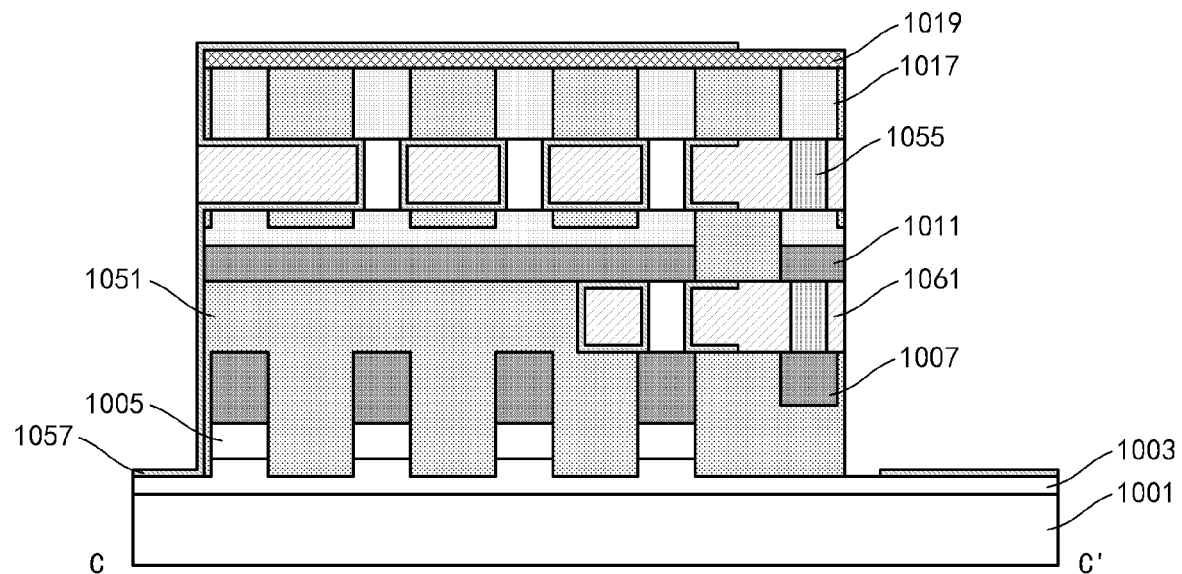
Figure 41D:
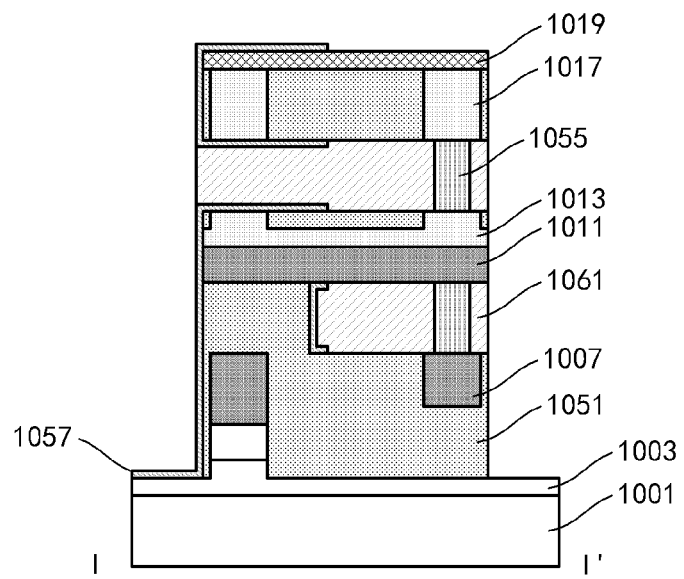
Figure 42A:
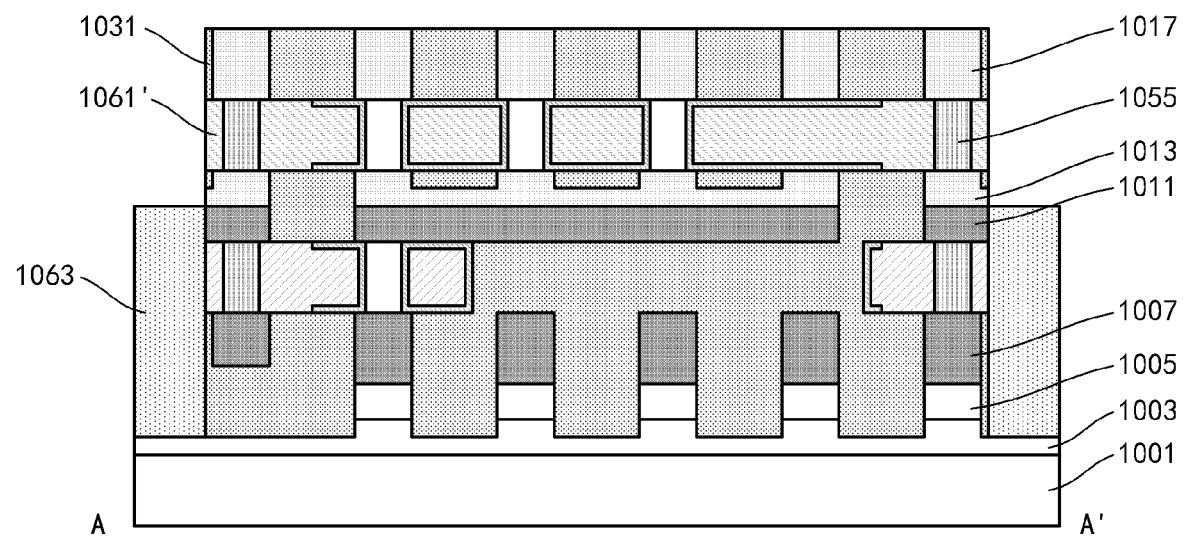
Figure 42B:
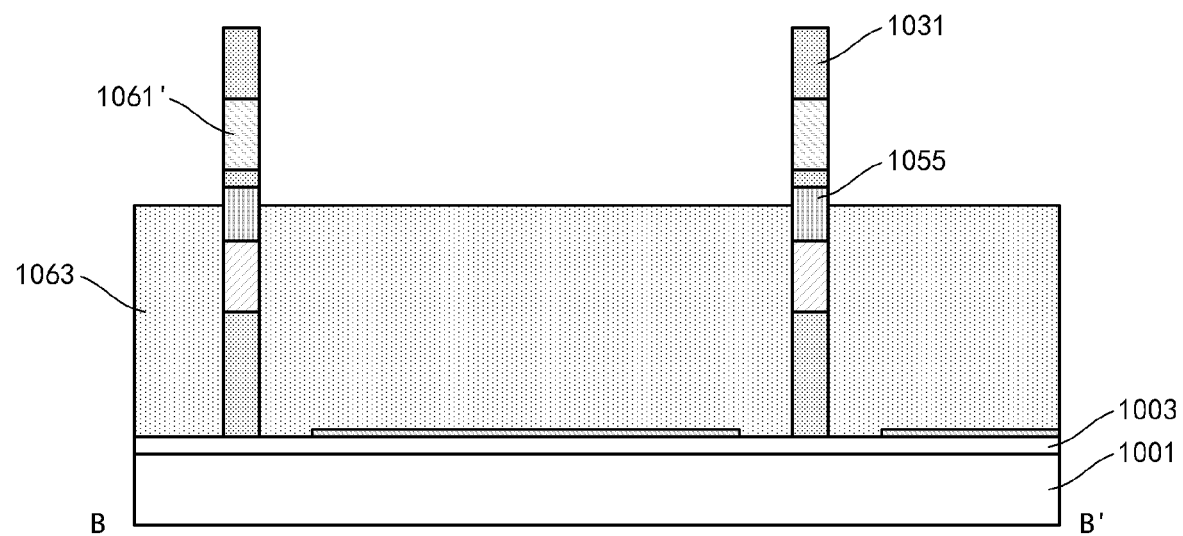
Figure 42C:
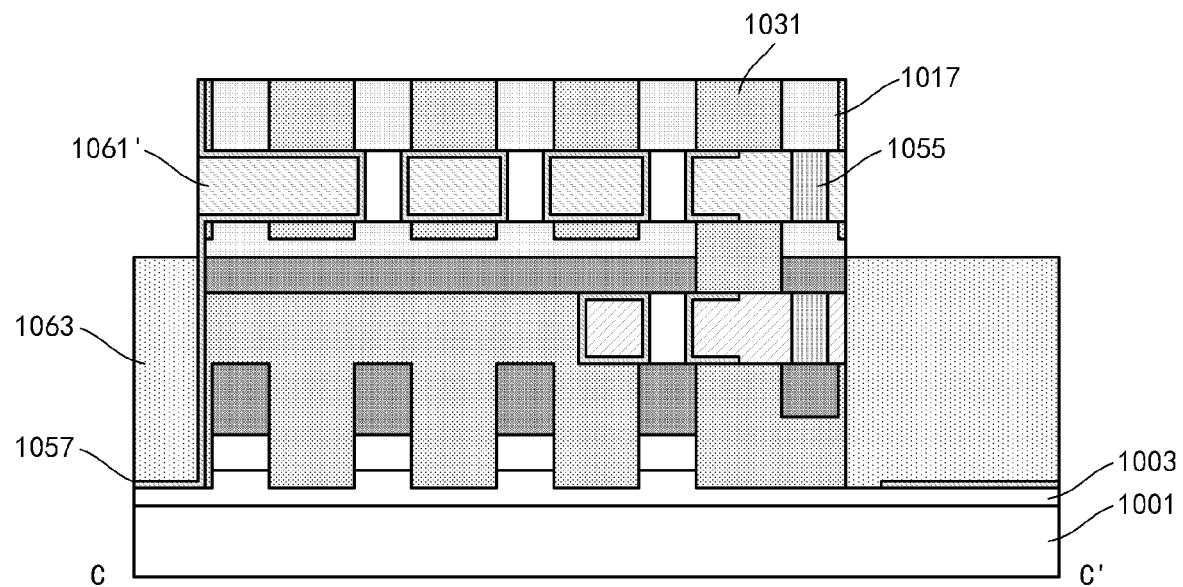
Figure 42D:
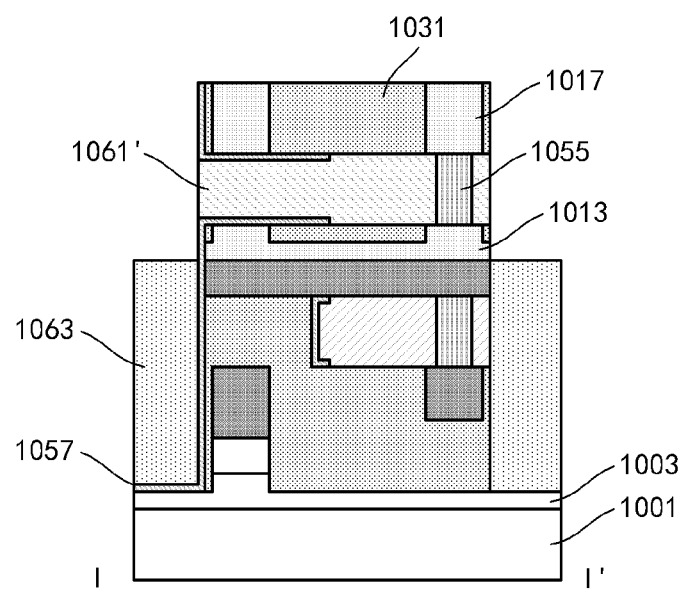
Figure 43A:
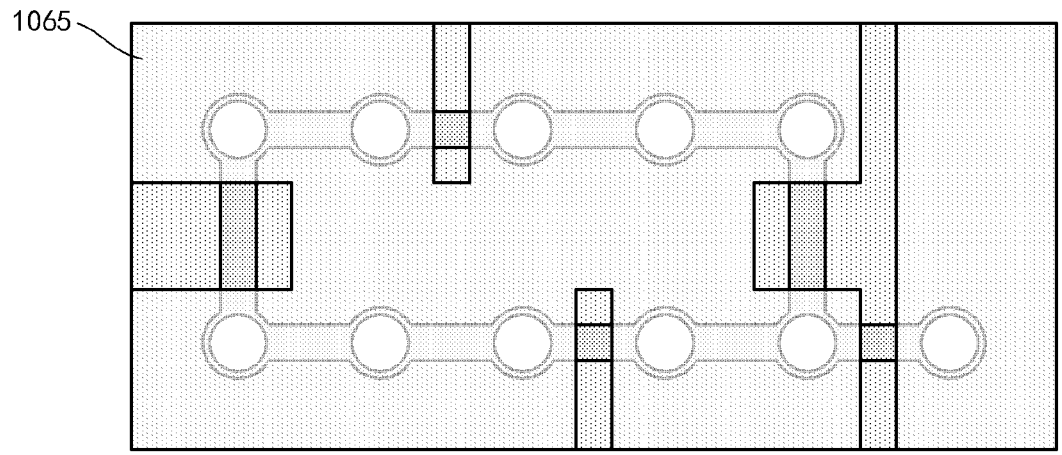
Figure 43B:
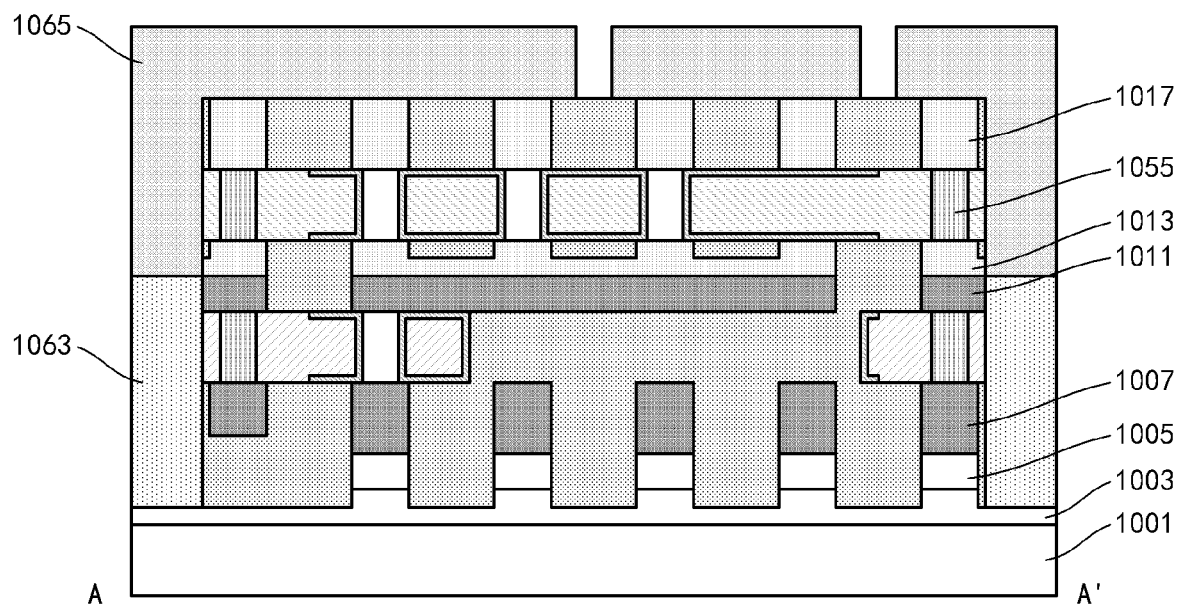
Figure 43C:
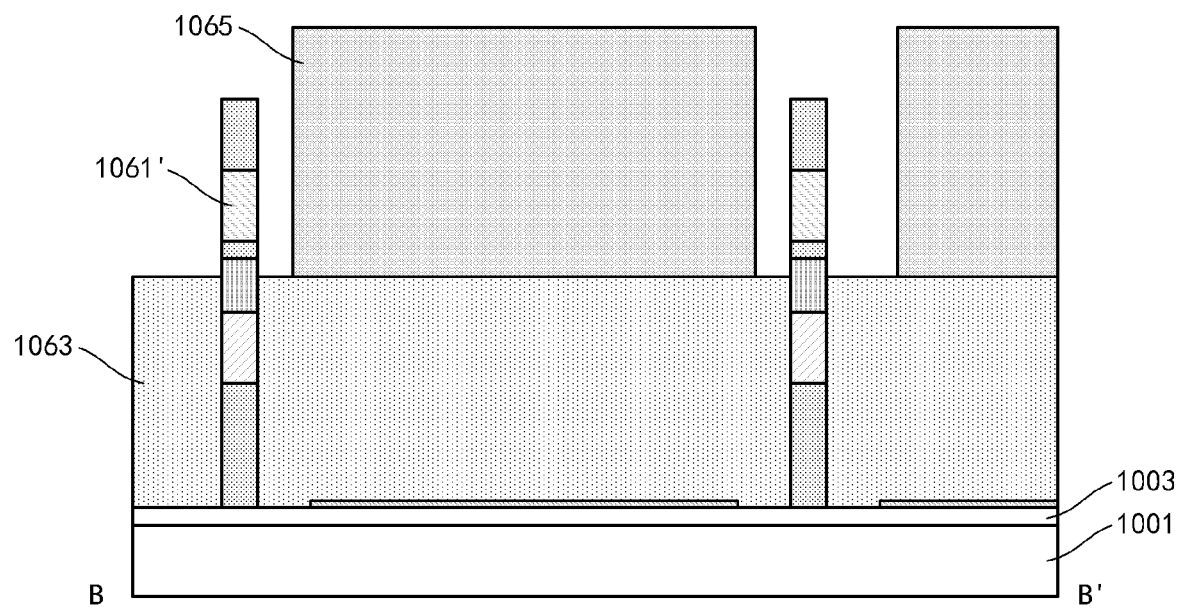
Figure 43D:
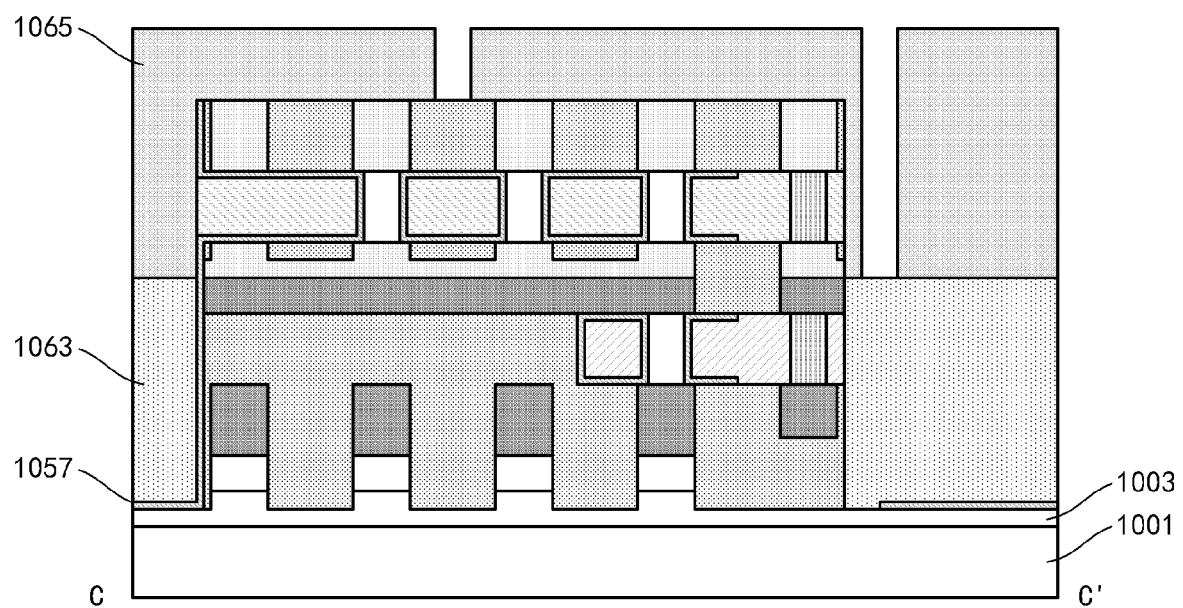
Figure 43E:
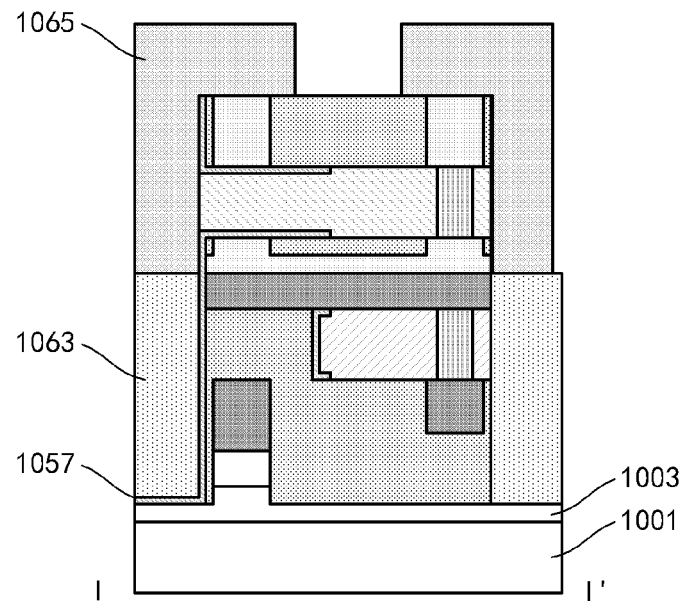

Then, as shown in FIGS. 41(a), 41(b), 41(c), and 41(d) (FIGS. 41(a), 41(b), 41(c), and 41(d) are sectional views taken along line AA', line BB', line CC', and line II' respectively), a gate electrode layer 1061 may be formed in gaps below the aluminum oxide layer 1019 by deposition and then back-etching. For example, the gate electrode layer 1061 may comprise a work function layer and a conductive filling layer. For example, for the p-type transistors, the work function layer may comprise TiN, TiNa, or a combination thereof, with a thickness of about 1-7 nm; and the conductive filling layer may comprise W and/or Ti, with a thickness sufficient to fill up the gaps below the hard mask. As shown in FIG. 41(a), gate electrodes of the p-type pull-up transistor and the n-type pull-down transistor in the first group may be electrically connected to each other through the third interconnection structure. Similarly, as shown in FIG. 41(c), gate electrodes of the p-type pull-up transistor and the n-type pull-down transistor in the second group may be electrically connected to each other through the fourth interconnection structure.

In order to further improve performance, different gate electrode layers, for example, gate electrode layers having different effective work functions, may be formed for the p-type transistors and the n-type transistors, respectively. For example, the gate electrode layer 1061 formed as described above, particularly the work function layer therein, may be used for the p-type transistors. Next, a gate electrode layer may be formed for the n-type transistors in the upper layer. For example, the gate electrode layer 1061 formed in the upper layer may be removed, and then a gate electrode layer for the n-type transistors may be formed in addition.

In order to prevent the gate electrode layer 1061 in the lower layer from being affected, the gate electrode layer 1061 in the lower layer may be shielded. For example, as shown in FIGS. 42(a), 42(b), 42(c), and 42(d) (FIGS. 42(a), 42(b), 42(c), and 42(d) are sectional views taken along line AA', line BB', line CC', and line II' respectively), a shielding layer 1063 may be formed on the above structure by deposition and then back-etching. The shielding layer 1063 may also be used for electrical isolation, and thus may comprise a dielectric material having etching selectivity desired (with respect to, for example, the gate electrode layer 1061), for example, oxide. Before the back-etching, the deposited material may be further planarized by, for example, CMP, and the CMP may be stopped at the placeholder layer 1031. In order to fully shield the lower layer while exposing the upper layer, a top surface of the shielding layer 1063 after being etched back may be positioned at a level between the upper layer and the lower layer, for example, at or near an interface between the first source/drain layer 1013 for the n-type transistors and the second source/drain layers 1011 for the p-type transistors. In addition, during the back-etching process, the aluminum oxide layer 1019 may also be removed. Then, the gate electrode layer 1061 in the upper layer may be removed by selective etching, and a gate electrode layer 1061' for the n-type transistors may be formed in the upper layer in the same manner as that of forming the gate electrode layer 1061. For example, the gate electrode layer 1061' may comprise a work function layer and a conductive filling layer. For example, for the n-type transistors, the work function layer may comprise TiN, TiNa, TiAlC, or a combination thereof, with a thickness of about 1-7 nm; and the conductive filling layer may comprise W and/or Ti, with a thickness sufficient to fill up the gaps below the hard mask.

Currently, the gate electrode layer 1061' in the upper layer continuously extends between the respective nanowires (three of which have been converted into silicide) in the upper channel layer, and isolation needs to be performed between the pull-down transistor and the pass-gate transistor and also between the first group of transistors and the second group of transistors. For example, as shown in FIGS. 43(a), 43(b), 43(c), 43(d), and 43(e) (FIGS. 43(a), 43(b), 43(c), 43(d), and 43(e) are a top view, a sectional view taken along line AA', a sectional view taken along line BB', a sectional view taken along line CC', and a sectional view taken along line II' respectively), photoresist 1065 may be formed on the above structure, and then patterned to expose regions where isolation is needed. Specifically, in the top view of FIG. 43(a), in the lower column, a region between the pull-down transistor (the second and third nanowires from the left) and the pass-gate transistor (the fourth nanowire from the left) may be exposed; and in the upper column, a region between the pull-down transistor (the second and third nanowires from the right) and the pass-gate transistor (the fourth nanowire from the right) may be exposed. In addition, a region between the two groups (corresponding to the upper column and the lower column) may also be exposed. In addition, in this example, the gate electrode is also formed between the contact plug to apply the power supply voltage $V_{DD}$ and the contact plug WL-1, and therefore a region between the two contact plugs may also be exposed.

Then, as shown in FIGS. 44(a), 44(b), 44(c), 44(d) and 44(e) (FIGS. 44(a), 44(b), 44(c), 44(d) and 44(e) are a top view, a sectional view taken along line AA', a sectional view taken along line BB', a sectional view taken along line CC', and a sectional view taken along with line II' respectively), the respective layers (for example, the placeholder layer 1031, the gate dielectric layer 1057 and the gate electrode layer 1061') may be etched downwards by, for example, RIE, with the photoresist 1065 as an etching mask until the gate electrode layer 1061' is cut off. In a case where the device is relatively small or the openings in the photoresist 1065 are relatively small, the gate electrode layer 1061' may be etched by isotropic etching to cut off the gate electrode layer 1061' below the placeholder layer 1031 through undercuts.

Figure 44A:
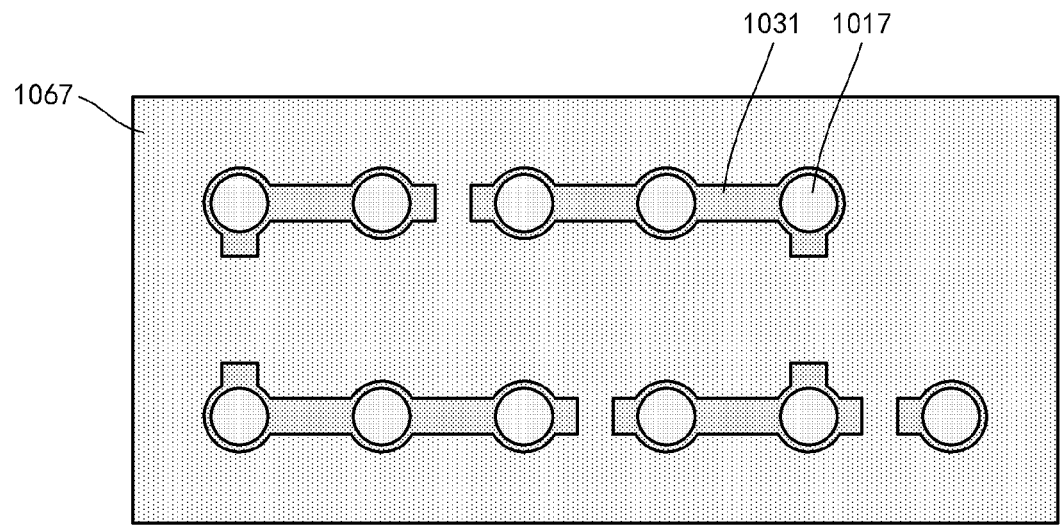
Figure 44B:
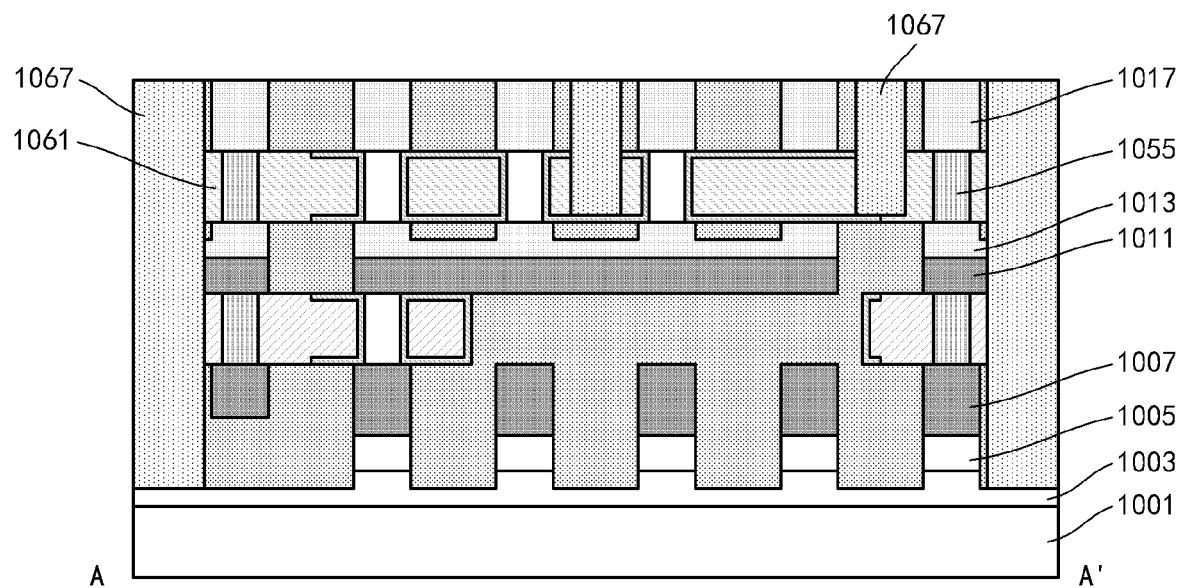
Figure 44C:
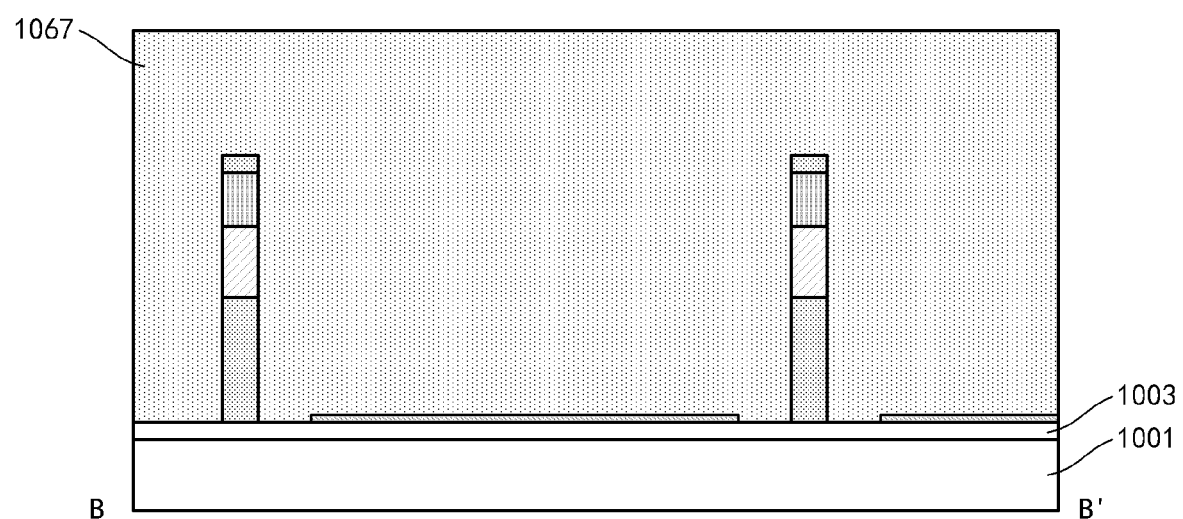
Figure 44D:
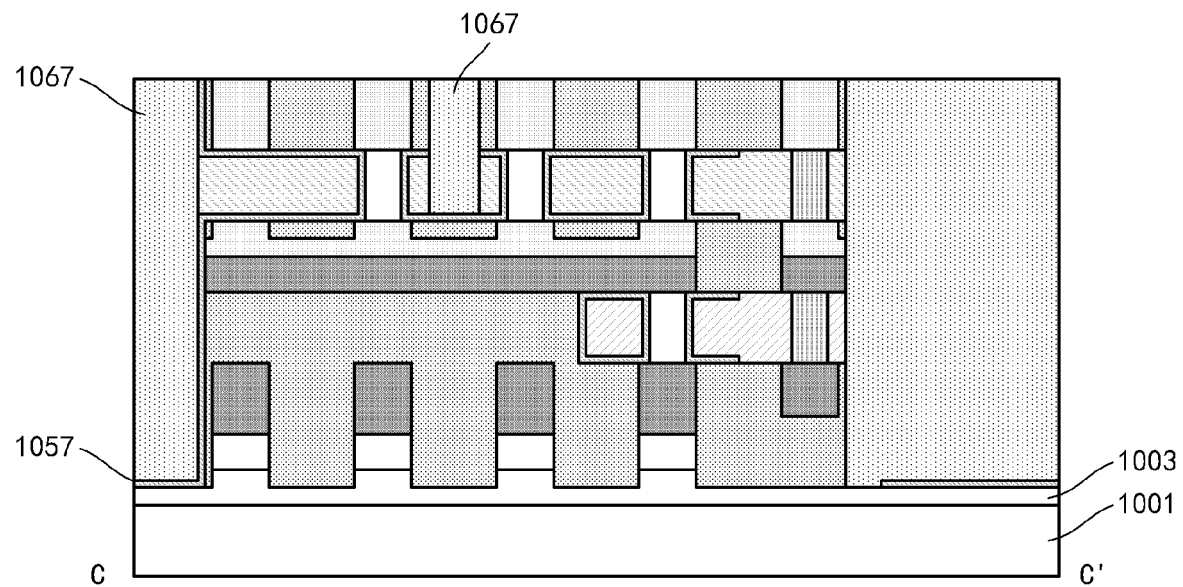
Figure 44E:
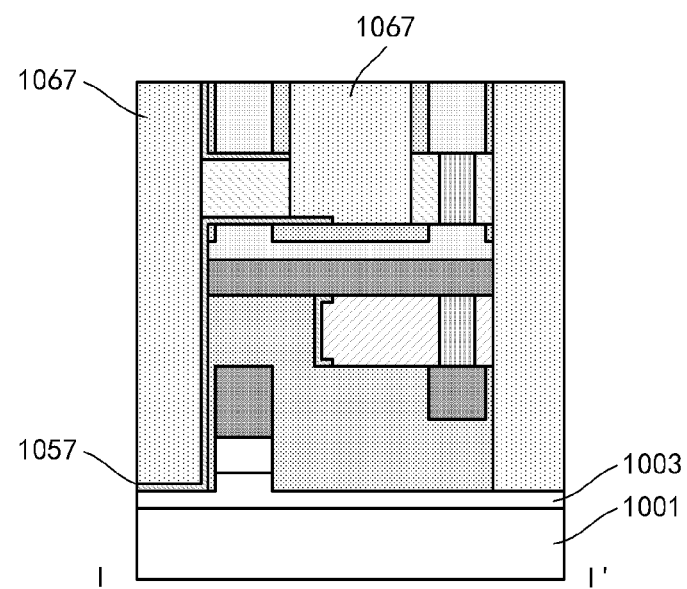

As shown in the top view of FIG. 44(a), the gate electrode layer 1061' is divided into a portion for the first pull-down transistor (a lower left portion in the figure), a portion for the first pass-gate transistor (a middle portion in the lower column in the figure), a portion for the second pull-down transistor (an upper right portion in the figure), and a portion for the second pass-gate transistor (an upper left portion in the figure).

So far, the manufacturing of the SRAM cell has been substantially completed. An isolation layer may be filled in gaps on the substrate by deposition and then planarization such as CMP (which may be stopped at the placeholder layer 1031). The isolation layer may comprise a suitable dielectric material such as oxide, and thus may be shown as an isolation layer 1067 together with the shielding layer 1063 described above.

Here, the contact plugs WL-1 and WL-2 may be formed.

Figure 45A:
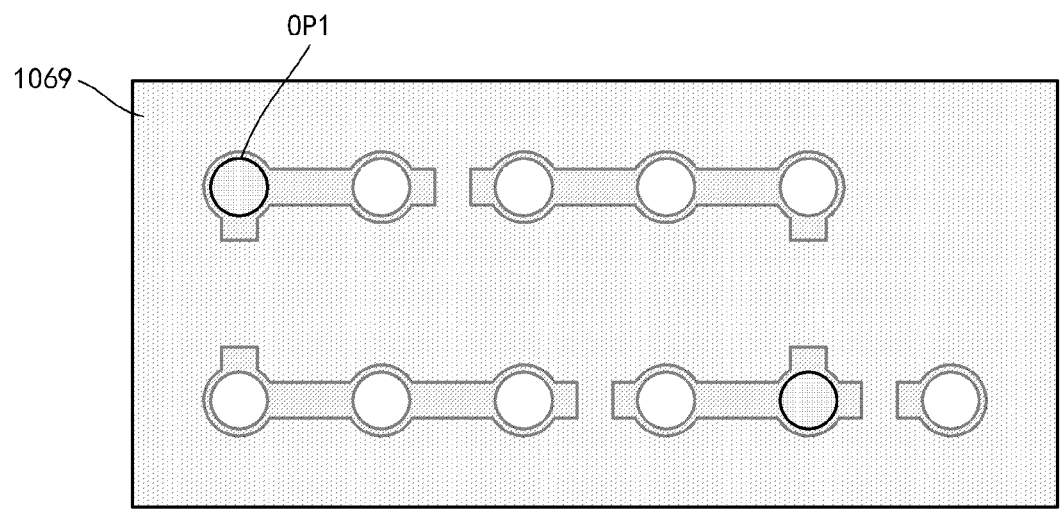
Figure 45B:
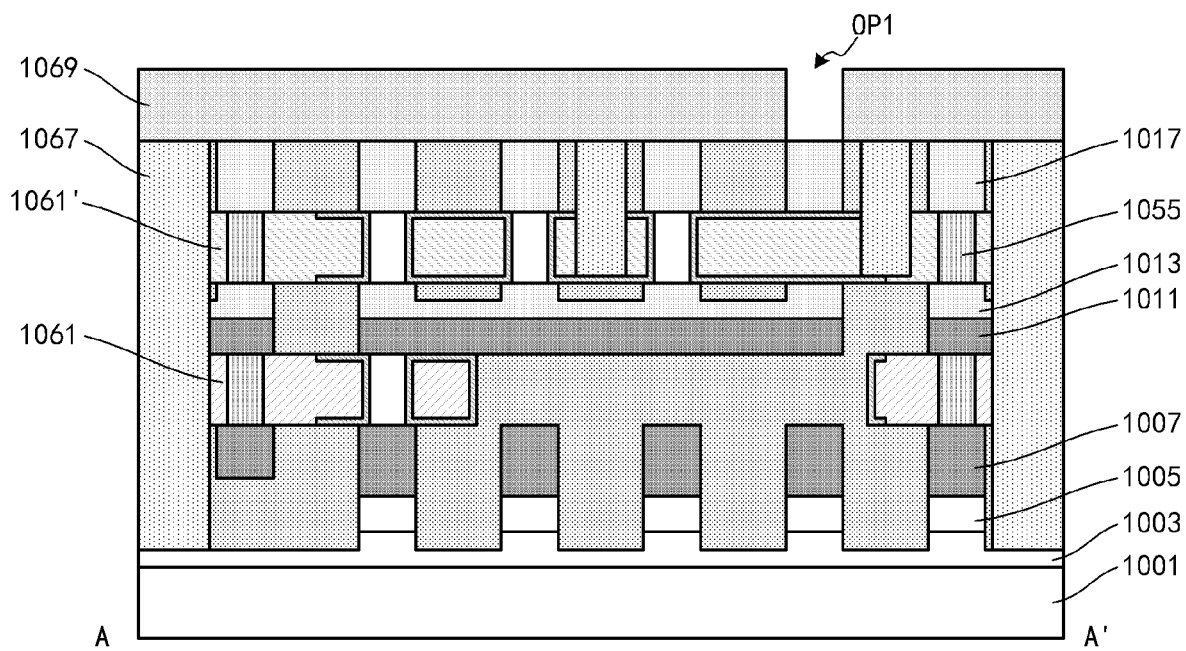
Figure 45C:
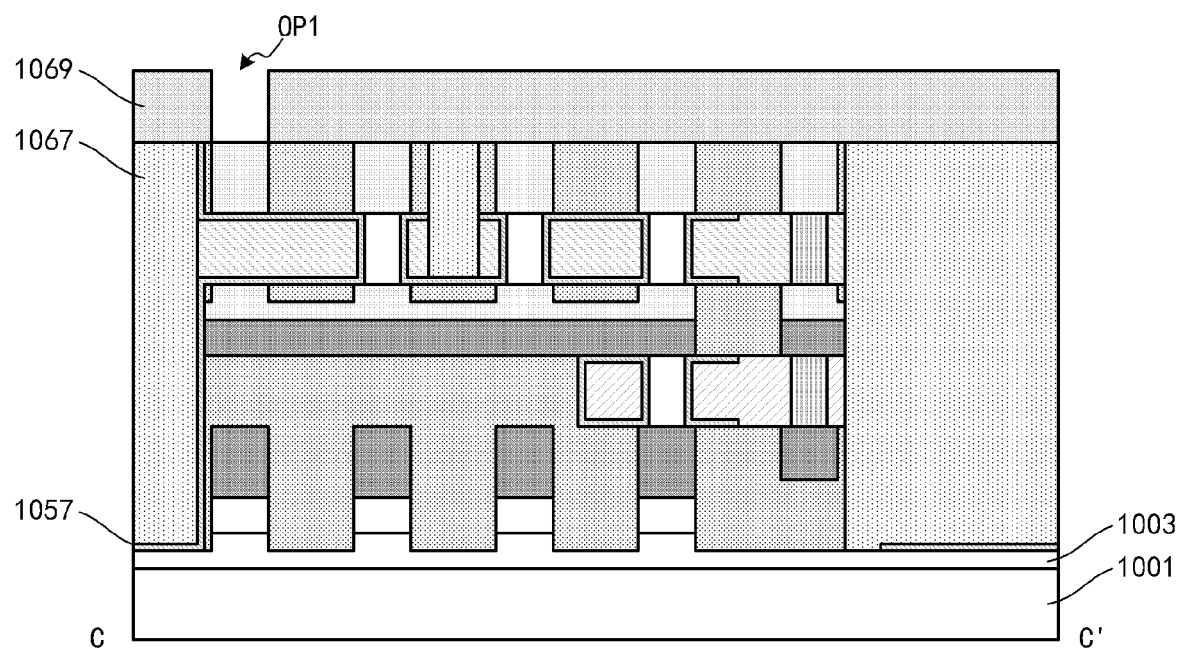

For example, as shown in FIGS. 45(a), 45(b), and 45(c) (FIGS. 45(a), 45(b), and 45(c) are a top view, a sectional view taken along line AA', and a sectional view taken along line CC' respectively), photoresist 1069 may be formed on the above structure, and then patterned to expose a region where the contact plugs WL-1 and WL-2 are located (diagonal corners of the rectangular pattern), as shown by openings OP1 in the figure.

Figure 46A:
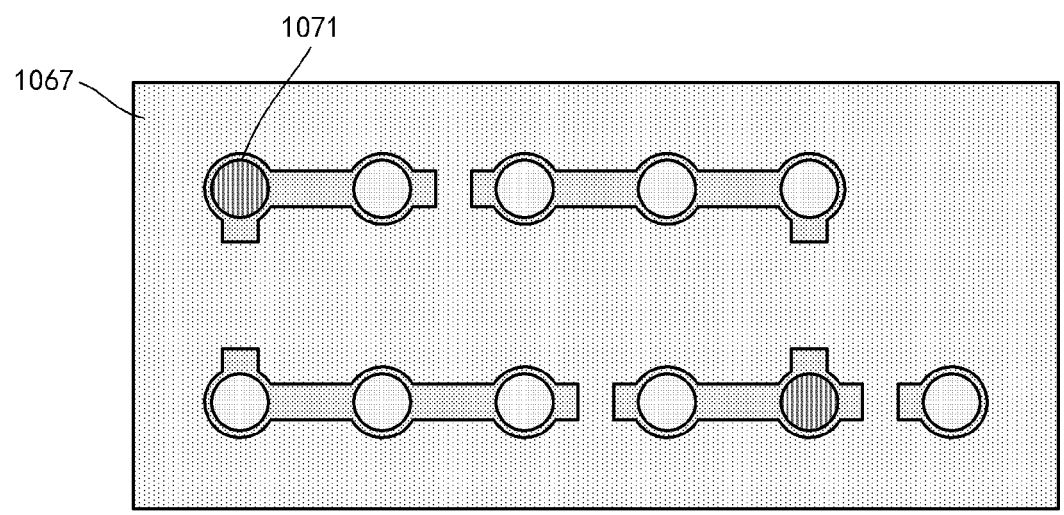
Figure 46B:
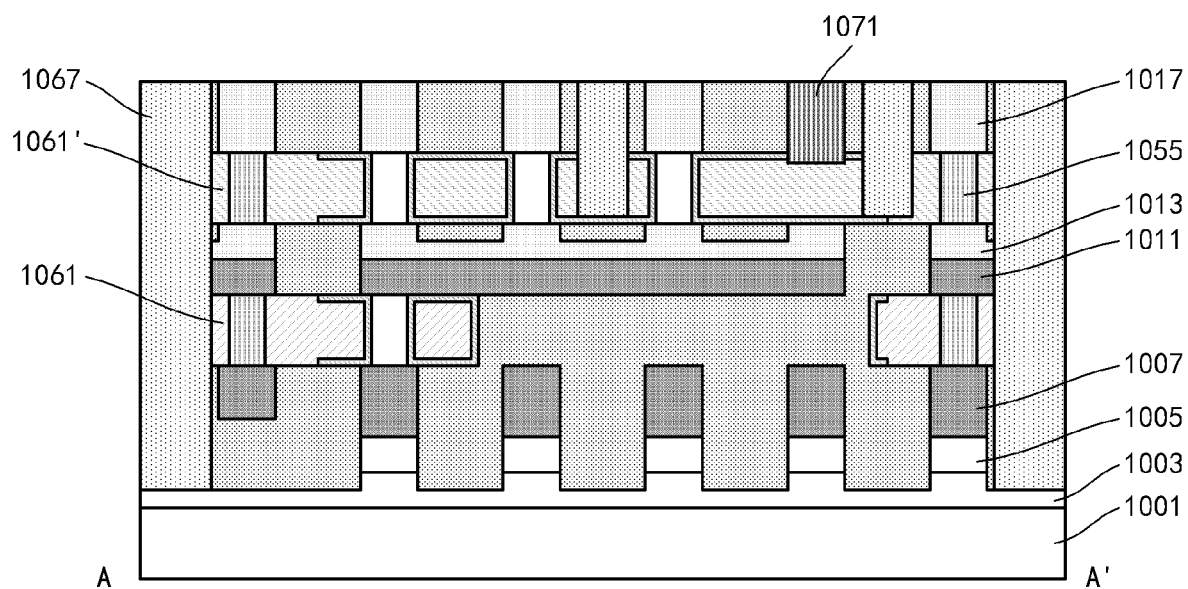
Figure 46C:
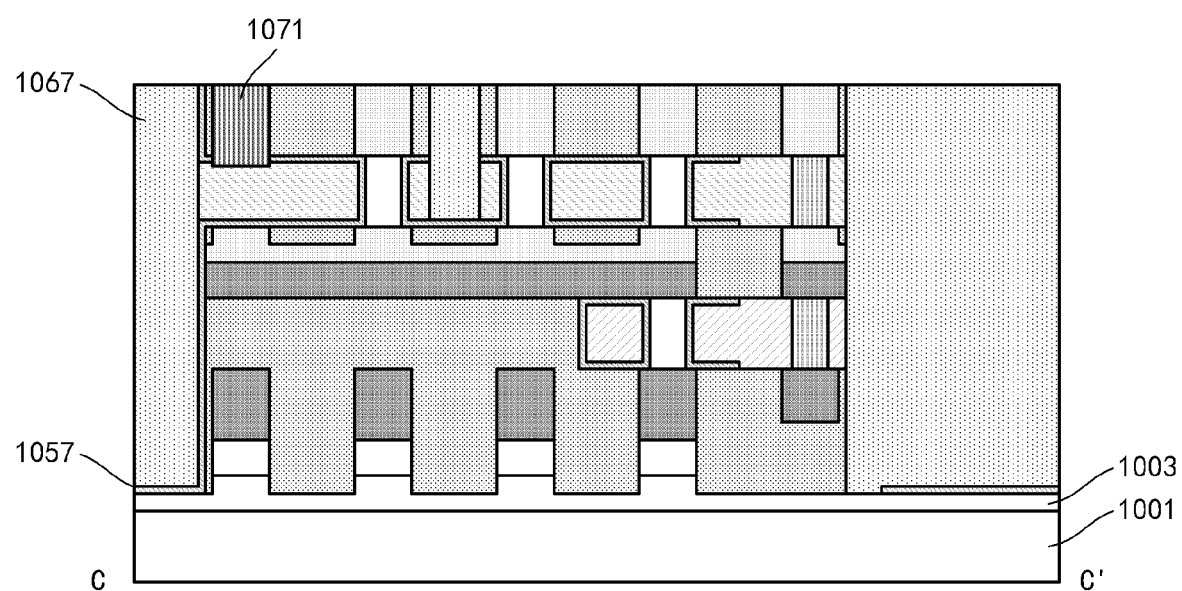
Figure 46D:
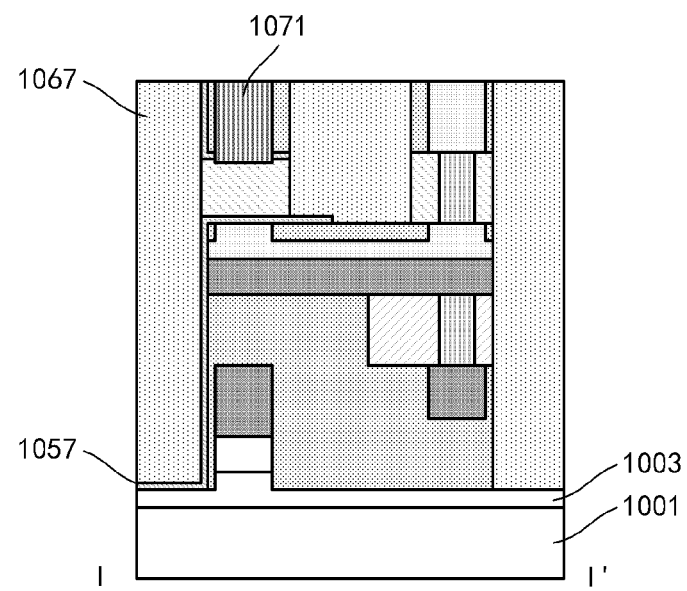

Then, as shown in FIGS. 46(a), 46(b), and 46(c) (FIGS. 46(a), 46(b), and 46(c) are a top view, a sectional view taken along line AA', and a sectional view taken along line CC' respectively), the respective layers (for example, the second source/drain layer 1017 which may have been partially or completely converted into silicide, and the gate dielectric layer 1057) may be etched downwards through the openings OP1 until the gate electrode layer 1061' is exposed. Thus, contact holes to the gate electrode layer 1061' are formed. The contact holes are defined by corresponding nanowires in the second source/drain layer 1017, and are therefore self-aligned to the gate electrode layer 1061'. Contact plugs 1071 (i.e., the contact plugs WL-1, WL-2) may be formed by filling the contact holes with a conductive material, for example, metal such as W, Ru, Co, or a combination thereof.

Next, various contacts may be manufactured.

Figure 47A:
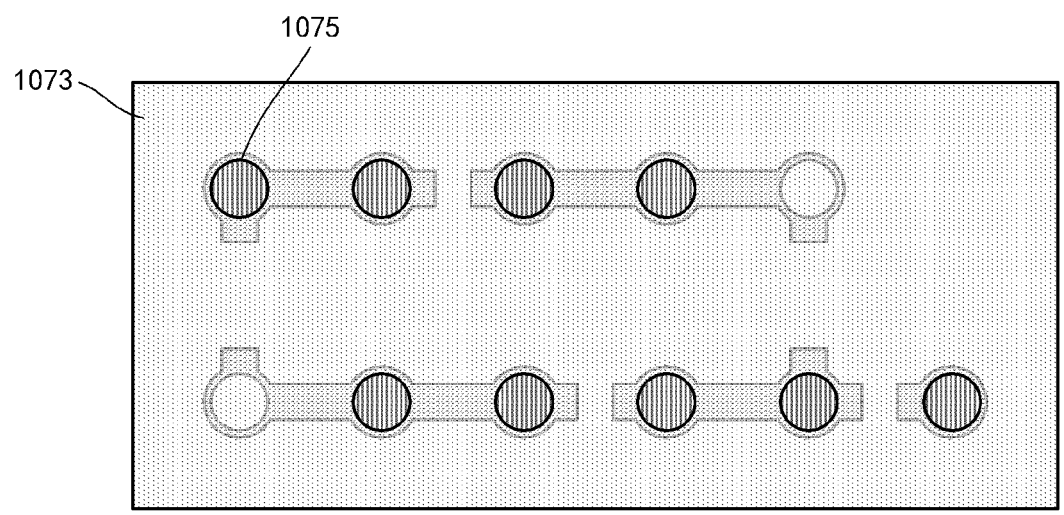
Figure 47B:
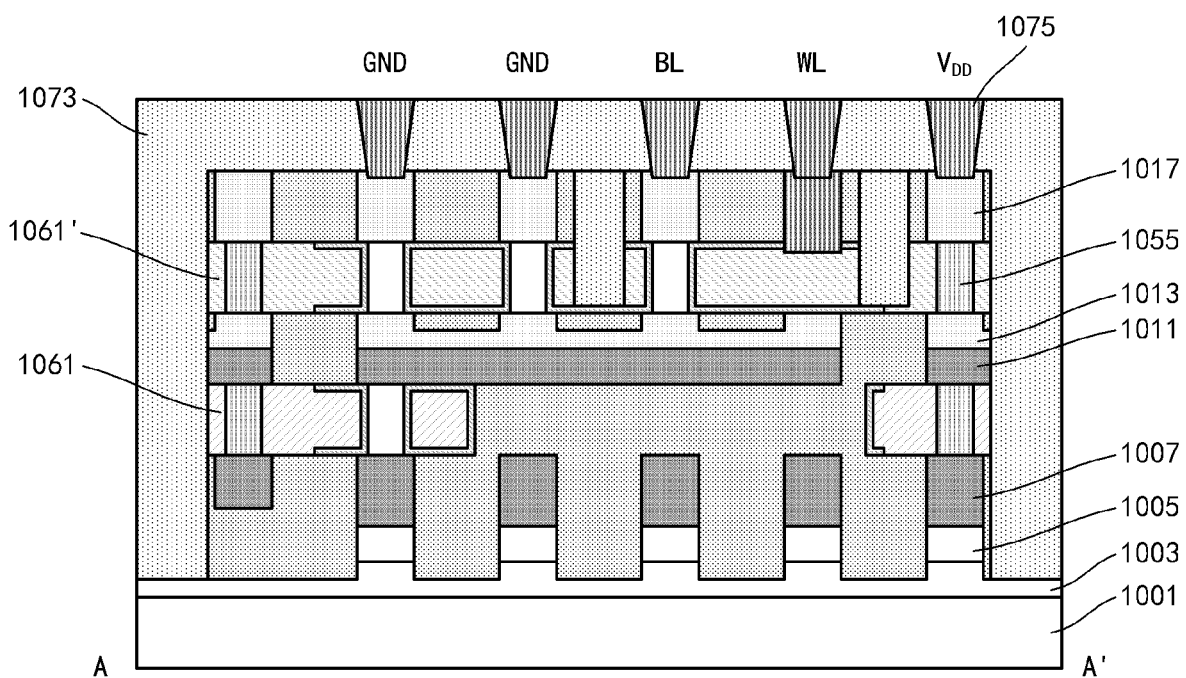
Figure 47C:
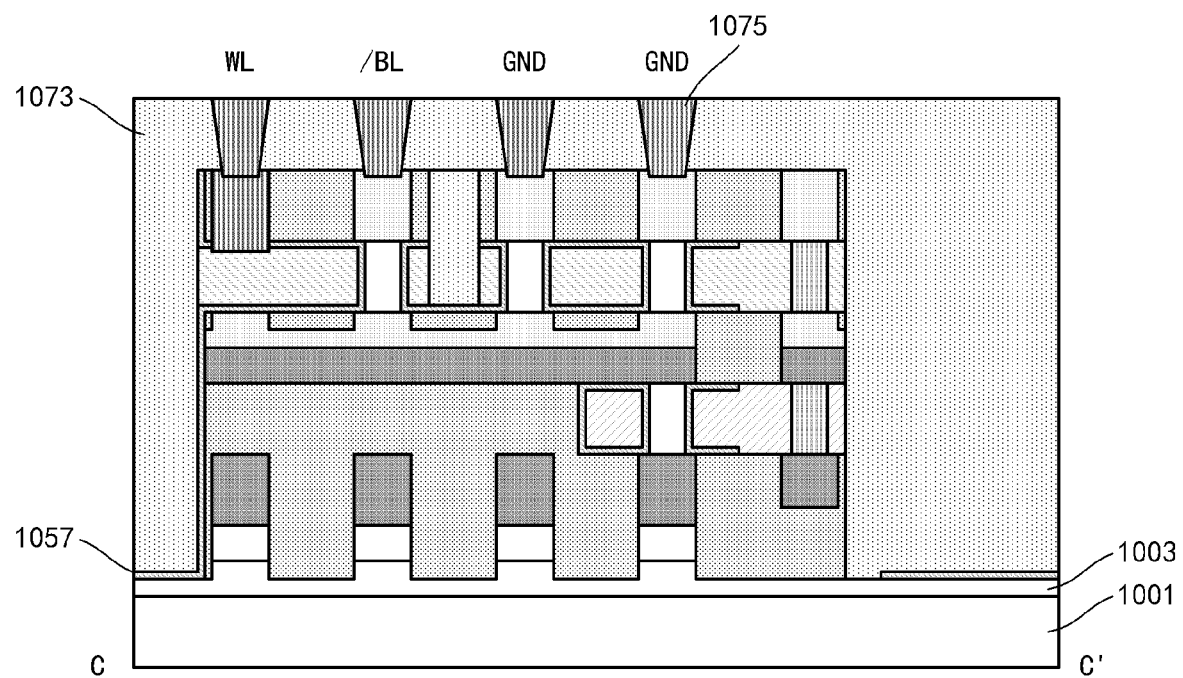

For example, as shown in FIGS. 47(a), 47(b), and 47(c) (FIGS. 47(a), 47(b), and 47(c) are a top view, a sectional view taken along line AA', and a sectional view taken along line CC' respectively), an isolation layer may be formed on the above structure by depositing a dielectric material such as oxide and planarizing the dielectric material by, for example, CMP. The isolation layer may be shown as 1073 together with the isolation layer 1067. In the isolation layer 1073, contact holes may be formed, and various contacts 1075 may be formed by filling the contact holes with a conductive material.

As shown in FIG. 47(b), the power supply voltage $V_{DD}$ may be applied to the corresponding contact plug through a corresponding one of the contacts 1075, and to the source/drain region of the first pull-up transistor through (the isolation auxiliary layer 1005 and) the contact layer 1003. The word line WL may be connected to the gate electrode of the first pass-gate transistor through a corresponding one of the contacts 1075 and the contact plug WL-1, and the bit line BL may be connected to the source/drain region of the first pass-gate transistor through a corresponding one of the contacts 1075. The ground voltage GND may be applied to the source/drain regions of the respective unit transistors in the first pull-down transistor through corresponding ones of the contacts 1075. The gate electrode of the respective unit transistors in the first pull-down transistor is electrically connected to the gate electrode of the first pull-up transistor through the third interconnection structure.

As shown in FIG. 47(c), the word line WL may be connected to the gate electrode of the second pass-gate transistor through a corresponding one of the contacts 1075 and the contact plug WL-2, and the complementary bit line/BL may be connected to the source/drain region of the second pass-gate transistor through a corresponding one of the contacts 1075. The ground voltage GND may be applied to the source/drain regions of the respective unit transistors in the second pull-down transistor through corresponding ones of the contacts 1075. The gate electrode of the respective unit transistors in the second pull-down transistor is electrically connected to the gate electrode of the second pull-up transistor through the fourth interconnection structure.

According to another embodiment of the present disclosure, the upper source/drain regions of the respective unit transistors of one same pull-down transistor may be connected together to facilitate the layout of the word lines and/or the bit lines.

Figure 48A:
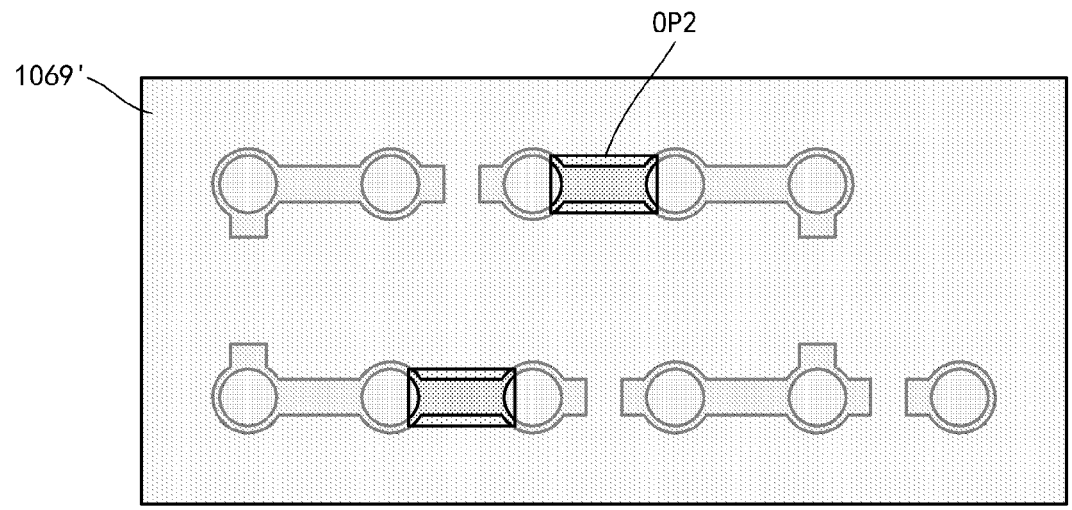
Figure 48B:
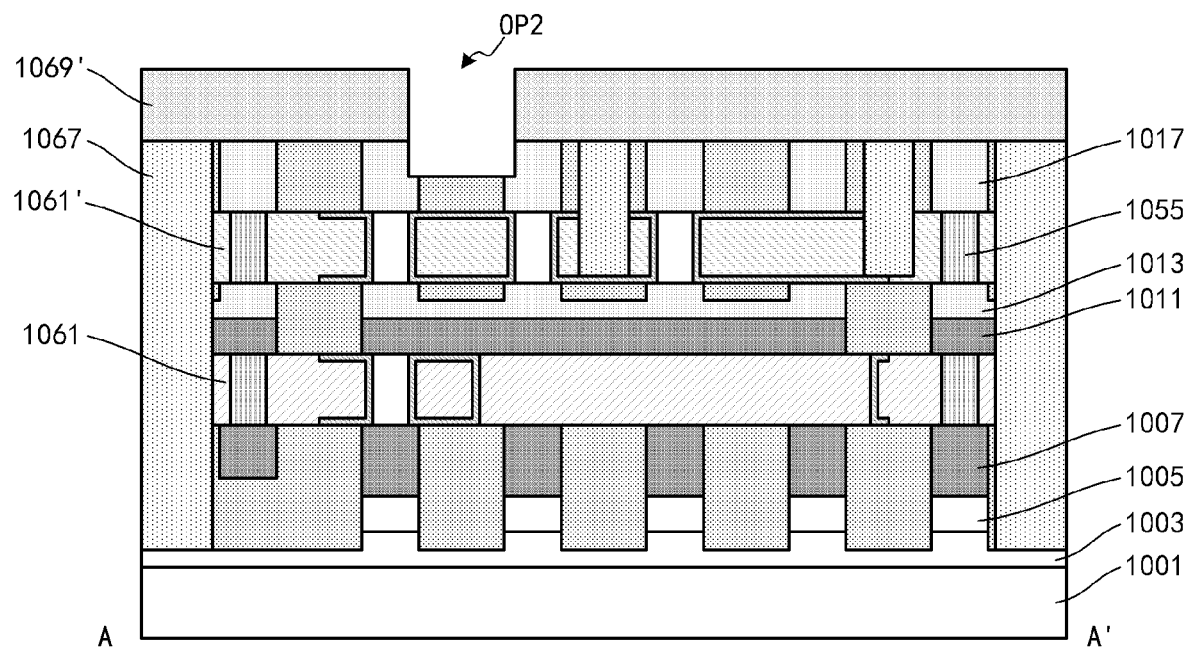
Figure 48C:
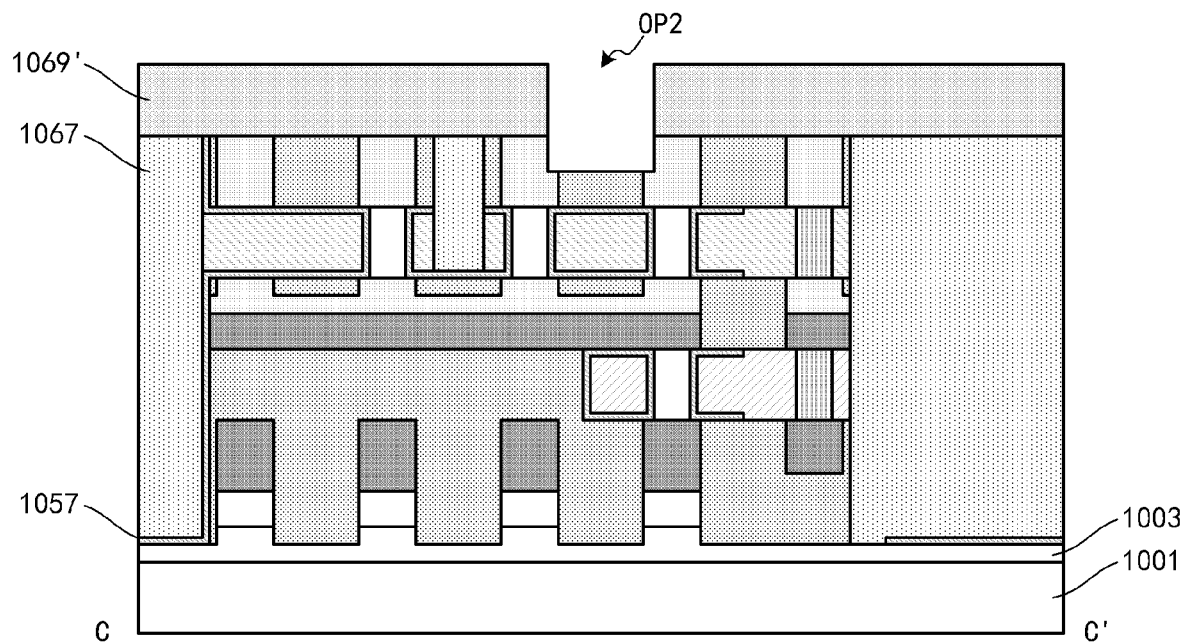

For example, as shown in FIGS. 48(a), 48(b), and 48(c) (FIGS. 48(a), 48(b), and 48(c) are a top view, a sectional view taken along line AA', and a sectional view taken along line CC' respectively), after the electrical isolation is formed in the gate electrode layer 1061' as described above in conjunction with FIGS. 44(a), 44(b), 44(c), 44(d), and 44(e), photoresist 1069' may be formed on the resulting structure, and then patterned to expose regions between the respective unit transistors of each of the pull-down transistors, as shown by openings OP2 in the figure. The openings OP2 may cover portions of the source/drain regions of the unit transistors of the respective pull-down transistors. The respective layers (for example, the placeholder layer 1031, the isolation layer 1067, and the second source/drain layer 1017 which may have been partially or completely converted into silicide) may be etched with the photoresist 1069' as an etching mask to form trenches corresponding to the openings OP2. The etching may be stopped before reaching the gate stacks.

Figure 49A:
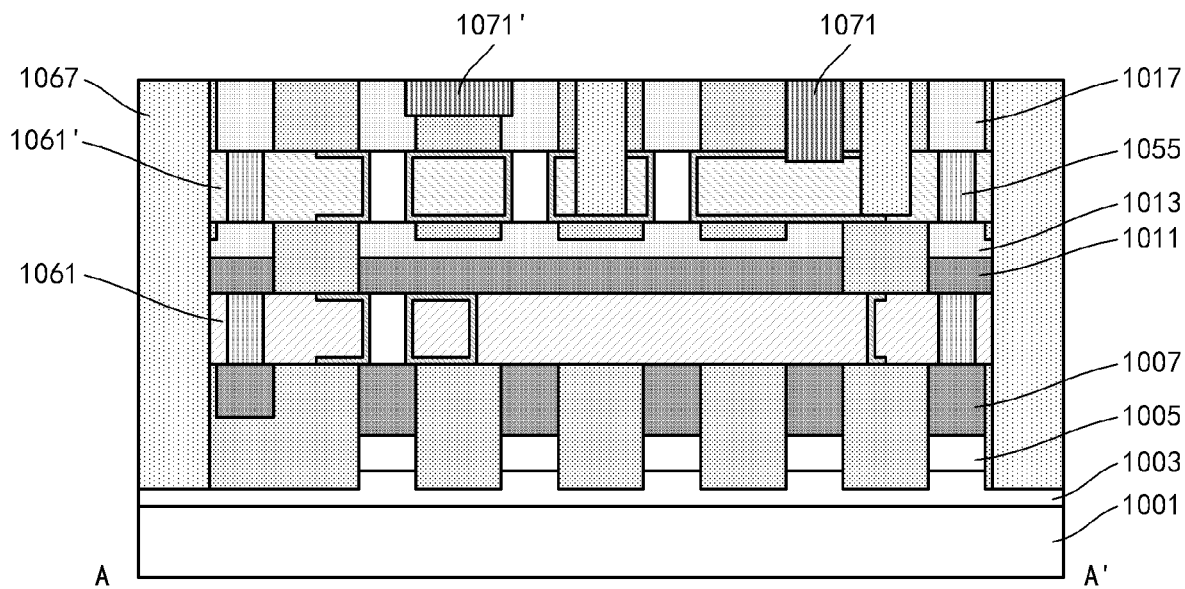
Figure 49B:
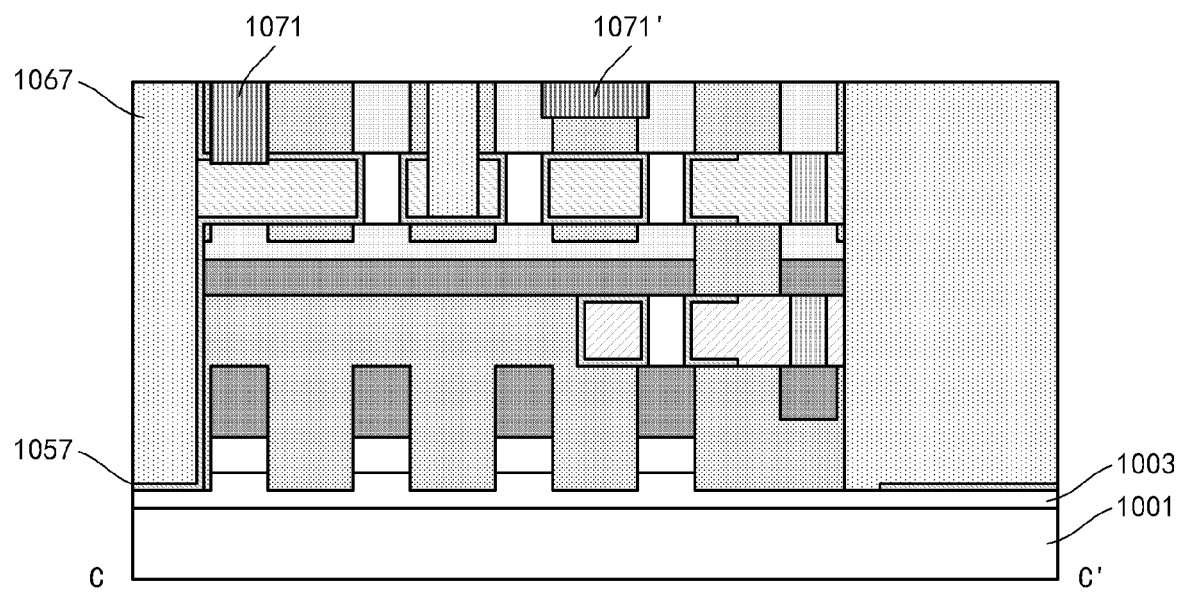

Then, as shown in FIGS. 49(a) and 49(b) (FIGS. 49(a) and 49(b) are sectional views taken along line AA' and line CC' respectively), contact plugs 1071 may be formed according to the processes described above in conjunction with FIGS. 45(a), 45(b) and 45(c) and FIGS. 46(a), 46(b) and 46(c). In forming the contact plugs 1071, interconnections 1071' between the source/drain regions of the respective unit transistors in each of the pull-down transistors may be formed in the trenches formed as described above.

Figure 50A:
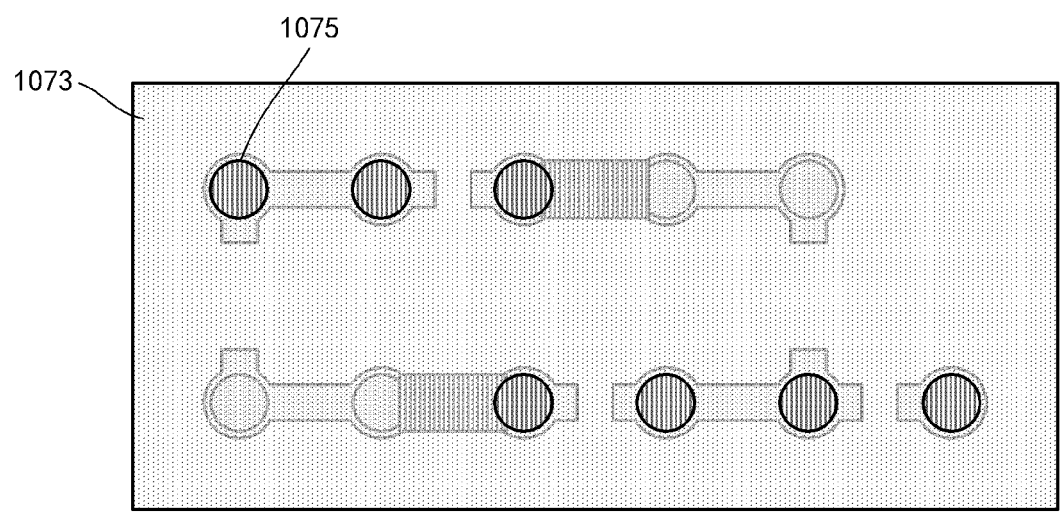
Figure 50B:
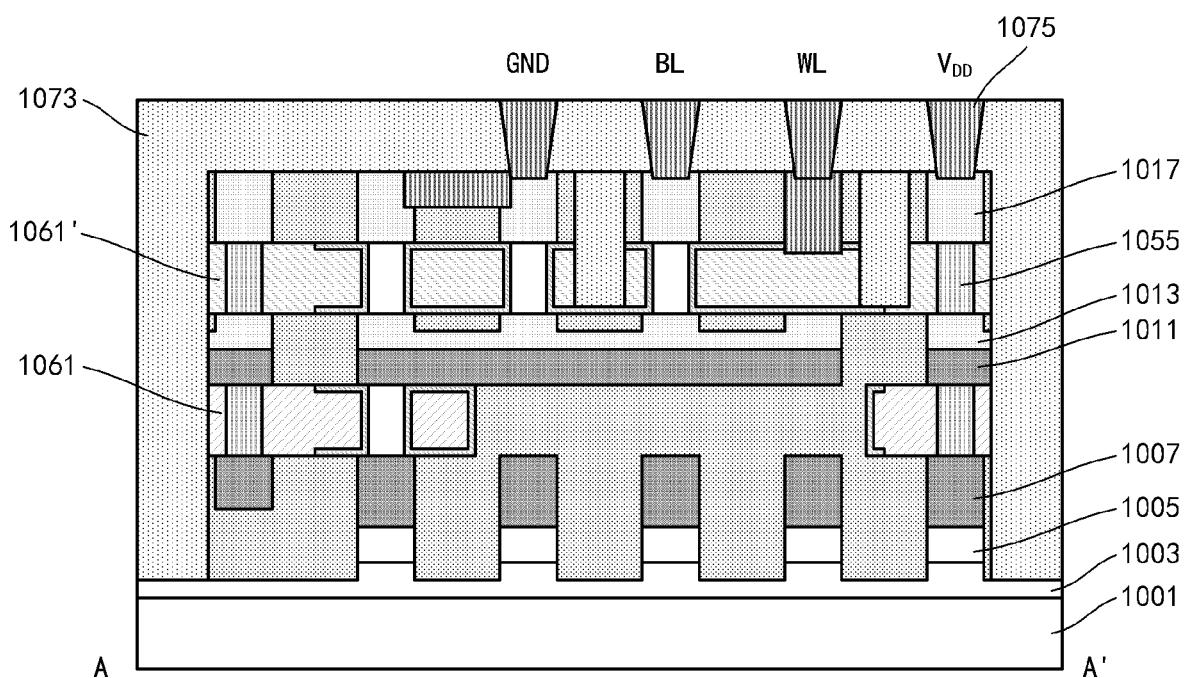
Figure 50C:
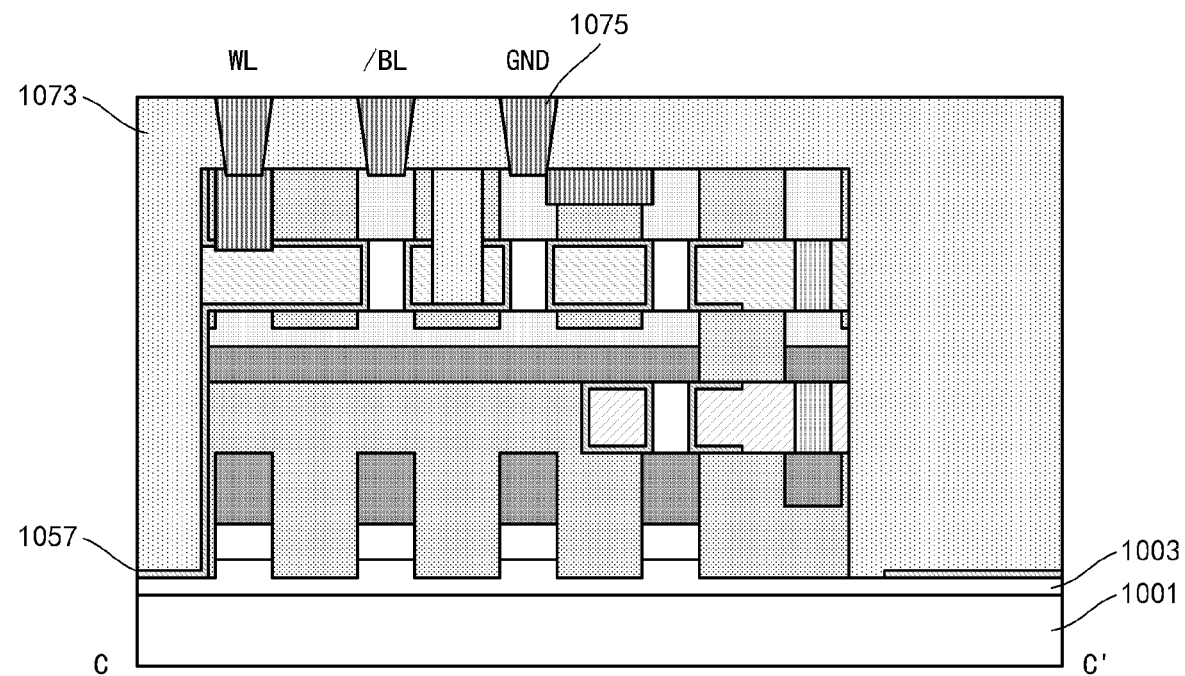

Then, as shown in FIGS. 50(a), 50(b), and 50(c) (FIGS. 50(a), 50(b), and 50(c) are a top view, a sectional view taken along line AA', and a sectional view taken along line CC' respectively), contacts 1075 may be formed according to the process described above in conjunction with FIGS. 47(a), 47(b) and 47(c). Since the source/drain regions of the respective unit transistors in each of the pull-down transistors are electrically connected to each other through the interconnections 1071', for the two unit transistors in one same pull-down transistor, only one ground contact may be formed, instead of forming two ground contacts as in the above embodiment.

Next, metallization may be formed.

Figure 51A:
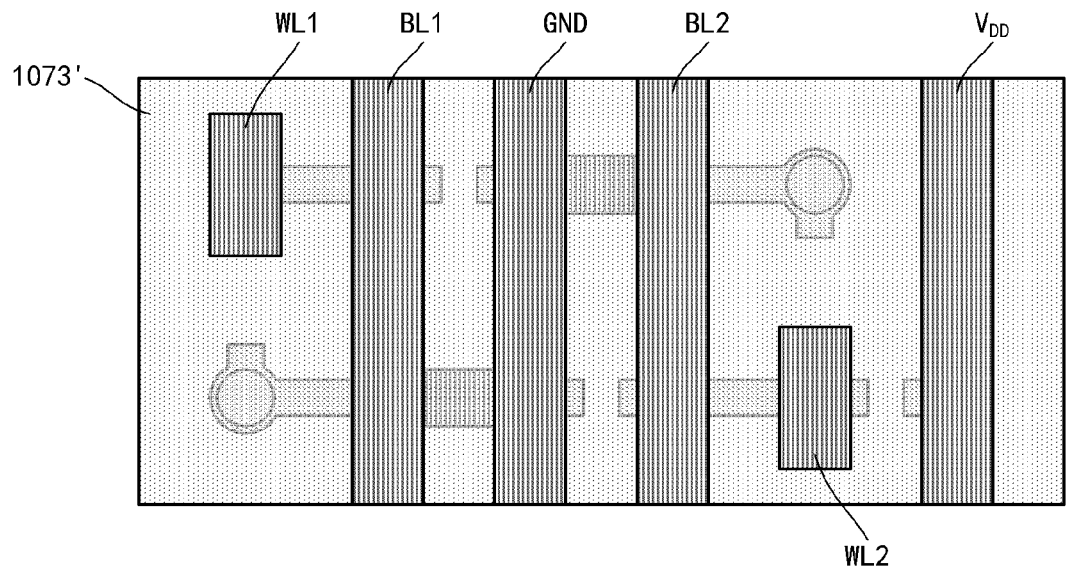
Figure 51B:
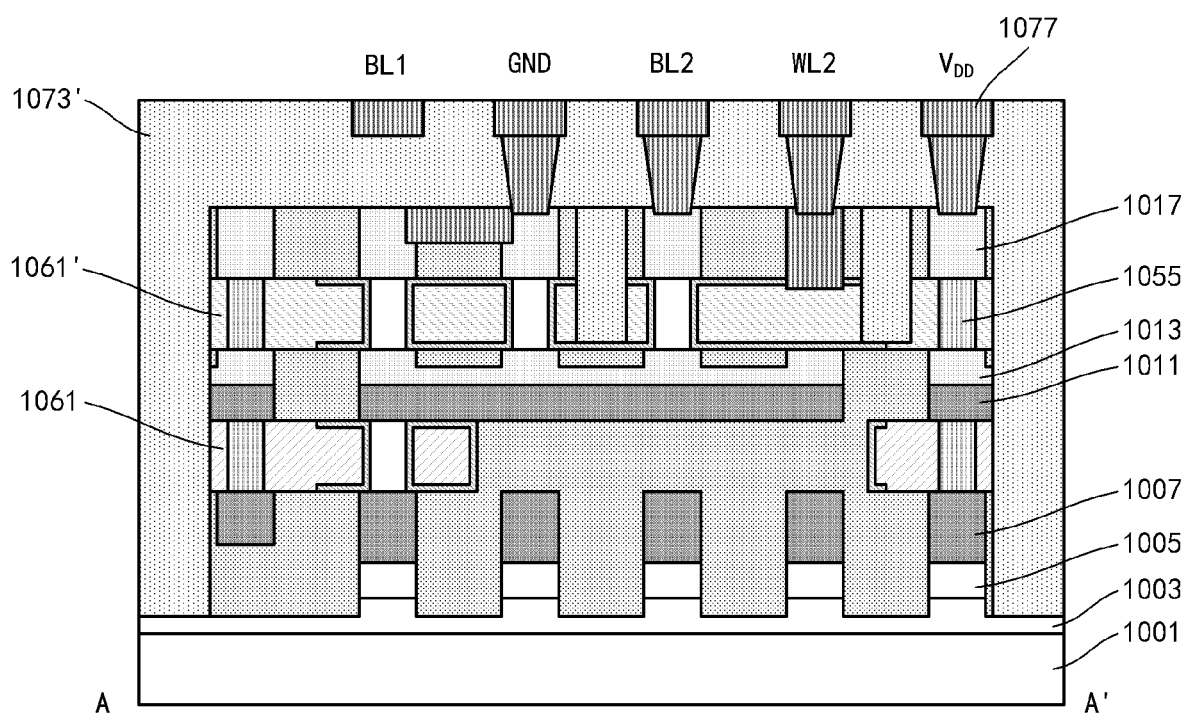
Figure 51C:
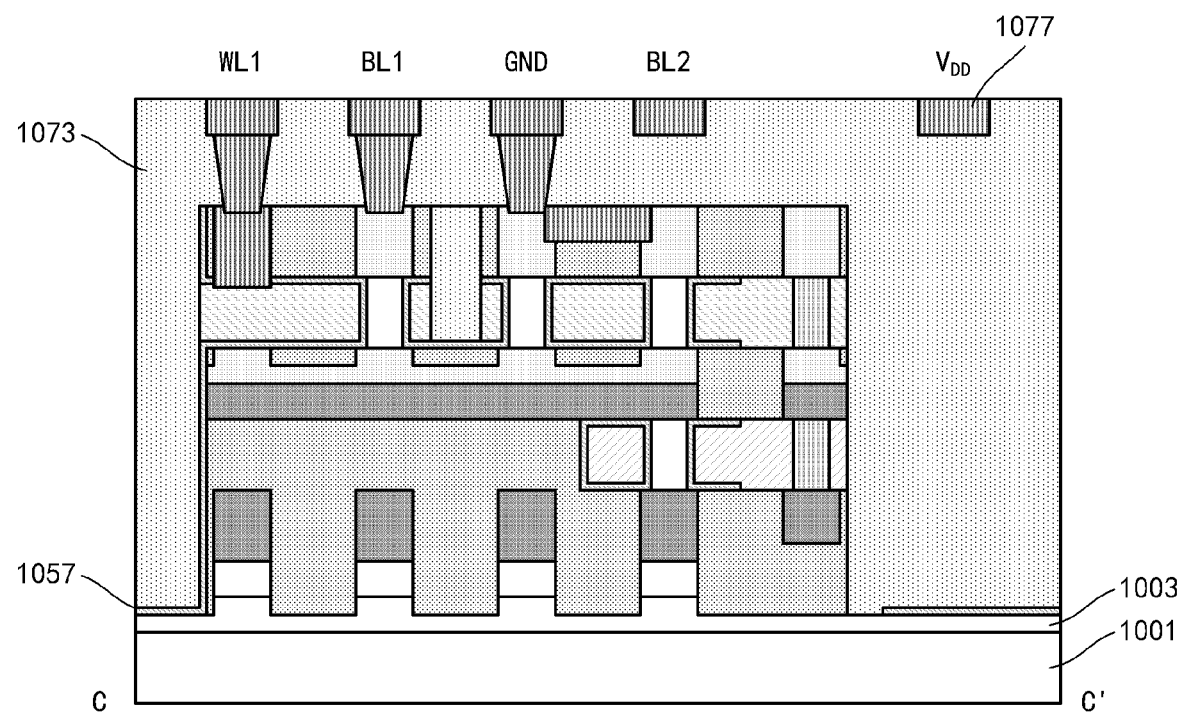

For example, as shown in FIGS. 51(*a*), 51(*b*), and 51(*c*) (FIGS. 51(*a*), 51(*b*), and 51(*c*) are a top view, a sectional view taken along line AA', and a sectional view taken along line CC' respectively), an isolation layer may be formed on the isolation layer 1073 by depositing a dielectric material such as oxide and planarizing the dielectric material by, for example, CMP. The isolation layer may be shown as 1073' together with the isolation layer 1073. A first metal layer 1077 may be formed in the isolation layer 1073', and comprises metal patterns connected to the respective contacts, for example, patterns WL1 and WL2 for the word lines, patterns BL1 and BL2 for the bit lines, a pattern GND for the ground voltage, and a pattern $V_{DD}$ for the power supply voltage. As shown in the top view in FIG. 51(*a*), since the ground contacts is reduced in number, the patterns BL1 and BL2 for the bit lines may be formed as straight lines, which is advantageous for patterning.

Figure 52A:
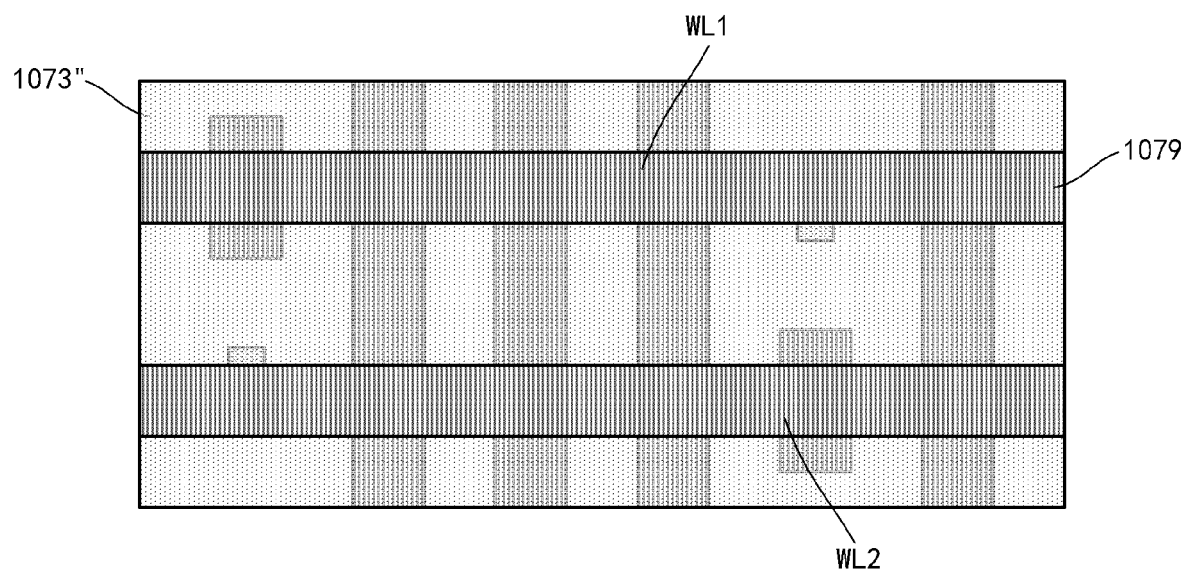
Figure 52B:
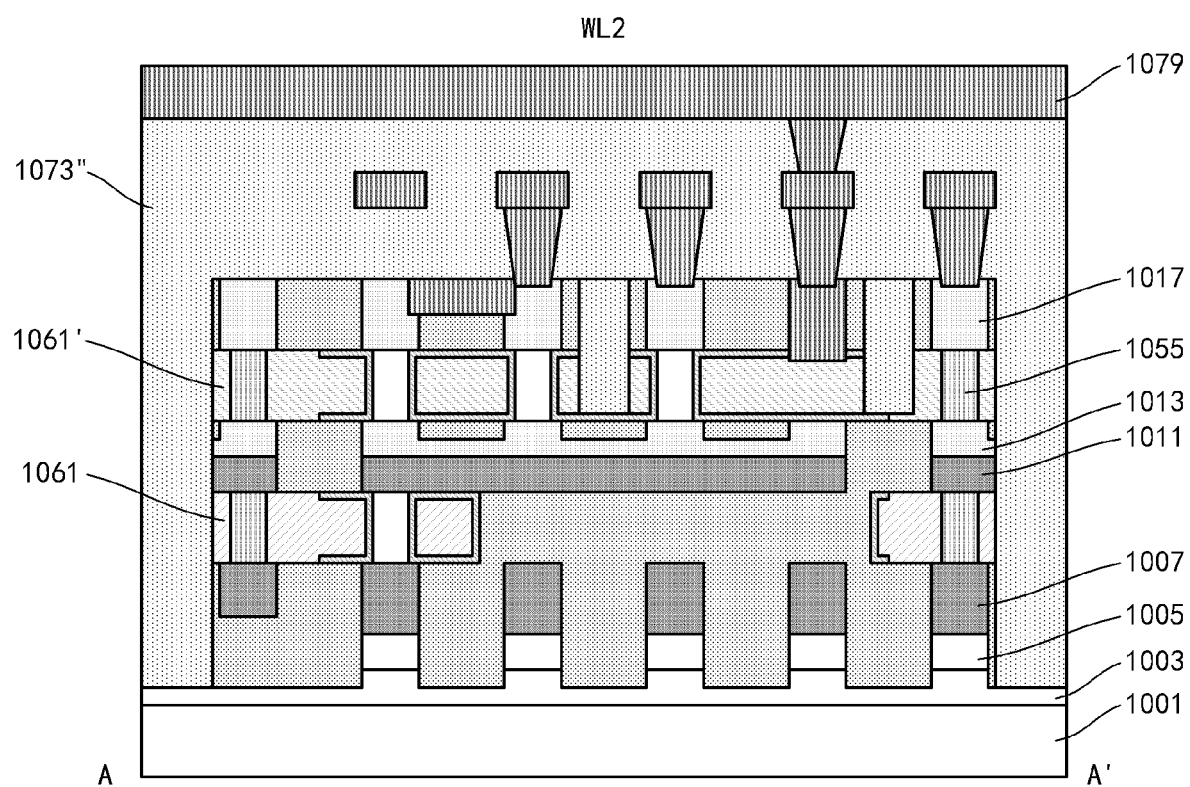
Figure 52C:
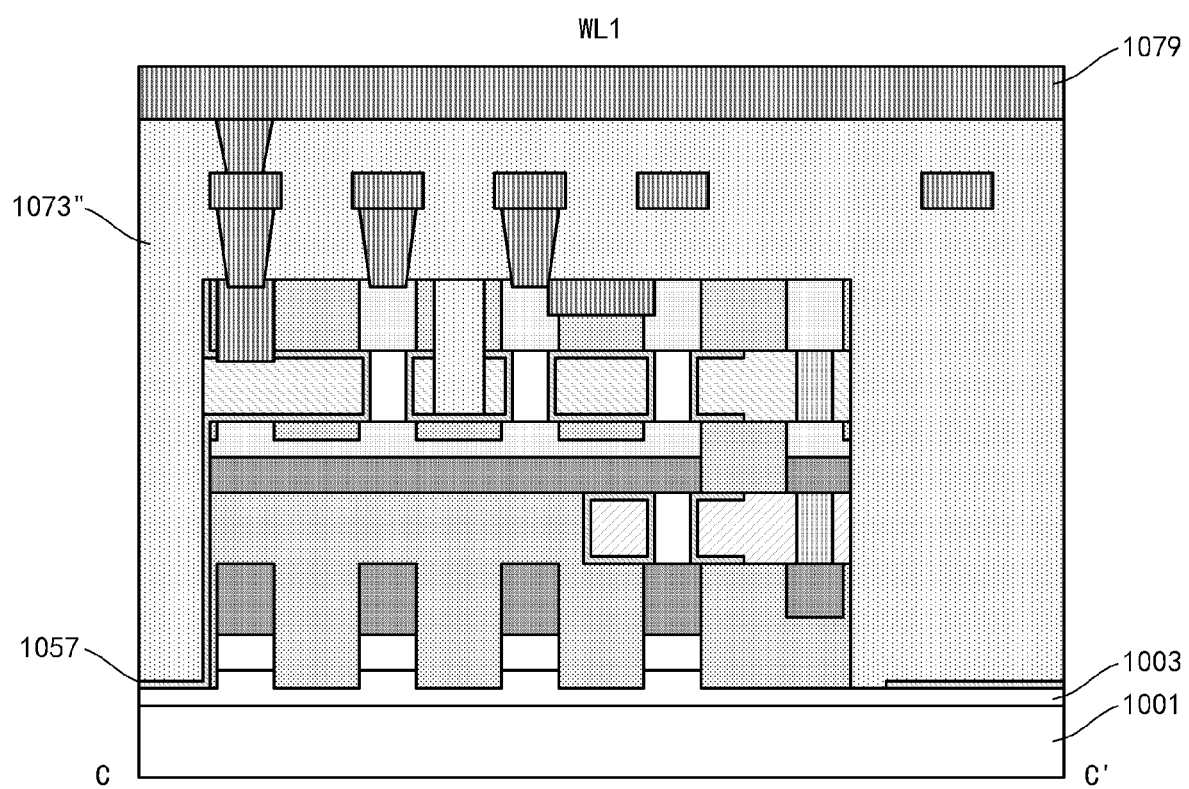

Then, as shown in FIGS. 52(*a*), 52(*b*), and 52(*c*) (FIGS. 52(*a*), 52(*b*), and 52(*c*) are a top view, a sectional view taken along line AA', and a sectional view taken along line CC' respectively), an isolation layer may be formed on the isolation layer 1073' by depositing a dielectric material such as oxide and planarizing the dielectric material by, for example, CMP. The isolation layer may be shown as 1073'' together with the isolation layer 1073'. A second metal layer 1079 may be formed in the isolation layer 1073'', and comprises patterns WL1 and WL2 for the word lines. As shown in the top view in FIG. 52(*a*), the patterns WL1 and WL2 for the word lines may be formed as straight lines, which is advantageous for patterning.

The SRAM cell according to the embodiments of the present disclosure may be applied to various electronic devices. For example, a memory may be formed based on such an SRAM cell, and thereby an electronic device may be constructed. Therefore, the present disclosure further provides a memory comprising the SRAM cell described above and an electronic device comprising such a memory. The electronic device may further comprise components such as a processor or the like which are operatively coupled to the memory. Such an electronic device is, for example, a smart phone, a computer, a Personal Computer (PC), a wearable smart device, a mobile power supply or the like.

The present disclosure also relates to the following aspects.

1. A method of manufacturing a Static Random Access Memory (SRAM) cell, comprising:
   providing a stack of a first group of a first source/drain layer, a channel layer and a second source/drain layer and a second group of a first source/drain layer, a channel layer and a second source/drain layer sequentially on a substrate;
   forming a hard mask layer on the stack, wherein the hard mask layer comprises body portions and connection portions between the respective body portions, wherein the body portions are configured to define transistors included in the SRAM cell, and the connection portions are configured to define interconnection structures included in the SRAM cell and have a line width less than that of the body portions;
   defining, in the channel layer and the second source/drain layer of the second group, active regions of pull-down transistors and pass-gate transistors among the transistors included in the SRAM cell by using the hard mask layer;
   defining, in the first source/drain layer of the second group and the second source/drain layer of the first group, a first interconnection structure and a second interconnection structure among the interconnection structures included in the SRAM cell by using the hard mask layer; and
   defining, in the channel layer and the first source/drain layer of the first group, active regions of pull-up transistors among the transistors included in the SRAM cell by using the hard mask layer.

2. The method according to aspect 1, wherein the hard mask layer further comprises additional body portions configured to define a third interconnection structure and a fourth interconnection structure among the interconnection structures.

3. The method according to aspect 1 or 2, wherein the hard mask layer further comprises an additional body portion configured to define a contact plug to a gate electrode of the pass-gate transistor.

4. The method according to any of the preceding aspects, wherein the hard mask layer has a rectangular or parallelogram shape as a whole.

5. The method according to any of the preceding aspects, wherein the hard mask layer further comprises an additional body portion configured to define a contact plug to apply a power supply voltage to the first source/drain layer of the first group.

6. The method according to any of the preceding aspects, wherein when the active regions are defined in the channel layer of the second group and the channel layer of the first group, portions of the channel layers at unnecessary positions are removed.

7. The method according to any of the preceding aspects, wherein defining active regions in the channel layer of the second group comprises:
   selectively etching the second source/drain layer and the channel layer of the second group sequentially with the hard mask layer as an etching mask;
   further selectively etching the channel layer of the second group, so that the channel layer is divided into separated portions corresponding to the respective body portions in the hard mask layer; and
   forming a sacrificial gate around peripheries of the respective separated portions of the channel layer based on the hard mask layer.

8. The method according to aspect 7, wherein defining active regions in the second source/drain layer of the second group comprises:
   further selectively etching the second source/drain layer of the second group, so that the second source/drain layer is divided into separated portions corresponding to the respective body portions in the hard mask layer; and
   forming a placeholder layer around peripheries of the respective separated portions of the second source/drain layer based on the hard mask layer.

9. The method according to aspect 7 or 8, wherein defining the first interconnection structure and the second interconnection structure in the first source/drain layer of the second group and the second source/drain layer of the first group comprises:

selectively etching the first source/drain layer of the second group and the second source/drain layer of the first group sequentially with the hard mask layer as an etching mask.

10. The method according to any of aspects 7 to 9, wherein defining active regions in the channel layer of the first group comprises:
   selectively etching the channel layer of the first group with the hard mask layer as an etching mask; and
   further selectively etching the channel layer, so that the channel layer is divided into separated portions corresponding to the respective body portions in the hard mask layer.

11. The method according to aspect 10, further comprising:
   forming a placeholder layer around the peripheries of the respective separated portions of the channel layer based on the hard mask layer according to a layout of the pull-up transistors in the SRAM cell; and
   forming a sacrificial gate around the peripheries of the respective separated portions of the channel layer based on the hard mask layer.

12. The method according to aspect 10, wherein defining the first interconnection structure and the second interconnection structure in the first source/drain layer of the second group and the second source/drain layer of the first group further comprises:
   realizing electrical isolation in the first source/drain layer of the second group and the second source/drain layer of the first group, so that the first source/drain layer of the second group and the second source/drain layer of the first group are divided into portions which correspond to the first interconnection structure and the second interconnection structure and are electrically isolated from each other.

13. The method according to any of aspects 7 to 12, wherein defining active regions in the first source/drain layer of the first group comprises:
   selectively etching the first source/drain layer with the hard mask layer as an etching mask;
   further selectively etching the first source/drain layer, so that the first source/drain layer is divided into separated portions corresponding to the respective body portions in the hard mask layer; and
   forming a placeholder layer around peripheries of the respective separated portions of the first source/drain layer based on the hard mask layer.

14. The method according to any of the preceding aspects, further comprising:
   providing an isolation auxiliary layer on the substrate, wherein the stack is provided on the isolation auxiliary layer,
   wherein the method further comprises:
      selectively etching the isolation auxiliary layer with the hard mask layer as an etching mask; and
      removing portions of the isolation auxiliary layer at positions where the third interconnection structure and the fourth interconnection structure are located.

15. The method according to any of the preceding aspects, further comprising:
   removing the placeholder layer and
   siliciding exposed portions of the source/drain layers.

16. The method according to any of the preceding aspects, further comprising:
   locally removing the sacrificial gate at positions of the third interconnection structure and the fourth interconnection structure and the contact plug to apply a power supply voltage to the first source/drain layer of the first group, and
   siliciding exposed portions of the channel layers.

17. The method according to any of the preceding aspects, further comprising:
   replacing the sacrificial gate with gate stacks.

18. A Static Random Access Memory (SRAM) cell, comprising:
   a first pull-up transistor, a second pull-up transistor, a first pull-down transistor, a second pull-down transistor, a first pass-gate transistor and a second pass-gate transistor provided at two levels on a substrate,
   wherein the respective transistors are vertical transistors,
   wherein the first pull-up transistor and the second pull-up transistor are provided at a first level, and the first pull-down transistor, the second pull-down transistor, the first pass-gate transistor and the second pass-gate transistor are provided at a second level different from the first level, and
   wherein a region where the first pull-up transistor and the second pull-up transistor are located and a region where the first pull-down transistor, the second pull-down transistor, the first pass-gate transistor and the second pass-gate transistor are located at least partially overlap in a vertical direction with respect to an upper surface of the substrate.

19. The SRAM cell according to aspect 18, wherein the first level is closer to the substrate than the second level, so that the first pull-down transistor, the second pull-down transistor, the first pass-gate transistor and the second pass-gate transistor are located above the first pull-up transistor and the second pull-up transistor with respect to the upper surface of the substrate; or
   wherein the second level is closer to the substrate than the first level, so that the first pull-down transistor, the second pull-down transistor, the first pass-gate transistor and the second pass-gate transistor are located below the first pull-up transistor and the second pull-up transistor with respect to the upper surface of the substrate.

20. The SRAM cell according to aspect 18 or aspect 19, wherein the first pull-up transistor, the first pull-down transistor, the second pull-up transistor and the second pull-down transistor are connected as two cross-coupled inverters, and
   wherein the first pass-gate transistor is connected between a first bit line and a first node between the first pull-up transistor and the first pull-down transistor, and the second pass-gate transistor is connected between a second bit line and a second node between the second pull-up transistor and the second pull-down transistor.

21. The SRAM cell according to aspect 20, wherein the first node is provided between the first level and the second level, and the second node is provided between the first level and the second level.

22. The SRAM cell according to aspect 18 or aspect 19, wherein at least one of the following is satisfied:
   the first pull-up transistor and the first pull-down transistor are aligned in the vertical direction; and
   the second pull-up transistor and the second pull-down transistor are aligned in the vertical direction.

23. The SRAM cell according to aspect 18 or aspect 19, wherein in a top view, a region where the first pull-up transistor, the first pull-down transistor, and the first pass-gate transistor are located is spaced apart from a region where the second pull-up transistor, the second pull-down transistor, and the second pass-gate transistor are located.

24. The SRAM cell according to aspect 18 or aspect 19, wherein each of the first pull-up transistor and the second pull-up transistor comprises one or more unit transistors; or wherein each of the first pull-down transistor and the second pull-down transistor comprises one or more unit transistors.

25. The SRAM cell according to aspect 24, wherein at least one of the following is satisfied:
at least a part of the unit transistors included in the first pull-up transistor at the first level is aligned in the vertical direction with at least a part of the unit transistors included in the first pull-down transistor and the first pass-gate transistor at the second level; and
at least a part of the unit transistors included in the second pull-up transistor at the first level is aligned in the vertical direction with at least a part of the unit transistors included in the second pull-down transistor and the second pass-gate transistor at the second level.

26. The SRAM cell according to aspect 18, wherein each of the first pull-up transistor, the second pull-up transistor, the first pull-down transistor, the second pull-down transistor, the first pass-gate transistor and the second pass-gate transistor comprises a vertical channel extending vertically with respect to the upper surface of the substrate and a gate electrode formed at least partially surrounding a periphery of the vertical channel, and
wherein the SRAM cell further comprises:
a first interconnection structure extending laterally with respect to the upper surface of the substrate and located at a level between the first level and the second level, wherein a source/drain region of the first pull-up transistor on a side facing the first pull-down transistor and source/drain regions of the first pull-down transistor and the first pass-gate transistor on a side facing the first pull-up transistor are electrically connected to each other by the first interconnection structure;
a second interconnection structure extending laterally with respect to the upper surface of the substrate and located at a level between the first level and the second level, wherein a source/drain region of the second pull-up transistor on a side facing the second pull-down transistor and source/drain regions of the second pull-down transistor and the second pass-gate transistor on a side facing the second pull-up transistor are electrically connected to each other by the second interconnection structure;
a third interconnection structure extending vertically with respect to the upper surface of the substrate, electrically connecting the gate electrode of the first pull-up transistor and the gate electrode of the first pull-down transistor, and electrically connected to the second interconnection structure; and
a fourth interconnection structure vertically extending with respect to the upper surface of the substrate, electrically connecting the gate electrode of the second pull-up transistor and the gate electrode of the second pull-down transistor, and electrically connected to the first interconnection structure.

27. The SRAM cell according to aspect 26, wherein the vertical channel of the first pull-up transistor and the vertical channel of the second pull-up transistor are at the substantially same level from the upper surface of the substrate.

28. The SRAM cell according to aspect 26 or aspect 27, wherein the respective vertical channels of the first pull-down transistor, the second pull-down transistor, the first pass-gate transistor and the second pass-gate transistor are at the substantially same level from the upper surface of the substrate.

29. The SRAM cell according to any of aspects 26 to 28, wherein at least one of the following is satisfied:
the vertical channel of the first pull-up transistor and the vertical channel of the first pull-down transistor are aligned in the vertical direction; or
the vertical channel of the second pull-up transistor and the vertical channel of the second pull-down transistor are aligned in the vertical direction.

30. The SRAM cell according to any of aspects 26 to 28, wherein at least one of the following is satisfied:
the source/drain region of the first pull-up transistor on the side facing the first pull-down transistor is aligned in the vertical direction with the source/drain region of the first pull-down transistor on the side facing the first pull-up transistor; or
the source/drain region of the second pull-up transistor on the side facing the second pull-down transistor is aligned in the vertical direction with the source/drain region of the second pull-down transistor on the side facing the second pull-up transistor.

31. The SRAM cell according to any of aspects 26 to 30, wherein the first interconnection structure comprises a first portion extending in a first direction and a second portion extending from the first portion towards the fourth interconnection structure in a second direction crossing the first direction so as to contact the fourth interconnection structure, and the first pull-up transistor, and the first pull-down transistor and the first pass-gate transistor are provided, respectively, on opposite sides of the first portion of the first interconnection structure in the vertical direction and overlap with the first portion in the vertical direction, and
wherein the second interconnection structure comprises a first portion extending in the first direction and a second portion extending from the first portion towards the third interconnection structure in the second direction so as to contact the third interconnection structure, and the second pull-up transistor, and the second pull-down transistor and the second pass-gate transistor are provided, respectively, on opposite sides of the first portion of the second interconnection structure in the vertical direction and overlap with the first portion in the vertical direction.

32. The SRAM cell according to aspect 31, wherein in a top view, the first interconnection structure and the second interconnection structure form a substantially rectangular shape.

33. The SRAM cell according to aspect 31, wherein in a top view,
an angle of about 60° is formed between the first portion and the second portion of the first interconnection structure, and an angle of about 120° is formed between the first portion and the second portion of the second interconnection structure; or
an angle of about 120° is formed between the first portion and the second portion of the first interconnection structure, and an angle of about 60° is formed between the first portion and the second portion of the second interconnection structure.

34. The SRAM cell according to aspect 31, wherein at least one of the following is satisfied:
the vertical channels of the first pull-down transistor and the first pass-gate transistor are aligned in the first direction, or the vertical channels of the second pull-down transistor and the second pass-gate transistor are aligned in the first direction.

35. The SRAM cell according to aspect 34, wherein at least one of the following is satisfied:
the third interconnection structure is aligned in the first direction with the vertical channels of the first pull-down transistor and the first pass-gate transistor, or
the fourth interconnection structure is aligned in the first direction with the vertical channels of the second pull-down transistor and the second pass-gate transistor.

36. The SRAM cell according to any of aspects 26 to 35, wherein the respective vertical channels are nanowires or nanosheets.

37. The SRAM cell according to any of aspects 26 to 36, wherein each of the transistors comprises a first source/drain layer, a channel layer, and a second source/drain layer which are stacked in the vertical direction, wherein the vertical channel is formed in the channel layer and wherein the channel layer comprises a single-crystalline semiconductor material.

38. The SRAM cell according to aspect 37, wherein the channel layer of the first pull-up transistor and the channel layer of the second pull-up transistor have top surfaces which are substantially coplanar with each other and bottom surfaces which are substantially coplanar with each other.

39. The SRAM cell according to aspect 38, wherein at least a portion of the gate electrode of each of the first pull-up transistor and the second pull-up transistor which is close to the respective channel layer has upper and lower surfaces which are substantially coplanar with upper and lower surfaces of the channel layer, respectively.

40. The SRAM cell according to any of aspects 37 to 39, wherein the respective channel layers of the first pull-down transistor, the second pull-down transistor, the first pass-gate transistor, and the second pass-gate transistor have top surfaces which are substantially coplanar with each other and bottom surfaces which are substantially coplanar with each other.

41. The SRAM cell according to aspect 40, wherein at least a portion of the gate electrode of each of the first pull-down transistor, the second pull-down transistor, the first pass-gate transistor and the second pass-gate transistor which is close to the respective channel layer has upper and lower surfaces which are substantially coplanar with upper and lower surfaces of the channel layer, respectively.

42. The SRAM cell according to any of aspects 37 to 41, wherein the second source/drain layer of the first pull-up transistor and the first source/drain layers of the first pull-down transistor and the first pass-gate transistor are in contact with each other and extend laterally to form the first interconnection structure, and
wherein the second source/drain layer of the second pull-up transistor and the first source/drain layers of the second pull-down transistor and the second pass-gate transistor are in contact with each other and extend laterally to form the second interconnection structure.

43. The SRAM cell according to aspect 42, wherein the respective source/drain layers are at least partially silicided.

44. The SRAM cell according to aspect 42, wherein the third interconnection structure comprises a first portion and a second portion located on opposite sides of the first interconnection structure in the vertical direction, respectively, and
wherein the fourth interconnection structure comprises a first portion and a second portion located on opposite sides of the second interconnection structure in the vertical direction, respectively,
wherein the first portion of the third interconnection structure and the first portion of the fourth interconnection structure comprise silicide containing a semiconductor element in the channel layers of the first pull-up transistor and the second pull-up transistor, and the second portion of the third interconnection structure and the second portion of the fourth interconnection structure comprise silicide containing a semiconductor element in the channel layers of the first pull-down transistor, the second pull-down transistor, the first pass-gate transistor, and the second pass-gate transistor.

45. A memory comprising a plurality of SRAM cells according to any of aspects 18 to 44.

46. An electronic device comprising the memory according to aspect 45 and a processor operatively coupled to the memory.

47. The electronic device according to aspect 46, comprising a smart phone, a computer, a tablet computer, a wearable smart device, an artificial intelligence device, and a mobile power supply.

In the above description, technical details such as patterning, etching or the like of each layer have not been described in detail. However, it should be understood by those skilled in the art that various technical means may be used to form layers, regions, or the like in desired shapes. In addition, in order to form the same structure, those skilled in the art may further design a method which is not completely the same as the method described above. In addition, although the embodiments are described respectively above, this does not mean that measures in the respective embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and equivalents thereof. Those skilled in the art may make various substitutions and modifications without departing from the scope of the present disclosure, and these substitutions and modifications shall fall within the scope of the present disclosure.

I claim:

1. A Static Random Access Memory (SRAM) cell, comprising:
a first pull-up transistor, a second pull-up transistor, a first pull-down transistor, a second pull-down transistor, a first pass-gate transistor and a second pass-gate transistor provided over two levels on a substrate,
wherein the respective transistors are vertical transistors,
wherein the first pull-up transistor and the second pull-up transistor are at a first level, and the first pull-down transistor, the second pull-down transistor, the first pass-gate transistor and the second pass-gate transistor are at a second level different from the first level,
wherein a first region where the first pull-up transistor and the second pull-up transistor are located and a second region where the first pull-down transistor, the second pull-down transistor, the first pass-gate transistor and the second pass-gate transistor are located at least partially overlap in a vertical direction with respect to an upper surface of the substrate, and
wherein each of the first pull-up transistor, the second pull-up transistor, the first pull-down transistor, the second pull-down transistor, the first pass-gate transistor and the second pass-gate transistor comprises a first source/drain layer, a channel layer, and a second source/drain layer which first source/drain layer, channel layer, and second source/drain layer are stacked in the vertical direction, and a gate electrode formed at least partially surrounding a periphery of the channel layer and self-aligned with the channel layer.

2. The SRAM cell according to claim 1, wherein the first level is closer to the substrate than the second level, so that the first pull-down transistor, the second pull-down transistor, the first pass-gate transistor and the second pass-gate transistor are located above the first pull-up transistor and the second pull-up transistor with respect to the upper surface of the substrate.

3. The SRAM cell according to claim 1, wherein the first pull-up transistor, the first pull-down transistor, the second pull-up transistor and the second pull-down transistor are connected as two cross-coupled inverters, and
wherein the first pass-gate transistor is connected between a first bit line and a first node between the first pull-up transistor and the first pull-down transistor, and the second pass-gate transistor is connected between a second bit line and a second node between the second pull-up transistor and the second pull-down transistor.

4. The SRAM cell according to claim 3, wherein the first node is between the first level and the second level, and the second node is between the first level and the second level.

5. The SRAM cell according to claim 1, wherein at least one of the following is satisfied:
the first pull-up transistor and the first pull-down transistor are aligned in the vertical direction; or
the second pull-up transistor and the second pull-down transistor are aligned in the vertical direction.

6. The SRAM cell according to claim 1, wherein in a top view, a region where the first pull-up transistor, the first pull-down transistor, and the first pass-gate transistor are located is spaced apart from a region where the second pull-up transistor, the second pull-down transistor, and the second pass-gate transistor are located.

7. The SRAM cell according to claim 1, wherein each of the first pull-up transistor and the second pull-up transistor comprises one or more unit transistors; or
wherein each of the first pull-down transistor and the second pull-down transistor comprises one or more unit transistors.

8. The SRAM cell according to claim 7, wherein at least one of the following is satisfied:
at least a part of the one or more unit transistors included in the first pull-up transistor at the first level is aligned in the vertical direction with at least a part of the one or more unit transistors included in the first pull-down transistor at the second level; or
at least a part of the one or more unit transistors included in the second pull-up transistor at the first level is aligned in the vertical direction with at least a part of the one or more unit transistors included in the second pull-down transistor at the second level.

9. The SRAM cell according to claim 1, wherein
the SRAM cell further comprises:
a first interconnection structure extending laterally with respect to the upper surface of the substrate and located at a level between the first level and the second level, wherein the source/drain layer of the first pull-up transistor on a side facing the first pull-down transistor and source/drain layers of the first pull-down transistor and the first pass-gate transistor on a side facing the first pull-up transistor are electrically connected to each other by the first interconnection structure;

a second interconnection structure extending laterally with respect to the upper surface of the substrate and located at a level between the first level and the second level, wherein the source/drain layer of the second pull-up transistor on a side facing the second pull-down transistor and source/drain layers of the second pull-down transistor and the second pass-gate transistor on a side facing the second pull-up transistor are electrically connected to each other by the second interconnection structure;

a third interconnection structure extending vertically with respect to the upper surface of the substrate, electrically connecting the gate electrode of the first pull-up transistor and the gate electrode of the first pull-down transistor, and electrically connected to the second interconnection structure; and a fourth interconnection structure vertically extending with respect to the upper surface of the substrate, electrically connecting the gate electrode of the second pull-up transistor and the gate electrode of the second pull-down transistor, and electrically connected to the first interconnection structure.

10. The SRAM cell according to claim 9, wherein the channel layer of the first pull-up transistor and the channel layer of the second pull-up transistor are at the substantially same level from the upper surface of the substrate.

11. The SRAM cell according to claim 9, wherein the respective channel layers of the first pull-down transistor, the second pull-down transistor, the first pass-gate transistor and the second pass-gate transistor are at the substantially same level from the upper surface of the substrate.

12. The SRAM cell according to claim 9, wherein at least one of the following is satisfied:
the channel layer of the first pull-up transistor and the channel layer of the first pull-down transistor are aligned in the vertical direction; or
the channel layer of the second pull-up transistor and the channel layer of the second pull-down transistor are aligned in the vertical direction.

13. The SRAM cell according to claim 9, wherein at least one of the following is satisfied:
the source/drain layer of the first pull-up transistor on the side facing the first pull-down transistor is aligned in the vertical direction with the source/drain layer of the first pull-down transistor on the side facing the first pull-up transistor; or
the source/drain layer of the second pull-up transistor on the side facing the second pull-down transistor is aligned in the vertical direction with the source/drain layer of the second pull-down transistor on the side facing the second pull-up transistor.

14. The SRAM cell according to claim 9, wherein the first interconnection structure comprises a first portion extending in a first direction and a second portion extending from the first portion towards the fourth interconnection structure in a second direction crossing the first direction so as to contact the fourth interconnection structure, and the first pull-up transistor, and the first pull-down transistor and the first pass-gate transistor are, respectively, on opposite sides of the first portion of the first interconnection structure in the vertical direction and overlap with the first portion in the vertical direction, and
wherein the second interconnection structure comprises a first portion extending in the first direction and a second portion extending from the first portion towards the third interconnection structure in the second direction so as to contact the third interconnection structure, and the second pull-up transistor, and the second pull-down transistor and the second pass-gate transistor are, respectively, on opposite sides of the first portion of the second interconnection structure in the vertical direction and overlap with the first portion in the vertical direction.

15. The SRAM cell according to claim 14, wherein in a top view, the first interconnection structure and the second interconnection structure form a substantially rectangular shape.

16. The SRAM cell according to claim 14, wherein in a top view,
an angle of about 60° is formed between the first portion and the second portion of the first interconnection structure, and an angle of about 120° is formed between the first portion and the second portion of the second interconnection structure; or
an angle of about 120° is formed between the first portion and the second portion of the first interconnection structure, and an angle of about 60° is formed between the first portion and the second portion of the second interconnection structure.

17. The SRAM cell according to claim 14, wherein at least one of the following is satisfied:
the channel layers of the first pull-down transistor and the first pass-gate transistor are aligned in the first direction, or
the channel layers of the second pull-down transistor and the second pass-gate transistor are aligned in the first direction.

18. The SRAM cell according to claim 17, wherein at least one of the following is satisfied:
the third interconnection structure is aligned in the first direction with the channel layers of the first pull-down transistor and the first pass-gate transistor, or
the fourth interconnection structure is aligned in the first direction with the channel layers of the second pull-down transistor and the second pass-gate transistor.

19. The SRAM cell according to claim 9, wherein the respective channel layers are nanowires or nanosheets.

20. The SRAM cell according to claim 9, wherein the channel layer comprises a single-crystalline semiconductor material.

21. The SRAM cell according to claim 20, wherein the channel layer of the first pull-up transistor and the channel layer of the second pull-up transistor have top surfaces which are substantially coplanar with each other and bottom surfaces which are substantially coplanar with each other.

22. The SRAM cell according to claim 21, wherein at least a portion of the gate electrode of the first pull-up transistor which is close to the channel layer of the first pull-up transistor has upper and lower surfaces which are substantially coplanar with upper and lower surfaces of the channel layer of the first pull-up transistor; and
wherein at least a portion of the gate electrode of the second pull-up transistor which is close to the channel layer of the second pull-up transistor has upper and lower surfaces which are substantially coplanar with upper and lower surfaces of the channel layer of the second pull-up transistor.

23. The SRAM cell according to claim 20, wherein the respective channel layers of the first pull-down transistor, the second pull-down transistor, the first pass-gate transistor, and the second pass-gate transistor have top surfaces which are substantially coplanar with each other and bottom surfaces which are substantially coplanar with each other.

24. The SRAM cell according to claim 23, wherein at least a portion of the gate electrode of the first pull-down transistor which is close to the channel layer of the first pull-up transistor has upper and lower surfaces which are substantially coplanar with upper and lower surfaces of the channel layer of the first pull-up transistor;
wherein at least a portion of the gate electrode of the second pull-down transistor which is close to the channel layer of the second pull-down transistor has upper and lower surfaces which are substantially coplanar with upper and lower surfaces of the channel layer of the second pull-down transistor;
wherein at least a portion of the gate electrode of the first pass-gate transistor which is close to the channel layer of the first pass-gate transistor has upper and lower surfaces which are substantially coplanar with upper and lower surfaces of the channel layer of the first pass-gate transistor; and
wherein at least a portion of the gate electrode of the second pass-gate transistor which is close to the channel layer of the second pass-gate transistor has upper and lower surfaces which are substantially coplanar with upper and lower surfaces of the channel layer of the second pass-gate transistor.

25. The SRAM cell according to claim 20, wherein the second source/drain layer of the first pull-up transistor and the first source/drain layers of the first pull-down transistor and the first pass-gate transistor are in contact with each other and extend laterally to form the first interconnection structure, and
wherein the second source/drain layer of the second pull-up transistor and the first source/drain layers of the second pull-down transistor and the second pass-gate transistor are in contact with each other and extend laterally to form the second interconnection structure.

26. The SRAM cell according to claim 25, wherein the respective source/drain layers are at least partially silicided.

27. The SRAM cell according to claim 25, wherein the third interconnection structure comprises a first portion and a second portion located on opposite sides of the first interconnection structure in the vertical direction, respectively,
wherein the fourth interconnection structure comprises a first portion and a second portion located on opposite sides of the second interconnection structure in the vertical direction, respectively, and
wherein the first portion of the third interconnection structure and the first portion of the fourth interconnection structure comprise silicide containing a semiconductor element in the channel layers of the first pull-up transistor and the second pull-up transistor, and the second portion of the third interconnection structure and the second portion of the fourth interconnection structure comprise silicide containing a semiconductor element in the channel layers of the first pull-down transistor, the second pull-down transistor, the first pass-gate transistor, and the second pass-gate transistor.

28. A memory comprising a plurality of SRAM cells according to claim 1.

29. An electronic device comprising the memory according to claim 28 and a processor operatively coupled to the memory.

30. The electronic device according to claim 29, comprising a smart phone, a computer, a tablet computer, a wearable smart device, an artificial intelligence device, or a mobile power supply.

* * * * *